US008601344B1

(12) United States Patent
Seshardri et al.

(10) Patent No.: US 8,601,344 B1
(45) Date of Patent: Dec. 3, 2013

(54) METHOD AND APPARATUS FOR A PARAMETERIZED INTERLEAVER DESIGN PROCESS

(71) Applicant: Hughes Network Systems, LLC, Germantown, MD (US)

(72) Inventors: Rohit Iyer Seshardri, Gaithersburg, MD (US); Mustafa Eroz, Germantown, MD (US); Lin-Nan Lee, Potomac, MD (US)

(73) Assignee: Hughes Network System, LLC, Germantown, MD (US)

( * ) Notice: Subject to any disclaimer, the term of this patent is extended or adjusted under 35 U.S.C. 154(b) by 0 days.

(21) Appl. No.: 13/955,862

(22) Filed: Jul. 31, 2013

Related U.S. Application Data

(63) Continuation of application No. 13/231,474, filed on Sep. 13, 2011, now Pat. No. 8,527,833.

(60) Provisional application No. 61/382,125, filed on Sep. 13, 2010.

(51) Int. Cl.
*H03M 13/00* (2006.01)

(52) U.S. Cl.
USPC ............................ 714/755; 714/702; 714/786

(58) Field of Classification Search
USPC .......................................... 714/702, 755, 786
See application file for complete search history.

(56) References Cited

U.S. PATENT DOCUMENTS 6,266,795 B1 7/2001 Wei
6,473,878 B1 10/2002 Wei
6,625,762 B1 9/2003 Le Dantec
6,785,859 B2 * 8/2004 Goldman ...................... 714/755
6,910,110 B2 6/2005 Kim et al.
6,961,889 B2 * 11/2005 Shin .............................. 714/755
7,089,480 B2 * 8/2006 Yun et al. ....................... 714/790
7,091,889 B2 * 8/2006 Kukla et al. ..................... 341/81

(Continued)

FOREIGN PATENT DOCUMENTS

EP 2043290 A2 4/2009
WO WO 2007/045642 A1 4/2007

OTHER PUBLICATIONS

DVB-RCS2 Document A155-2, Digital Video Broadcasting (DVB): "Second Generation DVB Interactive Satellite System; Part 2: Lower Layers for Satellite Standard; DVB Document A155-2", XP002665422, http://www.dvb.org/news_events/news/dvb-rcs2-published/index.xml, Mar. 2011, 140-144.
ESR P1070EP00 "European Search Report", Mar. 14, 2012.

(Continued)

*Primary Examiner* — Esaw Abraham
(74) *Attorney, Agent, or Firm* — Potomac Technology Law, LLC

(57) ABSTRACT

A parameterized interleaver design process is provided, which optimizes the design for interleavers of any size, and can be completely specified using only a few design parameters. According to the parameterized interleaver design process an interleaver $\pi(i)$ of a length N is generated. A number of subpermutation masks are defined, and a first intermediate interleaver permutation is partitioned into a number of subgroups, wherein the number of subgroups corresponds with the number of subpermutation masks. Each of the subgroups of the first intermediate interleaver permutation is partitioned into a number of further subgroups, and each of the subpermutation masks is applied to each of the further subgroups of a corresponding subgroup of the first intermediate interleaver permutation, resulting in a corresponding portion of a second intermediate interleaver permutation. The resulting interleaver $\pi(i)$ is generated based at least in part on the first and second intermediate interleaver permutations.

4 Claims, 12 Drawing Sheets

(56) References Cited

U.S. PATENT DOCUMENTS

| | | | | |
|---|---|---|---|---|
| 7,505,526 | B2 | 3/2009 | Coffey et al. | |
| 7,673,213 | B2 | 3/2010 | Chugg et al. | |
| 7,945,001 | B2 | 5/2011 | Ha et al. | |
| 7,949,926 | B2 * | 5/2011 | Nimbalker et al. | 714/755 |
| 7,958,425 | B2 | 6/2011 | Chugg et al. | |
| 8,107,552 | B2 * | 1/2012 | Niu et al. | 375/295 |
| 8,156,390 | B2 * | 4/2012 | Palanki et al. | 714/701 |
| 8,358,573 | B2 * | 1/2013 | Treigherman | 370/208 |
| 8,386,903 | B2 * | 2/2013 | Lee | 714/801 |
| 8,416,794 | B2 * | 4/2013 | Kang et al. | 370/412 |
| 2009/0113271 | A1 | 4/2009 | Bae et al. | |
| 2010/0169722 | A1 | 7/2010 | Wu et al. | |

OTHER PUBLICATIONS

Park, Sung-Joon et al., "Interleaver Optimization of Convolutional Turbo Code for 802.16 Systems", IEEE Communications Letters, vol. 13. No. 5, May 1, 2009, XP011281310, May 1, 2009, 339-341.

* cited by examiner

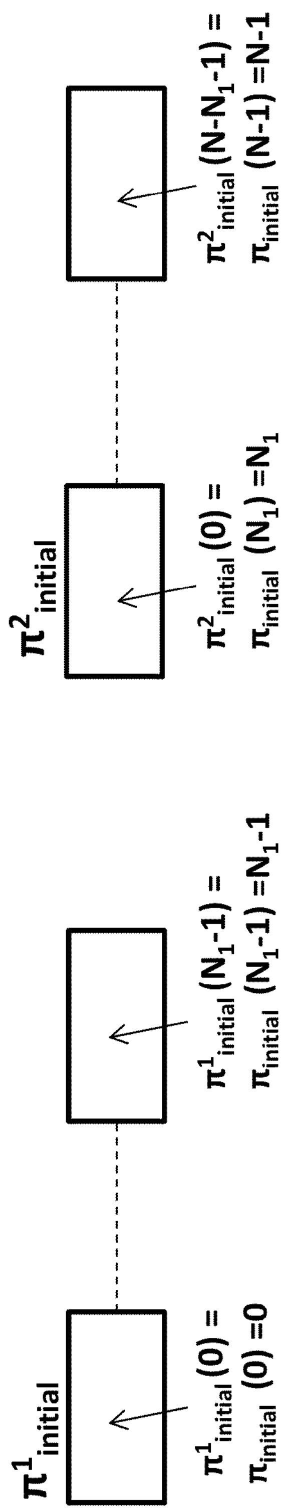
FIG. 5A
FIG. 5B
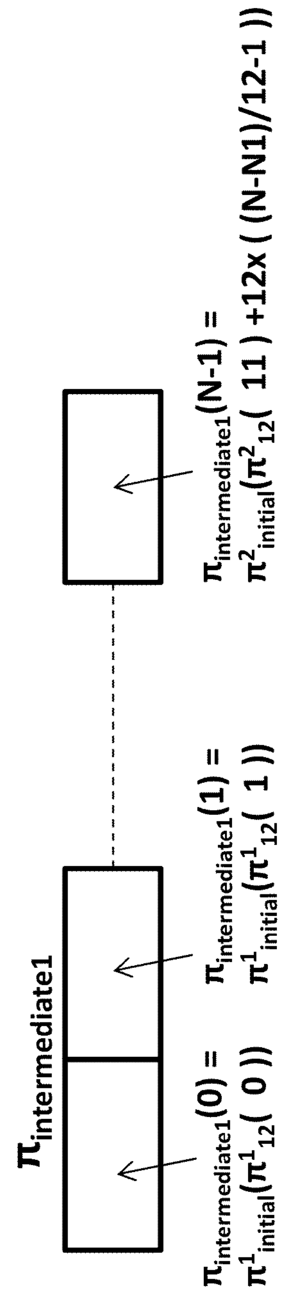
FIG. 5C

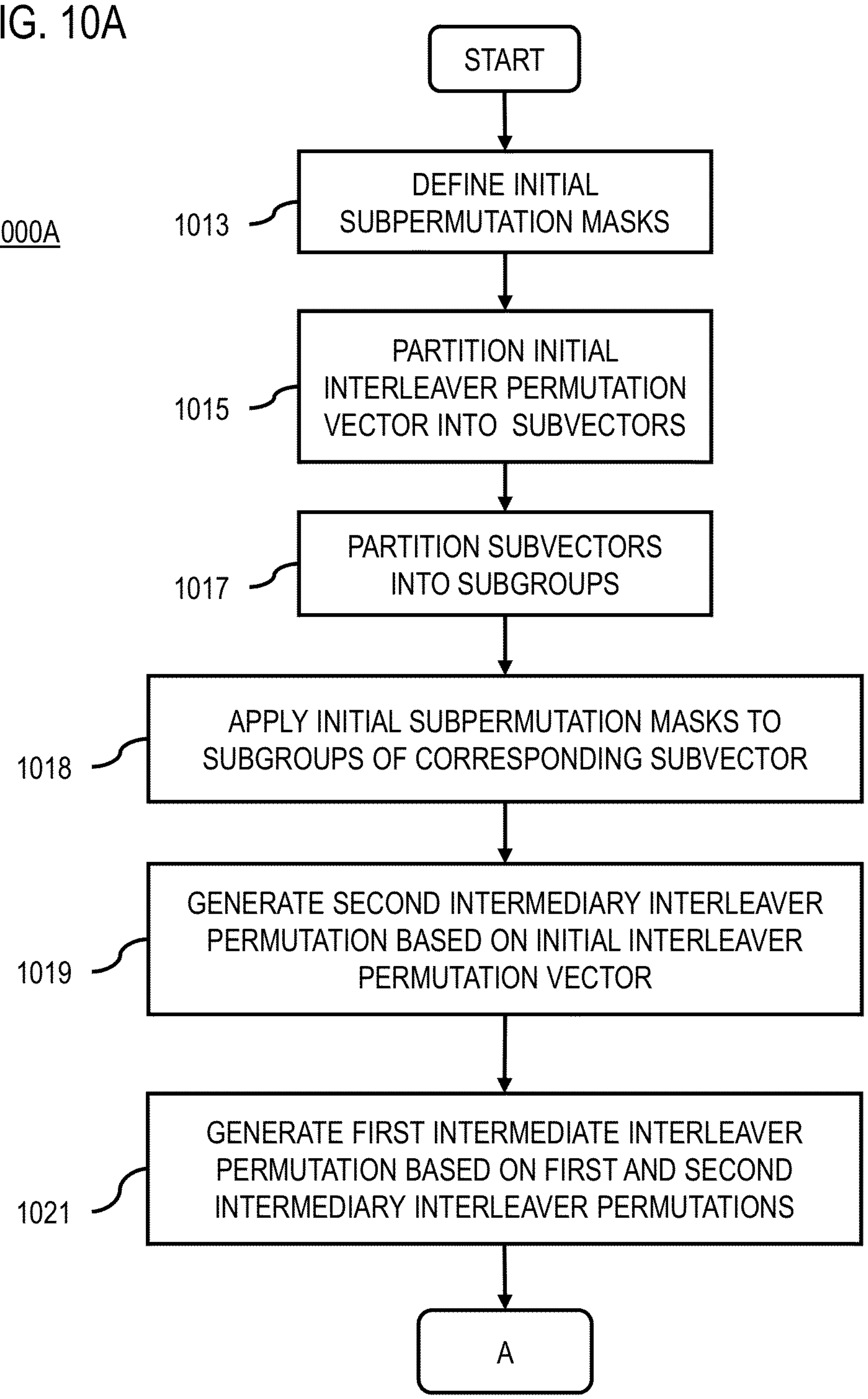

FIG. 10A
1000A
START
1013
DEFINE INITIAL SUBPERMUTATION MASKS
1015
PARTITION INITIAL INTERLEAVER PERMUTATION VECTOR INTO SUBVECTORS
1017
PARTITION SUBVECTORS INTO SUBGROUPS
1018
APPLY INITIAL SUBPERMUTATION MASKS TO SUBGROUPS OF CORRESPONDING SUBVECTOR
1019
GENERATE SECOND INTERMEDIARY INTERLEAVER PERMUTATION BASED ON INITIAL INTERLEAVER PERMUTATION VECTOR
1021
GENERATE FIRST INTERMEDIATE INTERLEAVER PERMUTATION BASED ON FIRST AND SECOND INTERMEDIARY INTERLEAVER PERMUTATIONS
A

METHOD AND APPARATUS FOR A PARAMETERIZED INTERLEAVER DESIGN PROCESS

RELATED APPLICATIONS

This application is a continuation, and claims the benefit of the filing date under 35 U.S.C. §120, of U.S. patent application Ser. No. 13/231,474 (filed 13 Sep. 2011), now U.S. Pat. No. 8,527,833, which claims priority under 35 U.S.C. §119 based on U.S. Provisional Application Ser. No. 61/382,125, filed Sep. 13, 2010, the disclosures of which are incorporated herein by reference in their entireties.

BACKGROUND

The present invention relates to error correction in coding schemes for digital communication systems, and more particularly to design optimization for Interleavers of any size, which can be completely specified using only a few design parameters (i.e. a parameterized interleaver).

In communication systems, system performance is aided by error control codes. Nearly all communications systems rely on some form of error control for managing errors that may occur due to noise and other factors during transmission of information through a communication channel. These communications systems can include satellite systems, fiber-optic systems, cellular systems, and radio and television broadcasting systems. Efficient error control schemes implemented at the transmitting end of these communications systems have the capacity to enable the transmission of data including audio, video, text, etc. with very low error rates within a given signal-to-noise ratio (SNR) environment. Powerful error control schemes also enable a communications system to achieve target error performance rates in environments with very low SNR, such as in satellite and other wireless systems where noise is prevalent and high levels of transmission power are costly, if even feasible.

Thus, broad classes of powerful error control schemes that enable reliable transmission of information have emerged including convolutional codes, low density parity check (LDPC) codes, and turbo codes. Both LDPC codes as well as some classes of turbo codes have been successfully demonstrated to approach near the theoretical bound (i.e., Shannon limit). Although long constraint length convolutional codes can also approach the Shannon limit, decoder design complexity prevents practical, wide spread adoption. LDPC codes and turbo codes, on the other hand, can achieve low error rates with lower complexity decoders.

In frequency division multiplexed (FDM) systems, adjacent channel interference (ACI) can seriously impair performance especially when high bandwidth efficiencies are desired. This is because in order to achieve high bandwidth/spectral efficiencies, the frequency separation between the adjacent channels (carriers) must be reduced, causing an increase in ACI and resulting in performance degradation. The performance can be improved by applying interference cancellation at the receiver. Such a design, however, entails an increase in the complexity. Alternatively, the performance could also be improved through a more judicious choice of the modulation and channel (error correction) coding. Bandwidth efficiency can be obtained by choosing modulations such as continuous phase modulation (CPM). Through a careful design of the CPM pulse shape and selection of the remaining modulation parameters, such as the alphabet size M and modulation index h, the power spectrum can be shaped to improve the resilience to ACI.

A pragmatic approach for attempting to achieve energy efficient communication would be the concatenation of a small constraint length binary error correction code and the modulator using a bit interleaver and the application of the "turbo-principle" of iterating between the demodulator and decoder at the receiver. Interleaving is a process of reordering a sequence of symbols or bits in a predetermined manner. "Interleaver size" is equal to the size of the sequence. The apparatus performing the interleaving is referred to herein as an Interleaver. A Turbo Interleaver serves to reorder an input data sequence in a pseudo-random fashion prior to an encoding by a second of the constituent codes. This approach is commonly known as bit interleaved coded modulation with iterative decoding (BICM-ID). The primary goals for error coding (FEC) and interleaver design are flexibility, effective performance, complexity (e.g., implementation complexity) and scalability.

A main problem in such communication systems, however, is an early occurrence of the error floor along the curve of error rate (e.g., frame error rate) with respect to signal to noise ratio. As the signal to noise ratio is improved the frame error rate generally improves in a relative fashion. Particularly, at higher frame error rates, the error rate improves at a sharper slope with respect to improvement in the signal to noise ratio (along the curve of frame error rate with respect to signal to noise ratio), and then at some point, the slop or rate of improvement in the frame error rate drops off or flattens out at lower frame error rates (also known as error floors). This phenomenon is dominated by the interleaver design. The goal of the interleaver design is to prevent early error floors—in other words, the goal is to set the point at which the frame error rate improvement drops off at a lowest practical error rate (e.g., at frame error rates of $10^{-5}$ or $10^{-6}$).

Coded systems employing small constraint length binary convolutional codes in a BICM-ID framework have been shown to have very good convergence thresholds, and hence perform very well in the waterfall region of the error rate curve. To prevent the early error floors that typically occur in these systems, an S-random bit interleaver is often used between the convolutional encoder and the modulator. The underlying principle behind S-random interleavers is to avoid mapping neighbor positions of an original input sequence to another neighbor position of the interleaved sequence within a window of size S. The design goal in S-random interleavers is to maximize S while preserving the above principle.

S-random interleavers, however, suffer from a main drawback in that they lack a general rule that can be used to specify an interleaver of any size N. A designer, therefore, has no practical option other than creating an explicit listing or specification for the entire interleaver for a given N. Also, S-random interleavers have to be redesigned every time the interleaver size is changed, and there is typically no requirement of any resemblance between the interleavers with similar sizes. Further, specification of the entire interleaver requires a respective amount of memory storage for each interleaver, and the specification of multiple interleavers of differing sizes multiplies the memory requirements. Accordingly, the memory required to store the entire interleaver generally renders the S-random interleaver as an impractical option for use in communication systems in which the interleaver length spans a wide range of values, for instance, from a few hundred bits to several thousand bits.

It is, therefore, desirable to have a general interleaver design based on an interleaver design rule that concisely defines interleavers of any size, which can be completely specified using only a few design parameters (i.e. a parameterized interleaver).

Some Exemplary Embodiments

The present invention advantageously addresses the needs above, as well as other needs, by providing a method, system, and software for a parameterized interleaver design process, which optimizes the design for interleavers of any size, and can be completely specified using only a few design parameters. The interleaver design process of the present invention offers a considerable reduction in memory requirement relative to the S-random interleaver. Also, simulation results show that interleavers designed via the methodology of the present invention either meet or improve on the performance of typical S-random interleavers.

According to an exemplary embodiment, a method of generating an interleaver $\pi(i)$ of a length N comprises defining a number of subpermutation masks. The method further comprises partitioning a one intermediate interleaver permutation into a number of subgroups, wherein the number of subgroups corresponds with the number of subpermutation masks. Each of the subgroups of the one intermediate interleaver permutation is partitioned into a number of further subgroups, and each of the subpermutation masks is applied to each of the further subgroups of a corresponding subgroup of the one intermediate interleaver permutation, resulting in a corresponding portion of a further intermediate interleaver permutation. The resulting interleaver $\pi(i)$ is generated based at least in part on the one intermediate and the further intermediate interleaver permutations.

According to a further exemplary embodiment, the method of generating an interleaver $\pi(i)$ of a length N further comprises defining a number of initial subpermutation masks. The method also comprises partitioning an initial interleaver permutation vector into a number of subvectors, wherein the number of subvectors corresponds to the number of initial subpermutation masks. Each of the subvectors is partitioned into a number of subgroups, and each of the initial subpermutation masks is applied to each of the subgroups of a corresponding subvector, resulting in a corresponding portion of a subvector intermediate interleaver permutation. An additional intermeduiate interleaver permutation is generated based at least in part on the initial interleaver permutation vector. The one intermediate interleaver permutation is generated based at least in part on the subvector intermediate and the additional intermediate interleaver permutations, wherein the one intermediate interleaver permutation is of the length N.

According to a further exemplary embodiment, a method of generating an interleaver $\pi(i)$ of a length N comprises defining a set of interleaver design parameters, including s, p, $N_1$, $K_1$, $K_2$ and $K_3$, and defining a plurality of subpermutation masks, $\pi^1$, $\pi^2$, $\pi^3$, $\pi^4$, $\pi^5$, and $\pi^6$. An initial interleaver permutation vector it initial is partitioned into a first subvector $\pi_{initial}^1$ of a length $N_1$ and a second subvector $\pi_{initial}^2$ of a length N-$N_1$. The first subvector $\pi_{initial}^1$ is partitioned into a number of first subgroups, and the subpermutation mask $\pi^1$ is applied to each of the first subgroups, resulting in a first portion of a first intermediate interleaver permutation $\pi_{intermediate1}(i)$, where i=0, 1, . . . , $N_1-1$. The second subvector $\pi_{initial}^2$ is partitioned into a number of second subgroups, and the subpermutation mask $\pi^2$ is applied to each of the second subgroups, resulting in a second portion of the first intermediate interleaver permutation $\pi_{intermediate1}(i)$, where i=$N_1$, . . . , N−1. The method further comprises generating a second intermediate interleaver permutation $\pi_{intermediate2}(i)$, based at least in part on the initial interleaver permutation vector, where i=0, 1, . . . , N−1, and generating a third intermediate interleaver permutation $\pi_{intermediate3}(i)$, based at least in part on the first and second intermediate interleaver permutations, where i=0, 1, . . . , N−1. The third intermediate interleaver permutation $\pi_{intermediate3}$ is partitioned into four subgroups, $\pi_{intermediate3}^1$, $\pi_{intermediate3}^2$, $\pi_{intermediate3}^3$, and $\pi_{intermediate3}^4$, having $K_1$, $K_2$, $K_3$ and $K_4$ elements, respectively, wherein $K_1+K_2+K_3+K_4=N$. The subgroup $\pi_{intermediate3}^1$ is partitioned into $K_1/12$ subgroups, and the subpermutation mask $\pi^3$ is applied to each of the $K_1/12$ subgroups, resulting in a first portion of a fourth intermediate interleaver permutation $\pi_{intermediate4}(i)$, where i=0, 1, . . . , $K_1-1$. The subgroup $\pi_{intermediate3}^2$ is partitioned into $K_2/12$ subgroups, and the subpermutation mask $\pi^4$ is applied to each of the $K_2/12$ subgroups, resulting in a second portion of the fourth intermediate interleaver permutation $\pi_{intermediate4}$ (i), where i=$K_1$, . . . , $(K_1+K_2)-1$. The subgroup $\pi_{intermediate3}^3$ is partitioned into $K_3/12$ subgroups, and the subpermutation mask $\pi^5$ is applied to each of the $K_3/12$ subgroups, resulting in a third portion of the fourth intermediate interleaver permutation $\pi_{intermediate4}(i)$, where i=$(K_1+K_2)$, . . . , $(K_1+K_2+K_3)-1$. The subgroup $\pi_{intermediate3}^4$ is partitioned into $K_4/12$ subgroups, and the subpermutation mask $\pi^6$ is applied to each of the $K_4/12$ subgroups, resulting in a fourth portion of the fourth intermediate interleaver permutation $\pi_{intermediate4}$ (i), where i=$(K_1+K_2+K_3)$, . . . , N−1. The resulting interleaver $\pi(i)$ is generated based at least in part on the third and fourth intermediate interleaver permutations, where =0, 1, . . . , N−1.

According to another exemplary embodiment, an apparatus for generating an interleaver $\pi(i)$ of a length N, comprises a processor configured to partition a one intermediate interleaver permutation into a number of subgroups, wherein the number of subgroups corresponds with a number of predetermined subpermutation masks. The processor is further configured to partition each of the subgroups of the one intermediate interleaver permutation into a number of further subgroups, and to apply each of the subpermutation masks to each of the further subgroups of a corresponding subgroup of the one intermediate interleaver permutation, resulting in a corresponding portion of a further intermediate interleaver permutation. The processor is further configured to generate the resulting interleaver $\pi(i)$ based at least in part on the one intermediate and the further intermediate interleaver permutations.

According to a further exemplary embodiment, the processor is further configured to partition an initial interleaver permutation vector into a number of subvectors, wherein the number of subvectors corresponds to a number of predetermined initial subpermutation masks. Each of the subvectors is partitioned into a number of subgroups, and each of the initial subpermutation masks is applied to each of the subgroups of a corresponding subvector, resulting in a corresponding portion of a subvector intermediate interleaver permutation. An additional intermediate interleaver permutation is generated based at least in part on the initial interleaver permutation vector. The one intermediate interleaver permutation is generated based at least in part on the subvector intermediate and the additional intermediate interleaver permutations, wherein the one intermediate interleaver permutation is of the length N.

According to a further exemplary embodiment, an apparatus for generating an interleaver $\pi(i)$ of a length N, comprises processor configured to partition an initial interleaver permutation vector $\pi_{initial}$ into a first subvector $\pi_{initial}^1$ of a length $N_1$ and a second subvector $\pi_{initial}^2$ of a length N-$N_1$, wherein $N_1$ comprises a predetermined parameter. The processor is further configured to partition the first subvector $\pi_{initial}^1$ into a number of first subgroups, and to apply a predetermined subpermutation mask $\pi^1$ to each of the first subgroups, resulting in a first portion of a first intermediate interleaver permutation $\pi_{intermediate1}(i)$, where i=0, 1, . . . , $N_1-1$. The processor is further configured to partition the second subvector $\pi_{initial}^2$ into a number of second subgroups, and to apply a predetermined subpermutation mask $\pi^2$ to each of the second subgroups, resulting in a second portion of the first intermediate interleaver permutation $\pi_{intermediate1}(i)$, where i=$N_1$, . . . , N−1. The processor is further configured to generate a second intermediate interleaver permutation $\pi_{intermediate2}$ (i), based at least in part on the initial interleaver permutation vector, where i=0, 1, . . . , N−1, and to generate a third intermediate interleaver permutation $\pi_{intermediate3}(i)$, based at least in part on the first and second intermediate interleaver permutations, where i=0, 1, . . . , N−1. The processor is further configured to partition the third intermediate interleaver permutation $\pi_{intermediate3}$ into four subgroups, $\pi_{intermediate3}^1$, $\pi_{intermediate3}^2$, $\pi_{intermediate3}^3$ and $\pi_{intermediate3}^4$, having $K_1$, $K_2$, $K_3$ and $K_4$ elements respectively, wherein $K_1$, $K_2$ and $K_3$ comprise predetermined parameters, and $K_1+K_2+K_3+K_4=N$. The processor is further configured to partition the subgroup $\pi_{intermediate3}^1$ into $K_1/12$ subgroups, and to apply a predetermined subpermutation mask $\pi^3$ to each of the $K_1/12$ subgroups, resulting in a first portion of a fourth intermediate interleaver permutation $\pi_{intermediate4}(i)$, where i=0, 1, . . . , $K_1-1$. The processor is further configured to partition the subgroup $\pi_{intermediate3}^2$ into $K_2/12$ subgroups, and to apply a predetermined subpermutation mask $\pi^4$ to each of the $K_2/12$ subgroups, resulting in a second portion of the fourth intermediate interleaver permutation $\pi_{intermediate4}$ (i), where i=$K_1$, . . . , $(K_1+K_2)-1$. The processor is further configured to partition the subgroup $\pi_{intermediate3}^3$ into $K_3/12$ subgroups, and to apply a predetermined subpermutation mask $\pi^5$ to each of the $K_3/12$ subgroups, resulting in a third portion of the fourth intermediate interleaver permutation $\pi_{intermediate4}(i)$, where i=$(K_1+K_2)$, . . . , $(K_1+K_2+K_3)-1$. The processor is further configured to partition the subgroup πintermediate3$^4$ into $K_4/12$ subgroups, and to apply a predetermined subpermutation mask $\pi^6$ to each of the $K_4/12$ subgroups, resulting in a fourth portion of the fourth intermediate interleaver permutation $\pi_{intermediate4}$ (i), where i=$(K_1+K_2+K_3)$, . . . , N−1. The processor is further configured to generate the resulting interleaver π(i) based at least in part on the third and fourth intermediate interleaver permutations, where i=0, 1, . . . , N−1.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 5A-5C illustrate a second step in the parameterized interleaver design process, according to an exemplary embodiment.

FIGS. 10A-10B illustrate flow charts of a process for a parameterized interleaver design, according to exemplary embodiments.

DETAILED DESCRIPTION

A method, system, and software for a parameterized interleaver design process, which optimizes the design for interleavers of any size, and can be completely specified using only a few design parameters is described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

Although certain embodiments of the present invention are described with respect to interleaver designs employed with continuous phase modulation (CPM), it is contemplated that these embodiments have applicability to other modulation schemes, such as frequency shifted keying (FSK), quadrature phase shifted keying (QPSK), offset quadrature phase shifted keying (OQPSK), quadrature amplitude modulation (QAM), adaptive coding and modulation (ACM), and the like.

Figure 1A:
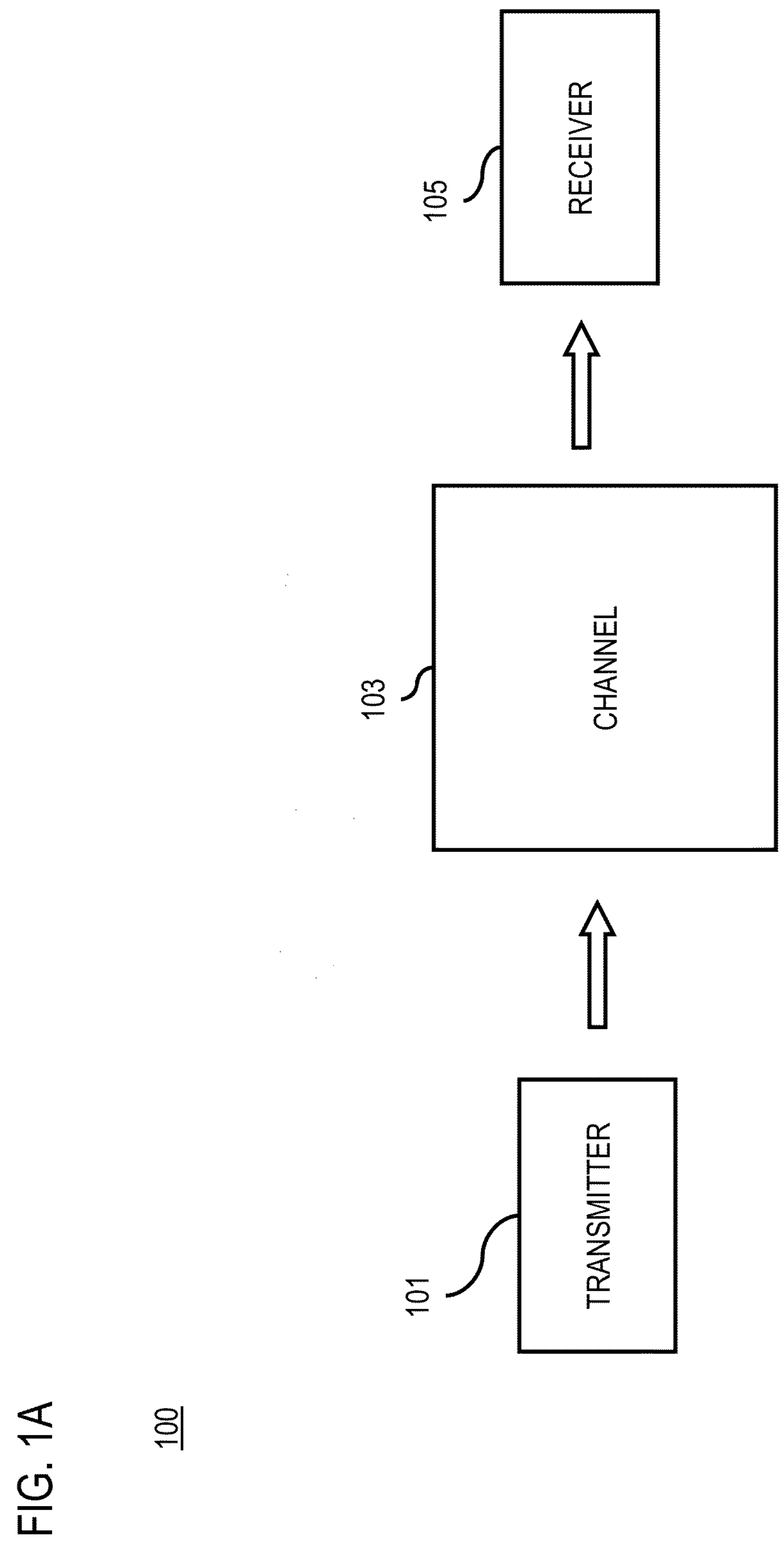
FIGS. 1A and 1B illustrate communications systems capable of employing interleavers designed in accordance with various exemplary embodiments.
Figure 1B:
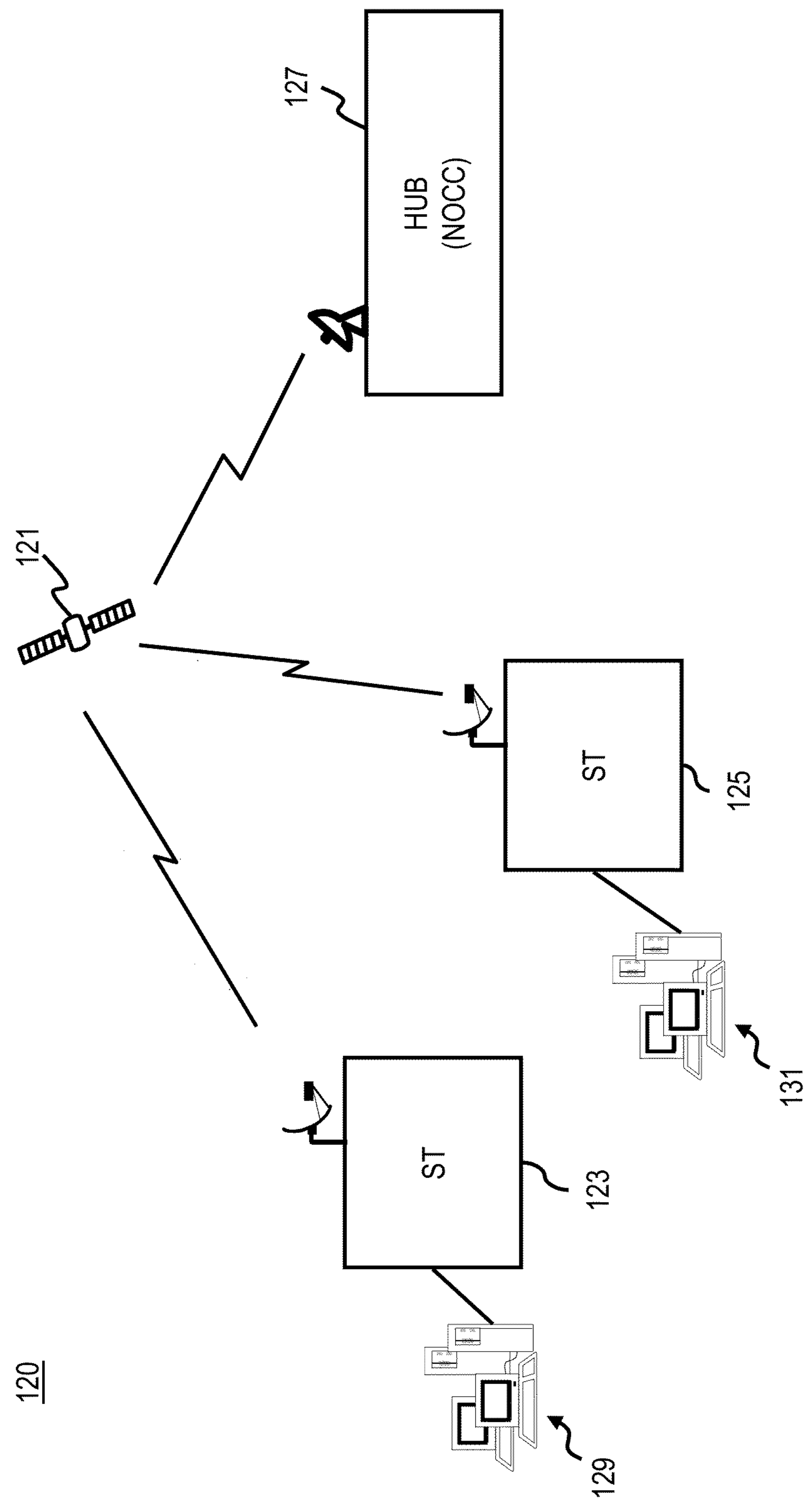

FIGS. 1A and 1B are communications systems capable of utilizing interleaver designs according to various exemplary embodiments. A digital communications system 100 includes one or more transmitters 101 (of which one is shown) that generate signal waveforms across a communication channel 103 to one or more receivers 105 (of which one is shown). In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, coding is utilized. For example, forward error correction (FEC) codes can be employed.

FEC is required in terrestrial and satellite systems to provide high quality communication over a radio frequency (RF) propagation channel, which induces signal waveform and spectrum distortions, including signal attenuation (freespace propagation loss), multi-path induced fading and adjacent channel interference. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communications systems continue to evolve in order to satisfy increased system requirements for new higher rate or higher fidelity communication services.

FIG. 1B is a diagram of an exemplary meshed network capable of supporting communication among terminals with varied capabilities, according to an embodiment of the present invention.

Satellite communications system 120 includes a satellite 121 that supports communication among multiple satellite terminals (STs) 123, 125 and a hub 127. The hub 127 may assume the role of a Network Operations Control Center (NOCC), which controls the access of the STs 123, 125 to the network 120 and also provides element management functions and control of the address resolution and resource management functionality. The satellite 121, in an exemplary embodiment, operates as a packet switch (e.g., at a data link layer) that provides direct unicast and multicast communication among the STs 123, 125. The STs 123, 125 provide connectivity to one or more hosts 129, 131, respectively. According to one embodiment of the present invention, the system 120 has a fully meshed architecture, whereby the STs 123, 125 may directly communicate.

In certain embodiments, for terminals of differing capabilities to communicate with each other, an exchange of information regarding the capabilities among the communicating terminals is needed. Specifically, the common air interface needs to support a discovery of the terminal's capabilities profile (or context information). These capabilities can include encryption scheme, compression scheme, segmentation and reassembly (SAR) scheme, automatic repeat request (ARQ) scheme, Quality-of-Service (QoS) parameters, power levels, modulation and coding schemes, power control algorithms, and link adaptation capabilities.

Under a conventional approach, terminal profile can be readily exchanged over a network with a star topology where no peer-to-peer communication exists. For example, in the General Packet Radio Service (GPRS)/Universal Mobile Telecommunications System (UMTS) family of protocols, such capabilities profiles include a packet data protocol (PDP) context and a mobility management context. In an exemplary embodiment, the concepts of PDP context and mobility management context are combined and the term packet data protocol (PDP) context is used in general to refer to terminal capabilities. It is recognized that these terminals can be mobile as well as non-mobile. According to an exemplary embodiment, this PDP context, for example, which can provide information about the encryption algorithm, compression algorithm, modes of data link layer communication, and physical layer transfer capabilities is combined by the transmit ST with the Quality of Service (QoS) of a pending data flow to determine a packet transfer context to use in transmission of the flow. If a PDP context has been previously established, then the sending ST can autonomously create the packet transfer context, which both satisfies the QoS of the data flow and is compatible with the receive ST capabilities.

According to one embodiment, the exchange of terminal profile can be executed over a meshed network, in a peer-to-peer manner. The STs 123, 125 support the use of a negotiation procedure to determine the optimal configuration for transmission and reception of data. If a protocol implements control procedures or options in newer versions (i.e., flow-control/rate-control), older protocol versions are able to detect the initiation as a new unsupported procedure and report the same to the peer with minimal disruption in the flow of traffic.

The ST-ST protocol advantageously takes into account that even for peers of the same version, some capabilities may not necessarily be always supported due to local temporal processing/memory/congestion-related constraints. Additionally, the ST-ST protocol design provides for rapid developments in data communication technology. For each ST 123, 125, there exist some configuration information, including network configuration, network service provider (NSP) configuration, software configuration, and user configuration, as indicated by the NOCC 127. These configurations relate to the features that the ST 123, 125 supports and offers to the user, and have a direct bearing on the transmission and reception capabilities.

To facilitate the flow of data from one peer ST 123 to another ST 125, potentially configured with different capabilities, a packet transfer context is employed. Such a common feature set depends on the PDP contexts of the two STs 123, 125. Further, this common feature set may also depend on the QoS of the flow, as well as the loading and status of the two STs at that point of time. In an exemplary embodiment, the packet transfer context is unidirectional and valid only for the transmit ST to send packets to the specified receive ST; thus, the packet transfer context may be unique to a given pair of STs.

System Model:

Transmitter.

Figure 2:
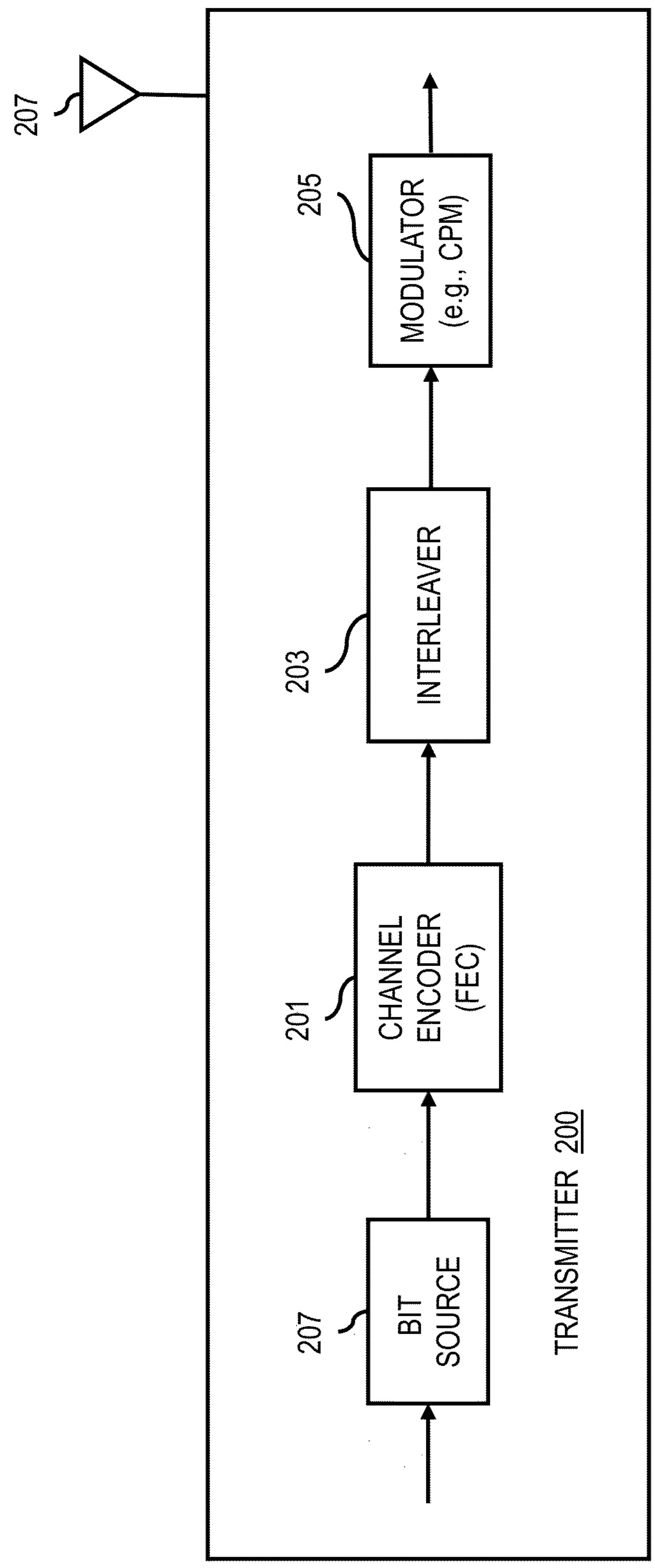
FIG. 2 illustrates a block diagram of a transmitter configured to operate in the systems of FIGS. 1A and 1B, according to an exemplary embodiment.

FIG. 2 is a block diagram of an exemplary transmitter configured to operate in the systems of FIGS. 1A and 1B. In this embodiment, the transmitter 200 is equipped with a channel encoder (FEC encoder) 201 that accepts input from an bit information source 207 and outputs coded stream of higher redundancy suitable for error correction processing at the receiver (shown in FIG. 3). Essentially, the encoder 201 generates the coded stream, and passes it to an interleaver, which reorders the sequence of symbols or bits from the encoder in a predetermined manner. The interleaved signal is fed to a modulator 205, which maps the encoded messages from encoder 201 to signal waveforms that are transmitted over the communication channel 103 to the satellite 121 via a transmit antenna 207.

In one exemplary embodiment, in the transmitter of FIG. 2, the bit source 207 outputs a vector of information bits $u=[u_0, u_1, \ldots, u_{N_u-1}]$ such that $u_i \in \{0,1\}$. The bit vector is passed to the channel encoder 201, and is encoded by a non-recursive, binary convolutional code for forward error correction to produce the codeword $b'=[b'_0, b'_1, \ldots, b'_{N-1}]$. The code rate is $R_c=N_u/N$.

The output of the encoder is fed to the interleaver. Interleaving is a process of rearranging the ordering of a data sequence in a one to one deterministic format. The inverse of this process is calling deinterleaving, which restores the received sequence to its original order. Interleaving is used to enhance the error correcting capability of coding. The interleaver contains the permutation indicies such that the interleaved codeword is given by $b=[b_0, b_1, \ldots, b_{N-1}]=[b'_{\pi(0)},$ $b'_{\pi(1)}, \ldots, b'_{\pi(N-1)}]$. As an example, if the codeword is b'=[1 1 0 0 1 1] and the interleaver is $\pi$=[3 0 5 1 4 2], the bit sequence at the output of the interleaver is b=[0 1 1 1 1 0]. The interleaved bits are mapped to symbols and input to the modulator.

The CPM modulator generates a modulated signal whose phase transitions are continuous from one symbol epoch to the next. The phase continuity ensures a power spectrum with relatively small side lobes. The power spectrum and performance of the CPM signal is influenced by the alphabet size M, the modulation index h, the type of the CPM pulse shape and the width L of the pulse shape. The complex baseband CPM signal is given by $$s(t) = \sqrt{\frac{2E_s}{T_s}} \exp(j\varphi(t)),$$

where $T_s$ is the symbol duration, $E_s$, is the average symbol energy. The CPM phase $\phi(t)$ is given by $$\varphi(t) = 2\pi h \sum_{i=0}^{\infty} a_i q(t - iT_s),\ t \geq 0.$$

where: (1) $a_i$ is the input symbol to the modulator, such that $a_i \in \{\pm1, \pm3, \ldots, \pm(M-1)\}$; (2) h is the modulation index and is a rational number of the form $h=m_h/p_h$; (3) q(t) is the CPM phase response and is a continuous function, such that, $$q(t) = \begin{cases} 0,\ t < 0 \\ \int_0^t g(\tau)\,d\tau,\ 0 \leq t \leq LT_s \\ 0.5t > LT_s \end{cases}$$

where L is the memory of the modulation, and is set to L=2. The phase response is obtained by a linear combination of the raised cosine (RC) and rectangular (REC) pulse shapes, such that, $$g(t)=\alpha_{RC}g_{RC}(t)+(1-\alpha_{RC})g_{REC}(t)$$

where, $$g_{RC}(t) = \begin{cases} \frac{1}{4T_s}\left(1 - \cos\frac{\pi t}{T_s}\right),\ 0 \leq t \leq 2T_s \\ 0,\ \text{otherwise,} \end{cases}$$

$$g_{REC}(t) = \begin{cases} \frac{1}{4T_s},\ 0 \leq t \leq 2T_s \\ 0,\ \text{otherwise,} \end{cases} \quad \text{and}$$

$$0 \leq \alpha_{RC} \leq 1.$$

Channel.

The modulated CPM signal is transmitted through the channel which distorts the signal by adding both noise and adjacent carrier interference. The noise is modeled as zero-mean, additive white Gaussian noise (AWGN) and the adjacent carrier interference is from four equally spaced carriers, assuming two carriers on either side of the desired CPM signal. If $f_i$ and $f_j$ are the center frequencies for the $i^{th}$ and the $j^{th}$ carriers respectively, then the frequency separation between two immediate neighbors is $\Delta_f=|f_i-f_j|$. It is also assumed that the carriers are homogenous, i.e. all carriers use identical CPM parameters and error correction coding.

Receiver.

Figure 3:
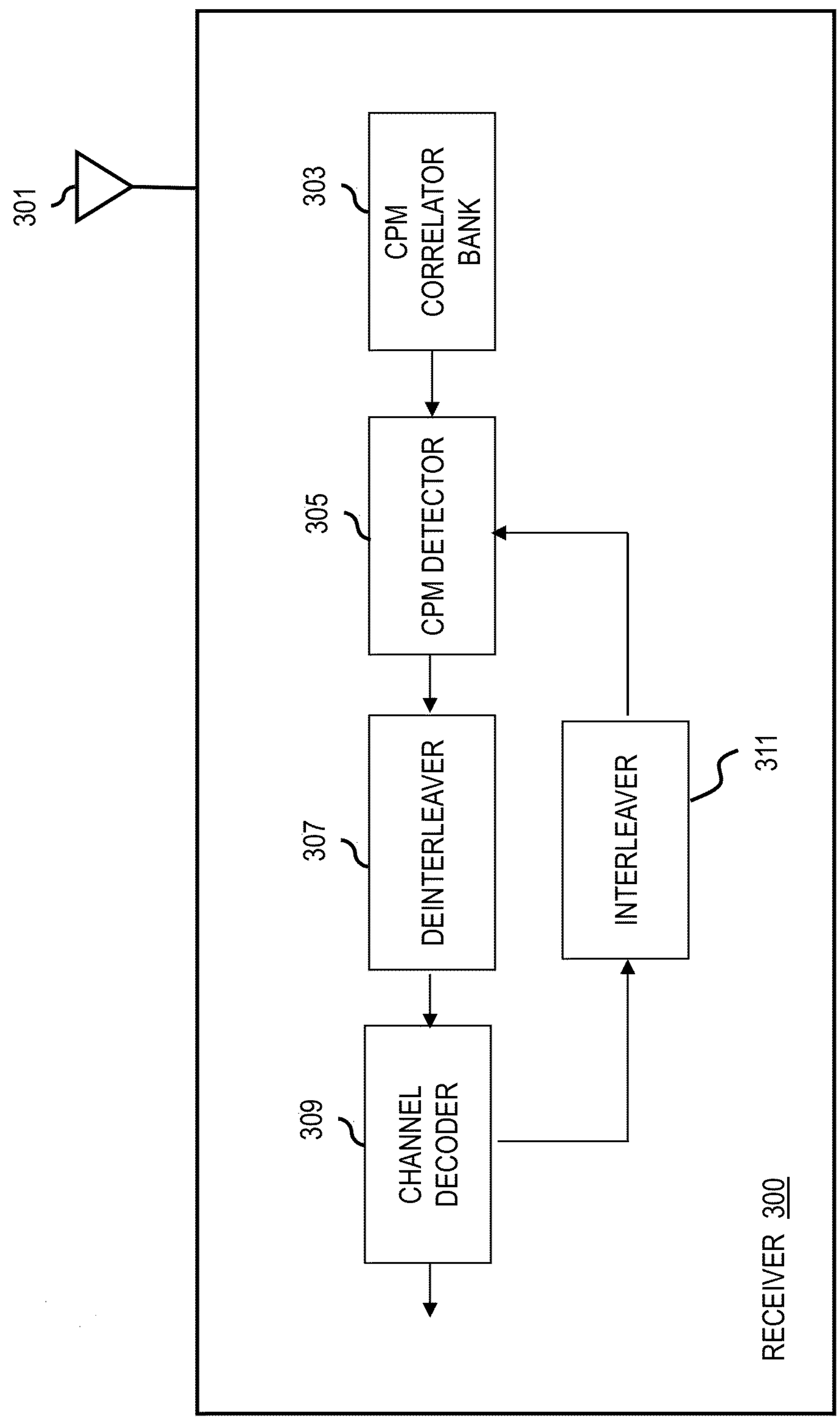
FIG. 3 illustrates a block diagram of a receiver configured to operate in the systems of FIGS. 1A and 1B, according to an exemplary embodiment.

FIG. 3 is a block diagram of an exemplary receiver configured to operate in the systems of FIGS. 1A and 1B. In this embodiment, the receiver comprises a CPM correlator/matched-filter bank front-end 303, a soft-in, soft-out (SISO) CPM detector 305, a deinterleaver 307, a convolutional channel decoder 309 and interleaver 311.

The CPM correlator bank 303 filters the received signal with $N_m$ possible reference signals, where $N_m$ is a finite integer number and depends on the choice of the CPM modulation parameters. The CPM correlator bank 303 provides a matrix, which contains statistical indication as to which of the possible transmitted signals may be the received signal.

The CPM detector 305 uses the statistics provided by the CPM correlator bank 303 to perform decoding using a decoding algorithm, such as a Viterbi or BCJR algorithm, for providing an estimate of the transmitted symbols (or equivalently of the transmitted codebits). The CPM detector 305 can also receive interleaved a priori probability information of the transmitted codebits being either a 1 or a 0 (i.e. bits generated by the convolutional code), provided by the channel decoder 309, in order to provide a better estimate of the transmitted signal. The probability estimates of the transmitted codebits, also known as extrinsic information, generated by the CPM detector 305 is deinterleaved by the deinterleaver 311, and input to the channel decoder 309.

The channel decoder 309 uses the deinterleaved probabilities in its decoding algorithm (e.g., Viterbi, BCJR) and generates an estimate of the transmitted information bits. In addition, the channel decoder 309 also provides probability estimates of the transmitted codebits, which, after interleaving, are used as the a priori probability information by the CPM detector 305. This iterative exchange of probabilities between the CPM detector 305 and the channel decoder 309 is continued until a maximum number of iterations are performed, such that, with each iteration, the decoder can provide more accurate estimates of the transmitted information bits.

Figure 10B:
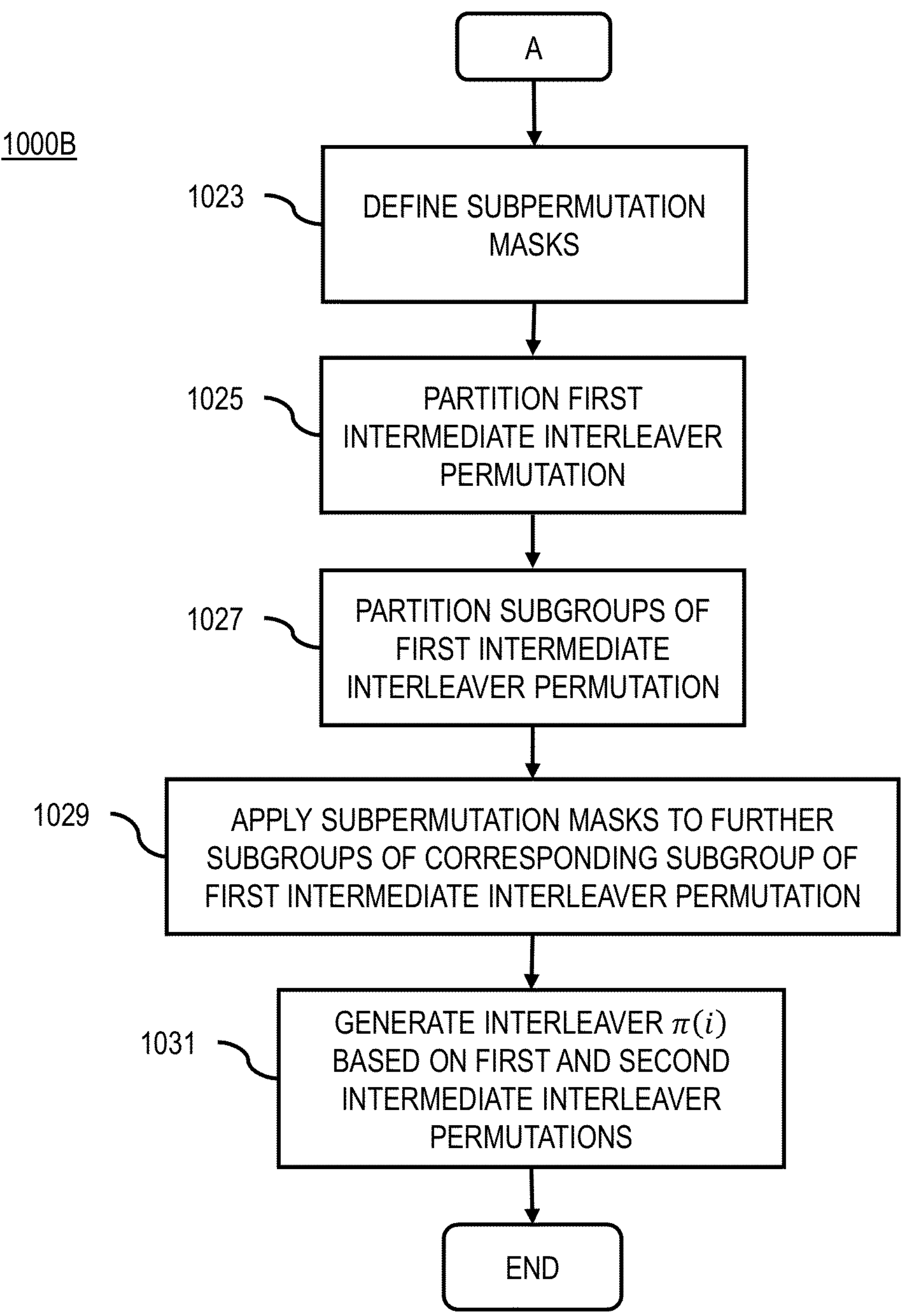

Parameterized Interleaver Design Procedure:

FIGS. 10A-10B illustrate a flowchart for a parameterized interleaver design process, which optimizes the design for interleavers of any size, and can be completely specified using only a few design parameters, according an exemplary embodiment. As stated above, the interleaver specifies the permutation of the bits in a codeword. Interleaving is a process of rearranging the ordering of a data sequence in a one to one deterministic format. More specifically, the interleaver is the set of permutation indices $\pi=[\pi(0), \pi(1), \ldots, \pi(N-1)]$, such that the bit sequence at the output of the convolutional encoder $b'=[b'_0, b'_1, \ldots, b'_{N-1}]\in\{0,1\}^N$ is mapped to $b=[b_0, b_1, \ldots, b_{N-1}]=[b'_{\pi(0)}, b'_{\pi(1)}, \ldots, b'_{\pi(N-1)}]\in\{0,1\}^N$ at the output of the interleaver. In in exemplary embodiment, the interleaver permutations are generated as follows.

Figure 12:
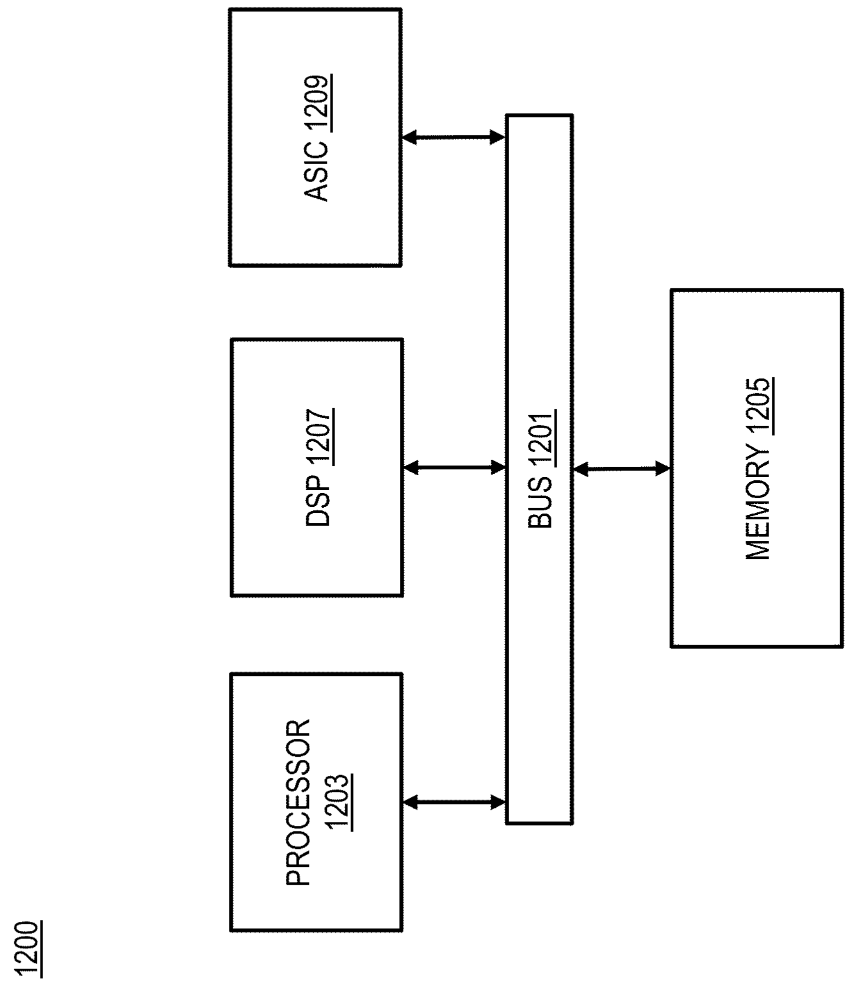
FIG. 12 is a diagram of a chip set that can be used to implement exemplary embodiments.

In one embodiment, the transmitter 200, for example, performs the processes 1000A and 1000B, implemented in, for instance, a chip set including a processor and a memory as shown in FIG. 12. In step 1013, initial subpermutation masks are defined for application to an initial interleaver permutation vector. In accordance with the present embodiment, two initial subpermutation vectors are defined for application to the subgroups of two initial interleaver subvectors. At step 1015, the initial interleaver permutation vector is partitioned into a number of subvectors, and, at step 1017, the subvectors are further partitioned into a number of subgroups. According to the present embodiment, the initial interleaver permutation vector is partitioned into two subvectors, and each of the subvectors is further partitioned into a number of subgroups, such that each subgroup contains 12 elements. Accordingly, being that each of the subgroups contains 12 elements, each of the subpermutation vectors also contains 12 elements. At step 1018, each of the initial subpermutation masks is applied to each of the subgroups of a corresponding subvector, resulting in a corresponding portion of a first intermediary interleaver permutation. For example, in the present case of two subvectors, one of the two initial subpermutation masks is applied to each of the subgroups of one of the two subvectors, which results in a first portion of the second intermediary interleaver permutation. Further, the other subpermutation mask is applied to each of the subgroups of the other subvector, which results in a second portion of the second intermediary interleaver permutation.

Figure 4:
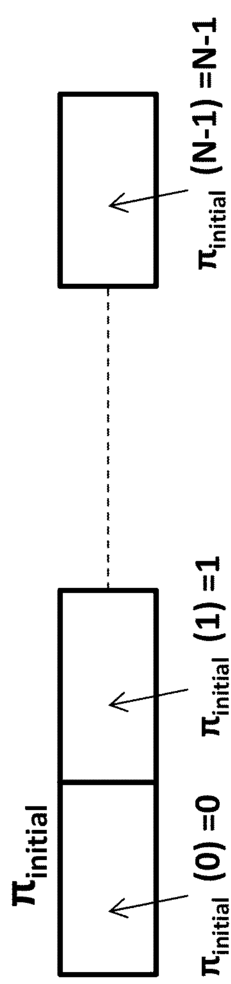
FIG. 4 illustrates a first step in the parameterized interleaver design process, according to an exemplary embodiment.

More specifically, as shown in FIG. 4, the process begins with an initial interleaver permutation vector, as follows:

$$\pi_{initial}=[0,1,2,\ldots,N-1].$$

Referring to FIGS. 5A-5C, the next step is to partition $\pi_{initial}$ into two distinct groups of lengths $N_1$ and $N-N_1$, respectively, as follows:

$$\pi_{initial}^{1}=[0,1,2,\ldots,N_1-1]$$

and $$\pi_{initial}^{2}=[N_1,N_{1+1},\ldots,N-1]$$

where πhd initial$^2(0)=\pi_{initial}(N_1)$.

Then, $\pi_{initial}^{1}$ is divided in $N_1/12$ subgroups (each of a length 12), and the subpermutation mask $\pi_{12}^{1}=[9, 11, 8, 6, 10, 2, 4, 0, 7, 5, 1, 3]$ is applied to each of the $N_1/12$ subgroups. The resulting intermediate interleaver permutations are given by:

$$\pi_{intermediate1}(i)=\pi_{initial}^{1}((j-1)\times 12+\pi_{12}^{1}(R_{12}[i]))$$

$$i=0,1,\ldots,N_1-1$$

where the index i falls within the subgroup j, such that $j\in\{1, 2, \ldots, N_1/12\}$ (for instance, j=1 corresponds to the subgroup $\pi_{initial}^{1}(0), \ldots, \pi_{initial}^{1}(11)$), and $R_N[\ ]$ represents the modulo-N operator.

Then, $\pi_{initial}^{2}$ is partitioned into $(N-N_1)/12$ subgroups (each of a length 12), and the subpermutation mask $\pi_{12}^{2}=[8, 11, 6, 4, 0, 7, 3, 10, 1, 5, 9, 2]$ is applied to each of the $(N-N_1)/12$ subgroups. The resulting intermediate interleaver permutations are given by:

$$\pi_{intermediate1}(i)=\pi_{initial}^{2}((j-1)\times 12+\pi_{12}^{2}(R_{12}[i]))$$

$$i=N_1,1,\ldots,N-1$$

where the index i falls within the subgroup j, such that $j\in\{1, 2, \ldots, (N-N_1)/12\}$.

Then, at step 1019, a second intermediary interleaver permutation is generated based on the initial interleaver permutation vector. Further, at step 1021, a first intermediate interleaver permutation is generated based on the first intermediary and the second intermediary interleaver permutations, wherein the first intermediate interleaver permutation is of the length N.

Figure 6:
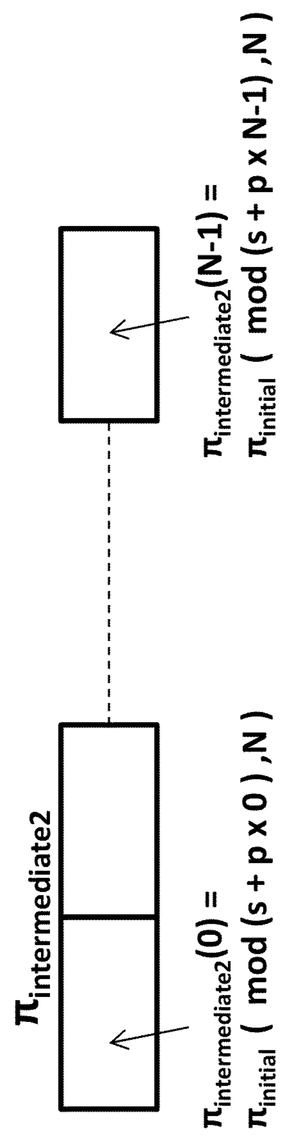
FIG. 6 illustrates a third step in the parameterized interleaver design process, according to an exemplary embodiment.

More specifically, as shown in FIG. 6, an intermediate permutation $\pi_{intermediate2}$ is defined, such that:

$$\pi_{intermediate2}(i)=\pi_{initial}(R_N[s+p\times i])$$

$$i=0,1,\ldots,N-1$$

where s and p are integers, and p is coprime with N, such that p<N and s<30.

Figure 7:
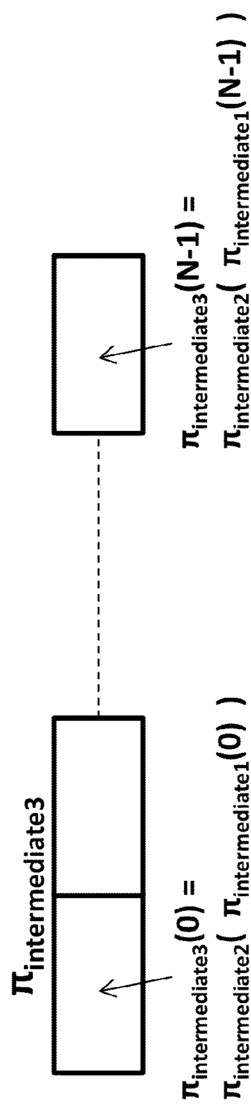
FIG. 7 illustrates a fourth step in the parameterized interleaver design process, according to an exemplary embodiment.
Figure 9:
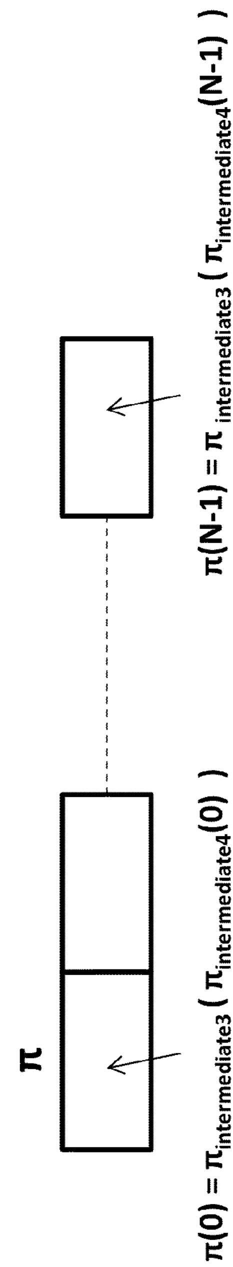
FIG. 9 illustrates a sixth step in the parameterized interleaver design process, according to an exemplary embodiment.

As shown in FIG. 7, an intermediate permutation $\pi_{intermediate3}$ is defined, such that:

$$\pi_{intermediate3}(i)=\pi_{intermediate2}(\pi_{intermediate1}(i))$$

$$i=0,1,\ldots,N-1$$

At step 1023, a number of further subpermutation masks are defined for application to subgroups of a further intermediate interleaver permutation, which, for the present embodiment number four masks, again with 12 elements each. Then, the first intermediate interleaver permutation is partitioned into a number of subgroups (step 1025), where the number of subgroups corresponds with the number of subpermutation masks. For example, according to the present embodiment, the first intermediate interleaver permutation is partitioned into four subgroups, corresponding to the four subpermutation masks. At step 1027, each of the subgroups of the first intermediate interleaver permutation is further partitioned into a number of subgroups, where, in the present example, each such subgroup contains 12 elements. Then, per step 1029, each of the subpermutation masks is applied to each of the further subgroups of a corresponding subgroup of the first intermediate interleaver permutation, resulting in a corresponding portion of a second intermediate interleaver permutation. Accordingly, for the present embodiment, (1) a first of the four subpermutation masks is applied to each of the subgroups of a first of the four subgroups of the first intermediate interleaver permutation, resulting in a first portion of the second intermediate interleaver permutation, (2) a second of the four subpermutation masks is applied to each of the subgroups of a second of the four subgroups of the first intermediate interleaver permutation, resulting in a second portion of the second intermediate interleaver permutation, (3) a third of the four subpermutation masks is applied to each of the subgroups of a third of the four subgroups of the first intermediate interleaver permutation, resulting in a third portion of the second intermediate interleaver permutation, and (4) the fourth of the four subpermutation masks is applied to each of the subgroups of the fourth of the four subgroups of the first intermediate interleaver permutation, resulting in a fourth portion of the second intermediate interleaver permutation. Finally, at step 1031, the interleaver π(i) is generated based on the first and second intermediate interleaver permutations.

Figure 8A:
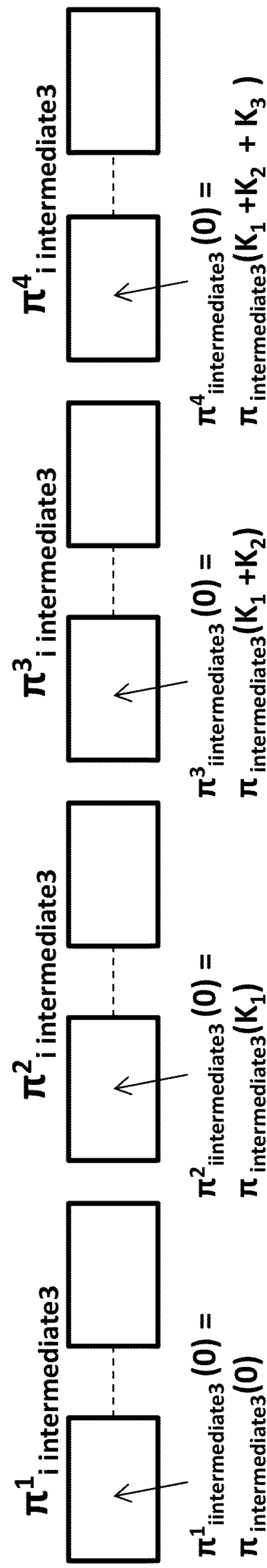
FIGS. 8A-8B illustrate a fifth step in the parameterized interleaver design process, according to an exemplary embodiment.
Figure 8B:
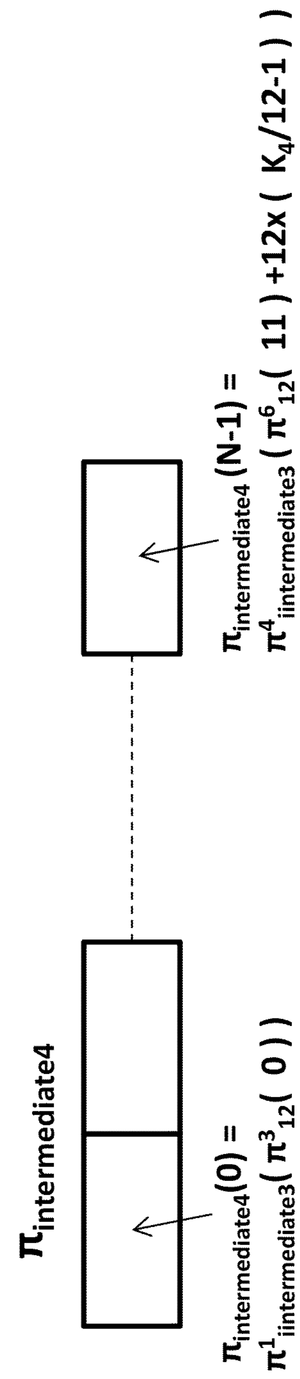

More specifically, referring to FIGS. 8A-8B, $\pi_{intermediate3}$ is partitioned into four distinct subgroups $\pi_{intermediate3}^{1}$, $\pi_{intermediate3}^{2}$, $\pi_{intermediate3}^{3}$, $\pi_{intermediate3}^{4}$ having $K_1$, $K_2$, $K_3$ and $K_4$ elements respectively, such that $K_1+K_2+K_3+K_4=N$.

First, $\pi_{intermediate3}^{1}$ is subdivided into $K_1/12$ subgroups, and the subpermutation mask $\pi_{12}^{3}=[4, 10, 5, 8, 3, 6, 9, 11, 1, 7, 0, 2]$ is applied to each of the $K_1/12$ subgroups, such that:

$$\pi_{intermediate4}(i)=\pi_{intermediate3}^{1}((j-1)\times 12+\pi_{12}^{3}(R_{12}[i]))$$

$$i=0,1,\ldots,K_1-1$$

where the index i falls within the subgroup j, such that $j\in\{1, 2, \ldots, K_1/12\}$.

Second, $\pi_{intermediate3}^{2}$ is divided into $K_2/12$ subgroups, each having 12 elements, and the subpermutation mask $\pi_{12}^{4}=[5, 8, 10, 2, 6, 4, 7, 1, 3, 9, 11, 0]$ is applied to each of the $K_2/12$ subgroups such that:

$$\pi_{intermediate4}(i)=\pi_{intermediate3}^{2}((j-1)\times 12+\pi_{12}^{4}(R_{12}[i]))$$

$$i=K_1,\ldots,(K_1+K_2)-1$$

where the index i falls within the subgroup j, such that $j\in\{1, 2, \ldots, K_2/12\}$.

Third, $\pi_{intermediate3}^{3}$ is divided into $K_3/12$ subgroups, and the subpermutation mask $\pi_{12}^{5}$=[10, 0, 9, 1, 11, 7, 3, 5, 8, 6, 2, 4] is applied to each of the $K_3/12$ subgroups, such that:

$$\pi_{intermediate4}(i)=\pi_{intermediate3}^{3}((j-1)\times 12+\pi_{12}^{5}(R_{12}[i]))$$

$$i=(K_1+K_2), \ldots, (K_1+K_2+K_3)-1$$

where the index i falls within the subgroup j, such that $j\in\{1, 2, \ldots, K_3/12\}$.

Fourth, $\pi_{intermediate3}^{4}$ is divided into $K_4/12$ subgroups, and the subpermutation mask $\pi_{12}^{6}$=[9, 7, 2, 4, 10, 8, 3, 6, 11, 1, 5, 0] is applied to each of the $K_4/12$ subgroups, such that:

$$\pi_{intermediate4}(i)=\pi_{intermediate3}^{4}((j-1)\times 12+\pi_{12}^{6}(R_{12}[i]))$$

$$i=(K_1+K_2+K_3), \ldots, N-1$$

where the index i falls within the subgroup j, such that $j\in\{1, 2, \ldots, K_4/12\}$.

As shown in FIG. 7, the final interleaver permutation is given by:

$$\pi(i)=\pi_{intermediate3}(\pi_{intermediate4}(i))$$

$$i=0,1, \ldots, N-1$$

Employing the foregoing methodology of this embodiment, for a given N, the interleaver may be implemented algebraically simply by specifying the subpermutation masks and the six parameters s, p, $N_1$, $K_1$, $K_2$ and $K_3$.

Interleaver Parameter Table:

The following table lists the values of s, p, $N_1$, $K_1$, $K_2$ and $K_3$ for various embodiments of the interleaver design process for different codeblock lengths.

| N | s | p | $N_1$ | $K_1$ | $K_2$ | $K_3$ |
|---|---|---|---|---|---|---|
| 468 | 15 | 229 | 252 | 144 | 132 | 120 |
| 720 | 3 | 53 | 516 | 468 | 192 | 36 |
| 1200 | 1 | 227 | 1080 | 360 | 336 | 384 |
| 1440 | 11 | 277 | 1068 | 360 | 360 | 360 |
| 1680 | 6 | 593 | 1620 | 420 | 420 | 420 |
| 1920 | 5 | 167 | 1716 | 1668 | 192 | 36 |
| 2160 | 2 | 263 | 2136 | 1536 | 408 | 48 |
| 2256 | 8 | 653 | 1200 | 576 | 576 | 576 |
| 2400 | 11 | 373 | 1428 | 1284 | 552 | 432 |
| 2640 | 6 | 13 | 1572 | 1212 | 1032 | 276 |
| 2880 | 11 | 443 | 1908 | 1572 | 744 | 456 |
| 3120 | 21 | 709 | 2052 | 1908 | 552 | 504 |
| 3360 | 5 | 23 | 2376 | 2064 | 360 | 792 |
| 3600 | 11 | 277 | 2040 | 1452 | 1392 | 516 |
| 3840 | 4 | 887 | 2400 | 1920 | 720 | 720 |
| 4080 | 7 | 313 | 2160 | 3132 | 708 | 132 |
| 4320 | 14 | 563 | 2160 | 1080 | 1080 | 720 |
| 4560 | 1 | 313 | 3684 | 2268 | 960 | 432. |

Figure 11:
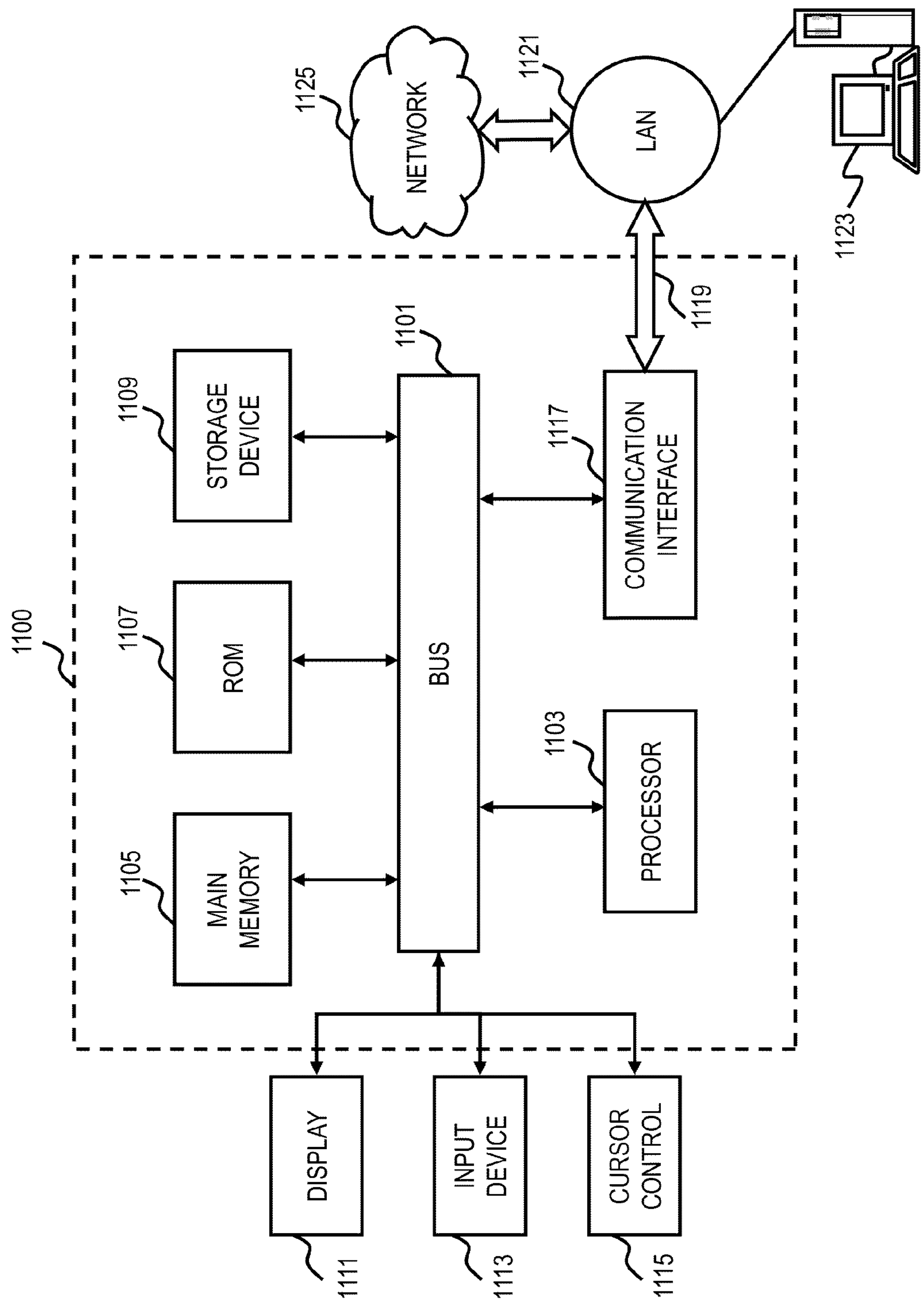
FIG. 11 is a diagram of a computer system that can perform the processes for a parameterized interleaver design, according to exemplary embodiments.

FIG. 11 illustrates a computer system upon which exemplary embodiments according to the present invention can be implemented. The computer system 1100 includes a bus 1101 or other communication mechanism for communicating information, and a processor 1103 coupled to the bus 1101 for processing information. The computer system 1100 also includes main memory 1105, such as a random access memory (RAM) or other dynamic storage device, coupled to the bus 1101 for storing information and instructions to be executed by the processor 1103. Main memory 1105 can also be used for storing temporary variables or other intermediate information during execution of instructions to be executed by the processor 1103. The computer system 1100 further includes a read only memory (ROM) 1107 or other static storage device coupled to the bus 1101 for storing static information and instructions for the processor 1103. A storage device 1109, such as a magnetic disk or optical disk, is additionally coupled to the bus 1101 for storing information and instructions.

The computer system 1100 may be coupled via the bus 1101 to a display 1111, such as a cathode ray tube (CRT), liquid crystal display, active matrix display, or plasma display, for displaying information to a computer user. An input device 1113, such as a keyboard including alphanumeric and other keys, is coupled to the bus 1101 for communicating information and command selections to the processor 1103. Another type of user input device is cursor control 1115, such as a mouse, a trackball, or cursor direction keys for communicating direction information and command selections to the processor 1103 and for controlling cursor movement on the display 1111.

According to one embodiment of the invention, generation and operation of interleaver designs in accordance with exemplary embodiments is provided by the computer system 1100 in response to the processor 1103 executing an arrangement of instructions contained in main memory 1105. Such instructions can be read into main memory 1105 from another computer-readable medium, such as the storage device 1109. Execution of the arrangement of instructions contained in main memory 1105 causes the processor 1103 to perform the process steps described herein. One or more processors in a multi-processing arrangement may also be employed to execute the instructions contained in main memory 1105. In alternative embodiments, hard-wired circuitry may be used in place of or in combination with software instructions to implement the embodiment of the present invention. Thus, embodiments of the present invention are not limited to any specific combination of hardware circuitry and software.

The computer system 1100 also includes a communication interface 1117 coupled to bus 1101. The communication interface 1117 provides a two-way data communication coupling to a network link 1119 connected to a local network 1121. For example, the communication interface 1117 may be a digital subscriber line (DSL) card or modem, an integrated services digital network (ISDN) card, a cable modem, or a telephone modem to provide a data communication connection to a corresponding type of telephone line. As another example, communication interface 1117 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1117 sends and receives electrical, electromagnetic, or optical signals that carry digital data streams representing various types of information. Further, the communication interface 1117 can include peripheral interface devices, such as a Universal Serial Bus (USB) interface, a PCMCIA (Personal Computer Memory Card International Association) interface, etc.

The network link 1119 typically provides data communication through one or more networks to other data devices. For example, the network link 1119 may provide a connection through local network 1121 to a host computer 1123, which has connectivity to a network 1125 (e.g. a wide area network (WAN) or the global packet data communication network now commonly referred to as the "Internet") or to data equipment operated by service provider. The local network 1121 and network 1125 both use electrical, electromagnetic, or optical signals to convey information and instructions. The signals through the various networks and the signals on network link 1119 and through communication interface 1117, which communicate digital data with computer system 1100, are exemplary forms of carrier waves bearing the information and instructions.

The computer system 1100 can send messages and receive data, including program code, through the network(s), network link 1119, and communication interface 1117. In the Internet example, a server (not shown) might transmit requested code belonging to an application program for implementing an embodiment of the present invention through the network 1125, local network 1121 and communication interface 1117. The processor 1103 may execute the transmitted code while being received and/or store the code in storage device 239, or other non-volatile storage for later execution. In this manner, computer system 1100 may obtain application code in the form of a carrier wave.

The term "computer-readable medium" as used herein refers to any medium that participates in providing instructions to the processor 1103 for execution. Such a medium may take many forms, including but not limited to non-volatile media, volatile media, and transmission media. Non-volatile media include, for example, optical or magnetic disks, such as storage device 1109. Volatile media include dynamic memory, such as main memory 1105. Transmission media include coaxial cables, copper wire and fiber optics, including the wires that comprise bus 1101. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

FIG. 12 illustrates a chip set 1200 in which embodiments of the invention may be implemented. Chip set 1200 includes, for instance, processor and memory components described with respect to FIG. 12 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 1200 includes a communication mechanism such as a bus 1201 for passing information among the components of the chip set 1200. A processor 1203 has connectivity to the bus 1201 to execute instructions and process information stored in, for example, a memory 1205. The processor 1203 may include one or more processing cores with each core configured to perform independently. A multi-core processor enables multiprocessing within a single physical package. Examples of a multi-core processor include two, four, eight, or greater numbers of processing cores. Alternatively or in addition, the processor 1203 may include one or more microprocessors configured in tandem via the bus 1201 to enable independent execution of instructions, pipelining, and multithreading. The processor 1203 may also be accompanied with one or more specialized components to perform certain processing functions and tasks such as one or more digital signal processors (DSP) 1207, and/or one or more application-specific integrated circuits (ASIC) 1209. A DSP 1207 typically is configured to process real-world signals (e.g., sound) in real time independently of the processor 1203. Similarly, an ASIC 1209 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1203 and accompanying components have connectivity to the memory 1205 via the bus 1201. The memory 1205 includes both dynamic memory (e.g., RAM) and static memory (e.g., ROM) for storing executable instructions that, when executed by the processor 1203 and/or the DSP 1207 and/or the ASIC 1209, perform the process of exemplary embodiments as described herein. The memory 1205 also stores the data associated with or generated by the execution of the process.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method for interleaving a codeword, wherein the codeword comprises a first bit sequence $b'=[b'_0, b'_1, \ldots, b'_{N-1}]\in\{0,1\}^N$ of a block length N, the method comprising:

interleaving the codeword based on an interleaver, wherein the interleaver specifies a set of permutation indices $\pi=[\pi(0), \pi(1), \ldots, \pi(N-1)]$;

wherein the interleaving of the codeword comprises reordering or mapping the first bit sequence $b'=[b'_0, b'_1, \ldots, b'_{N-1}]\in\{0,1\}^N$ of the codeword into a second bit sequence $b=[b_0, b_1, \ldots, b_{N-1}]=[b'_{\pi(0)}, b'_{\pi(1)}, \ldots, b'_{\pi(N-1)}]\in\{0,1\}^N$; and wherein, for any one specific block length N listed in the following table, the interleaver comprises the set of permutation indices specified in the table for that block length N:

| Block Length N | Permutation Indices $\pi = [\pi(0), \pi(1), \ldots, \pi(N-1)]$ | | | | | | |
|---|---|---|---|---|---|---|---|
| 336 | 156 | 145 | 332 | 198 | 11 | 239 | 22 |
| | 37 | 305 | 319 | 77 | 130 | 21 | 51 |
| | 227 | 119 | 104 | 129 | 159 | 172 | 50 |
| | 10 | 237 | 267 | 278 | 160 | 36 | 118 |
| | 39 | 52 | 268 | 211 | 24 | 13 | 200 |

-continued

| Block Length N | Permutation Indices π = [π(0), π(1), . . . , π(N − 1)] | | | | | | |
|---|---|---|---|---|---|---|---|
| | 38 | 252 | 132 | 54 | 241 | 173 | 187 |
| | 80 | 282 | 229 | 199 | 323 | 106 | 40 |
| | 1 | 240 | 161 | 12 | 146 | 135 | 203 |
| | 269 | 322 | 256 | 243 | 175 | 188 | 213 |
| | 26 | 15 | 83 | 94 | 321 | 242 | 109 |
| | 55 | 202 | 93 | 16 | 284 | 150 | 30 |
| | 201 | 122 | 325 | 257 | 205 | 108 | 299 |
| | 4 | 283 | 56 | 111 | 97 | 190 | 137 |
| | 164 | 219 | 272 | 298 | 179 | 138 | 85 |
| | 313 | 204 | 17 | 245 | 126 | 297 | 259 |
| | 59 | 18 | 234 | 69 | 31 | 112 | 98 |
| | 73 | 177 | 275 | 218 | 208 | 151 | 260 |
| | 247 | 328 | 314 | 192 | 32 | 87 | 140 |
| | 274 | 72 | 127 | 206 | 88 | 330 | 221 |
| | 235 | 316 | 194 | 102 | 263 | 273 | 20 |
| | 302 | 277 | 35 | 45 | 61 | 75 | 329 |
| | 209 | 153 | 169 | 183 | 101 | 19 | 236 |
| | 8 | 291 | 210 | 60 | 142 | 276 | 131 |
| | 317 | 168 | 116 | 250 | 103 | 184 | 64 |
| 471 | 374 | 169 | 5 | 160 | 344 | 25 | 70 |
| | 46 | 460 | 176 | 325 | 370 | 91 | 251 |
| | 292 | 8 | 157 | 202 | 391 | 83 | 67 |
| | 457 | 34 | 223 | 383 | 367 | 84 | 149 |
| | 294 | 225 | 189 | 155 | 210 | 2 | 315 |
| | 21 | 455 | 42 | 302 | 147 | 401 | 48 |
| | 342 | 134 | 447 | 233 | 348 | 104 | 303 |
| | 229 | 274 | 220 | 404 | 85 | 130 | 319 |
| | 52 | 236 | 385 | 430 | 151 | 311 | 295 |
| | 68 | 217 | 262 | 451 | 143 | 127 | 312 |
| | 94 | 283 | 443 | 427 | 144 | 438 | 329 |
| | 200 | 424 | 354 | 215 | 161 | 276 | 375 |
| | 186 | 47 | 461 | 108 | 207 | 402 | 63 |
| | 293 | 448 | 39 | 234 | 363 | 194 | 213 |
| | 289 | 305 | 145 | 26 | 55 | 71 | 464 |
| | 445 | 326 | 355 | 371 | 296 | 22 | 211 |
| | 158 | 187 | 203 | 128 | 322 | 43 | 372 |
| | 45 | 428 | 154 | 343 | 204 | 389 | 36 |
| | 16 | 414 | 275 | 336 | 435 | 107 | 92 |
| | 162 | 168 | 267 | 407 | 392 | 78 | 441 |
| | 65 | 418 | 299 | 353 | 254 | 423 | 40 |
| | 131 | 394 | 86 | 205 | 340 | 349 | 439 |
| | 386 | 37 | 172 | 181 | 271 | 356 | 415 |
| | 4 | 13 | 103 | 188 | 247 | 35 | 90 |
| | 403 | 20 | 79 | 335 | 390 | 76 | 405 |
| | 369 | 167 | 222 | 376 | 237 | 281 | 182 |
| | 54 | 208 | 69 | 113 | 14 | 183 | 228 |
| | 359 | 413 | 314 | 15 | 100 | 159 | 199 |
| | 146 | 265 | 400 | 409 | 31 | 116 | 175 |
| | 331 | 286 | 23 | 232 | 257 | 442 | 278 |
| | 323 | 64 | 89 | 304 | 110 | 80 | 139 |
| | 150 | 136 | 410 | 380 | 429 | 395 | 255 |
| | 242 | 212 | 261 | 227 | 87 | 411 | 366 |
| | 93 | 59 | 387 | 243 | 198 | 173 | 129 |
| 504 | 293 | 325 | 372 | 104 | 171 | 438 | 19 |
| | 482 | 366 | 357 | 215 | 319 | 244 | 336 |
| | 267 | 30 | 115 | 59 | 446 | 212 | 304 |
| | 415 | 359 | 432 | 46 | 195 | 281 | 485 |
| | 38 | 308 | 400 | 429 | 262 | 313 | 360 |
| | 291 | 377 | 77 | 109 | 470 | 354 | 345 |
| | 358 | 409 | 456 | 188 | 255 | 18 | 103 |
| | 62 | 450 | 441 | 299 | 403 | 328 | 230 |
| | 351 | 114 | 199 | 143 | 26 | 334 | 388 |
| | 499 | 424 | 12 | 92 | 279 | 365 | 65 |
| | 122 | 392 | 484 | 9 | 254 | 138 | 397 |
| | 16 | 375 | 50 | 476 | 193 | 105 | 306 |
| | 36 | 234 | 493 | 53 | 102 | 442 | 322 |
| | 289 | 201 | 383 | 257 | 80 | 314 | 135 |
| | 198 | 34 | 418 | 300 | 435 | 283 | 227 |
| | 176 | 410 | 117 | 79 | 4 | 268 | 228 |
| | 27 | 379 | 323 | 64 | 338 | 222 | 481 |
| | 100 | 459 | 324 | 56 | 277 | 189 | 390 |
| | 318 | 73 | 51 | 309 | 196 | 368 | 22 |
| | 256 | 219 | 11 | 164 | 341 | 398 | 486 |
| | 216 | 118 | 263 | 414 | 169 | 292 | 405 |
| | 78 | 248 | 469 | 88 | 315 | 260 | 243 |
| | 265 | 407 | 501 | 94 | 448 | 477 | 259 |

-continued

| Block Length N | Permutation Indices π = [π(0), π(1), . . . , π(N − 1)] | | | | | | |
|---|---|---|---|---|---|---|---|
| | 297 | 356 | 339 | 425 | 55 | 72 | 408 |
| | 40 | 221 | 355 | 182 | 14 | 125 | 251 |
| | 151 | 168 | 0 | 406 | 66 | 236 | 457 |
| | 110 | 202 | 347 | 498 | 253 | 376 | 489 |
| | 162 | 332 | 49 | 191 | 399 | 382 | 327 |
| | 349 | 472 | 81 | 178 | 343 | 113 | 495 |
| | 428 | 57 | 139 | 394 | 177 | 274 | 423 |
| | 439 | 209 | 87 | 32 | 124 | 241 | 335 |
| | 273 | 370 | 15 | 37 | 150 | 179 | 84 |
| | 220 | 337 | 431 | 460 | 194 | 362 | 116 |
| | 246 | 275 | 180 | 348 | 416 | 45 | 127 |
| | 290 | 458 | 174 | 497 | 427 | 197 | 75 |
| | 8 | 141 | 223 | 478 | 261 | 320 | 3 |
| 603 | 127 | 490 | 316 | 213 | 386 | 406 | 14 |
| | 88 | 585 | 540 | 178 | 4 | 78 | 435 |
| | 357 | 312 | 440 | 158 | 450 | 207 | 589 |
| | 322 | 530 | 277 | 579 | 361 | 162 | 119 |
| | 594 | 351 | 133 | 425 | 0 | 187 | 550 |
| | 505 | 197 | 263 | 559 | 212 | 148 | 45 |
| | 35 | 59 | 584 | 520 | 417 | 372 | 10 |
| | 356 | 292 | 189 | 144 | 272 | 590 | 282 |
| | 561 | 516 | 154 | 362 | 109 | 411 | 193 |
| | 288 | 526 | 134 | 426 | 183 | 565 | 257 |
| | 506 | 198 | 555 | 337 | 29 | 95 | 391 |
| | 327 | 163 | 401 | 467 | 491 | 416 | 352 |
| | 173 | 239 | 124 | 21 | 188 | 11 | 214 |
| | 5 | 393 | 560 | 492 | 586 | 307 | 25 |
| | 442 | 155 | 358 | 79 | 397 | 15 | 120 |
| | 130 | 451 | 223 | 387 | 110 | 338 | 30 |
| | 551 | 541 | 159 | 264 | 328 | 402 | 233 |
| | 531 | 36 | 482 | 174 | 114 | 556 | 453 |
| | 254 | 1 | 377 | 437 | 225 | 392 | 215 |
| | 149 | 100 | 597 | 274 | 587 | 190 | 511 |
| | 369 | 536 | 359 | 562 | 283 | 55 | 219 |
| | 131 | 224 | 383 | 373 | 591 | 96 | 542 |
| | 427 | 145 | 363 | 468 | 314 | 61 | 546 |
| | 497 | 285 | 478 | 384 | 199 | 334 | 581 |
| | 250 | 47 | 571 | 596 | 353 | 230 | 279 |
| | 343 | 368 | 125 | 220 | 51 | 294 | 433 |
| | 6 | 374 | 423 | 66 | 205 | 528 | 76 |
| | 195 | 493 | 577 | 300 | 448 | 345 | 538 |
| | 349 | 72 | 329 | 117 | 310 | 216 | 31 |
| | 592 | 489 | 82 | 479 | 403 | 428 | 185 |
| | 454 | 251 | 175 | 200 | 557 | 52 | 483 |
| | 275 | 572 | 438 | 206 | 255 | 553 | 37 |
| | 101 | 578 | 27 | 325 | 409 | 132 | 389 |
| | 463 | 226 | 549 | 504 | 142 | 42 | 399 |
| | 321 | 494 | 514 | 414 | 171 | 424 | 245 |
| | 186 | 196 | 543 | 93 | 83 | 266 | 107 |
| | 315 | 465 | 455 | 38 | 151 | 192 | 469 |
| | 227 | 410 | 523 | 564 | 241 | 533 | 176 |
| | 295 | 336 | 13 | 305 | 58 | 574 | 474 |
| | 439 | 77 | 320 | 346 | 246 | 256 | 3 |
| | 92 | 118 | 18 | 28 | 375 | 525 | 515 |
| | 390 | 400 | 147 | 297 | 287 | 470 | 583 |
| | 519 | 69 | 168 | 242 | 355 | 396 | 73 |
| | 431 | | | | | | |
| 804 | 168 | 361 | 473 | 794 | 38 | 53 | 487 |
| | 57 | 216 | 424 | 520 | 391 | 491 | 666 |
| | 328 | 665 | 295 | 395 | 572 | 699 | 747 |
| | 199 | 58 | 476 | 765 | 250 | 618 | 588 |
| | 378 | 507 | 154 | 524 | 251 | 685 | 477 |
| | 459 | 426 | 396 | 589 | 381 | 540 | 748 |
| | 300 | 493 | 605 | 122 | 170 | 185 | 619 |
| | 189 | 348 | 556 | 652 | 523 | 382 | 800 |
| | 460 | 797 | 427 | 527 | 702 | 27 | 478 |
| | 331 | 190 | 608 | 93 | 783 | 750 | 720 |
| | 510 | 639 | 286 | 656 | 624 | 13 | 125 |
| | 591 | 558 | 287 | 721 | 513 | 672 | 76 |
| | 432 | 625 | 737 | 254 | 784 | 317 | 751 |
| | 321 | 158 | 206 | 221 | 655 | 514 | 128 |
| | 592 | 688 | 559 | 659 | 30 | 159 | 610 |
| | 463 | 563 | 740 | 63 | 111 | 78 | 611 |
| | 644 | 129 | 418 | 786 | 756 | 145 | 257 |
| | 322 | 692 | 645 | 482 | 49 | 594 | 545 |
| | 549 | 708 | 757 | 500 | 208 | 564 | 483 |

-continued

| Block Length N | Permutation Indices $\pi = [\pi(0), \pi(1), \ldots, \pi(N-1)]$ | | | | | | |
|---|---|---|---|---|---|---|---|
| | 661 | 402 | 353 | 468 | 387 | 260 | 338 |
| | 16 | 131 | 453 | 164 | 724 | 691 | 550 |
| | 195 | 66 | 628 | 595 | 695 | 646 | 165 |
| | 50 | 499 | 358 | 147 | 69 | 228 | 277 |
| | 503 | 454 | 293 | 614 | 181 | 726 | 677 |
| | 681 | 36 | 85 | 630 | 340 | 455 | 777 |
| | 793 | 536 | 485 | 600 | 519 | 390 | 148 |
| | 389 | 263 | 585 | 296 | 374 | 19 | 682 |
| | 327 | 198 | 760 | 727 | 23 | 778 | 617 |
| | 182 | 631 | 731 | 279 | 201 | 360 | 409 |
| | 394 | 586 | 425 | 746 | 313 | 56 | 5 |
| | 9 | 650 | 217 | 762 | 713 | 587 | 105 |
| | 121 | 668 | 376 | 732 | 651 | 522 | 280 |
| | 521 | 636 | 555 | 428 | 506 | 151 | 10 |
| | 88 | 525 | 684 | 184 | 474 | 299 | 637 |
| | 266 | 329 | 380 | 444 | 718 | 282 | 667 |
| | 218 | 429 | 622 | 188 | 571 | 42 | 237 |
| | 123 | 90 | 475 | 752 | 461 | 156 | 41 |
| | 379 | 654 | 45 | 623 | 508 | 204 | 253 |
| | 269 | 768 | 653 | 590 | 157 | 383 | 316 |
| | 557 | 12 | 61 | 46 | 542 | 753 | 142 |
| | 769 | 191 | 124 | 495 | 447 | 414 | 799 |
| | 350 | 399 | 754 | 318 | 703 | 174 | 369 |
| | 255 | 224 | 607 | 80 | 593 | 288 | 173 |
| | 511 | 788 | 177 | 755 | 77 | 336 | 385 |
| | 81 | 96 | 544 | 722 | 289 | 515 | 448 |
| | 689 | 626 | 193 | 178 | 674 | 723 | 274 |
| | 97 | 323 | 256 | 789 | 127 | 612 | 160 |
| | 434 | 548 | 31 | 275 | 386 | 597 | 82 |
| | 739 | 420 | 772 | 339 | 790 | 613 | 64 |
| | 194 | 243 | 291 | 517 | 209 | 502 | 629 |
| | 598 | 421 | 676 | 647 | 213 | 18 | 372 |
| | 17 | 551 | 437 | 728 | 758 | 68 | 355 |
| | 21 | 632 | 180 | 774 | 259 | 744 | 292 |
| | 566 | 680 | 163 | 648 | 518 | 567 | 615 |
| | 67 | 311 | 100 | 633 | 118 | 745 | 196 |
| | 4 | 375 | 423 | 649 | 341 | 71 | 761 |
| | 730 | 553 | 245 | 538 | 345 | 152 | 504 |
| | 712 | 683 | 249 | 54 | 86 | 200 | |
| 912 | 576 | 882 | 475 | 762 | 257 | 905 | 705 |
| | 151 | 438 | 845 | 581 | 381 | 76 | 550 |
| | 521 | 671 | 57 | 664 | 226 | 268 | 3 |
| | 645 | 422 | 814 | 856 | 591 | 625 | 358 |
| | 490 | 532 | 267 | 840 | 34 | 215 | 140 |
| | 855 | 516 | 622 | 803 | 728 | 103 | 385 |
| | 132 | 479 | 404 | 691 | 61 | 461 | 261 |
| | 80 | 367 | 649 | 137 | 849 | 544 | 272 |
| | 325 | 725 | 525 | 220 | 860 | 818 | 471 |
| | 201 | 808 | 536 | 494 | 147 | 181 | 660 |
| | 46 | 88 | 735 | 769 | 502 | 642 | 235 |
| | 411 | 445 | 178 | 318 | 823 | 198 | 605 |
| | 766 | 906 | 499 | 786 | 281 | 431 | 729 |
| | 548 | 835 | 869 | 107 | 405 | 182 | 574 |
| | 793 | 695 | 81 | 770 | 250 | 292 | 27 |
| | 669 | 446 | 92 | 50 | 615 | 276 | 216 |
| | 680 | 638 | 291 | 864 | 804 | 239 | 164 |
| | 879 | 540 | 379 | 127 | 827 | 589 | 809 |
| | 55 | 342 | 462 | 265 | 485 | 156 | 578 |
| | 138 | 853 | 161 | 744 | 172 | 130 | 425 |
| | 749 | 586 | 760 | 718 | 101 | 549 | 244 |
| | 436 | 394 | 689 | 225 | 832 | 171 | 583 |
| | 365 | 813 | 590 | 759 | 632 | 7 | 666 |
| | 266 | 435 | 308 | 595 | 383 | 684 | 779 |
| | 896 | 271 | 59 | 360 | 455 | 790 | 134 |
| | 647 | 36 | 629 | 300 | 722 | 764 | 229 |
| | 305 | 888 | 398 | 440 | 817 | 105 | 712 |
| | 74 | 116 | 493 | 693 | 388 | 639 | 139 |
| | 169 | 369 | 64 | 315 | 727 | 102 | 222 |
| | 652 | 903 | 403 | 690 | 810 | 613 | 833 |
| | 79 | 366 | 486 | 289 | 11 | 346 | 520 |
| | 162 | 504 | 599 | 22 | 196 | 154 | 449 |
| | 275 | 610 | 784 | 742 | 125 | 573 | 350 |
| | 286 | 418 | 863 | 249 | 392 | 768 | 783 |
| | 143 | 614 | 637 | 218 | 459 | 120 | 513 |
| | 313 | 806 | 135 | 708 | 189 | 524 | 332 |
| | 723 | 757 | 777 | 200 | 547 | 648 | 65 |

-continued

| Block Length N | Permutation Indices $\pi = [\pi(0), \pi(1), \ldots, \pi(N-1)]$ | | | | | | |
|---|---|---|---|---|---|---|---|
| | 453 | 788 | 223 | 324 | 653 | 510 | 630 |
| | 811 | 0 | 329 | 186 | 306 | 736 | 593 |
| | 419 | 774 | 894 | 412 | 269 | 16 | 339 |
| | 570 | 170 | 857 | 604 | 15 | 588 | 69 |
| | 533 | 280 | 603 | 264 | 657 | 826 | 800 |
| | 279 | 852 | 333 | 668 | 476 | 370 | 35 |
| | 9 | 344 | 152 | 792 | 623 | 439 | 227 |
| | 740 | 468 | 797 | 115 | 815 | 374 | 397 |
| | 473 | 703 | 491 | 880 | 73 | 566 | 807 |
| | 167 | 556 | 661 | 242 | 483 | 517 | 537 |
| | 89 | 830 | 159 | 193 | 213 | 382 | 895 |
| | 747 | 781 | 801 | 58 | 571 | 838 | 503 |
| | 477 | 646 | 247 | 514 | 179 | 534 | 654 |
| | 99 | 330 | 767 | 842 | 296 | 322 | 210 |
| | 443 | 518 | 884 | 910 | 259 | 348 | 417 |
| | 560 | 752 | 847 | 24 | 93 | 876 | 805 |
| | 523 | 612 | 681 | 552 | 481 | 62 | 627 |
| | 357 | 228 | 157 | 650 | 303 | 575 | 557 |
| | 745 | 326 | 891 | 251 | 233 | 640 | 715 |
| | 567 | 798 | 821 | 316 | 391 | 44 | 678 |
| | 497 | 904 | 67 | 466 | 354 | 277 | 885 |
| | 655 | 142 | 30 | 865 | 561 | 598 | 113 |
| | 618 | 541 | 237 | 274 | 701 | 448 | 183 |
| | 825 | 862 | 377 | 124 | 771 | 131 | 527 |
| | 301 | 794 | 447 | 719 | 203 | 278 | 644 |
| | 123 | 395 | 791 | 866 | 320 | 512 | 607 |
| | 53 | 542 | 908 | 188 | 283 | 372 | 441 |
| | 584 | 776 | 871 | 421 | 117 | 900 | 829 |
| | 174 | 97 | | | | | |
| 1200 | 199 | 1000 | 670 | 477 | 613 | 236 | 684 |
| | 1018 | 825 | 961 | 584 | 1194 | 720 | 1157 |
| | 109 | 932 | 342 | 1068 | 305 | 794 | 447 |
| | 690 | 216 | 653 | 1142 | 795 | 23 | 1137 |
| | 1001 | 290 | 1143 | 371 | 739 | 340 | 10 |
| | 291 | 719 | 1087 | 688 | 131 | 1138 | 301 |
| | 235 | 1036 | 706 | 513 | 649 | 272 | 882 |
| | 1054 | 861 | 997 | 620 | 30 | 756 | 1193 |
| | 145 | 968 | 378 | 520 | 341 | 830 | 483 |
| | 726 | 252 | 689 | 1178 | 831 | 59 | 427 |
| | 1037 | 326 | 1179 | 407 | 775 | 376 | 46 |
| | 457 | 755 | 1123 | 724 | 394 | 201 | 337 |
| | 271 | 845 | 742 | 549 | 555 | 308 | 918 |
| | 1090 | 897 | 1033 | 656 | 1104 | 792 | 29 |
| | 181 | 1004 | 414 | 1140 | 377 | 866 | 519 |
| | 762 | 288 | 725 | 14 | 867 | 95 | 463 |
| | 619 | 362 | 15 | 443 | 811 | 412 | 82 |
| | 363 | 791 | 1159 | 760 | 430 | 237 | 373 |
| | 307 | 1108 | 778 | 358 | 721 | 344 | 954 |
| | 1126 | 933 | 1069 | 692 | 102 | 828 | 65 |
| | 217 | 1040 | 450 | 1176 | 413 | 902 | 685 |
| | 798 | 324 | 761 | 50 | 903 | 66 | 499 |
| | 1109 | 398 | 51 | 479 | 393 | 448 | 118 |
| | 399 | 827 | 1195 | 796 | 466 | 273 | 409 |
| | 343 | 1144 | 587 | 621 | 757 | 380 | 990 |
| | 1162 | 969 | 975 | 728 | 138 | 864 | 847 |
| | 1076 | 585 | 938 | 449 | 253 | 486 | 12 |
| | 86 | 797 | 601 | 834 | 976 | 939 | 1006 |
| | 949 | 1182 | 708 | 87 | 154 | 1161 | 484 |
| | 1056 | 435 | 502 | 309 | 832 | 11 | 68 |
| | 850 | 657 | 1180 | 294 | 416 | 379 | 278 |
| | 101 | 707 | 764 | 727 | 626 | 137 | 1141 |
| | 1112 | 1075 | 974 | 485 | 289 | 360 | 48 |
| | 122 | 833 | 637 | 870 | 396 | 1105 | 815 |
| | 985 | 18 | 744 | 123 | 190 | 1197 | 293 |
| | 1092 | 471 | 538 | 345 | 868 | 47 | 104 |
| | 886 | 693 | 16 | 395 | 452 | 415 | 314 |
| | 364 | 743 | 800 | 763 | 662 | 173 | 1177 |
| | 1148 | 1111 | 1010 | 67 | 325 | 558 | 84 |
| | 158 | 869 | 673 | 906 | 432 | 1011 | 1078 |
| | 1021 | 54 | 196 | 159 | 226 | 33 | 556 |
| | 1128 | 507 | 574 | 381 | 904 | 83 | 140 |
| | 922 | 729 | 52 | 431 | 488 | 451 | 350 |
| | 400 | 779 | 836 | 799 | 698 | 209 | 13 |
| | 1184 | 1147 | 1046 | 557 | 231 | 594 | 120 |
| | 194 | 905 | 709 | 780 | 468 | 1047 | 1114 |
| | 1057 | 90 | 816 | 195 | 35 | 1042 | 592 |

-continued

| Block Length N | Permutation Indices π = [π(0), π(1), . . . , π(N − 1)] | | | | | | |
|---|---|---|---|---|---|---|---|
| | 1164 | 543 | 610 | 417 | 940 | 119 | 176 |
| | 958 | 765 | 88 | 467 | 524 | 487 | 386 |
| | 436 | 750 | 872 | 835 | 734 | 245 | 49 |
| | 156 | 1082 | 397 | 454 | 34 | 20 | 1163 |
| | 745 | 802 | 609 | 368 | 311 | 331 | 280 |
| | 957 | 716 | 659 | 679 | 628 | 579 | 474 |
| | 942 | 1027 | 749 | 927 | 822 | 785 | 348 |
| | 124 | 75 | 1008 | 1133 | 696 | 422 | 937 |
| | 318 | 281 | 1044 | 770 | 85 | 142 | 1149 |
| | 192 | 1118 | 433 | 263 | 297 | 56 | 1199 |
| | 651 | 838 | 645 | 404 | 347 | 367 | 316 |
| | 993 | 752 | 695 | 261 | 664 | 615 | 510 |
| | 1043 | 1063 | 1012 | 963 | 858 | 821 | 384 |
| | 160 | 111 | 6 | 715 | 732 | 458 | 973 |
| | 354 | 317 | 1080 | 806 | 121 | 178 | 1185 |
| | 228 | 1154 | 469 | 526 | 333 | 92 | 1170 |
| | 817 | 874 | 681 | 440 | 383 | 403 | 352 |
| | 1029 | 788 | 731 | 751 | 700 | 781 | 546 |
| | 1079 | 1099 | 1048 | 999 | 894 | 857 | 420 |
| | 1169 | 147 | 42 | 5 | 768 | 494 | 879 |
| | 390 | 353 | 1116 | 842 | 157 | 214 | 21 |
| | 264 | 1190 | 505 | 562 | 369 | 128 | 71 |
| | 853 | 683 | 490 | 476 | 419 | 439 | 388 |
| | 1065 | 824 | 767 | 787 | 736 | 687 | 582 |
| | 1115 | 1135 | 1084 | 1035 | 930 | 893 | 1072 |
| | 232 | 183 | 78 | 41 | 804 | 530 | 1045 |
| | 426 | 389 | 1152 | 878 | 193 | 250 | 57 |
| | 300 | 26 | 541 | 598 | 405 | 164 | 107 |
| | 889 | 946 | 753 | 512 | 455 | 475 | 197 |
| | 1101 | 860 | 803 | 823 | 772 | 723 | 456 |
| | 1151 | 717 | 966 | 319 | 733 | 218 | 1071 |
| | 114 | 667 | 1081 | 566 | 219 | 268 | 704 |
| | 99 | 914 | 567 | 616 | 1052 | 1188 | 286 |
| | 915 | 964 | 200 | 336 | 634 | 773 | 441 |
| | 548 | 100 | 982 | 1121 | 789 | 491 | 306 |
| | 130 | 269 | 910 | 839 | 654 | 7 | 421 |
| | 285 | 1187 | 1002 | 355 | 769 | 254 | 1107 |
| | 150 | 703 | 1117 | 602 | 255 | 304 | 740 |
| | 265 | 950 | 603 | 425 | 1088 | 24 | 322 |
| 1284 | 242 | 317 | 1155 | 16 | 684 | 823 | 879 |
| | 669 | 534 | 420 | 810 | 644 | 696 | 1183 |
| | 214 | 546 | 351 | 490 | 668 | 457 | 131 |
| | 116 | 168 | 655 | 753 | 1151 | 844 | 721 |
| | 391 | 489 | 887 | 580 | 206 | 281 | 1119 |
| | 623 | 818 | 193 | 17 | 855 | 1000 | 384 |
| | 1213 | 1037 | 369 | 234 | 178 | 510 | 344 |
| | 327 | 472 | 1198 | 246 | 51 | 190 | 368 |
| | 876 | 1015 | 1100 | 1152 | 355 | 453 | 851 |
| | 836 | 946 | 1124 | 189 | 587 | 782 | 1190 |
| | 860 | 649 | 323 | 518 | 1177 | 1001 | 555 |
| | 59 | 1036 | 913 | 737 | 69 | 1218 | 1162 |
| | 398 | 473 | 27 | 172 | 840 | 979 | 1035 |
| | 825 | 1192 | 576 | 715 | 800 | 852 | 55 |
| | 370 | 702 | 536 | 646 | 824 | 1173 | 287 |
| | 243 | 382 | 811 | 349 | 23 | 218 | 877 |
| | 547 | 645 | 1043 | 736 | 613 | 437 | 1053 |
| | 779 | 974 | 98 | 173 | 1011 | 1156 | 540 |
| | 85 | 1193 | 525 | 390 | 276 | 666 | 500 |
| | 483 | 126 | 70 | 402 | 207 | 346 | 524 |
| | 1032 | 1171 | 1227 | 82 | 511 | 49 | 1007 |
| | 992 | 1044 | 247 | 345 | 743 | 436 | 62 |
| | 1016 | 805 | 479 | 674 | 1082 | 1157 | 711 |
| | 215 | 410 | 1069 | 893 | 225 | 90 | 1260 |
| | 554 | 629 | 183 | 328 | 1054 | 102 | 1191 |
| | 1203 | 64 | 732 | 871 | 956 | 1008 | 211 |
| | 858 | 277 | 45 | 1231 | 468 | 692 | 744 |
| | 505 | 716 | 262 | 399 | 538 | 179 | 411 |
| | 1224 | 164 | 216 | 1199 | 1209 | 1074 | 593 |
| | 10 | 935 | 1167 | 28 | 329 | 866 | 1086 |
| | 903 | 1048 | 65 | 100 | 571 | 241 | 9 |
| | 1085 | 338 | 558 | 1261 | 1029 | 680 | 226 |
| | 43 | 746 | 205 | 416 | 1246 | 99 | 238 |
| | 501 | 403 | 924 | 1148 | 1200 | 899 | 909 |
| | 718 | 884 | 994 | 635 | 867 | 1012 | 29 |
| | 730 | 371 | 603 | 748 | 1049 | 1084 | 271 |
| | 117 | 1266 | 785 | 38 | 258 | 961 | 729 |

-continued

| Block Length N | Permutation Indices π = [π(0), π(1), . . . , π(N − 1)] | | | | | | |
|---|---|---|---|---|---|---|---|
| | 521 | 1058 | 1027 | 446 | 1189 | 367 | 888 |
| | 1014 | 433 | 201 | 103 | 624 | 848 | 900 |
| | 1221 | 872 | 418 | 584 | 694 | 335 | 567 |
| | 96 | 291 | 430 | 71 | 81 | 1230 | 749 |
| | 108 | 1091 | 1101 | 966 | 485 | 1022 | 1242 |
| | 1059 | 1204 | 221 | 758 | 727 | 146 | 889 |
| | 1241 | 1276 | 714 | 133 | 1185 | 1087 | 324 |
| | 450 | 902 | 361 | 572 | 118 | 255 | 394 |
| | 97 | 559 | 1080 | 1275 | 130 | 1055 | 1065 |
| | 816 | 1040 | 1092 | 791 | 1023 | 1168 | 185 |
| | 886 | 527 | 759 | 904 | 1205 | 1240 | 427 |
| | 273 | 138 | 941 | 976 | 414 | 1117 | 885 |
| | 677 | 1214 | 150 | 602 | 61 | 272 | 1102 |
| | 1056 | 357 | 780 | 1251 | 112 | 919 | 448 |
| | 574 | 765 | 630 | 906 | 184 | 325 | 1169 |
| | 868 | 642 | 422 | 1094 | 905 | 1247 | 212 |
| | 940 | 1081 | 983 | 1178 | 1232 | 236 | 1257 |
| | 719 | 914 | 939 | 1256 | 1215 | 302 | 1134 |
| | 704 | 1243 | 951 | 289 | 619 | 1096 | 113 |
| | 465 | 25 | 606 | 330 | 1133 | 550 | 274 |
| | 91 | 568 | 869 | 286 | 1236 | 253 | 947 |
| | 605 | 1248 | 972 | 549 | 683 | 878 | 932 |
| | 766 | 285 | 419 | 614 | 639 | 1207 | 915 |
| | 155 | 1132 | 404 | 943 | 429 | 1273 | 319 |
| | 140 | 428 | 165 | 1009 | 306 | 30 | 833 |
| | 123 | 494 | 1075 | 268 | 569 | 1270 | 936 |
| | 1062 | 786 | 305 | 948 | 672 | 249 | 383 |
| | 41 | 742 | 466 | 709 | 119 | 314 | 339 |
| | 144 | 445 | 1139 | 832 | 104 | 643 | 129 |
| | 875 | 1070 | 1095 | 128 | 87 | 458 | 6 |
| | 831 | 115 | 1107 | 194 | 775 | 1252 | 269 |
| | 621 | 181 | 762 | 486 | 5 | 648 | 372 |
| | 498 | 724 | 1025 | 442 | 166 | 409 | 1103 |
| | 761 | 120 | 1128 | 705 | 839 | 532 | 1088 |
| | 864 | 441 | 575 | 770 | 795 | 1112 | 1071 |
| | 560 | 145 | 336 | 1197 | 311 | 1253 | 475 |
| | 72 | 933 | 47 | 989 | 462 | 348 | 321 |
| | 1067 | 725 | 198 | 142 | 279 | 320 | 424 |
| | 967 | 1104 | 15 | 307 | 160 | 496 | 788 |
| | 813 | 1076 | 678 | 734 | 495 | 1142 | 358 |
| | 916 | 470 | 260 | 1129 | 36 | 897 | 11 |
| | 1280 | 865 | 1114 | 633 | 1031 | 689 | 162 |
| | 850 | 1093 | 767 | 425 | 931 | 1126 | 1263 |
| | 503 | 161 | 667 | 804 | 999 | 7 | 1144 |
| | 654 | 598 | 513 | 776 | 378 | 434 | 195 |
| | 471 | 763 | 616 | 170 | 1244 | 829 | 1020 |
| | 352 | 688 | 980 | 565 | 814 | 333 | 731 |
| | 687 | 50 | 492 | 793 | 467 | 125 | 631 |
| | 228 | 1089 | 203 | 1145 | 618 | 504 | 477 |
| | 1223 | 881 | 354 | 298 | 213 | 476 | 78 |
| | 1123 | 34 | 171 | 463 | 316 | 1154 | 944 |
| | 969 | 199 | 834 | 388 | 651 | 14 | 514 |
| | 570 | 626 | 387 | 1034 | 192 | 493 | 167 |
| | 152 | 1021 | 1212 | 789 | 1187 | 845 | 318 |
| | 1006 | 1249 | 923 | 581 | 54 | 1282 | 135 |
| 1539 | 1014 | 1137 | 191 | 1246 | 656 | 905 | 960 |
| | 195 | 394 | 1340 | 53 | 108 | 571 | 1501 |
| | 1078 | 488 | 95 | 792 | 1255 | 649 | 448 |
| | 779 | 1010 | 403 | 1333 | 1132 | 726 | 350 |
| | 1087 | 481 | 387 | 1196 | 1500 | 1362 | 1485 |
| | 1071 | 344 | 648 | 510 | 633 | 1223 | 1277 |
| | 1332 | 1194 | 1210 | 1227 | 1426 | 836 | 1085 |
| | 358 | 375 | 574 | 1520 | 1127 | 288 | 751 |
| | 1258 | 561 | 275 | 506 | 1435 | 829 | 628 |
| | 1245 | 959 | 1190 | 583 | 1513 | 1419 | 692 |
| | 338 | 1267 | 661 | 567 | 1376 | 144 | 6 |
| | 1345 | 1251 | 524 | 828 | 690 | 706 | 1403 |
| | 1208 | 1046 | 52 | 1390 | 1407 | 70 | 1016 |
| | 736 | 538 | 555 | 754 | 57 | 1307 | 2 |
| | 1239 | 437 | 741 | 455 | 686 | 79 | 1009 |
| | 1425 | 245 | 1370 | 763 | 157 | 63 | 872 |
| | 929 | 984 | 1447 | 841 | 747 | 20 | 324 |
| | 595 | 1525 | 1324 | 704 | 542 | 1084 | 886 |
| | 472 | 66 | 1226 | 232 | 34 | 51 | 250 |
| | 374 | 916 | 825 | 735 | 1469 | 237 | 1487 |
| | 1509 | 563 | 617 | 921 | 635 | 866 | 259 |

-continued

| Block Length N | Permutation Indices π = [π(0), π(1), . . . , π(N − 1)] | | | | | | |
|---|---|---|---|---|---|---|---|
| | 1301 | 176 | 425 | 480 | 943 | 337 | 243 |
| | 1109 | 1164 | 91 | 1021 | 820 | 200 | 38 |
| | 775 | 169 | 1504 | 1098 | 722 | 1264 | 1066 |
| | 652 | 246 | 1406 | 412 | 321 | 231 | 965 |
| | 1020 | 882 | 1005 | 59 | 113 | 417 | 131 |
| | 153 | 743 | 797 | 1101 | 1457 | 1512 | 439 |
| | 946 | 356 | 605 | 660 | 1123 | 517 | 316 |
| | 1289 | 1344 | 271 | 1201 | 1000 | 594 | 218 |
| | 955 | 349 | 148 | 1278 | 902 | 1263 | 461 |
| | 710 | 103 | 426 | 1091 | 1145 | 501 | 1200 |
| | 896 | 239 | 293 | 1185 | 348 | 953 | 1062 |
| | 442 | 333 | 566 | 101 | 210 | 1348 | 13 |
| | 1250 | 785 | 1108 | 496 | 697 | 536 | 840 |
| | 256 | 1180 | 1381 | 1220 | 1058 | 451 | 774 |
| | 529 | 261 | 206 | 1135 | 1458 | 587 | 641 |
| | 890 | 283 | 392 | 1271 | 1325 | 681 | 1380 |
| | 1076 | 419 | 1474 | 1365 | 528 | 1133 | 1242 |
| | 622 | 406 | 746 | 281 | 604 | 1528 | 193 |
| | 1430 | 323 | 1288 | 676 | 877 | 716 | 554 |
| | 436 | 1467 | 25 | 1293 | 1238 | 631 | 954 |
| | 709 | 441 | 386 | 1315 | 1424 | 767 | 821 |
| | 0 | 463 | 572 | 1451 | 970 | 861 | 24 |
| | 1256 | 1455 | 118 | 1438 | 242 | 1313 | 1422 |
| | 802 | 586 | 926 | 1355 | 784 | 172 | 373 |
| | 74 | 503 | 1468 | 963 | 1057 | 789 | 734 |
| | 616 | 111 | 205 | 1473 | 1418 | 811 | 920 |
| | 889 | 621 | 1032 | 1495 | 68 | 947 | 466 |
| | 180 | 643 | 752 | 951 | 1150 | 934 | 1274 |
| | 114 | 99 | 298 | 82 | 422 | 851 | 280 |
| | 1517 | 766 | 1106 | 1535 | 964 | 459 | 553 |
| | 720 | 683 | 112 | 1143 | 1237 | 969 | 914 |
| | 582 | 291 | 385 | 117 | 62 | 991 | 1100 |
| | 1069 | 908 | 1212 | 139 | 248 | 447 | 646 |
| | 360 | 823 | 1146 | 1131 | 1330 | 1114 | 1454 |
| | 294 | 1013 | 262 | 978 | 1317 | 655 | 1384 |
| | 1053 | 1448 | 465 | 1339 | 639 | 1144 | 733 |
| | 1417 | 791 | 78 | 1505 | 845 | 201 | 487 |
| | 762 | 653 | 1529 | 885 | 1171 | 404 | 471 |
| | 142 | 1462 | 319 | 1088 | 1048 | 1326 | 950 |
| | 1003 | 236 | 196 | 474 | 98 | 758 | 1081 |
| | 880 | 944 | 1248 | 1442 | 229 | 1139 | 640 |
| | 396 | 590 | 913 | 287 | 1110 | 1001 | 341 |
| | 61 | 971 | 258 | 149 | 1025 | 381 | 667 |
| | 942 | 833 | 1174 | 958 | 1351 | 584 | 544 |
| | 322 | 106 | 499 | 1268 | 1228 | 1506 | 1130 |
| | 1183 | 309 | 376 | 654 | 744 | 938 | 1261 |
| | 1167 | 1124 | 1428 | 86 | 409 | 1319 | 606 |
| | 576 | 1236 | 1093 | 467 | 1290 | 1181 | 521 |
| | 241 | 1151 | 438 | 329 | 670 | 454 | 847 |
| | 1336 | 371 | 1354 | 1138 | 1531 | 764 | 724 |
| | 502 | 286 | 679 | 1341 | 1408 | 150 | 240 |
| | 1363 | 489 | 663 | 620 | 924 | 1118 | 1441 |
| | 1347 | 1304 | 72 | 732 | 589 | 1499 | 786 |
| | 290 | 1416 | 1273 | 647 | 1470 | 1361 | 166 |
| | 421 | 651 | 832 | 509 | 850 | 634 | 1027 |
| | 1516 | 551 | 1534 | 1318 | 175 | 837 | 904 |
| | 1217 | 573 | 859 | 1521 | 159 | 116 | 420 |
| | 7 | 669 | 843 | 800 | 1104 | 228 | 85 |
| | 1527 | 1484 | 1322 | 912 | 769 | 143 | 966 |
| | 470 | 60 | 1453 | 147 | 328 | 5 | 346 |
| | 601 | 831 | 1012 | 47 | 1030 | 814 | 1207 |
| | 160 | 731 | 713 | 69 | 355 | 1017 | 1191 |
| | 1397 | 753 | 1039 | 165 | 339 | 296 | 600 |
| | 187 | 849 | 1023 | 408 | 462 | 104 | 64 |
| | 818 | 1092 | 1360 | 788 | 748 | 342 | 1162 |
| | 508 | 1472 | 1432 | 1026 | 310 | 1079 | 703 |
| | 687 | 174 | 994 | 227 | 1387 | 1011 | 781 |
| | 249 | 911 | 535 | 839 | 1465 | 893 | 948 |
| | 1219 | 1523 | 613 | 41 | 96 | 1440 | 1494 |
| | 1297 | 190 | 780 | 588 | 856 | 284 | 244 |
| | 998 | 806 | 4 | 968 | 928 | 522 | 1342 |
| | 688 | 9 | 183 | 1206 | 490 | 1259 | 883 |
| | 867 | 140 | 1281 | 407 | 31 | 335 | 961 |
| | 429 | 197 | 715 | 1019 | 109 | 1073 | 1128 |
| | 1399 | 167 | 793 | 1222 | 276 | 84 | 352 |
| | 1477 | 370 | 494 | 302 | 1036 | 464 | 424 |

-continued

| Block Length N | Permutation Indices π = [π(0), π(1), . . . , π(N − 1)] | | | | | | |
|---|---|---|---|---|---|---|---|
| | 1178 | 986 | 184 | 1041 | 1215 | 702 | 1522 |
| | 868 | 189 | 363 | 1172 | 777 | 1439 | 1063 |
| | 1047 | 320 | 1461 | 1229 | 211 | 515 | 1141 |
| | 609 | 377 | 895 | 1199 | 289 | 718 | 1308 |
| | 43 | 1203 | 973 | 1402 | 1526 | 1334 | 532 |
| | 121 | 550 | 674 | 482 | 1216 | 537 | 711 |
| | 1358 | 1166 | 364 | 1221 | 1395 | 668 | 273 |
| | 834 | 369 | 543 | 1352 | 957 | 725 | 1243 |
| | 1120 | 500 | 105 | 1409 | 391 | 695 | 1321 |
| | 682 | 557 | 1075 | 699 | 469 | 898 | 1022 |
| | 223 | 1383 | 1153 | 46 | 170 | 1514 | 712 |
| | 301 | 1265 | 854 | 662 | 1396 | 717 | 891 |
| | 468 | 1346 | 330 | 1401 | 39 | 848 | 453 |
| 1759 | 196 | 1350 | 469 | 101 | 1395 | 519 | 1017 |
| | 769 | 401 | 1695 | 859 | 1317 | 1247 | 128 |
| | 701 | 243 | 1159 | 1617 | 1547 | 428 | 586 |
| | 1459 | 165 | 95 | 728 | 886 | 1524 | 1046 |
| | 395 | 1028 | 1186 | 72 | 1346 | 1696 | 1098 |
| | 1486 | 372 | 1646 | 244 | 1398 | 517 | 149 |
| | 194 | 544 | 1698 | 817 | 449 | 1743 | 907 |
| | 246 | 1117 | 749 | 291 | 1207 | 1665 | 1595 |
| | 1049 | 591 | 1507 | 213 | 143 | 776 | 934 |
| | 891 | 55 | 513 | 443 | 1076 | 1234 | 120 |
| | 813 | 743 | 1376 | 1534 | 420 | 1694 | 292 |
| | 1676 | 82 | 720 | 242 | 592 | 1746 | 865 |
| | 1020 | 542 | 66 | 294 | 1165 | 797 | 339 |
| | 1192 | 594 | 619 | 1097 | 639 | 1555 | 261 |
| | 13 | 1397 | 939 | 103 | 561 | 491 | 1124 |
| | 1239 | 403 | 861 | 791 | 1424 | 1582 | 468 |
| | 703 | 1161 | 1091 | 1724 | 130 | 768 | 290 |
| | 1391 | 272 | 430 | 1068 | 590 | 940 | 342 |
| | 730 | 1368 | 890 | 1240 | 642 | 1513 | 1145 |
| | 1190 | 1540 | 942 | 61 | 1445 | 987 | 151 |
| | 1242 | 361 | 1745 | 1287 | 451 | 909 | 839 |
| | 293 | 1587 | 751 | 1209 | 1139 | 20 | 178 |
| | 1051 | 1509 | 1439 | 320 | 478 | 1116 | 638 |
| | 57 | 1739 | 620 | 778 | 1416 | 938 | 1288 |
| | 920 | 1078 | 1716 | 1238 | 1588 | 990 | 109 |
| | 264 | 1538 | 136 | 1290 | 409 | 41 | 1335 |
| | 436 | 1590 | 709 | 341 | 1635 | 799 | 1257 |
| | 1009 | 641 | 183 | 1099 | 1557 | 1487 | 368 |
| | 483 | 1399 | 105 | 35 | 668 | 826 | 1464 |
| | 405 | 335 | 968 | 1126 | 12 | 1286 | 1636 |
| | 1268 | 1754 | 1426 | 312 | 1586 | 184 | 1338 |
| | 1726 | 612 | 134 | 484 | 1638 | 757 | 389 |
| | 434 | 784 | 1012 | 1057 | 689 | 231 | 1147 |
| | 486 | 1357 | 989 | 531 | 1447 | 153 | 83 |
| | 1289 | 831 | 1747 | 453 | 383 | 1016 | 1174 |
| | 295 | 753 | 683 | 1316 | 1474 | 360 | 1634 |
| | 983 | 1616 | 22 | 660 | 182 | 532 | 1686 |
| | 322 | 960 | 482 | 1753 | 832 | 234 | 1105 |
| | 1260 | 782 | 1132 | 534 | 559 | 1037 | 146 |
| | 1432 | 834 | 1705 | 1337 | 879 | 43 | 501 |
| | 253 | 1637 | 1179 | 343 | 801 | 731 | 1364 |
| | 1479 | 643 | 1101 | 1031 | 1664 | 70 | 708 |
| | 1401 | 1331 | 212 | 370 | 1008 | 530 | 880 |
| | 512 | 670 | 1308 | 830 | 1180 | 582 | 1453 |
| | 1608 | 1130 | 1480 | 882 | 1 | 1757 | 1385 |
| | 1430 | 28 | 1182 | 301 | 1685 | 1227 | 391 |
| | 1482 | 601 | 233 | 1527 | 691 | 1149 | 1079 |
| | 533 | 75 | 991 | 1449 | 1379 | 260 | 418 |
| | 1291 | 1749 | 1679 | 560 | 718 | 1356 | 878 |
| | 227 | 860 | 1018 | 1656 | 1178 | 1528 | 930 |
| | 1318 | 204 | 1478 | 76 | 1230 | 349 | 1733 |
| | 912 | 376 | 1530 | 649 | 281 | 1575 | 739 |
| | 78 | 949 | 581 | 123 | 1039 | 1497 | 1427 |
| | 881 | 423 | 1339 | 45 | 1727 | 608 | 766 |
| | 1639 | 345 | 275 | 908 | 1066 | 1704 | 1226 |
| | 575 | 1208 | 1366 | 252 | 1526 | 124 | 1278 |
| | 1666 | 552 | 74 | 424 | 1578 | 697 | 329 |
| | 374 | 724 | 952 | 997 | 629 | 171 | 1087 |
| | 426 | 1297 | 929 | 471 | 1387 | 93 | 23 |
| | 1229 | 771 | 1687 | 393 | 323 | 956 | 1114 |
| | 235 | 693 | 623 | 1256 | 1414 | 300 | 1574 |
| | 923 | 1556 | 1714 | 600 | 122 | 472 | 1626 |
| | 262 | 900 | 422 | 772 | 174 | 1045 | 677 |

-continued

| Block Length N | Permutation Indices $\pi = [\pi(0), \pi(1), \ldots, \pi(N-1)]$ | | | | | | |
|---|---|---|---|---|---|---|---|
| | 722 | 1072 | 474 | 499 | 977 | 86 | 1435 |
| | 774 | 1645 | 1277 | 819 | 1735 | 441 | 371 |
| | 1577 | 1119 | 283 | 741 | 671 | 1304 | 1462 |
| | 583 | 1041 | 971 | 1604 | 10 | 648 | 170 |
| | 1271 | 152 | 310 | 948 | 470 | 820 | 222 |
| | 610 | 1248 | 770 | 1120 | 522 | 1393 | 1025 |
| | 1070 | 1420 | 822 | 1693 | 1325 | 867 | 31 |
| | 1122 | 241 | 1625 | 1167 | 331 | 789 | 719 |
| | 173 | 1467 | 631 | 1089 | 1019 | 1652 | 58 |
| | 931 | 1389 | 1319 | 200 | 358 | 996 | 518 |
| | 1619 | 500 | 658 | 1296 | 818 | 1168 | 570 |
| | 958 | 1596 | 1118 | 1468 | 870 | 1741 | 1373 |
| | 1418 | 16 | 1170 | 289 | 1673 | 1215 | 379 |
| | 1470 | 589 | 221 | 1515 | 679 | 1137 | 1067 |
| | 521 | 63 | 979 | 1437 | 1367 | 248 | 406 |
| | 1279 | 1737 | 1667 | 548 | 706 | 1344 | 866 |
| | 215 | 848 | 1006 | 1644 | 1166 | 1516 | 918 |
| | 1306 | 192 | 1466 | 64 | 1218 | 337 | 1721 |
| | 14 | 364 | 1518 | 637 | 269 | 1563 | 727 |
| | 892 | 937 | 569 | 111 | 1027 | 1052 | 1415 |
| | 869 | 411 | 1327 | 33 | 1715 | 596 | 754 |
| | 1627 | 333 | 263 | 896 | 1054 | 1692 | 1214 |
| | 563 | 1196 | 1354 | 240 | 1514 | 112 | 1266 |
| | 1654 | 540 | 62 | 685 | 317 | 1566 | 362 |
| | 840 | 985 | 617 | 114 | 662 | 1075 | 712 |
| | 917 | 414 | 962 | 1375 | 186 | 802 | 644 |
| | 1262 | 1675 | 1312 | 1102 | 944 | 759 | 381 |
| | 1612 | 1402 | 1244 | 1059 | 681 | 611 | 288 |
| | 1544 | 1359 | 981 | 911 | 588 | 733 | 365 |
| | 1281 | 1211 | 888 | 1033 | 665 | 162 | 710 |
| | 1188 | 1333 | 965 | 462 | 1010 | 1423 | 1060 |
| | 1265 | 762 | 1310 | 1723 | 1360 | 1150 | 1405 |
| | 1610 | 271 | 1660 | 1450 | 1292 | 1107 | 729 |
| | 208 | 1750 | 1592 | 1407 | 1029 | 959 | 636 |
| | 140 | 1707 | 1329 | 1259 | 936 | 1081 | 713 |
| | 1629 | 1559 | 1236 | 1381 | 1013 | 510 | 1058 |
| | 1536 | 1681 | 1313 | 810 | 1358 | 19 | 1408 |
| | 1613 | 1110 | 1658 | 319 | 1708 | 1498 | 1340 |
| | 206 | 579 | 256 | 1365 | 1640 | 1455 | 1077 |
| | 556 | 346 | 188 | 3 | 1377 | 1307 | 984 |
| | 488 | 303 | 1677 | 1607 | 1284 | 558 | 1584 |
| | 1519 | 1106 | 1156 | 858 | 132 | 525 | 1088 |
| | 1456 | 1158 | 432 | 825 | 1388 | 755 | 1546 |
| | 732 | 1125 | 1688 | 1055 | 94 | 1503 | 577 |
| | 236 | 1355 | 394 | 51 | 877 | 509 | 967 |
| | 694 | 351 | 1177 | 809 | 1267 | 854 | 904 |
| | 1477 | 1109 | 1567 | 1154 | 1204 | 906 | 180 |
| | 115 | 1454 | 1504 | 1206 | 480 | 873 | 1436 |
| | 52 | 1506 | 780 | 1173 | 1736 | 1103 | 142 |
| | 1080 | 1473 | 284 | 1403 | 442 | 99 | 925 |
| | 584 | 1703 | 742 | 399 | 1225 | 857 | 1315 |
| | 1042 | 699 | 1525 | 1157 | 1615 | 1202 | 1252 |
| | 73 | 1457 | 163 | 1502 | 1552 | 1254 | 528 |
| | 463 | 50 | 100 | 1554 | 828 | 1221 | 32 |
| | 400 | 1521 | 490 | 650 | 700 | 102 | 605 |
| | 790 | 950 | 1000 | 402 | 905 | 447 | 1363 |
| | 1300 | 702 | 1205 | 747 | 1663 | 299 | 1345 |
| | 1505 | 1047 | 211 | 599 | 1232 | 121 | 276 |
| | 511 | 899 | 1532 | 421 | 576 | 1269 | 238 |
| | 80 | 721 | 876 | 1569 | 538 | 698 | 748 |
| | 1176 | 117 | 1048 | 495 | 838 | 1476 | 450 |
| | 1348 | 795 | 1138 | 24 | 750 | 1711 | 347 |
| | 1438 | 324 | 1050 | 259 | 647 | 169 | 1280 |
| 1884 | 961 | 1193 | 1659 | 1588 | 1404 | 378 | 656 |
| | 1791 | 1720 | 1536 | 510 | 788 | 1834 | 572 |
| | 1198 | 595 | 1155 | 552 | 704 | 1273 | 947 |
| | 1052 | 684 | 883 | 1405 | 1079 | 566 | 1489 |
| | 1015 | 1161 | 1211 | 698 | 1574 | 1853 | 153 |
| | 1343 | 736 | 1753 | 101 | 285 | 402 | 1726 |
| | 1 | 233 | 699 | 628 | 444 | 1302 | 1580 |
| | 831 | 666 | 106 | 1434 | 63 | 874 | 1496 |
| | 238 | 1519 | 195 | 1476 | 1628 | 313 | 1871 |
| | 92 | 1138 | 1807 | 69 | 119 | 1490 | 482 |
| | 8 | 201 | 251 | 1622 | 614 | 893 | 1077 |
| | 383 | 1660 | 793 | 1025 | 1209 | 1420 | 1236 |
| | 925 | 1157 | 1623 | 1552 | 1368 | 342 | 620 |

-continued

| Block Length N | Permutation Indices $\pi = [\pi(0), \pi(1), \ldots, \pi(N-1)]$ | | | | | | |
|---|---|---|---|---|---|---|---|
| | 1473 | 1590 | 1030 | 427 | 987 | 384 | 536 |
| | 1162 | 559 | 1119 | 516 | 715 | 1237 | 911 |
| | 1016 | 178 | 847 | 993 | 1043 | 530 | 1406 |
| | 932 | 1125 | 1175 | 568 | 1538 | 1817 | 117 |
| | 1307 | 700 | 1717 | 65 | 531 | 460 | 276 |
| | 1802 | 197 | 663 | 592 | 408 | 1266 | 1544 |
| | 513 | 630 | 70 | 1351 | 27 | 1308 | 1460 |
| | 672 | 1483 | 1808 | 1440 | 1639 | 277 | 1835 |
| | 56 | 1102 | 1771 | 33 | 83 | 1454 | 446 |
| | 1856 | 165 | 215 | 1492 | 625 | 857 | 1041 |
| | 347 | 1624 | 757 | 989 | 1455 | 1384 | 1200 |
| | 842 | 1121 | 1587 | 1422 | 862 | 306 | 819 |
| | 1437 | 1554 | 994 | 391 | 951 | 348 | 500 |
| | 1596 | 570 | 848 | 10 | 679 | 1201 | 875 |
| | 980 | 142 | 764 | 957 | 1007 | 494 | 1370 |
| | 896 | 1465 | 1139 | 532 | 1549 | 1781 | 81 |
| | 1271 | 758 | 1681 | 29 | 495 | 424 | 240 |
| | 1766 | 161 | 345 | 462 | 1786 | 1183 | 1743 |
| | 477 | 594 | 34 | 1315 | 1875 | 1272 | 1471 |
| | 636 | 1494 | 1772 | 934 | 1603 | 1749 | 1799 |
| | 255 | 1066 | 1688 | 1881 | 47 | 1324 | 410 |
| | 1820 | 505 | 179 | 1456 | 589 | 821 | 1287 |
| | 311 | 1682 | 674 | 953 | 1419 | 1348 | 1164 |
| | 1269 | 1386 | 1085 | 1852 | 223 | 806 | 901 |
| | 1217 | 194 | 355 | 985 | 1033 | 511 | 1428 |
| | 534 | 1117 | 789 | 643 | 1560 | 812 | 1858 |
| | 921 | 728 | 1222 | 1179 | 576 | 971 | 1797 |
| | 1354 | 1311 | 708 | 1103 | 327 | 256 | 1745 |
| | 370 | 1235 | 459 | 294 | 1877 | 760 | 1062 |
| | 309 | 426 | 125 | 892 | 1147 | 1730 | 1825 |
| | 257 | 1118 | 1326 | 25 | 73 | 1435 | 468 |
| | 1458 | 110 | 1713 | 1520 | 600 | 1736 | 898 |
| | 337 | 1652 | 262 | 219 | 1500 | 11 | 837 |
| | 864 | 116 | 1632 | 143 | 1251 | 1180 | 785 |
| | 1294 | 275 | 1101 | 1218 | 917 | 1684 | 55 |
| | 1233 | 1350 | 1049 | 1816 | 187 | 817 | 865 |
| | 1181 | 158 | 366 | 949 | 621 | 475 | 1392 |
| | 498 | 1034 | 753 | 560 | 1054 | 776 | 1822 |
| | 1261 | 692 | 1186 | 1143 | 540 | 935 | 159 |
| | 1788 | 1040 | 202 | 1067 | 291 | 220 | 1709 |
| | 334 | 1199 | 141 | 258 | 1841 | 724 | 979 |
| | 273 | 484 | 89 | 950 | 1111 | 1741 | 1789 |
| | 221 | 1082 | 1290 | 1873 | 1545 | 1399 | 432 |
| | 1375 | 74 | 1677 | 1484 | 94 | 51 | 1332 |
| | 301 | 1663 | 226 | 183 | 1464 | 1859 | 1083 |
| | 828 | 80 | 1126 | 107 | 1215 | 1050 | 749 |
| | 1258 | 239 | 1065 | 1182 | 881 | 1648 | 19 |
| | 1479 | 1408 | 1013 | 1874 | 198 | 781 | 829 |
| | 1145 | 122 | 330 | 866 | 585 | 392 | 1356 |
| | 415 | 998 | 1093 | 524 | 1018 | 975 | 372 |
| | 1225 | 703 | 1620 | 1107 | 504 | 899 | 123 |
| | 1752 | 1004 | 166 | 1031 | 1857 | 90 | 1673 |
| | 768 | 1163 | 105 | 222 | 1805 | 688 | 943 |
| | 519 | 448 | 53 | 914 | 1122 | 1705 | 1377 |
| | 185 | 952 | 1254 | 1790 | 1509 | 1316 | 1810 |
| | 1339 | 38 | 133 | 1448 | 58 | 15 | 1296 |
| | 217 | 1627 | 1518 | 1796 | 915 | 1310 | 976 |
| | 1650 | 44 | 1047 | 1442 | 203 | 1480 | 411 |
| | 454 | 529 | 335 | 1706 | 543 | 139 | 1029 |
| | 467 | 1838 | 440 | 271 | 1443 | 745 | 162 |
| | 807 | 356 | 1575 | 830 | 247 | 1410 | 1109 |
| | 1425 | 1009 | 379 | 1542 | 1241 | 336 | 982 |
| | 558 | 1768 | 1373 | 1882 | 1584 | 813 | 995 |
| | 1505 | 130 | 1716 | 945 | 1127 | 520 | 1335 |
| | 1378 | 1453 | 1259 | 746 | 1232 | 1063 | 351 |
| | 1391 | 878 | 1364 | 1148 | 483 | 1669 | 1086 |
| | 1731 | 1280 | 333 | 1754 | 1171 | 450 | 149 |
| | 465 | 49 | 1303 | 676 | 281 | 1260 | 492 |
| | 1482 | 808 | 413 | 922 | 624 | 1737 | 35 |
| | 545 | 1524 | 286 | 1869 | 167 | 1444 | 375 |
| | 418 | 493 | 299 | 1670 | 272 | 103 | 1275 |
| | 431 | 1708 | 404 | 188 | 1407 | 662 | 126 |
| | 771 | 320 | 1257 | 794 | 211 | 1374 | 1073 |
| | 1389 | 973 | 390 | 1600 | 1205 | 1714 | 1416 |
| | 522 | 1732 | 1337 | 1846 | 1548 | 777 | 959 |
| | 1469 | 564 | 1210 | 1285 | 1091 | 578 | 1299 |

-continued

| Block Length N | Permutation Indices π = [π(0), π(1), . . . , π(N − 1)] | | | | | | |
|---|---|---|---|---|---|---|---|
| | 1342 | 1417 | 1223 | 710 | 1196 | 1027 | 315 |
| | 1355 | 748 | 1563 | 1112 | 447 | 1586 | 1003 |
| | 1695 | 1291 | 297 | 1718 | 1135 | 414 | 113 |
| | 711 | 13 | 1314 | 640 | 245 | 754 | 456 |
| | 1446 | 678 | 377 | 886 | 588 | 1701 | 1883 |
| | 509 | 1488 | 250 | 325 | 131 | 1502 | 104 |
| | 852 | 457 | 263 | 1634 | 236 | 20 | 1239 |
| | 395 | 1672 | 603 | 152 | 1089 | 626 | 43 |
| | 735 | 331 | 1221 | 805 | 175 | 1432 | 1037 |
| | 1635 | 937 | 354 | 1564 | 1169 | 1678 | 1380 |
| | 439 | 1602 | 1301 | 396 | 1042 | 741 | 923 |
| | 1433 | 528 | 1174 | 1249 | 1055 | 542 | 1028 |
| | 1776 | 1005 | 1187 | 580 | 1160 | 944 | 279 |
| | 1319 | 712 | 1527 | 1076 | 129 | 1550 | 967 |
| | 1424 | 1255 | 261 | 1729 | 1146 | 472 | 77 |
| | 1583 | 209 | 1278 | 718 | 675 | 1387 | 604 |
| | 1363 | 1320 | 525 | 1472 | 642 | 1108 | 171 |
| | 657 | 1651 | 868 | 1334 | 68 | 373 | 816 |
| | 1000 | 1466 | 435 | 458 | 478 | 177 | 227 |
| | 567 | 590 | 610 | 685 | 359 | 869 | 7 |
| | 1212 | 441 | 491 | 1001 | 186 | 1510 | 1467 |
| | 623 | 1133 | 318 | 1642 | 1599 | 380 | 1528 |
| | 403 | 360 | 1449 | 512 | 1566 | 148 | 860 |
| | 1581 | 691 | 1792 | 374 | 992 | 1297 | 1740 |
| | 40 | 506 | 1359 | 1382 | 1402 | 1477 | 1151 |
| | 1491 | 1561 | 1534 | 1609 | 1283 | 1793 | 931 |
| | 252 | 1365 | 1415 | 41 | 1110 | 550 | 507 |
| | 1547 | 173 | 1195 | 682 | 639 | 1304 | 474 |
| | 1327 | 1284 | 489 | 1436 | 606 | 1072 | 1784 |
| | 903 | 1615 | 832 | 1298 | 32 | 290 | 780 |
| | 964 | 1336 | 399 | 422 | 442 | 517 | 191 |
| | 296 | 601 | 1044 | 649 | 323 | 833 | 18 |
| | 1176 | 405 | 455 | 965 | 150 | 1474 | 1431 |
| | 587 | 1097 | 235 | 192 | 1281 | 344 | 1398 |
| | 367 | 324 | 1413 | 523 | 1530 | 206 | 824 |
| | 1827 | 655 | 1756 | 338 | 1191 | 1214 | 1234 |
| | 1794 | 376 | 1323 | 1346 | 1366 | 1441 | 1115 |
| | 1220 | 1525 | 84 | 1197 | 1247 | 1757 | 942 |
| | 216 | 1329 | 1379 | 5 | 1074 | 514 | 471 |
| | 1511 | 137 | 1159 | 1116 | 321 | 1268 | 438 |
| | 1338 | 1248 | 453 | 1447 | 664 | 1130 | 1748 |
| | 867 | 1579 | 796 | 1262 | 231 | 254 | 274 |
| | 834 | 1300 | 363 | 433 | 406 | 481 | 155 |
| | 260 | 565 | 1008 | 237 | 287 | 797 | 1866 |
| | 670 | 369 | 419 | 929 | 67 | 1438 | 1395 |
| | 551 | 1061 | 199 | 156 | 1245 | 308 | 1362 |
| 2052 | 1948 | 410 | 1319 | 1341 | 115 | 83 | 658 |
| | 611 | 633 | 1459 | 943 | 2002 | 852 | 63 |
| | 751 | 235 | 1928 | 144 | 1407 | 488 | 257 |
| | 1220 | 1488 | 699 | 414 | 1284 | 1193 | 50 |
| | 2043 | 1758 | 576 | 485 | 1394 | 974 | 1883 |
| | 1920 | 94 | 686 | 266 | 1175 | 1197 | 1873 |
| | 1096 | 1610 | 467 | 489 | 1315 | 1283 | 1858 |
| | 1811 | 1833 | 607 | 91 | 1150 | 0 | 1263 |
| | 1951 | 1435 | 1076 | 1344 | 555 | 1688 | 1457 |
| | 368 | 636 | 1899 | 1614 | 432 | 341 | 1250 |
| | 1191 | 906 | 1776 | 1685 | 542 | 122 | 1031 |
| | 1068 | 1294 | 1886 | 1466 | 323 | 345 | 1021 |
| | 244 | 758 | 1667 | 1689 | 463 | 1999 | 1006 |
| | 959 | 981 | 1807 | 1291 | 932 | 1200 | 411 |
| | 1099 | 583 | 224 | 492 | 1755 | 836 | 605 |
| | 1568 | 1369 | 1047 | 762 | 1632 | 1541 | 398 |
| | 339 | 54 | 924 | 833 | 1742 | 1322 | 179 |
| | 216 | 442 | 1034 | 614 | 1523 | 1545 | 169 |
| | 1444 | 1958 | 815 | 837 | 1663 | 1147 | 154 |
| | 107 | 129 | 955 | 439 | 80 | 348 | 1611 |
| | 97 | 1783 | 1424 | 1692 | 903 | 2036 | 1805 |
| | 716 | 517 | 195 | 1962 | 780 | 689 | 1598 |
| | 1539 | 1254 | 72 | 298 | 890 | 470 | 1379 |
| | 1416 | 1642 | 182 | 1814 | 671 | 693 | 1519 |
| | 592 | 1106 | 2015 | 2037 | 811 | 295 | 1354 |
| | 1307 | 1329 | 103 | 1639 | 1280 | 1548 | 759 |
| | 1297 | 931 | 572 | 840 | 51 | 1184 | 953 |
| | 1916 | 1717 | 1395 | 1110 | 1980 | 1889 | 746 |
| | 687 | 402 | 1272 | 1498 | 38 | 1670 | 527 |
| | 881 | 790 | 448 | 962 | 1871 | 1893 | 667 |

-continued

| Block Length N | Permutation Indices π = [π(0), π(1), . . . , π(N − 1)] | | | | | | |
|---|---|---|---|---|---|---|---|
| | 1792 | 254 | 1163 | 1185 | 2011 | 1495 | 502 |
| | 455 | 477 | 1303 | 787 | 428 | 696 | 1959 |
| | 445 | 79 | 1772 | 2040 | 1251 | 332 | 1836 |
| | 1064 | 865 | 543 | 258 | 1128 | 1037 | 1946 |
| | 1887 | 1602 | 420 | 646 | 1238 | 818 | 1727 |
| | 29 | 1990 | 1648 | 110 | 1019 | 1041 | 1867 |
| | 940 | 1454 | 311 | 333 | 1159 | 643 | 1702 |
| | 1655 | 1677 | 451 | 1987 | 1628 | 1896 | 1107 |
| | 1645 | 1279 | 920 | 1188 | 399 | 114 | 984 |
| | 212 | 13 | 1743 | 1458 | 276 | 185 | 1266 |
| | 229 | 1556 | 1357 | 1620 | 875 | 897 | 2018 |
| | 649 | 1229 | 167 | 189 | 1310 | 430 | 983 |
| | 1511 | 1533 | 1720 | 1774 | 1843 | 88 | 44 |
| | 1012 | 749 | 1135 | 1432 | 1388 | 255 | 1651 |
| | 427 | 724 | 1314 | 1599 | 793 | 68 | 336 |
| | 606 | 891 | 85 | 1412 | 1213 | 1476 | 731 |
| | 1429 | 704 | 505 | 768 | 23 | 45 | 1166 |
| | 264 | 377 | 1367 | 1389 | 458 | 1630 | 1699 |
| | 659 | 681 | 868 | 922 | 991 | 1288 | 1244 |
| | 160 | 1949 | 283 | 580 | 536 | 1455 | 799 |
| | 1627 | 1924 | 462 | 747 | 1993 | 1268 | 1069 |
| | 1806 | 39 | 1285 | 560 | 361 | 624 | 1931 |
| | 577 | 1904 | 1705 | 1968 | 1223 | 1245 | 314 |
| | 1464 | 1577 | 515 | 537 | 1658 | 778 | 847 |
| | 1859 | 1881 | 16 | 70 | 139 | 436 | 392 |
| | 1360 | 1097 | 1483 | 1780 | 1736 | 603 | 1849 |
| | 775 | 1072 | 1662 | 1947 | 1141 | 416 | 217 |
| | 954 | 1239 | 433 | 1760 | 1561 | 1824 | 1079 |
| | 1777 | 418 | 853 | 1116 | 371 | 393 | 1514 |
| | 612 | 725 | 1715 | 1737 | 806 | 1978 | 2047 |
| | 1007 | 1029 | 1216 | 1270 | 1339 | 1636 | 1592 |
| | 508 | 245 | 631 | 928 | 884 | 1803 | 997 |
| | 1975 | 220 | 810 | 1095 | 289 | 1616 | 1417 |
| | 102 | 387 | 1633 | 908 | 709 | 972 | 227 |
| | 925 | 1618 | 1 | 581 | 1571 | 1593 | 662 |
| | 1812 | 1925 | 863 | 885 | 2006 | 1126 | 1195 |
| | 155 | 177 | 364 | 101 | 487 | 784 | 740 |
| | 1708 | 1445 | 1831 | 76 | 32 | 951 | 145 |
| | 1123 | 302 | 2010 | 243 | 1489 | 764 | 565 |
| | 1302 | 1587 | 781 | 56 | 1909 | 120 | 1427 |
| | 73 | 766 | 1201 | 1781 | 719 | 741 | 1862 |
| | 960 | 1073 | 11 | 33 | 1154 | 274 | 343 |
| | 1355 | 1377 | 1564 | 1301 | 1687 | 1984 | 1940 |
| | 856 | 593 | 979 | 1276 | 1866 | 99 | 1345 |
| | 271 | 1502 | 1158 | 1443 | 637 | 1964 | 1765 |
| | 450 | 735 | 1981 | 1256 | 1057 | 1320 | 575 |
| | 1273 | 1966 | 349 | 929 | 1919 | 1941 | 1010 |
| | 108 | 221 | 1420 | 1565 | 550 | 663 | 1452 |
| | 712 | 857 | 476 | 2007 | 744 | 1088 | 1351 |
| | 1820 | 1299 | 36 | 1014 | 493 | 1530 | 1869 |
| | 913 | 306 | 1837 | 822 | 1161 | 1471 | 1085 |
| | 1129 | 431 | 453 | 1247 | 694 | 1994 | 866 |
| | 1797 | 539 | 2038 | 1286 | 158 | 1421 | 406 |
| | 1330 | 1696 | 568 | 713 | 1750 | 1863 | 600 |
| | 1912 | 5 | 1676 | 1155 | 1944 | 236 | 499 |
| | 968 | 447 | 769 | 162 | 1693 | 678 | 1017 |
| | 2022 | 1850 | 1103 | 309 | 1430 | 61 | 985 |
| | 395 | 1653 | 722 | 1405 | 277 | 798 | 1277 |
| | 14 | 1164 | 1621 | 90 | 569 | 478 | 1606 |
| | 1063 | 800 | 1913 | 1822 | 1532 | 1011 | 1559 |
| | 1205 | 797 | 824 | 303 | 534 | 1480 | 1183 |
| | 116 | 1647 | 1878 | 772 | 475 | 165 | 352 |
| | 1170 | 998 | 251 | 1509 | 578 | 1261 | 133 |
| | 1595 | 801 | 1922 | 553 | 1477 | 1998 | 425 |
| | 1214 | 312 | 919 | 1290 | 1769 | 1678 | 754 |
| | 211 | 2000 | 1061 | 970 | 680 | 159 | 707 |
| | 353 | 1997 | 2024 | 1503 | 1734 | 628 | 331 |
| | 1316 | 795 | 1026 | 1972 | 1675 | 1365 | 1552 |
| | 318 | 146 | 1451 | 657 | 1778 | 409 | 1333 |
| | 743 | 2001 | 1070 | 1753 | 625 | 1146 | 1625 |
| | 362 | 1512 | 67 | 438 | 917 | 826 | 1954 |
| | 1411 | 1148 | 209 | 1853 | 1880 | 1359 | 1907 |
| | 1236 | 1145 | 1172 | 651 | 882 | 1828 | 1531 |
| | 464 | 1995 | 174 | 1120 | 823 | 513 | 700 |
| | 1518 | 1346 | 599 | 1857 | 926 | 1609 | 481 |
| | 1943 | 1149 | 218 | 901 | 1825 | 294 | 773 |

-continued

| Block Length N | Permutation Indices π = [π(0), π(1), . . . , π(N − 1)] | | | | | |
|---|---|---|---|---|---|---|---|
| | 1562 | 660 | 1267 | 1638 | 65 | 2026 | 1102 |
| | 559 | 296 | 1409 | 1001 | 1028 | 507 | 1055 |
| | 384 | 293 | 320 | 1851 | 30 | 976 | 679 |
| | 1664 | 1143 | 1374 | 1202 | 2023 | 1713 | 1900 |
| | 666 | 494 | 1799 | 1005 | 74 | 757 | 1681 |
| | 1091 | 297 | 1418 | 49 | 973 | 1494 | 1973 |
| | 710 | 1860 | 415 | 152 | 1265 | 1174 | 250 |
| | 1759 | 1496 | 176 | 832 | 1051 | 788 | 557 |
| | 1520 | 124 | 193 | 714 | 1584 | 1756 | 1879 |
| | 1537 | 6 | 876 | 1982 | 1171 | 613 | 522 |
| | 168 | 1274 | 947 | 1957 | 131 | 1635 | 153 |
| | 239 | 1716 | 1475 | 927 | 1497 | 1738 | 106 |
| | 767 | 219 | 789 | 1030 | 1450 | 688 | 907 |
| | 81 | 322 | 1376 | 2032 | 199 | 1988 | 1757 |
| | 668 | 1324 | 1393 | 1914 | 732 | 904 | 1027 |
| | 685 | 1206 | 24 | 1130 | 319 | 1813 | 1722 |
| | 1368 | 422 | 95 | 1105 | 1331 | 783 | 1353 |
| | 1439 | 864 | 623 | 75 | 645 | 886 | 1306 |
| | 1967 | 1419 | 1989 | 178 | 1232 | 1888 | 55 |
| | 1281 | 1522 | 524 | 1180 | 1249 | 1136 | 905 |
| | 1868 | 472 | 541 | 1062 | 1932 | 52 | 175 |
| | 1885 | 354 | 1224 | 278 | 2003 | 961 | 870 |
| | 516 | 1622 | 1295 | 253 | 479 | 1983 | 501 |
| | 587 | 12 | 1823 | 1275 | 1845 | 34 | 454 |
| | 1115 | 567 | 1137 | 1378 | 380 | 1036 | 1255 |
| | 429 | 670 | 1724 | 328 | 397 | 284 | 53 |
| | 1016 | 1672 | 1741 | 210 | 1080 | 1252 | 1375 |
| | 1033 | 1554 | 372 | 1478 | 1151 | 109 | 18 |
| | 2033 | 770 | 443 | 1453 | 1679 | 1131 | 1701 |
| | 1787 | 1212 | 971 | 423 | 993 | 1234 | 1654 |
| | 263 | 1767 | 285 | 526 | 1580 | 184 | 403 |
| | 1629 | 1553 | 872 | 1528 | 1597 | 1484 | 936 |
| | 164 | 820 | 889 | 1410 | 228 | 400 | 523 |
| | 181 | 702 | 1572 | 626 | 299 | 1309 | 1218 |
| | 1181 | 1970 | 1643 | 601 | 827 | 279 | 849 |
| | 935 | 360 | 119 | 1623 | 141 | 382 | 802 |
| | 1463 | 915 | 1485 | 1726 | 728 | 1384 | 1603 |
| | 777 | 701 | 20 | 676 | 745 | 632 | 84 |
| | 1364 | 902 | 37 | 558 | 1428 | 1600 | 1723 |
| | 1381 | 1902 | 720 | 1826 | 1499 | 457 | 366 |
| | 329 | 1118 | 791 | 1801 | 2027 | 1479 | 2049 |
| 2259 | 317 | 507 | 1067 | 836 | 1226 | 226 | 489 |
| | 2020 | 1136 | 576 | 764 | 789 | 383 | 1948 |
| | 1198 | 1826 | 826 | 1089 | 30 | 1298 | 1261 |
| | 1364 | 1389 | 983 | 292 | 967 | 2142 | 276 |
| | 630 | 1898 | 1861 | 186 | 1229 | 1105 | 2007 |
| | 1567 | 1495 | 876 | 2117 | 51 | 1264 | 142 |
| | 1829 | 1705 | 351 | 911 | 680 | 120 | 70 |
| | 651 | 1864 | 742 | 420 | 608 | 633 | 1830 |
| | 1280 | 720 | 670 | 933 | 527 | 1142 | 511 |
| | 1020 | 1208 | 1233 | 174 | 136 | 1405 | 1986 |
| | 1533 | 1127 | 1742 | 1111 | 1039 | 1073 | 1661 |
| | 736 | 2005 | 330 | 1373 | 1249 | 2151 | 455 |
| | 1639 | 1673 | 1549 | 195 | 1408 | 286 | 2220 |
| | 305 | 495 | 1055 | 824 | 1214 | 214 | 477 |
| | 2008 | 886 | 564 | 752 | 777 | 371 | 1936 |
| | 1814 | 814 | 1077 | 18 | 1286 | 655 | 583 |
| | 1352 | 1377 | 971 | 280 | 955 | 2130 | 264 |
| | 618 | 1886 | 1849 | 1183 | 1217 | 1093 | 1995 |
| | 1555 | 474 | 864 | 2105 | 39 | 1252 | 130 |
| | 1817 | 1693 | 339 | 899 | 668 | 108 | 296 |
| | 639 | 1852 | 730 | 1358 | 358 | 621 | 1818 |
| | 1268 | 708 | 658 | 921 | 515 | 2080 | 499 |
| | 1196 | 1221 | 162 | 1430 | 1393 | 1974 | 761 |
| | 1115 | 1730 | 1099 | 1027 | 408 | 1649 | 1839 |
| | 1993 | 318 | 1361 | 1237 | 2139 | 443 | 212 |
| | 1008 | 2249 | 183 | 1396 | 274 | 2208 | 140 |
| | 483 | 1043 | 812 | 1202 | 202 | 465 | 59 |
| | 874 | 552 | 740 | 765 | 1962 | 1924 | 937 |
| | 802 | 1065 | 659 | 1274 | 643 | 571 | 605 |
| | 959 | 268 | 1537 | 2118 | 252 | 14931 | 683 |
| | 1243 | 1171 | 1205 | 1081 | 1983 | 940 | 2074 |
| | 852 | 2093 | 27 | 587 | 356 | 746 | 2002 |
| | 327 | 1540 | 418 | 96 | 284 | 309 | 2159 |
| | 956 | 1346 | 346 | 609 | 1806 | 818 | 781 |
| | 884 | 909 | 503 | 2068 | 487 | 1662 | 2052 |

-continued

| Block Length N | Permutation Indices π = [π(0), π(1), . . . , π(N − 1)] | | | | | |
|---|---|---|---|---|---|---|---|
| | 150 | 1418 | 1381 | 715 | 749 | 625 | 1527 |
| | 1087 | 6 | 396 | 1637 | 1827 | 784 | 1918 |
| | 1349 | 1225 | 2127 | 431 | 200 | 1896 | 1846 |
| | 171 | 1384 | 262 | 890 | 128 | 153 | 1350 |
| | 800 | 240 | 190 | 453 | 47 | 662 | 31 |
| | 728 | 753 | 1950 | 1912 | 925 | 1506 | 293 |
| | 647 | 1262 | 631 | 559 | 2196 | 328 | 1462 |
| | 1353 | 294 | 2106 | 2231 | 2000 | 1671 | 1193 |
| | 1159 | 928 | 2062 | 1971 | 840 | 1928 | 1781 |
| | 344 | 15 | 1793 | 1990 | 1369 | 1831 | 206 |
| | 1440 | 272 | 1669 | 469 | 1456 | 84 | 297 |
| | 425 | 175 | 806 | 1334 | 597 | 1794 | 103 |
| | 2056 | 684 | 897 | 491 | 1650 | 1775 | 1544 |
| | 1197 | 138 | 703 | 472 | 1606 | 1515 | 384 |
| | 2250 | 119 | 2144 | 1815 | 1337 | 1534 | 1625 |
| | 188 | 2115 | 984 | 2072 | 1213 | 1675 | 1000 |
| | 1937 | 2134 | 2225 | 313 | 350 | 878 | 141 |
| | 1813 | 19 | 1600 | 228 | 441 | 35 | 1194 |
| | 950 | 1478 | 741 | 1938 | 1494 | 1619 | 1388 |
| | 1041 | 635 | 547 | 316 | 1450 | 1359 | 881 |
| | 2094 | 2219 | 1988 | 1659 | 528 | 1378 | 757 |
| | 2050 | 1959 | 1481 | 1916 | 1769 | 2113 | 844 |
| | 1128 | 1978 | 1357 | 1819 | 194 | 722 | 2241 |
| | 113 | 457 | 1444 | 72 | 285 | 1482 | 1038 |
| | 794 | 1322 | 585 | 179 | 91 | 2116 | 994 |
| | 885 | 2082 | 1638 | 1763 | 1532 | 1203 | 725 |
| | 691 | 460 | 1594 | 1503 | 372 | 1460 | 601 |
| | 2132 | 1803 | 1325 | 1522 | 1613 | 1363 | 1994 |
| | 972 | 2060 | 1201 | 1 | 988 | 1872 | 2085 |
| | 2213 | 1963 | 338 | 866 | 129 | 1326 | 1891 |
| | 1588 | 216 | 429 | 23 | 1182 | 1307 | 1076 |
| | 729 | 1926 | 235 | 4 | 1376 | 1047 | 2172 |
| | 1782 | 304 | 1438 | 1347 | 869 | 1066 | 1157 |
| | 1976 | 1647 | 516 | 1604 | 745 | 1207 | 532 |
| | 1469 | 1666 | 1757 | 2101 | 2138 | 410 | 1929 |
| | 1345 | 1807 | 1132 | 2016 | 2229 | 1823 | 1735 |
| | 482 | 1010 | 273 | 1470 | 1026 | 1151 | 920 |
| | 573 | 167 | 79 | 2104 | 982 | 891 | 413 |
| | 1626 | 1751 | 1520 | 1191 | 60 | 910 | 289 |
| | 1582 | 1491 | 1013 | 1448 | 1301 | 1645 | 376 |
| | 1313 | 1510 | 889 | 1351 | 1982 | 254 | 1773 |
| | 1901 | 2245 | 976 | 1860 | 2073 | 1667 | 570 |
| | 326 | 854 | 117 | 1967 | 1879 | 1648 | 526 |
| | 417 | 11 | 1170 | 1295 | 1064 | 735 | 257 |
| | 223 | 2248 | 1126 | 1035 | 2160 | 992 | 133 |
| | 1664 | 1335 | 857 | 1054 | 1145 | 895 | 1526 |
| | 504 | 1592 | 733 | 1195 | 520 | 1404 | 1617 |
| | 1745 | 2089 | 2126 | 398 | 1917 | 858 | 1423 |
| | 1192 | 308 | 2192 | 1104 | 1333 | 279 | 1014 |
| | 2254 | 2057 | 89 | 579 | 1314 | 561 | 1720 |
| | 1933 | 879 | 1614 | 861 | 1070 | 2058 | 1033 |
| | 48 | 1161 | 1370 | 1739 | 277 | 898 | 1508 |
| | 1670 | 436 | 1289 | 1436 | 1570 | 1479 | 402 |
| | 877 | 1498 | 2108 | 1779 | 1355 | 1548 | 1339 |
| | 2170 | 2079 | 1002 | 1848 | 2233 | 1867 | 1248 |
| | 1955 | 842 | 1939 | 1158 | 2201 | 405 | 1564 |
| | 577 | 211 | 245 | 705 | 914 | 1283 | 2077 |
| | 2148 | 1005 | 2164 | 2236 | 833 | 980 | 1114 |
| | 1514 | 1883 | 421 | 1042 | 1652 | 1323 | 246 |
| | 721 | 1580 | 1714 | 1623 | 1199 | 1392 | 1777 |
| | 2252 | 1923 | 846 | 386 | 1483 | 702 | 1092 |
| | 1799 | 1992 | 121 | 2011 | 2045 | 249 | 458 |
| | 2083 | 1302 | 1692 | 549 | 1708 | 1780 | 1921 |
| | 389 | 849 | 1058 | 1427 | 677 | 586 | 958 |
| | 52 | 124 | 265 | 1124 | 1496 | 1167 | 743 |
| | 1277 | 1186 | 1558 | 1467 | 390 | 2186 | 1621 |
| | 2096 | 1767 | 1343 | 1536 | 1327 | 546 | 1589 |
| | 990 | 530 | 2221 | 1855 | 1236 | 93 | 302 |
| | 1927 | 1146 | 2189 | 393 | 1552 | 1624 | 221 |
| | 1836 | 693 | 902 | 1271 | 2065 | 430 | 1040 |
| | 2152 | 2224 | 821 | 968 | 1102 | 1011 | 2190 |
| | 409 | 1030 | 1640 | 1311 | 887 | 2030 | 871 |
| | 1702 | 1611 | 534 | 1380 | 1765 | 1399 | 1433 |
| | 1487 | 374 | 1471 | 690 | 1080 | 2193 | 1096 |
| | 109 | 1999 | 2033 | 237 | 446 | 815 | 1609 |
| | 1680 | 537 | 1696 | 1768 | 1909 | 512 | 646 |

-continued

| Block Length N | Permutation Indices π = [π(0), π(1), . . . , π(N − 1)] | | | | | | |
|---|---|---|---|---|---|---|---|
| | 1046 | 1415 | 665 | 574 | 1184 | 855 | 2034 |
| | 253 | 1112 | 1246 | 1155 | 731 | 924 | 1309 |
| | 1784 | 1455 | 378 | 2174 | 1015 | 234 | 624 |
| | 1331 | 1524 | 1315 | 1543 | 1577 | 2037 | 2246 |
| | 2209 | 834 | 1224 | 81 | 1240 | 1312 | 1453 |
| | 2177 | 381 | 590 | 1612 | 209 | 118 | 490 |
| | 1840 | 1259 | 2053 | 656 | 1028 | 699 | 275 |
| | 809 | 718 | 1090 | 999 | 2178 | 1718 | 1153 |
| | 1628 | 1299 | 875 | 1068 | 859 | 78 | 1121 |
| | 522 | 62 | 1753 | 1387 | 768 | 1881 | 2090 |
| | 1459 | 678 | 1721 | 2181 | 1084 | 1156 | 2009 |
| | 1368 | 225 | 434 | 803 | 1597 | 2218 | 572 |
| | 1684 | 1756 | 353 | 500 | 634 | 543 | 1722 |
| | 843 | 562 | 419 | 1403 | 1034 | 1172 | 365 |
| | 719 | 100 | 28 | 1234 | 12 | 1425 | 541 |
| | 1634 | 1772 | 965 | 1725 | 841 | 1512 | 1897 |
| | 612 | 2025 | 1853 | 506 | 1603 | 1531 | 2043 |
| | 1441 | 2112 | 241 | 822 | 87 | 44 | 1919 |
| | 2203 | 2131 | 387 | 106 | 1566 | 947 | 578 |
| | 687 | 644 | 263 | 1900 | 1828 | 1016 | 1812 |
| | 2166 | 1547 | 1178 | 1078 | 509 | 1269 | 385 |
| | 172 | 1616 | 156 | 1569 | 1397 | 50 | 1741 |
| | 1109 | 1869 | 985 | 1656 | 1447 | 1375 | 1887 |
| | 1997 | 650 | 85 | 666 | 2187 | 1906 | 1110 |
| | 2047 | 1975 | 231 | 2206 | 2063 | 791 | 422 |
| | 531 | 488 | 1710 | 1744 | 1672 | 622 | 53 |
| | 407 | 1391 | 1022 | 1160 | 1956 | 1113 | 941 |
| | 16 | 1222 | 653 | 1413 | 529 | 2150 | 991 |
| | 300 | 1713 | 1541 | 1500 | 1885 | 210 | 1731 |
| | 1129 | 494 | 1591 | 1519 | 2031 | 1750 | 1607 |
| | 229 | 810 | 75 | 32 | 1907 | 1288 | 1216 |
| | 375 | 94 | 1554 | 935 | 566 | 704 | 2153 |
| | 251 | 1888 | 1816 | 766 | 1800 | 957 | 785 |
| | 1166 | 1304 | 497 | 1257 | 373 | 1044 | 1429 |
| | 144 | 1557 | 1385 | 38 | 1135 | 1063 | 1575 |
| | 973 | 1644 | 1435 | 354 | 1875 | 1832 | 1451 |
| | 73 | 1663 | 2175 | 1894 | 1098 | 479 | 110 |
| | 219 | 176 | 2051 | 1432 | 1360 | 548 | 1344 |
| | 1698 | 1732 | 710 | 610 | 41 | 801 | 2173 |
| | 1960 | 1148 | 1944 | 1101 | 929 | 1838 | 1273 |
| | 641 | 1401 | 517 | 1188 | 979 | 907 | 1419 |
| | 1529 | 182 | 1873 | 198 | 1719 | 1676 | 642 |
| | 1579 | 1507 | 2019 | 1738 | 1595 | 323 | 2210 |
| | 63 | 20 | 1242 | 1276 | 1204 | 154 | 1841 |
| | 2195 | 923 | 554 | 692 | 1488 | 645 | 473 |
| | 1804 | 754 | 185 | 945 | 61 | 1682 | 523 |
| | 485 | 1245 | 361 | 1032 | 1417 | 1998 | 1263 |
| | 661 | 26 | 1123 | 1051 | 1563 | 1282 | 486 |
| | 2017 | 342 | 1863 | 1820 | 1439 | 820 | 748 |
| | 2163 | 1882 | 1086 | 467 | 98 | 236 | 1685 |
| | 2039 | 1420 | 1348 | 298 | 1332 | | |
| 3012 | 945 | 1581 | 1229 | 73 | 1147 | 646 | 294 |
| | 2429 | 1273 | 2588 | 1846 | 1494 | 1716 | 1793 |
| | 776 | 34 | 2694 | 2916 | 2993 | 1080 | 203 |
| | 882 | 1104 | 1181 | 2280 | 1403 | 1996 | 2733 |
| | 2381 | 468 | 2603 | 184 | 921 | 1316 | 603 |
| | 791 | 1384 | 2121 | 2516 | 1803 | 1490 | 2564 |
| | 309 | 704 | 3003 | 2690 | 752 | 10 | 2670 |
| | 1191 | 878 | 1952 | 1210 | 858 | 2646 | 1157 |
| | 140 | 2410 | 2058 | 834 | 2357 | 444 | 49 |
| | 246 | 2034 | 545 | 1644 | 1249 | 1360 | 2579 |
| | 1143 | 2844 | 2449 | 2560 | 767 | 680 | 2979 |
| | 637 | 748 | 1967 | 1880 | 1167 | 854 | 1687 |
| | 155 | 68 | 2367 | 2054 | 2887 | 2386 | 950 |
| | 555 | 1 | 1075 | 574 | 2150 | 2010 | 2931 |
| | 2275 | 1774 | 338 | 198 | 1119 | 1615 | 2425 |
| | 1538 | 1398 | 2319 | 2815 | 613 | 724 | 1943 |
| | 507 | 1003 | 1813 | 1924 | 131 | 285 | 2945 |
| | 2531 | 112 | 1331 | 1485 | 1133 | 2989 | 1051 |
| | 2049 | 2685 | 2333 | 1177 | 2251 | 1750 | 314 |
| | 521 | 2377 | 439 | 2950 | 1514 | 2820 | 2295 |
| | 1639 | 1138 | 2714 | 1008 | 1085 | 979 | 1307 |
| | 1986 | 2208 | 2285 | 2179 | 2507 | 88 | 825 |
| | 473 | 367 | 695 | 1288 | 2025 | 2661 | 2309 |
| | 1895 | 2488 | 213 | 849 | 497 | 2353 | 656 |
| | 1413 | 1808 | 1697 | 782 | 1856 | 1114 | 762 |

-continued

| Block Length N | Permutation Indices π = [π(0), π(1), . . . , π(N − 1)] | | | | | | |
|---|---|---|---|---|---|---|---|
| | 2897 | 1982 | 44 | 2314 | 1962 | 2184 | 2261 |
| | 1244 | 502 | 150 | 372 | 449 | 1548 | 671 |
| | 1350 | 1572 | 1649 | 2748 | 1871 | 2464 | 189 |
| | 2849 | 936 | 541 | 652 | 1389 | 1784 | 1071 |
| | 1741 | 1852 | 59 | 2984 | 2271 | 1958 | 20 |
| | 1259 | 1172 | 459 | 146 | 1220 | 478 | 126 |
| | 1659 | 1346 | 2420 | 1678 | 242 | 102 | 1023 |
| | 608 | 2878 | 1442 | 1302 | 2223 | 912 | 517 |
| | 2642 | 2502 | 411 | 2112 | 1717 | 1828 | 35 |
| | 1611 | 2107 | 2917 | 16 | 1235 | 1148 | 435 |
| | 1105 | 1216 | 2435 | 2589 | 1635 | 1081 | 2155 |
| | 623 | 777 | 2835 | 2281 | 343 | 2854 | 1418 |
| | 1625 | 469 | 1543 | 1042 | 2618 | 2478 | 387 |
| | 2743 | 2242 | 806 | 666 | 1587 | 2083 | 2411 |
| | 2006 | 300 | 2787 | 271 | 599 | 1192 | 1929 |
| | 975 | 1471 | 1799 | 2392 | 117 | 753 | 401 |
| | 2999 | 580 | 1317 | 1953 | 1601 | 445 | 1519 |
| | 2517 | 141 | 2801 | 1645 | 2719 | 2218 | 1866 |
| | 989 | 2845 | 907 | 406 | 54 | 276 | 353 |
| | 2348 | 1606 | 1254 | 1476 | 1553 | 2652 | 1775 |
| | 2454 | 2676 | 2753 | 840 | 2975 | 556 | 1293 |
| | 941 | 2040 | 1163 | 1756 | 2493 | 2888 | 2777 |
| | 2363 | 2956 | 681 | 1076 | 363 | 50 | 1124 |
| | 1881 | 2276 | 1563 | 1250 | 2324 | 1582 | 1230 |
| | 2763 | 2450 | 512 | 2782 | 2430 | 1206 | 2729 |
| | 1712 | 970 | 618 | 2406 | 917 | 2016 | 1621 |
| | 1818 | 594 | 2117 | 204 | 2821 | 2932 | 1139 |
| | 305 | 1404 | 1009 | 1120 | 2339 | 2252 | 1539 |
| | 2209 | 2320 | 527 | 440 | 2739 | 2426 | 488 |
| | 1727 | 1640 | 927 | 614 | 1447 | 946 | 2522 |
| | 2127 | 1814 | 2647 | 2146 | 710 | 570 | 1491 |
| | 835 | 334 | 1910 | 1770 | 2691 | 175 | 985 |
| | 98 | 2970 | 879 | 1375 | 2185 | 2296 | 503 |
| | 2079 | 2575 | 373 | 484 | 1703 | 1857 | 1505 |
| | 1573 | 1684 | 2903 | 45 | 2705 | 1549 | 2623 |
| | 1091 | 1245 | 893 | 2749 | 811 | 310 | 1886 |
| | 2093 | 937 | 2011 | 1510 | 74 | 1380 | 855 |
| | 199 | 2710 | 1274 | 2580 | 2055 | 2551 | 2879 |
| | 2474 | 768 | 845 | 739 | 1067 | 1660 | 2397 |
| | 2045 | 1939 | 2267 | 2860 | 585 | 1221 | 869 |
| | 455 | 1048 | 1785 | 2421 | 2069 | 913 | 2228 |
| | 2985 | 609 | 257 | 2113 | 416 | 2686 | 2334 |
| | 1457 | 542 | 1616 | 874 | 522 | 744 | 821 |
| | 2816 | 2074 | 1722 | 1944 | 2021 | 108 | 2243 |
| | 2922 | 132 | 209 | 1308 | 431 | 1024 | 1761 |
| | 1409 | 2508 | 1631 | 2224 | 2961 | 344 | 2643 |
| | 301 | 412 | 1149 | 1544 | 831 | 518 | 1592 |
| | 2831 | 2744 | 2031 | 1718 | 2792 | 2050 | 1698 |
| | 219 | 2918 | 980 | 238 | 2898 | 1674 | 185 |
| | 2180 | 1438 | 2 | 2874 | 783 | 2484 | 2089 |
| | 1202 | 1062 | 1983 | 672 | 277 | 388 | 1607 |
| | 171 | 1872 | 1477 | 1588 | 2807 | 2720 | 2007 |
| | 2677 | 2788 | 995 | 908 | 195 | 2653 | 715 |
| | 2195 | 2349 | 1395 | 841 | 1915 | 1414 | 2990 |
| | 2595 | 2041 | 103 | 2614 | 1178 | 1038 | 1959 |
| | 1303 | 802 | 2378 | 2238 | 147 | 643 | 1453 |
| | 566 | 426 | 1347 | 1843 | 2171 | 2764 | 971 |
| | 2547 | 31 | 359 | 952 | 1973 | 817 | 2325 |
| | 1260 | 1559 | 161 | 2017 | 513 | 340 | 2590 |
| | 1361 | 205 | 1713 | 1540 | 778 | 1077 | 619 |
| | 2913 | 2740 | 1978 | 2277 | 1819 | 1925 | 2479 |
| | 166 | 465 | 7 | 113 | 667 | 2826 | 36 |
| | 2412 | 1313 | 2108 | 1014 | 1236 | 1535 | 137 |
| | 296 | 2214 | 2436 | 2735 | 1337 | 422 | 1448 |
| | 624 | 923 | 2537 | 1622 | 2648 | 2716 | 1954 |
| | 123 | 2822 | 836 | 904 | 142 | 441 | 1188 |
| | 2036 | 2104 | 1342 | 1641 | 2388 | 1289 | 2084 |
| | 2542 | 2841 | 576 | 2489 | 272 | 2190 | 966 |
| | 1776 | 677 | 1472 | 378 | 2166 | 1381 | 1911 |
| | 2672 | 1578 | 354 | 2581 | 99 | 2798 | 812 |
| | 1554 | 769 | 1299 | 986 | 2012 | 2080 | 1318 |
| | 2499 | 2186 | 200 | 268 | 2518 | 287 | 552 |
| | 1400 | 1468 | 706 | 1487 | 1752 | 51 | 1207 |
| | 1906 | 2687 | 1747 | 1251 | 2407 | 470 | 330 |
| | 2947 | 2451 | 595 | 1670 | 1530 | 745 | 1275 |
| | 1795 | 2870 | 2730 | 1945 | 2475 | 1921 | 417 |

-continued

| Block Length N | Permutation Indices π = [π(0), π(1), . . . , π(N − 1)] | | | | | | |
|---|---|---|---|---|---|---|---|
| | 918 | 133 | 1265 | 109 | 1617 | 1444 | 682 |
| | 2465 | 1309 | 2817 | 2644 | 1882 | 2663 | 1723 |
| | 239 | 571 | 2952 | 2923 | 851 | 2427 | 70 |
| | 1140 | 1111 | 1569 | 615 | 1270 | 2846 | 1853 |
| | 2769 | 1815 | 2470 | 1034 | 41 | 220 | 85 |
| | 658 | 2234 | 1241 | 1420 | 1285 | 2793 | 2027 |
| | 2441 | 2620 | 2485 | 981 | 215 | 547 | 2928 |
| | 673 | 2181 | 1415 | 1988 | 1116 | 2292 | 1545 |
| | 2615 | 176 | 2316 | 480 | 2745 | 2393 | 2446 |
| | 504 | 1680 | 933 | 581 | 634 | 282 | 1217 |
| | 2133 | 1781 | 1834 | 1482 | 2417 | 2596 | 2702 |
| | 22 | 2682 | 3 | 784 | 890 | 1916 | 1391 |
| | 1203 | 1984 | 2090 | 104 | 61 | 152 | 846 |
| | 278 | 1304 | 1261 | 1352 | 2046 | 1656 | 909 |
| | 2461 | 2552 | 234 | 2856 | 2591 | 1757 | 1810 |
| | 1434 | 1044 | 779 | 2957 | 3010 | 2658 | 2991 |
| | 1979 | 543 | 1198 | 2774 | 1179 | 1960 | 2066 |
| | 2398 | 962 | 2379 | 148 | 254 | 1280 | 1237 |
| | 567 | 1348 | 1454 | 2480 | 2437 | 2287 | 210 |
| | 2413 | 668 | 625 | 475 | 1410 | 2827 | 755 |
| | 1825 | 1675 | 2610 | 1015 | 1955 | 519 | 1174 |
| | 798 | 2215 | 143 | 1719 | 2374 | 938 | 2355 |
| | 1343 | 2919 | 562 | 2138 | 1145 | 1324 | 1931 |
| | 2697 | 186 | 2263 | 1603 | 119 | 712 | 1526 |
| | 451 | 2803 | 1319 | 1912 | 2726 | 495 | 1733 |
| | 2519 | 100 | 914 | 1695 | 2933 | 2649 | 2350 |
| | 2114 | 485 | 1121 | 837 | 538 | 2977 | 1473 |
| | 2321 | 2037 | 1738 | 1165 | 2673 | 1608 | 2239 |
| | 2938 | 2365 | 861 | 2808 | 427 | 2779 | 1295 |
| | 2061 | 996 | 1868 | 2172 | 2495 | 76 | 1974 |
| | 56 | 360 | 683 | 1276 | 162 | 461 | 1097 |
| | 1883 | 2476 | 1362 | 1661 | 2297 | 2013 | 1714 |
| | 2562 | 2861 | 2895 | 201 | 2914 | 2582 | 596 |
| | 1083 | 1401 | 1102 | 770 | 1796 | 972 | 1844 |
| | 2302 | 1970 | 2996 | 726 | 32 | 336 | 1141 |
| | 1184 | 1926 | 1232 | 1536 | 2341 | 2452 | 1338 |
| | 2432 | 2736 | 529 | 640 | 2538 | 2837 | 2871 |
| | 1729 | 1840 | 2654 | 423 | 1059 | 1859 | 1078 |
| | 842 | 1623 | 2259 | 47 | 2278 | 1946 | 2972 |
| | 447 | 1247 | 466 | 134 | 1160 | 1902 | 967 |
| | 1666 | 1334 | 2360 | 90 | 2167 | 1507 | 505 |
| | 548 | 1290 | 355 | 2707 | 1705 | 1816 | 2630 |
| | 1555 | 895 | 2905 | 4 | 818 | 1599 | 2235 |
| | 1093 | 1204 | 2018 | 2799 | 1025 | 1223 | 442 |
| | 206 | 987 | 2225 | 2423 | 1642 | 1069 | 2577 |
| | 413 | 611 | 2842 | 2269 | 765 | 2712 | 331 |
| | 1030 | 457 | 1965 | 900 | 1531 | 871 | 2399 |
| | 153 | 2100 | 2731 | 2071 | 587 | 1180 | 1994 |
| | 919 | 259 | 1787 | 2380 | 1266 | 1565 | 2201 |
| | 2987 | 568 | 2466 | 2765 | 389 | 105 | 2818 |
| | 654 | 953 | 1589 | 1305 | 1006 | 433 | 1941 |
| | 2789 | 2505 | 2206 | 1633 | 129 | 2076 | 2948 |
| | 394 | 62 | 1088 | 264 | 1136 | 1440 | 1763 |
| | 2288 | 1464 | 2336 | 2640 | 2963 | 544 | 2442 |
| | 524 | 828 | 1151 | 1744 | 630 | 929 | 963 |
| | 2833 | 2944 | 1830 | 2129 | 2163 | 2481 | 2182 |
| | 18 | 317 | 351 | 669 | 370 | 38 | 1064 |
| | 1551 | 2351 | 1570 | 1238 | 2264 | 3006 | 2312 |
| | 2770 | 2438 | 452 | 1194 | 500 | 804 | 1609 |
| | 1652 | 2394 | 1700 | 2004 | 2809 | 2920 | 722 |
| | 2900 | 192 | 997 | 1108 | 1922 | 2703 | 327 |
| | 2197 | 2308 | 110 | 891 | 1527 | 2327 | 1546 |
| | 1310 | 2091 | 2727 | 515 | 2746 | 2173 | 428 |
| | 915 | 1715 | 934 | 361 | 1869 | 2370 | 1435 |
| | 2134 | 558 | 2115 | 1479 | 1561 | 2896 | 1898 |
| | 905 | 2679 | 2761 | 1084 | 86 | 2303 | 2023 |
| | 949 | 2284 | 1286 | 491 | 211 | 2563 | 2891 |
| | 2486 | 1209 | 1411 | 751 | 1079 | 1845 | 910 |
| | 2611 | 1951 | 2279 | 33 | 2110 | 1980 | 2693 |
| | 467 | 1233 | 298 | 168 | 881 | 245 | 2737 |
| | 1498 | 1368 | 2081 | 1445 | 925 | 2260 | 2346 |
| | 269 | 2645 | 2125 | 448 | 534 | 1185 | 1628 |
| | 313 | 1648 | 1734 | 2385 | 2828 | 120 | 2255 |
| | 2934 | 573 | 1016 | 1320 | 443 | 968 | 274 |
| | 2216 | 2520 | 1643 | 2168 | 1474 | 1344 | 2057 |
| | 2843 | 356 | 2674 | 2544 | 2655 | 2621 | 2342 |

-continued

| Block Length N | Permutation Indices π = [π(0), π(1), . . . , π(N − 1)] | | | | | | |
|---|---|---|---|---|---|---|---|
| | 862 | 732 | 843 | 809 | 530 | 1624 | 1710 |
| | 2043 | 2009 | 1730 | 2824 | 2910 | 549 | 992 |
| | 2930 | 1012 | 1098 | 2231 | 2192 | 2496 | 2101 |
| | 2298 | 419 | 380 | 684 | 289 | 332 | 2650 |
| | 1580 | 1884 | 1489 | 1532 | 838 | 2274 | 819 |
| | 2689 | 2732 | 2038 | 462 | 2019 | 1383 | 1706 |
| | 226 | 1662 | 207 | 2583 | 2906 | 988 | 3002 |
| | 1407 | 771 | 1094 | 2188 | 1190 | 395 | 115 |
| | 2053 | 376 | 2390 | 1595 | 1315 | 655 | 1465 |
| | 578 | 2795 | 2515 | 1855 | 2665 | 2949 | 2014 |
| | 703 | 43 | 853 | 1137 | 202 | 1638 | 785 |
| | 1571 | 2337 | 1402 | 2838 | 1985 | 747 | 829 |
| | 2602 | 2472 | 173 | 1947 | 2029 | 352 | 2366 |
| | 1373 | 135 | 217 | 1552 | 554 | 2289 | 2491 |
| | 1417 | 2752 | 1754 | 477 | 679 | 19 | 347 |
| | 1026 | 1677 | 1879 | 1219 | 1547 | 2313 | 1378 |
| | 67 | 2419 | 2747 | 501 | 2578 | 2448 | 149 |
| | 935 | 1701 | 766 | 636 | 1349 | 713 | 193 |
| | 1966 | 1836 | 2549 | 1913 | 1393 | 2728 | 2814 |
| | 737 | 101 | 2593 | 916 | 1002 | 1653 | 2096 |
| | 1022 | 2116 | 2202 | 2853 | 284 | 588 | 2723 |
| | 390 | 1041 | 1484 | 1788 | 911 | 1436 | 742 |
| | 2684 | 2988 | 2111 | 2636 | 1942 | 366 | 1923 |
| | 781 | 824 | 130 | 1566 | 111 | 77 | 2810 |
| | 1330 | 2766 | 1311 | 1277 | 998 | 2092 | 2178 |
| | 2511 | 2477 | 2198 | 280 | 2294 | 1499 | 1460 |
| | 386 | 1480 | 482 | 2699 | 2660 | 2964 | 2569 |
| | 1682 | 887 | 607 | 1152 | 757 | 800 | 106 |
| | 1807 | 2352 | 1957 | 2000 | 1306 | 2742 | 1287 |
| | 145 | 188 | 2506 | 930 | 2487 | 1851 | 2174 |
| | 694 | 2130 | 675 | 39 | 121 | 1456 | 458 |
| | 1875 | 1239 | 1321 | 2656 | 1658 | 863 | 583 |
| | 2521 | 844 | 2858 | 2063 | 1783 | 1123 | 1933 |
| | 1046 | 251 | 2983 | 2323 | 2651 | 405 | 2482 |
| | 1171 | 511 | 839 | 1605 | 670 | 540 | 1253 |
| | 2039 | 2805 | 1870 | 1740 | 2453 | 1215 | 1297 |
| | 58 | 2940 | 641 | 2415 | 2497 | 820 | 2834 |
| | 1841 | 1205 | 685 | 2020 | 2106 | 2757 | 2959 |
| | 1885 | 208. | | | | | |
| 336 | 249 | 279 | 290 | 170 | 48 | 264 | 186 |
| | 62 | 280 | 223 | 238 | 25 | 212 | 78 |
| | 331 | 144 | 133 | 253 | 185 | 335 | 293 |
| | 174 | 92 | 294 | 307 | 65 | 320 | 9 |
| | 66 | 215 | 107 | 226 | 117 | 147 | 158 |
| | 281 | 334 | 225 | 255 | 266 | 148 | 91 |
| | 27 | 95 | 308 | 333 | 254 | 121 | 53 |
| | 214 | 105 | 28 | 296 | 162 | 42 | 79 |
| | 136 | 68 | 270 | 217 | 120 | 311 | 228 |
| | 41 | 258 | 295 | 149 | 0 | 134 | 123 |
| | 67 | 191 | 310 | 244 | 231 | 163 | 176 |
| | 216 | 14 | 3 | 71 | 82 | 309 | 230 |
| | 29 | 246 | 81 | 43 | 124 | 110 | 324 |
| | 189 | 287 | 232 | 220 | 96 | 70 | 327 |
| | 2 | 326 | 271 | 44 | 99 | 152 | 178 |
| | 312 | 286 | 207 | 193 | 84 | 167 | 125 |
| | 315 | 301 | 58 | 5 | 233 | 114 | 285 |
| | 166 | 47 | 6 | 289 | 57 | 155 | 100 |
| | 165 | 181 | 195 | 113 | 300 | 248 | 46 |
| | 303 | 222 | 139 | 154 | 288 | 143 | 86 |
| | 180 | 128 | 262 | 115 | 196 | 76 | 318 |
| | 34 | 23 | 304 | 182 | 157 | 251 | 261 |
| | 74 | 292 | 265 | 89 | 33 | 49 | 63 |
| | 306 | 197 | 141 | 224 | 171 | 90 | 7 |
| 471 | 259 | 419 | 393 | 120 | 185 | 206 | 1 |
| | 470 | 235 | 420 | 17 | 38 | 301 | 346 |
| | 252 | 317 | 338 | 133 | 178 | 124 | 308 |
| | 170 | 433 | 269 | 384 | 140 | 339 | 364 |
| | 101 | 216 | 440 | 171 | 196 | 126 | 57 |
| | 272 | 3 | 28 | 426 | 357 | 321 | 287 |
| | 328 | 258 | 179 | 153 | 119 | 174 | 434 |
| | 11 | 453 | 180 | 245 | 266 | 61 | 106 |
| | 12 | 77 | 469 | 98 | 361 | 406 | 352 |
| | 377 | 398 | 193 | 238 | 184 | 368 | 49 |
| | 444 | 75 | 270 | 399 | 230 | 249 | 285 |
| | 102 | 231 | 62 | 81 | 117 | 32 | 256 |

-continued

| Block Length N | Permutation Indices π = [π(0), π(1), . . . , π(N − 1)] | | | | | | |
|---|---|---|---|---|---|---|---|
| | 362 | 381 | 417 | 332 | 88 | 18 | 347 |
| | 239 | 164 | 388 | 318 | 408 | 334 | 280 |
| | 190 | 379 | 240 | 166 | 112 | 121 | 137 |
| | 72 | 466 | 412 | 421 | 468 | 437 | 277 |
| | 298 | 244 | 253 | 30 | 109 | 458 | 19 |
| | 135 | 330 | 459 | 290 | 309 | 345 | 260 |
| | 246 | 141 | 122 | 177 | 291 | 316 | 221 |
| | 422 | 9 | 123 | 148 | 53 | 462 | 0 |
| | 99 | 378 | 224 | 273 | 300 | 365 | 250 |
| | 56 | 115 | 132 | 197 | 82 | 431 | 226 |
| | 432 | 29 | 382 | 263 | 58 | 218 | 337 |
| | 214 | 105 | 358 | 50 | 219 | 264 | 313 |
| | 449 | 350 | 51 | 96 | 195 | 6 | 320 |
| | 351 | 396 | 27 | 306 | 152 | 201 | 467 |
| | 327 | 138 | 452 | 33 | 60 | 125 | 10 |
| | 284 | 333 | 360 | 425 | 310 | 191 | 454 |
| | 142 | 446 | 416 | 7 | 192 | 241 | 97 |
| | 248 | 307 | 24 | 73 | 397 | 163 | 118 |
| | 95 | 373 | 279 | 463 | 209 | 165 | 324 |
| | 111 | 66 | 41 | 465 | 156 | 450 | 436 |
| | 341 | 297 | 456 | 282 | 268 | 74 | 44 |
| | 288 | 114 | | | | | |
| 504 | 467 | 350 | 154 | 208 | 237 | 70 | 121 |
| | 454 | 99 | 185 | 389 | 421 | 278 | 200 |
| | 333 | 166 | 217 | 264 | 462 | 453 | 311 |
| | 13 | 374 | 296 | 363 | 107 | 211 | 136 |
| | 54 | 159 | 426 | 7 | 455 | 24 | 142 |
| | 203 | 307 | 232 | 134 | 404 | 496 | 21 |
| | 47 | 120 | 238 | 387 | 321 | 173 | 205 |
| | 500 | 183 | 269 | 473 | 1 | 48 | 284 |
| | 417 | 250 | 301 | 158 | 42 | 33 | 395 |
| | 97 | 144 | 380 | 447 | 210 | 295 | 239 |
| | 461 | 491 | 346 | 226 | 108 | 129 | 91 |
| | 161 | 488 | 218 | 39 | 391 | 316 | 76 |
| | 204 | 225 | 187 | 131 | 471 | 146 | 68 |
| | 487 | 412 | 172 | 132 | 330 | 85 | 149 |
| | 63 | 242 | 126 | 385 | 449 | 479 | 353 |
| | 464 | 181 | 93 | 294 | 130 | 10 | 396 |
| | 41 | 71 | 430 | 272 | 2 | 213 | 175 |
| | 245 | 106 | 302 | 123 | 475 | 419 | 160 |
| | 288 | 167 | 271 | 434 | 137 | 152 | 373 |
| | 67 | 420 | 285 | 147 | 233 | 367 | 384 |
| | 502 | 352 | 381 | 163 | 494 | 326 | 437 |
| | 329 | 463 | 480 | 312 | 214 | 378 | 6 |
| | 86 | 422 | 29 | 155 | 344 | 61 | 184 |
| | 310 | 474 | 140 | 361 | 503 | 207 | 190 |
| | 402 | 157 | 280 | 393 | 452 | 340 | 369 |
| | 95 | 303 | 286 | 231 | 317 | 451 | 468 |
| | 44 | 436 | 465 | 247 | 74 | 96 | 17 |
| | 413 | 43 | 60 | 206 | 298 | 443 | 90 |
| | 440 | 28 | 145 | 258 | 287 | 192 | 170 |
| | 445 | 35 | 83 | 492 | 156 | 186 | 5 |
| | 364 | 98 | 266 | 20 | 153 | 235 | 490 |
| | 252 | 282 | 101 | 31 | 305 | 69 | 128 |
| | 249 | 331 | 82 | 483 | 466 | 111 | 133 |
| | 401 | 165 | 224 | 411 | 433 | 23 | 52 |
| | 58 | 112 | 229 | 342 | 371 | 276 | 444 |
| | 25 | 119 | 148 | 386 | 240 | 270 | 89 |
| 603 | 306 | 63 | 445 | 137 | 203 | 499 | 152 |
| | 602 | 271 | 509 | 575 | 599 | 524 | 460 |
| | 281 | 347 | 43 | 296 | 232 | 129 | 84 |
| | 415 | 68 | 113 | 501 | 456 | 94 | 302 |
| | 376 | 273 | 228 | 466 | 74 | 366 | 123 |
| | 218 | 238 | 446 | 138 | 495 | 331 | 569 |
| | 436 | 510 | 267 | 49 | 341 | 407 | 103 |
| | 39 | 421 | 222 | 179 | 475 | 128 | 64 |
| | 485 | 60 | 601 | 247 | 500 | 545 | 333 |
| | 323 | 19 | 382 | 208 | 105 | 278 | 298 |
| | 44 | 580 | 477 | 432 | 70 | 496 | 570 |
| | 249 | 204 | 332 | 50 | 342 | 99 | 481 |
| | 535 | 253 | 471 | 576 | 422 | 169 | 54 |
| | 243 | 348 | 194 | 486 | 317 | 268 | 165 |
| | 566 | 258 | 89 | 40 | 537 | 104 | 527 |
| | 461 | 412 | 309 | 476 | 600 | 299 | 502 |
| | 184 | 81 | 248 | 71 | 164 | 595 | 313 |
| | 20 | 552 | 46 | 367 | 85 | 303 | 408 |

-continued

| Block Length N | Permutation Indices π = [π(0), π(1), . . . , π(N − 1)] | | | | | | |
|---|---|---|---|---|---|---|---|
| | 418 | 139 | 457 | 75 | 180 | 26 | 318 |
| | 229 | 447 | 170 | 398 | 90 | 521 | 472 |
| | 324 | 388 | 462 | 293 | 244 | 141 | 308 |
| | 234 | 65 | 16 | 513 | 80 | 503 | 106 |
| | 452 | 209 | 86 | 135 | 378 | 517 | 240 |
| | 458 | 507 | 150 | 289 | 12 | 160 | 57 |
| | 522 | 115 | 2 | 532 | 429 | 22 | 419 |
| | 156 | 304 | 201 | 394 | 191 | 443 | 140 |
| | 573 | 56 | 563 | 487 | 512 | 269 | 146 |
| | 444 | 259 | 284 | 41 | 518 | 567 | 210 |
| | 166 | 413 | 290 | 339 | 582 | 121 | 62 |
| | 280 | 111 | 354 | 547 | 434 | 364 | 261 |
| | 126 | 265 | 588 | 136 | 33 | 116 | 23 |
| | 360 | 508 | 405 | 488 | 395 | 319 | 344 |
| | 177 | 370 | 276 | 91 | 350 | 181 | 539 |
| | 161 | 473 | 122 | 7 | 311 | 235 | 598 |
| | 112 | 335 | 48 | 379 | 17 | 260 | 286 |
| | 420 | 97 | 498 | 32 | 548 | 558 | 568 |
| | 270 | 404 | 430 | 385 | 340 | 87 | 237 |
| | 202 | 102 | 221 | 459 | 9 | 108 | 182 |
| | 484 | 231 | 381 | 371 | 554 | 67 | 326 |
| | 153 | 143 | 544 | 167 | 480 | 157 | 449 |
| | 98 | 211 | 252 | 529 | 330 | 464 | 380 |
| | 24 | 301 | 593 | 236 | 262 | 217 | 172 |
| | 365 | 8 | 34 | 534 | 53 | 291 | 441 |
| 804 | 346 | 764 | 87 | 135 | 102 | 635 | 265 |
| | 153 | 442 | 6 | 780 | 169 | 281 | 602 |
| | 716 | 443 | 73 | 669 | 24 | 554 | 569 |
| | 781 | 89 | 410 | 136 | 232 | 103 | 203 |
| | 314 | 362 | 377 | 7 | 670 | 284 | 573 |
| | 40 | 715 | 11 | 186 | 315 | 766 | 332 |
| | 719 | 92 | 219 | 267 | 234 | 767 | 397 |
| | 285 | 574 | 138 | 108 | 301 | 413 | 734 |
| | 44 | 575 | 205 | 801 | 638 | 686 | 701 |
| | 109 | 705 | 60 | 268 | 364 | 235 | 335 |
| | 446 | 494 | 509 | 139 | 239 | 416 | 543 |
| | 172 | 43 | 706 | 320 | 609 | 94 | 462 |
| | 47 | 222 | 351 | 802 | 368 | 95 | 529 |
| | 417 | 303 | 270 | 240 | 433 | 225 | 384 |
| | 176 | 144 | 337 | 449 | 770 | 14 | 29 |
| | 241 | 33 | 192 | 400 | 496 | 367 | 226 |
| | 578 | 304 | 641 | 271 | 371 | 546 | 675 |
| | 419 | 741 | 452 | 530 | 175 | 34 | 627 |
| | 354 | 112 | 79 | 179 | 130 | 773 | 290 |
| | 787 | 83 | 435 | 357 | 516 | 565 | 306 |
| | 742 | 581 | 98 | 469 | 212 | 161 | 276 |
| | 2 | 373 | 114 | 65 | 743 | 261 | 776 |
| | 20 | 532 | 84 | 3 | 678 | 436 | 403 |
| | 792 | 711 | 584 | 662 | 307 | 407 | 759 |
| | 488 | 244 | 211 | 70 | 262 | 101 | 422 |
| | 115 | 215 | 166 | 489 | 326 | 697 | 438 |
| | 471 | 393 | 552 | 601 | 344 | 52 | 408 |
| | 134 | 505 | 246 | 197 | 312 | 231 | 104 |
| | 150 | 664 | 779 | 297 | 8 | 568 | 535 |
| | 120 | 39 | 714 | 472 | 439 | 539 | 490 |
| | 620 | 698 | 343 | 202 | 795 | 717 | 72 |
| | 247 | 347 | 298 | 137 | 458 | 25 | 570 |
| | 603 | 733 | 106 | 55 | 330 | 155 | 621 |
| | 411 | 763 | 236 | 59 | 363 | 796 | 749 |
| | 140 | 333 | 107 | 233 | 492 | 541 | 526 |
| | 252 | 700 | 74 | 445 | 671 | 604 | 171 |
| | 782 | 349 | 334 | 26 | 75 | 430 | 798 |
| | 479 | 412 | 141 | 735 | 704 | 283 | 560 |
| | 687 | 238 | 606 | 187 | 464 | 657 | 431 |
| | 512 | 91 | 366 | 561 | 576 | 220 | 398 |
| | 272 | 785 | 480 | 365 | 302 | 673 | 658 |
| | 143 | 28 | 528 | 577 | 803 | 736 | 465 |
| | 110 | 481 | 707 | 640 | 207 | 562 | 126 |
| | 370 | 62 | 273 | 466 | 32 | 415 | 690 |
| | 15 | 771 | 738 | 319 | 596 | 305 | 0 |
| | 642 | 223 | 498 | 693 | 467 | 352 | 48 |
| | 531 | 579 | 1 | 497 | 227 | 113 | 404 |
| | 709 | 401 | 694 | 501 | 308 | 660 | 450 |
| | 35 | 405 | 210 | 242 | 356 | 643 | 324 |
| | 116 | 146 | 258 | 547 | 791 | 580 | 309 |
| | 162 | 451 | 132 | 484 | 51 | 99 | 325 |

-continued

| Block Length N | Permutation Indices π = [π(0), π(1), . . . , π(N − 1)] | | | | | | |
|---|---|---|---|---|---|---|---|
| | 599 | 710 | 117 | 406 | 229 | 725 | 214 |
| | 663 | 310 | 133 | 388 | 359 | 729 | 534 |
| | 37 | 533 | 22 | 149 | 440 | 470 | 582 |
| | 167 | 537 | 342 | 696 | 486 | 775 | 456 |
| | 248 | 278 | 392 | 679 | 119 | 230 | 441 |
| | 294 | 583 | 264 | 616 | 183 | 634 | 457 |
| 912 | 400 | 128 | 86 | 651 | 685 | 252 | 558 |
| | 592 | 327 | 361 | 94 | 234 | 739 | 114 |
| | 37 | 682 | 822 | 415 | 702 | 197 | 347 |
| | 498 | 464 | 751 | 785 | 23 | 321 | 98 |
| | 427 | 709 | 611 | 909 | 686 | 166 | 208 |
| | 287 | 585 | 362 | 8 | 878 | 531 | 192 |
| | 38 | 596 | 554 | 207 | 780 | 720 | 155 |
| | 230 | 795 | 456 | 396 | 743 | 295 | 43 |
| | 505 | 72 | 378 | 883 | 258 | 1 | 401 |
| | 54 | 559 | 846 | 341 | 77 | 789 | 484 |
| | 522 | 17 | 665 | 465 | 160 | 634 | 676 |
| | 755 | 141 | 748 | 310 | 352 | 87 | 121 |
| | 506 | 898 | 28 | 675 | 336 | 442 | 582 |
| | 616 | 351 | 12 | 118 | 299 | 224 | 511 |
| | 600 | 706 | 887 | 812 | 187 | 469 | 371 |
| | 563 | 488 | 775 | 145 | 545 | 345 | 122 |
| | 451 | 733 | 221 | 21 | 628 | 356 | 314 |
| | 480 | 902 | 32 | 409 | 609 | 304 | 555 |
| | 620 | 85 | 285 | 892 | 231 | 643 | 18 |
| | 873 | 568 | 819 | 319 | 606 | 726 | 529 |
| | 495 | 907 | 282 | 402 | 205 | 839 | 262 |
| | 870 | 78 | 420 | 515 | 850 | 112 | 70 |
| | 96 | 191 | 526 | 700 | 658 | 41 | 489 |
| | 202 | 376 | 334 | 877 | 165 | 854 | 111 |
| | 176 | 553 | 753 | 530 | 699 | 572 | 859 |
| | 429 | 206 | 375 | 248 | 535 | 323 | 624 |
| | 51 | 463 | 211 | 911 | 673 | 893 | 564 |
| | 426 | 546 | 349 | 569 | 240 | 662 | 704 |
| | 25 | 245 | 828 | 256 | 214 | 509 | 45 |
| | 670 | 844 | 802 | 185 | 633 | 328 | 579 |
| | 478 | 773 | 309 | 4 | 255 | 667 | 42 |
| | 897 | 674 | 843 | 716 | 91 | 750 | 180 |
| | 519 | 679 | 467 | 195 | 49 | 26 | 460 |
| | 444 | 837 | 260 | 68 | 874 | 539 | 355 |
| | 848 | 656 | 384 | 713 | 31 | 731 | 290 |
| | 60 | 389 | 619 | 407 | 796 | 901 | 482 |
| | 834 | 83 | 472 | 577 | 158 | 399 | 433 |
| | 148 | 5 | 746 | 75 | 109 | 129 | 298 |
| | 340 | 663 | 697 | 717 | 886 | 487 | 754 |
| | 373 | 393 | 562 | 163 | 430 | 95 | 450 |
| | 238 | 212 | 106 | 683 | 126 | 246 | 758 |
| | 694 | 359 | 175 | 875 | 434 | 209 | 868 |
| | 763 | 551 | 110 | 133 | 626 | 867 | 528 |
| | 698 | 721 | 302 | 543 | 204 | 597 | 20 |
| | 890 | 219 | 253 | 273 | 608 | 416 | 144 |
| | 841 | 861 | 284 | 631 | 732 | 149 | 6 |
| | 872 | 307 | 408 | 737 | 594 | 714 | 232 |
| | 84 | 413 | 270 | 390 | 820 | 677 | 424 |
| | 858 | 66 | 496 | 353 | 100 | 423 | 457 |
| | 254 | 29 | 688 | 153 | 190 | 617 | 364 |
| | 672 | 741 | 778 | 293 | 40 | 687 | 47 |
| | 454 | 217 | 710 | 363 | 635 | 119 | 194 |
| | 386 | 39 | 311 | 707 | 782 | 236 | 428 |
| | 899 | 881 | 458 | 824 | 104 | 199 | 288 |
| | 52 | 500 | 692 | 787 | 337 | 33 | 816 |
| | 368 | 90 | 13 | 621 | 492 | 173 | 2 |
| | 601 | 297 | 168 | 761 | 508 | 243 | 474 |
| | 10 | 437 | 184 | 831 | 150 | 587 | 580 |
| | 772 | 507 | 738 | 263 | 338 | 331 | 730 |
| | 414 | 851 | 14 | 380 | 406 | 294 | 756 |
| | 602 | 56 | 82 | 343 | 432 | 501 | 538 |
| | 836 | 19 | 108 | 177 | 48 | 889 | 470 |
| | 696 | 765 | 636 | 565 | 146 | 711 | 71 |
| | 312 | 241 | 734 | 387 | 659 | 641 | 136 |
| | 410 | 63 | 335 | 317 | 724 | 799 | 452 |
| 1200 | 372 | 809 | 98 | 951 | 179 | 547 | 148 |
| | 446 | 229 | 527 | 895 | 496 | 1139 | 1173 |
| | 875 | 43 | 844 | 514 | 321 | 327 | 80 |
| | 1192 | 862 | 669 | 805 | 428 | 1038 | 564 |
| | 1017 | 1153 | 776 | 186 | 328 | 149 | 638 |

-continued

| Block Length N | Permutation Indices π = [π(0), π(1), . . . , π(N − 1)] | | | | | | |
|---|---|---|---|---|---|---|---|
| | 1124 | 534 | 60 | 497 | 986 | 639 | 1067 |
| | 408 | 391 | 134 | 987 | 215 | 583 | 184 |
| | 482 | 135 | 563 | 931 | 532 | 202 | 9 |
| | 846 | 79 | 880 | 550 | 357 | 493 | 116 |
| | 28 | 898 | 705 | 841 | 464 | 912 | 600 |
| | 1053 | 1189 | 812 | 222 | 948 | 185 | 674 |
| | 1160 | 570 | 96 | 533 | 1022 | 675 | 1103 |
| | 444 | 881 | 170 | 1023 | 251 | 165 | 220 |
| | 518 | 171 | 599 | 967 | 568 | 238 | 45 |
| | 947 | 115 | 916 | 359 | 166 | 529 | 152 |
| | 64 | 934 | 741 | 747 | 500 | 1110 | 636 |
| | 1089 | 25 | 848 | 258 | 984 | 221 | 710 |
| | 1196 | 606 | 748 | 569 | 1058 | 711 | 1074 |
| | 480 | 917 | 206 | 1059 | 287 | 655 | 256 |
| | 554 | 207 | 635 | 1003 | 604 | 274 | 81 |
| | 983 | 151 | 952 | 622 | 429 | 565 | 188 |
| | 1073 | 970 | 777 | 913 | 536 | 1146 | 672 |
| | 1125 | 61 | 884 | 132 | 1020 | 257 | 746 |
| | 32 | 642 | 168 | 605 | 1094 | 877 | 1175 |
| | 516 | 953 | 242 | 1095 | 323 | 691 | 292 |
| | 590 | 243 | 671 | 310 | 117 | 640 | 1019 |
| | 591 | 658 | 465 | 988 | 167 | 224 | 187 |
| | 586 | 136 | 515 | 572 | 535 | 434 | 1145 |
| | 863 | 920 | 883 | 782 | 1039 | 97 | 330 |
| | 31 | 1130 | 641 | 445 | 678 | 204 | 783 |
| | 989 | 793 | 1026 | 552 | 1131 | 1198 | 1005 |
| | 174 | 900 | 279 | 346 | 153 | 676 | 1055 |
| | 627 | 694 | 501 | 1024 | 203 | 260 | 223 |
| | 849 | 172 | 551 | 608 | 571 | 470 | 1181 |
| | 899 | 956 | 919 | 818 | 329 | 3 | 366 |
| | 813 | 1166 | 677 | 481 | 714 | 240 | 819 |
| | 1025 | 829 | 1062 | 4 | 1167 | 1007 | 814 |
| | 210 | 936 | 315 | 382 | 189 | 712 | 1091 |
| | 663 | 730 | 537 | 1060 | 239 | 296 | 259 |
| | 885 | 208 | 522 | 644 | 607 | 506 | 17 |
| | 935 | 992 | 955 | 854 | 365 | 169 | 402 |
| | 103 | 2 | 713 | 517 | 588 | 276 | 855 |
| | 1061 | 865 | 1098 | 624 | 133 | 70 | 1077 |
| | 246 | 972 | 351 | 418 | 225 | 521 | 1127 |
| | 699 | 766 | 573 | 1096 | 275 | 332 | 1041 |
| | 921 | 244 | 623 | 680 | 643 | 542 | 53 |
| | 971 | 1028 | 991 | 890 | 401 | 205 | 438 |
| | 139 | 38 | 295 | 423 | 786 | 312 | 891 |
| | 1097 | 901 | 1134 | 660 | 39 | 106 | 1113 |
| | 282 | 424 | 387 | 784 | 735 | 630 | 593 |
| | 1183 | 1132 | 1083 | 978 | 941 | 504 | 230 |
| | 361 | 126 | 89 | 852 | 578 | 1093 | 1150 |
| | 437 | 0 | 926 | 241 | 298 | 105 | 1064 |
| | 74 | 589 | 646 | 453 | 212 | 155 | 175 |
| | 994 | 801 | 560 | 503 | 69 | 472 | 553 |
| | 908 | 851 | 871 | 820 | 771 | 666 | 629 |
| | 19 | 1168 | 1119 | 1014 | 523 | 540 | 266 |
| | 267 | 162 | 125 | 888 | 614 | 1129 | 1186 |
| | 473 | 652 | 962 | 277 | 334 | 141 | 1100 |
| | 110 | 625 | 682 | 262 | 248 | 191 | 211 |
| | 1030 | 837 | 596 | 539 | 559 | 508 | 459 |
| | 944 | 887 | 907 | 856 | 807 | 702 | 665 |
| | 55 | 977 | 1155 | 1050 | 1013 | 576 | 302 |
| | 303 | 36 | 161 | 924 | 650 | 1165 | 22 |
| | 509 | 72 | 998 | 313 | 370 | 177 | 1136 |
| | 146 | 661 | 718 | 525 | 284 | 227 | 247 |
| | 1066 | 873 | 632 | 575 | 595 | 544 | 495 |
| | 980 | 923 | 489 | 892 | 843 | 738 | 701 |
| | 91 | 40 | 1191 | 1086 | 1049 | 612 | 338 |
| | 339 | 234 | 943 | 960 | 686 | 1 | 58 |
| | 545 | 108 | 1034 | 349 | 406 | 213 | 1172 |
| | 182 | 697 | 754 | 561 | 320 | 198 | 283 |
| | 1102 | 909 | 668 | 611 | 631 | 580 | 531 |
| | 1016 | 959 | 979 | 928 | 1009 | 774 | 737 |
| | 127 | 76 | 27 | 1122 | 1085 | 648 | 374 |
| | 375 | 270 | 233 | 996 | 722 | 37 | 94 |
| | 581 | 144 | 1070 | 385 | 442 | 249 | 8 |
| | 1120 | 356 | 492 | 790 | 929 | 597 | 299 |
| | 840 | 911 | 77 | 945 | 647 | 462 | 1015 |
| | 1171 | 93 | 995 | 810 | 163 | 577 | 62 |
| | 143 | 1158 | 511 | 925 | 410 | 63 | 112 |

-continued

| Block Length N | Permutation Indices π = [π(0), π(1), . . . , π(N − 1)] | | | | | | |
|---|---|---|---|---|---|---|---|
| | 859 | 73 | 758 | 411 | 460 | 896 | 1032 |
| | 1106 | 759 | 808 | 44 | 180 | 478 | 617 |
| | 1156 | 392 | 528 | 826 | 965 | 633 | 335 |
| | 876 | 1174 | 113 | 981 | 618 | 498 | 1051 |
| | 461 | 129 | 1031 | | | | |
| 1284 | 960 | 163 | 261 | 659 | 854 | 229 | 53 |
| | 1281 | 395 | 88 | 998 | 1073 | 627 | 772 |
| | 326 | 985 | 809 | 363 | 508 | 1176 | 31 |
| | 545 | 1161 | 1026 | 912 | 18 | 1136 | 1188 |
| | 1264 | 706 | 1038 | 843 | 982 | 1160 | 949 |
| | 523 | 608 | 660 | 1147 | 1245 | 359 | 52 |
| | 454 | 883 | 981 | 95 | 1072 | 698 | 773 |
| | 157 | 1115 | 26 | 685 | 509 | 63 | 208 |
| | 544 | 421 | 245 | 861 | 726 | 670 | 1002 |
| | 1265 | 819 | 964 | 406 | 487 | 543 | 682 |
| | 700 | 84 | 223 | 308 | 360 | 847 | 945 |
| | 210 | 44 | 154 | 332 | 681 | 1079 | 1274 |
| | 1174 | 68 | 1141 | 815 | 1010 | 385 | 209 |
| | 153 | 551 | 244 | 121 | 1229 | 561 | 426 |
| | 482 | 890 | 965 | 519 | 664 | 48 | 187 |
| | 701 | 33 | 1182 | 1068 | 174 | 8 | 60 |
| | 918 | 862 | 1194 | 1028 | 1138 | 32 | 381 |
| | 679 | 735 | 874 | 19 | 841 | 515 | 710 |
| | 552 | 1039 | 1137 | 251 | 1228 | 1105 | 929 |
| | 313 | 1271 | 182 | 590 | 665 | 219 | 364 |
| | 1202 | 577 | 401 | 1017 | 882 | 768 | 1158 |
| | 137 | 975 | 1120 | 562 | 894 | 699 | 838 |
| | 856 | 240 | 379 | 435 | 516 | 1003 | 541 |
| | 366 | 200 | 252 | 739 | 837 | 1235 | 928 |
| | 46 | 224 | 13 | 971 | 1166 | 290 | 365 |
| | 309 | 707 | 400 | 717 | 582 | 101 | 136 |
| | 443 | 675 | 820 | 1121 | 374 | 594 | 1046 |
| | 556 | 857 | 892 | 79 | 1033 | 801 | 703 |
| | 628 | 66 | 769 | 537 | 439 | 1018 | 1184 |
| | 254 | 997 | 1208 | 754 | 891 | 1030 | 671 |
| | 1195 | 432 | 656 | 708 | 407 | 417 | 282 |
| | 392 | 502 | 143 | 375 | 520 | 821 | 74 |
| | 1163 | 111 | 256 | 557 | 592 | 1063 | 733 |
| | 774 | 293 | 830 | 1050 | 469 | 237 | 1172 |
| | 566 | 535 | 1238 | 697 | 908 | 396 | 591 |
| | 1225 | 993 | 895 | 132 | 356 | 408 | 107 |
| | 380 | 1210 | 92 | 202 | 1127 | 75 | 220 |
| | 1083 | 1222 | 863 | 873 | 738 | 257 | 292 |
| | 599 | 609 | 474 | 1277 | 530 | 750 | 169 |
| | 712 | 1013 | 266 | 235 | 938 | 397 | 859 |
| | 784 | 222 | 925 | 693 | 595 | 1116 | 56 |
| | 661 | 1153 | 80 | 910 | 1047 | 1186 | 827 |
| | 67 | 588 | 783 | 922 | 563 | 573 | 438 |
| | 548 | 600 | 299 | 531 | 676 | 977 | 230 |
| | 35 | 267 | 412 | 713 | 1250 | 1219 | 638 |
| | 930 | 449 | 484 | 1206 | 625 | 393 | 295 |
| | 722 | 942 | 110 | 853 | 1064 | 610 | 747 |
| | 1130 | 1149 | 1051 | 288 | 512 | 564 | 263 |
| | 787 | 24 | 248 | 300 | 1283 | 231 | 376 |
| | 1239 | 94 | 1019 | 413 | 755 | 1004 | 259 |
| | 589 | 149 | 491 | 740 | 1279 | 792 | 93 |
| | 227 | 447 | 764 | 586 | 553 | 310 | 723 |
| | 751 | 264 | 849 | 1272 | 459 | 604 | 127 |
| | 817 | 114 | 1122 | 641 | 58 | 1066 | 585 |
| | 76 | 377 | 1078 | 802 | 1045 | 455 | 148 |
| | 756 | 480 | 57 | 191 | 386 | 440 | 728 |
| | 1077 | 1211 | 122 | 147 | 464 | 423 | 794 |
| | 640 | 1196 | 451 | 159 | 781 | 1111 | 304 |
| | 1220 | 957 | 517 | 1098 | 822 | 341 | 1042 |
| | 2 | 583 | 1060 | 77 | 778 | 444 | 745 |
| | 294 | 1097 | 456 | 180 | 1041 | 1175 | 86 |
| | 250 | 1258 | 777 | 911 | 1106 | 1131 | 415 |
| | 1237 | 647 | 340 | 896 | 151 | 921 | 481 |
| | 578 | 632 | 920 | 657 | 217 | 798 | 522 |
| | 907 | 615 | 986 | 283 | 760 | 1061 | 478 |
| | 973 | 270 | 1278 | 797 | 156 | 1164 | 741 |
| | 232 | 533 | 1234 | 958 | 1201 | 611 | 806 |
| | 970 | 636 | 937 | 347 | 40 | 596 | 1135 |
| | 1233 | 83 | 278 | 303 | 620 | 579 | 950 |
| | 796 | 39 | 607 | 315 | 686 | 1267 | 460 |
| | 343 | 1113 | 673 | 1254 | 978 | 497 | 1140 |

-continued

| Block Length N | Permutation Indices π = [π(0), π(1), . . . , π(N − 1)] | | | | | | |
|---|---|---|---|---|---|---|---|
| | 158 | 990 | 1216 | 233 | 934 | 658 | 901 |
| | 612 | 807 | 1099 | 952 | 4 | 296 | 1165 |
| | 835 | 186 | 1024 | 3 | 650 | 1150 | 109 |
| | 1262 | 1052 | 637 | 828 | 405 | 803 | 461 |
| | 373 | 622 | 141 | 539 | 197 | 954 | 898 |
| | 601 | 275 | 1217 | 690 | 634 | 771 | 812 |
| | 953 | 175 | 312 | 507 | 799 | 652 | 988 |
| | 106 | 21 | 284 | 1170 | 1226 | 987 | 350 |
| | 20 | 124 | 962 | 752 | 337 | 528 | 105 |
| | 196 | 488 | 73 | 322 | 1125 | 239 | 1181 |
| | 842 | 0 | 301 | 1259 | 917 | 139 | 334 |
| | 597 | 995 | 653 | 1159 | 12 | 1269 | 499 |
| | 389 | 1146 | 1090 | 1005 | 1268 | 870 | 926 |
| | 826 | 963 | 1255 | 1108 | 662 | 452 | 37 |
| | 991 | 342 | 1180 | 188 | 1057 | 22 | 265 |
| | 134 | 1179 | 542 | 984 | 1 | 959 | 617 |
| | 529 | 720 | 297 | 695 | 353 | 1110 | 996 |
| | 757 | 431 | 89 | 846 | 790 | 927 | 968 |
| | 1109 | 331 | 526 | 663 | 955 | 808 | 362 |
| | 204 | 177 | 691 | 42 | 880 | 1143 | 506 |
| | 176 | 280 | 1118 | | | | |
| 1539 | 1423 | 817 | 723 | 1532 | 300 | 162 | 178 |
| | 1538 | 1300 | 894 | 518 | 1060 | 862 | 879 |
| | 42 | 1202 | 208 | 10 | 27 | 226 | 1065 |
| | 892 | 801 | 1391 | 1445 | 213 | 1463 | 158 |
| | 539 | 593 | 897 | 1253 | 842 | 235 | 1165 |
| | 152 | 401 | 456 | 919 | 313 | 219 | 1028 |
| | 1140 | 67 | 997 | 796 | 390 | 14 | 556 |
| | 145 | 1480 | 1074 | 698 | 1240 | 1042 | 1059 |
| | 222 | 1382 | 1537 | 388 | 297 | 207 | 941 |
| | 996 | 858 | 981 | 35 | 89 | 393 | 749 |
| | 129 | 719 | 773 | 1184 | 1433 | 1488 | 415 |
| | 922 | 332 | 581 | 636 | 1099 | 493 | 292 |
| | 623 | 1320 | 247 | 1177 | 976 | 570 | 194 |
| | 931 | 325 | 124 | 1254 | 878 | 1420 | 1329 |
| | 915 | 402 | 492 | 354 | 477 | 1067 | 1121 |
| | 1176 | 1038 | 1161 | 215 | 1536 | 269 | 680 |
| | 186 | 202 | 899 | 418 | 1364 | 77 | 132 |
| | 903 | 1102 | 512 | 761 | 816 | 1279 | 673 |
| | 1089 | 803 | 1034 | 427 | 1357 | 1156 | 750 |
| | 182 | 1111 | 505 | 411 | 1434 | 1524 | 1386 |
| | 1189 | 1095 | 368 | 672 | 534 | 657 | 1247 |
| | 1052 | 1356 | 1218 | 1234 | 395 | 1450 | 860 |
| | 580 | 382 | 399 | 598 | 8 | 257 | 312 |
| | 1083 | 1282 | 585 | 299 | 530 | 1459 | 853 |
| | 1269 | 983 | 1214 | 607 | 1 | 1443 | 930 |
| | 362 | 1291 | 685 | 591 | 1400 | 168 | 30 |
| | 1369 | 1275 | 548 | 852 | 714 | 730 | 1427 |
| | 1232 | 1070 | 76 | 1414 | 1431 | 94 | 1040 |
| | 760 | 562 | 579 | 778 | 188 | 1331 | 26 |
| | 1353 | 516 | 479 | 1444 | 939 | 1033 | 765 |
| | 1163 | 378 | 87 | 181 | 1449 | 1394 | 787 |
| | 771 | 865 | 597 | 1008 | 1471 | 44 | 923 |
| | 1388 | 156 | 619 | 728 | 927 | 1126 | 910 |
| | 1303 | 90 | 75 | 274 | 58 | 398 | 827 |
| | 759 | 1493 | 742 | 1082 | 1511 | 940 | 435 |
| | 1533 | 696 | 659 | 1410 | 1119 | 1213 | 945 |
| | 449 | 558 | 267 | 361 | 93 | 504 | 967 |
| | 844 | 1045 | 884 | 1188 | 115 | 224 | 423 |
| | 32 | 336 | 799 | 1122 | 1107 | 1306 | 1090 |
| | 1483 | 270 | 255 | 989 | 238 | 578 | 1007 |
| | 83 | 137 | 1029 | 192 | 155 | 906 | 615 |
| | 177 | 876 | 1481 | 54 | 1299 | 1393 | 1125 |
| | 629 | 738 | 340 | 541 | 380 | 684 | 1147 |
| | 1024 | 1225 | 1064 | 1368 | 295 | 618 | 603 |
| | 212 | 50 | 979 | 1302 | 1287 | 485 | 1270 |
| | 127 | 450 | 1115 | 1169 | 525 | 1224 | 1187 |
| | 263 | 317 | 1209 | 372 | 977 | 1086 | 795 |
| | 357 | 1056 | 125 | 234 | 1372 | 37 | 1412 |
| | 809 | 918 | 520 | 721 | 560 | 864 | 1327 |
| | 1204 | 1405 | 1244 | 12 | 475 | 798 | 783 |
| | 285 | 230 | 1159 | 1482 | 611 | 665 | 21 |
| | 307 | 416 | 1295 | 1349 | 705 | 1404 | 473 |
| | 443 | 1498 | 1389 | 552 | 1157 | 1266 | 975 |
| | 430 | 770 | 305 | 414 | 16 | 217 | 56 |
| | 347 | 1312 | 700 | 901 | 740 | 1044 | 1507 |

-continued

| Block Length N | Permutation Indices π = [π(0), π(1), . . . , π(N − 1)] | | | | | | |
|---|---|---|---|---|---|---|---|
| | 460 | 49 | 1031 | 1262 | 279 | 602 | 161 |
| | 179 | 410 | 107 | 216 | 596 | 900 | 1094 |
| | 1149 | 1323 | 1280 | 48 | 708 | 565 | 1475 |
| | 642 | 266 | 1392 | 1249 | 1479 | 1446 | 1337 |
| | 540 | 397 | 627 | 808 | 1379 | 826 | 610 |
| | 1311 | 1492 | 527 | 1510 | 1294 | 151 | 813 |
| | 1211 | 1193 | 549 | 835 | 1497 | 135 | 92 |
| | 1233 | 1519 | 645 | 819 | 776 | 1080 | 204 |
| | 1436 | 1503 | 138 | 1298 | 888 | 745 | 119 |
| | 822 | 446 | 36 | 1429 | 123 | 304 | 875 |
| | 254 | 577 | 807 | 988 | 23 | 1006 | 790 |
| | 1491 | 136 | 707 | 689 | 45 | 331 | 993 |
| | 497 | 1373 | 729 | 1015 | 141 | 315 | 272 |
| | 1413 | 163 | 932 | 999 | 956 | 794 | 384 |
| | 80 | 40 | 318 | 1478 | 1068 | 925 | 1155 |
| | 1002 | 626 | 1286 | 73 | 303 | 484 | 1055 |
| | 434 | 757 | 987 | 1168 | 203 | 185 | 1077 |
| | 815 | 102 | 887 | 869 | 225 | 511 | 1173 |
| | 677 | 17 | 909 | 1195 | 428 | 495 | 452 |
| | 1486 | 343 | 1112 | 1072 | 1350 | 974 | 564 |
| | 260 | 220 | 498 | 122 | 782 | 1105 | 1335 |
| | 1182 | 1272 | 1466 | 253 | 483 | 664 | 1235 |
| | 614 | 937 | 311 | 1134 | 383 | 365 | 1257 |
| | 995 | 282 | 173 | 1049 | 405 | 691 | 1460 |
| | 857 | 1198 | 982 | 1375 | 608 | 568 | 846 |
| | 130 | 523 | 1292 | 1252 | 1530 | 1154 | 278 |
| | 440 | 400 | 678 | 768 | 962 | 1285 | 1515 |
| | 1148 | 1452 | 110 | 433 | 1343 | 630 | 1415 |
| | 1260 | 1117 | 491 | 1314 | 1205 | 545 | 1437 |
| | 980 | 478 | 353 | 871 | 1175 | 265 | 694 |
| | 1037 | 19 | 1179 | 949 | 1378 | 1502 | 1310 |
| | 327 | 97 | 526 | 650 | 458 | 1192 | 513 |
| | 209 | 264 | 1142 | 126 | 1197 | 1371 | 644 |
| | 756 | 810 | 345 | 519 | 1328 | 933 | 701 |
| | 1136 | 1096 | 476 | 81 | 1385 | 367 | 671 |
| | 1374 | 658 | 533 | 1051 | 675 | 445 | 874 |
| | 575 | 199 | 1359 | 1129 | 22 | 146 | 1490 |
| | 507 | 277 | 1241 | 830 | 638 | 1158 | 693 |
| | 389 | 444 | 252 | 306 | 1377 | 15 | 824 |
| | 936 | 990 | 632 | 592 | 1508 | 1113 | 881 |
| | 1316 | 1276 | 870 | 154 | 29 | 547 | 171 |
| | 18 | 838 | 71 | 1231 | 855 | 625 | 1054 |
| | 755 | 379 | 3 | 1309 | 737 | 326 | 134 |
| | 1367 | 457 | 1421 | 1476 | 1284 | 1338 | 873 |
| | 569 | 624 | 432 | 486 | 128 | 88 | 1004 |
| | 1116 | 1170 | 812 | 772 | 366 | 1186 | 1061 |
| | 1496 | 1456 | 1050 | 334 | 1103 | 727 | 351 |
| | 198 | 1018 | 251 | 1411 | 1035 | 805 | 233 |
| | 935 | 559 | 863 | 1489 | 917 | 972 | 314 |
| | 11 | 637 | 65 | 120 | 1464 | 1518 | 1160 |
| | 214 | 804 | 612 | 666 | 308 | 268 | 1398 |
| | 1296 | 28 | 992 | 952 | 546 | 1366 | 599 |
| | 33 | 100 | 1230 | 514 | 1283 | 907 | 531 |
| | 164 | 1305 | 431 | 55 | 359 | 985 | 413 |
| | 221 | 739 | 1043 | 133 | 1097 | 1152 | |
| 1759 | 947 | 1580 | 1738 | 624 | 1032 | 496 | 1650 |
| | 1758 | 286 | 924 | 446 | 796 | 198 | 1069 |
| | 1224 | 746 | 1096 | 498 | 1369 | 1001 | 543 |
| | 1396 | 798 | 1669 | 1301 | 843 | 7 | 465 |
| | 217 | 1601 | 1143 | 307 | 765 | 695 | 1328 |
| | 1443 | 607 | 1065 | 995 | 1628 | 34 | 672 |
| | 932 | 1295 | 176 | 334 | 106 | 494 | 844 |
| | 476 | 634 | 1272 | 794 | 1144 | 546 | 1417 |
| | 1572 | 1094 | 1752 | 1444 | 846 | 1717 | 1349 |
| | 1394 | 1744 | 1146 | 265 | 1649 | 1191 | 355 |
| | 1446 | 565 | 197 | 1491 | 655 | 1113 | 1043 |
| | 497 | 39 | 955 | 1413 | 1343 | 224 | 382 |
| | 1255 | 1713 | 1643 | 524 | 682 | 1320 | 842 |
| | 191 | 824 | 982 | 1620 | 1142 | 1492 | 894 |
| | 1282 | 168 | 1442 | 40 | 1194 | 313 | 1697 |
| | 1742 | 340 | 1494 | 613 | 1756 | 245 | 1539 |
| | 640 | 42 | 913 | 545 | 87 | 1003 | 1461 |
| | 1213 | 845 | 387 | 1303 | 9 | 1691 | 572 |
| | 687 | 1603 | 309 | 239 | 872 | 1030 | 1668 |
| | 609 | 539 | 1172 | 1330 | 216 | 1490 | 88 |
| | 1472 | 1630 | 516 | 38 | 388 | 1542 | 661 |

-continued

| Block Length N | Permutation Indices π = [π(0), π(1), . . . , π(N − 1)] | | | | | | |
|---|---|---|---|---|---|---|---|
| | 816 | 338 | 688 | 90 | 961 | 593 | 135 |
| | 988 | 390 | 1261 | 893 | 435 | 1351 | 1755 |
| | 690 | 1561 | 1193 | 735 | 1651 | 357 | 287 |
| | 1493 | 1035 | 199 | 657 | 587 | 1220 | 1378 |
| | 459 | 957 | 887 | 1520 | 1678 | 564 | 972 |
| | 1187 | 68 | 226 | 864 | 386 | 736 | 138 |
| | 526 | 1164 | 686 | 1036 | 438 | 1309 | 941 |
| | 986 | 1336 | 738 | 1609 | 1241 | 783 | 1699 |
| | 1038 | 157 | 1541 | 1083 | 247 | 705 | 635 |
| | 457 | 89 | 1383 | 547 | 1005 | 935 | 1568 |
| | 1683 | 847 | 1305 | 1235 | 116 | 274 | 46 |
| | 1605 | 1535 | 416 | 574 | 1212 | 734 | 1084 |
| | 716 | 874 | 1512 | 1034 | 1384 | 786 | 1657 |
| | 60 | 1334 | 1684 | 1086 | 205 | 1589 | 1131 |
| | 232 | 1386 | 505 | 137 | 1431 | 595 | 1053 |
| | 805 | 437 | 1731 | 895 | 1353 | 1283 | 164 |
| | 737 | 279 | 1195 | 1653 | 1583 | 464 | 622 |
| | 1495 | 201 | 131 | 764 | 922 | 1560 | 1082 |
| | 431 | 1064 | 1222 | 108 | 1382 | 1732 | 1134 |
| | 1522 | 408 | 1682 | 280 | 1434 | 553 | 185 |
| | 230 | 580 | 1734 | 853 | 485 | 27 | 943 |
| | 282 | 1153 | 785 | 327 | 1243 | 1701 | 1631 |
| | 1085 | 627 | 1543 | 249 | 179 | 812 | 970 |
| | 927 | 91 | 549 | 479 | 1112 | 1270 | 156 |
| | 849 | 779 | 1412 | 1570 | 456 | 1730 | 328 |
| | 1712 | 118 | 756 | 278 | 628 | 30 | 901 |
| | 1056 | 578 | 928 | 330 | 1201 | 833 | 375 |
| | 1228 | 630 | 1501 | 1133 | 675 | 1591 | 297 |
| | 49 | 1433 | 975 | 139 | 597 | 527 | 1160 |
| | 1275 | 439 | 897 | 827 | 1460 | 1618 | 504 |
| | 1197 | 1127 | 8 | 1485 | 804 | 326 | 676 |
| | 308 | 466 | 1104 | 626 | 976 | 378 | 1249 |
| | 1404 | 926 | 1276 | 678 | 1549 | 1181 | 723 |
| | 1576 | 978 | 97 | 1481 | 1023 | 187 | 645 |
| | 397 | 29 | 1323 | 487 | 945 | 875 | 1508 |
| | 1623 | 787 | 1245 | 1175 | 56 | 214 | 852 |
| | 1545 | 1475 | 356 | 514 | 1152 | 674 | 1024 |
| | 656 | 814 | 1452 | 974 | 1324 | 726 | 1597 |
| | 0 | 1274 | 1624 | 1026 | 145 | 1529 | 1071 |
| | 172 | 1326 | 445 | 77 | 1371 | 535 | 993 |
| | 745 | 377 | 1671 | 835 | 1293 | 1223 | 104 |
| | 219 | 1135 | 1593 | 1523 | 404 | 562 | 1200 |
| | 141 | 71 | 704 | 862 | 1500 | 1022 | 1372 |
| | 1004 | 1162 | 48 | 1322 | 1672 | 1074 | 193 |
| | 348 | 1622 | 220 | 1374 | 493 | 125 | 1419 |
| | 520 | 1674 | 793 | 425 | 1719 | 883 | 1341 |
| | 1093 | 725 | 267 | 1183 | 1641 | 1571 | 452 |
| | 567 | 1483 | 189 | 119 | 752 | 910 | 1548 |
| | 489 | 419 | 1465 | 1210 | 96 | 1370 | 1720 |
| | 1352 | 1510 | 396 | 1670 | 268 | 1422 | 541 |
| | 696 | 218 | 568 | 1722 | 841 | 473 | 15 |
| | 868 | 270 | 1141 | 773 | 315 | 1231 | 1689 |
| | 1441 | 1073 | 615 | 1531 | 237 | 167 | 800 |
| | 915 | 79 | 537 | 467 | 1100 | 1258 | 144 |
| | 837 | 767 | 1400 | 1558 | 444 | 1718 | 316 |
| | 1700 | 1425 | 744 | 266 | 616 | 18 | 889 |
| | 1044 | 566 | 916 | 318 | 1189 | 821 | 363 |
| | 1216 | 618 | 1489 | 1121 | 663 | 1579 | 285 |
| | 37 | 1421 | 963 | 127 | 585 | 515 | 1148 |
| | 1263 | 427 | 885 | 815 | 1448 | 1606 | 492 |
| | 1185 | 1115 | 1748 | 154 | 792 | 314 | 664 |
| | 296 | 454 | 1092 | 614 | 964 | 366 | 1237 |
| | 1392 | 914 | 1264 | 666 | 1537 | 1169 | 711 |
| | 1564 | 966 | 85 | 1469 | 1011 | 175 | 633 |
| | 385 | 17 | 1311 | 475 | 933 | 863 | 1496 |
| | 775 | 412 | 202 | 44 | 1611 | 1233 | 1163 |
| | 502 | 344 | 159 | 1533 | 1463 | 1140 | 1285 |
| | 26 | 81 | 11 | 1440 | 1585 | 1217 | 714 |
| | 311 | 1740 | 133 | 1517 | 1014 | 1562 | 223 |
| | 433 | 65 | 1314 | 110 | 523 | 160 | 1702 |
| | 1614 | 410 | 823 | 460 | 250 | 92 | 1659 |
| | 1123 | 760 | 550 | 392 | 207 | 1581 | 1511 |
| | 850 | 692 | 507 | 129 | 59 | 1488 | 1633 |
| | 807 | 429 | 359 | 36 | 181 | 1565 | 1062 |
| | 659 | 336 | 481 | 113 | 1362 | 158 | 571 |
| | 781 | 413 | 1662 | 458 | 871 | 508 | 298 |

-continued

| Block Length N | Permutation Indices π = [π(0), π(1), . . . , π(N − 1)] | | | | | | |
|---|---|---|---|---|---|---|---|
| | 210 | 758 | 1171 | 808 | 598 | 440 | 255 |
| | 1471 | 1108 | 898 | 740 | 555 | 177 | 107 |
| | 1198 | 1040 | 855 | 477 | 407 | 84 | 229 |
| | 1155 | 777 | 707 | 384 | 529 | 161 | 1410 |
| | 1007 | 684 | 829 | 461 | 1710 | 506 | 919 |
| | 1129 | 761 | 258 | 806 | 1219 | 856 | 646 |
| | 225 | 788 | 155 | 946 | 603 | 1429 | 1061 |
| | 455 | 1246 | 903 | 1729 | 1361 | 67 | 1406 |
| | 1203 | 277 | 1661 | 367 | 1706 | 4 | 1458 |
| | 209 | 667 | 254 | 304 | 6 | 166 | 992 |
| | 554 | 604 | 306 | 1332 | 1725 | 536 | 1655 |
| | 606 | 1632 | 273 | 836 | 203 | 994 | 651 |
| | 573 | 1136 | 503 | 1294 | 951 | 25 | 1409 |
| | 803 | 1594 | 1251 | 325 | 1709 | 415 | 2 |
| | 1551 | 625 | 257 | 715 | 302 | 352 | 54 |
| | 557 | 1015 | 602 | 652 | 354 | 1380 | 21 |
| | 902 | 126 | 654 | 1680 | 321 | 884 | 251 |
| | 954 | 228 | 621 | 1184 | 551 | 1342 | 999 |
| | 921 | 1484 | 851 | 1642 | 1299 | 373 | 5 |
| | 1151 | 190 | 1599 | 673 | 305 | 763 | 350 |
| | 147 | 1063 | 1451 | 332 | 973 | 1128 | 69 |
| | 1751 | 632 | 1273 | 1428 | 369 | 1090 | 1250 |
| | 1573 | 1728 | 669 | 1390 | 1550 | 1600 | 1002 |
| | 969 | 1690 | 98 | 148 | 1302 | 53 | 1347 |
| | 398 | 448 | 1602 | 353 | 1647 | 811 | 1199 |
| | 150 | 653 | 195 | 1111 | 1499 | 380 | 1021 |
| | 1411 | 47 | 1321 | 680 | 953 | 998 | 417 |
| | 1621 | 980 | 1253 | 1298 | 717 | 1648 | 1095 |
| | 1553 | 1598 | | | | | |
| 1884 | 1702 | 487 | 633 | 683 | 170 | 1046 | 1325 |
| | 765 | 815 | 208 | 1178 | 1457 | 1641 | 1758 |
| | 340 | 1357 | 1589 | 1773 | 100 | 1800 | 774 |
| | 1721 | 303 | 232 | 48 | 906 | 1184 | 346 |
| | 270 | 1594 | 991 | 1551 | 948 | 1100 | 1293 |
| | 1123 | 1683 | 1080 | 1279 | 1801 | 1475 | 962 |
| | 742 | 1411 | 1557 | 1607 | 1094 | 86 | 365 |
| | 1689 | 1739 | 1132 | 218 | 497 | 681 | 798 |
| | 1264 | 397 | 629 | 1095 | 1024 | 840 | 1698 |
| | 761 | 1227 | 1156 | 972 | 1830 | 224 | 1270 |
| | 1194 | 634 | 31 | 591 | 1872 | 140 | 709 |
| | 210 | 488 | 120 | 319 | 841 | 515 | 2 |
| | 1666 | 451 | 597 | 647 | 134 | 1010 | 1289 |
| | 729 | 779 | 172 | 1189 | 1421 | 1605 | 1722 |
| | 398 | 1321 | 1553 | 135 | 64 | 1764 | 738 |
| | 1685 | 267 | 102 | 1426 | 870 | 1383 | 310 |
| | 234 | 1558 | 955 | 1515 | 912 | 1064 | 1633 |
| | 1134 | 1412 | 574 | 1243 | 1765 | 1439 | 926 |
| | 706 | 1328 | 1521 | 1571 | 1058 | 50 | 329 |
| | 145 | 1703 | 1096 | 229 | 461 | 645 | 856 |
| | 1322 | 361 | 593 | 1059 | 988 | 804 | 1662 |
| | 725 | 909 | 1026 | 466 | 1747 | 423 | 1704 |
| | 1158 | 598 | 1879 | 555 | 1836 | 151 | 673 |
| | 174 | 452 | 1498 | 283 | 429 | 479 | 1850 |
| | 1630 | 368 | 561 | 611 | 4 | 974 | 1253 |
| | 1069 | 743 | 136 | 1153 | 1385 | 1851 | 1780 |
| | 362 | 1238 | 1517 | 99 | 28 | 1728 | 702 |
| | 1649 | 1833 | 66 | 1390 | 787 | 1347 | 744 |
| | 292 | 108 | 919 | 1244 | 876 | 1075 | 1597 |
| | 1098 | 1376 | 538 | 1207 | 1353 | 1403 | 890 |
| | 1140 | 1292 | 1485 | 1535 | 928 | 61 | 293 |
| | 109 | 1667 | 1060 | 193 | 425 | 891 | 820 |
| | 1286 | 278 | 557 | 1023 | 858 | 298 | 1626 |
| | 689 | 873 | 990 | 430 | 1711 | 387 | 1668 |
| | 1216 | 1032 | 6 | 284 | 1330 | 115 | 637 |
| | 138 | 416 | 1462 | 200 | 393 | 443 | 1814 |
| | 332 | 826 | 783 | 180 | 575 | 1401 | 1612 |
| | 680 | 312 | 707 | 1815 | 1744 | 1349 | 326 |
| | 839 | 1665 | 1782 | 1481 | 364 | 619 | 1202 |
| | 30 | 1613 | 496 | 751 | 1381 | 1429 | 907 |
| | 722 | 930 | 1513 | 1185 | 1039 | 72 | 1208 |
| | 1598 | 1317 | 1124 | 1618 | 1340 | 502 | 1367 |
| | 1256 | 1750 | 1707 | 1104 | 1499 | 723 | 652 |
| | 1604 | 766 | 1631 | 855 | 784 | 389 | 1250 |
| | 1763 | 705 | 822 | 521 | 1288 | 1543 | 242 |
| | 1048 | 653 | 1514 | 1675 | 421 | 469 | 1831 |
| | 1646 | 1854 | 553 | 225 | 79 | 996 | 248 |

-continued

| Block Length N | Permutation Indices π = [π(0), π(1), . . . , π(N − 1)] | | | | | | |
|---|---|---|---|---|---|---|---|
| | 638 | 357 | 164 | 658 | 615 | 12 | 407 |
| | 343 | 790 | 747 | 144 | 539 | 1647 | 1576 |
| | 644 | 1690 | 671 | 1779 | 1614 | 1313 | 196 |
| | 803 | 1629 | 1746 | 1445 | 328 | 583 | 1166 |
| | 88 | 1577 | 554 | 762 | 1345 | 1393 | 871 |
| | 686 | 894 | 1430 | 1149 | 956 | 36 | 1172 |
| | 1562 | 1657 | 1088 | 1582 | 1539 | 936 | 1331 |
| | 1267 | 300 | 1671 | 1068 | 1463 | 687 | 616 |
| | 1568 | 730 | 1595 | 537 | 654 | 353 | 1120 |
| | 1727 | 669 | 786 | 485 | 1252 | 1507 | 253 |
| | 1012 | 617 | 1478 | 1686 | 385 | 57 | 1795 |
| | 1516 | 1818 | 470 | 189 | 1880 | 490 | 212 |
| | 602 | 697 | 128 | 622 | 579 | 1860 | 371 |
| | 307 | 1224 | 476 | 1522 | 503 | 1611 | 1540 |
| | 608 | 1654 | 635 | 1461 | 1578 | 1277 | 160 |
| | 767 | 1593 | 1804 | 1409 | 386 | 547 | 1177 |
| | 52 | 1541 | 518 | 726 | 1309 | 981 | 835 |
| | 556 | 811 | 1394 | 1113 | 920 | 1414 | 1371 |
| | 1573 | 1621 | 1099 | 1546 | 1503 | 900 | 1295 |
| | 1231 | 264 | 1400 | 562 | 1427 | 651 | 486 |
| | 1532 | 694 | 1559 | 501 | 618 | 317 | 1084 |
| | 1691 | 844 | 449 | 1823 | 660 | 958 | 265 |
| | 581 | 71 | 792 | 1090 | 21 | 302 | 1712 |
| | 1844 | 897 | 434 | 1735 | 1014 | 713 | 1692 |
| | 613 | 1867 | 1240 | 845 | 1824 | 1056 | 661 |
| | 1372 | 977 | 1486 | 1188 | 417 | 599 | 1876 |
| | 204 | 850 | 549 | 731 | 124 | 939 | 535 |
| | 1057 | 863 | 350 | 836 | 667 | 1839 | 1141 |
| | 388 | 968 | 752 | 87 | 1226 | 690 | 1806 |
| | 884 | 1821 | 1358 | 775 | 54 | 1637 | 732 |
| | 1537 | 954 | 280 | 1769 | 394 | 96 | 1585 |
| | 412 | 17 | 526 | 228 | 1341 | 1523 | 916 |
| | 1128 | 1774 | 1849 | 1655 | 1142 | 1863 | 1459 |
| | 97 | 1787 | 1274 | 1760 | 1591 | 879 | 181 |
| | 1312 | 243 | 1676 | 1011 | 266 | 1567 | 846 |
| | 1855 | 861 | 445 | 1699 | 978 | 677 | 1656 |
| | 577 | 1878 | 1204 | 809 | 1318 | 1020 | 249 |
| | 1242 | 941 | 1450 | 1152 | 381 | 563 | 1840 |
| | 168 | 814 | 889 | 695 | 182 | 668 | 499 |
| | 1021 | 827 | 314 | 800 | 584 | 1803 | 1105 |
| | 352 | 1167 | 716 | 1653 | 1190 | 607 | 1770 |
| | 895 | 1785 | 1369 | 739 | 112 | 1601 | 696 |
| | 1501 | 918 | 244 | 1733 | 358 | 60 | 1173 |
| | 282 | 1865 | 960 | 1606 | 1305 | 1487 | 880 |
| | 1092 | 1738 | 1813 | 1619 | 1106 | 1592 | 1423 |
| | 1569 | 1751 | 1144 | 1724 | 1508 | 843 | 98 |
| | 1276 | 207 | 1640 | 693 | 230 | 1531 | 810 |
| | 1819 | 825 | 409 | 1710 | 1036 | 641 | 1150 |
| | 541 | 1842 | 1168 | 773 | 1282 | 984 | 213 |
| | 1206 | 905 | 0 | 646 | 721 | 527 | 14 |
| | 132 | 778 | 853 | 659 | 146 | 632 | 463 |
| | 609 | 791 | 184 | 999 | 548 | 1767 | 1022 |
| | 316 | 1131 | 727 | 1617 | 1154 | 571 | 1734 |
| | 859 | 147 | 1333 | 750 | 76 | 1565 | 190 |
| | 1418 | 882 | 114 | 1697 | 322 | 24 | 1137 |
| | 246 | 1829 | 924 | 1570 | 1645 | 1451 | 938 |
| | 586 | 288 | 1777 | 1556 | 1861 | 420 | 1533 |
| | 1070 | 39 | 62 | 82 | 157 | 1715 | 341 |
| | 241 | 214 | 289 | 1847 | 473 | 1495 | 1452 |
| | 45 | 95 | 605 | 1674 | 1114 | 1071 | 1783 |
| | 737 | 1759 | 1246 | 1203 | 1868 | 1038 | 1504 |
| | 1848 | 1053 | 163 | 1170 | 1636 | 464 | 769 |
| | 295 | 1396 | 1862 | 596 | 854 | 1344 | 573 |
| | 16 | 963 | 986 | 1006 | 1081 | 755 | 1265 |
| | 1165 | 1608 | 1213 | 887 | 1397 | 582 | 22 |
| | 969 | 1019 | 1529 | 714 | 154 | 111 | 823 |
| | 1661 | 799 | 756 | 1845 | 908 | 78 | 544 |
| | 888 | 93 | 1087 | 304 | 770 | 1388 | 1693 |
| | 1219 | 436 | 902 | 1755 | 1778 | 1798 | 1497 |
| | 940 | 3 | 26 | 46 | 121 | 1679 | 305 |
| | 205 | 648 | 1761 | 1811 | 437 | 1506 | 946 |
| | 9 | 59 | 569 | 1638 | 1078 | 1035 | 1700 |
| | 701 | 1723 | 1680 | 885 | 1832 | 1002 | 1468 |
| | 1812 | 1017 | 127 | 1228 | 1694 | 428 | 733 |
| | 259 | 1360 | 1826 | 795 | 818 | 838 | 913 |
| | 1864 | 927 | 997 | 970 | 1045 | 719 | 1229 |

-continued

| Block Length N | Permutation Indices π = [π(0), π(1), . . . , π(N − 1)] | | | | | | |
|---|---|---|---|---|---|---|---|
| | 1129 | 1572 | 801 | 851 | 1361 | 546 | 1870 |
| | 933 | 983 | 1493 | 631 | 118 | 75 | 740 |
| | 1625 | 763 | 720 | 1809 | 872 | 42 | 508 |
| | 382 | 339 | 1051 | 268 | 734 | 1352 | 1610 |
| | 1136 | 400 | 772 | 1719 | 1742 | 1762 | 1837 |
| | 904 | 1616 | 37 | 480 | 85 | 1643 | 269 |
| | 169 | 612 | 1725 | 1775 | 401 | 1470 | 910 |
| | 349 | 23 | 533 | 1555 | 1512 | 717 | 1664 |
| | 665 | 1687 | 1644 | 849 | 1843 | 966 | 1526 |
| | 1306 | 1263 | 91 | 1192 | 1658 | 627 | 650 |
| | 176 | 1230 | 1696 | 759 | 782 | 802 | 877 |
| | 1828 | | | | | | |
| 2052 | 1560 | 771 | 486 | 1673 | 1582 | 1240 | 1754 |
| | 1196 | 965 | 874 | 532 | 112 | 1955 | 1977 |
| | 1901 | 1876 | 1456 | 930 | 1269 | 1945 | 1579 |
| | 1682 | 222 | 561 | 1237 | 871 | 512 | 313 |
| | 1905 | 529 | 647 | 1856 | 1657 | 1335 | 1050 |
| | 1991 | 514 | 949 | 627 | 342 | 1529 | 1438 |
| | 708 | 1971 | 1052 | 821 | 730 | 388 | 2020 |
| | 344 | 113 | 22 | 1732 | 1312 | 786 | 1125 |
| | 1049 | 1024 | 604 | 78 | 417 | 1093 | 727 |
| | 830 | 1422 | 1761 | 385 | 19 | 1712 | 1513 |
| | 1053 | 1729 | 1847 | 1004 | 805 | 483 | 198 |
| | 1139 | 1714 | 564 | 1827 | 1542 | 677 | 586 |
| | 1908 | 1119 | 200 | 2021 | 1930 | 1588 | 1168 |
| | 1544 | 1313 | 1222 | 880 | 460 | 1986 | 273 |
| | 197 | 172 | 1804 | 1278 | 1617 | 241 | 1927 |
| | 2030 | 570 | 909 | 1585 | 1703 | 860 | 661 |
| | 201 | 877 | 995 | 1570 | 2005 | 1683 | 1398 |
| | 287 | 862 | 1764 | 975 | 690 | 1877 | 1786 |
| | 1056 | 267 | 1400 | 1169 | 1078 | 736 | 316 |
| | 692 | 461 | 370 | 28 | 1660 | 1134 | 1473 |
| | 1397 | 1372 | 952 | 426 | 765 | 1441 | 1075 |
| | 1178 | 1770 | 57 | 733 | 851 | 8 | 1861 |
| | 1401 | 25 | 143 | 718 | 1153 | 831 | 546 |
| | 1487 | 10 | 912 | 123 | 1890 | 1025 | 934 |
| | 204 | 1467 | 548 | 317 | 226 | 1936 | 1516 |
| | 1892 | 1661 | 1253 | 1228 | 808 | 282 | 621 |
| | 545 | 520 | 100 | 1626 | 1965 | 589 | 223 |
| | 326 | 918 | 1257 | 1933 | 2051 | 1208 | 1009 |
| | 549 | 1225 | 1343 | 1918 | 301 | 2031 | 1746 |
| | 635 | 1210 | 60 | 1323 | 1038 | 173 | 82 |
| | 1404 | 615 | 1748 | 1517 | 1426 | 1084 | 664 |
| | 1040 | 809 | 401 | 376 | 2008 | 1482 | 1821 |
| | 1745 | 602 | 1300 | 774 | 1113 | 1789 | 1423 |
| | 1526 | 66 | 405 | 1081 | 1199 | 356 | 157 |
| | 1749 | 373 | 491 | 1066 | 1501 | 1179 | 894 |
| | 1835 | 358 | 1260 | 471 | 186 | 1373 | 1282 |
| | 552 | 1815 | 896 | 665 | 574 | 232 | 1864 |
| | 188 | 2009 | 1601 | 1576 | 1156 | 630 | 969 |
| | 893 | 1802 | 1382 | 1974 | 261 | 937 | 571 |
| | 1605 | 674 | 1846 | 347 | 1094 | 750 | 1035 |
| | 1138 | 1691 | 386 | 42 | 327 | 1573 | 214 |
| | 796 | 752 | 1671 | 1015 | 1558 | 408 | 521 |
| | 963 | 307 | 850 | 1752 | 1865 | 803 | 825 |
| | 776 | 1044 | 1157 | 1830 | 117 | 304 | 41 |
| | 132 | 1122 | 1461 | 530 | 1385 | 1771 | 950 |
| | 753 | 1874 | 994 | 1547 | 242 | 1950 | 183 |
| | 286 | 839 | 1586 | 1242 | 1527 | 721 | 1414 |
| | 1996 | 1952 | 819 | 163 | 706 | 1608 | 1721 |
| | 111 | 1507 | 2050 | 900 | 1013 | 1686 | 2025 |
| | 1976 | 192 | 305 | 978 | 1317 | 1504 | 1241 |
| | 1332 | 270 | 609 | 1730 | 533 | 1403 | 98 |
| | 1953 | 1022 | 142 | 695 | 1442 | 1098 | 1383 |
| | 1486 | 2039 | 734 | 390 | 675 | 1921 | 562 |
| | 1144 | 1100 | 2019 | 1363 | 1906 | 756 | 869 |
| | 1311 | 655 | 1832 | 48 | 161 | 834 | 1173 |
| | 1124 | 1392 | 1505 | 126 | 465 | 652 | 389 |
| | 480 | 1470 | 1809 | 878 | 1733 | 551 | 1298 |
| | 1101 | 170 | 1342 | 1895 | 590 | 246 | 531 |
| | 634 | 1187 | 1934 | 1590 | 1875 | 1219 | 1762 |
| | 292 | 248 | 1167 | 511 | 1054 | 1956 | 17 |
| | 459 | 1855 | 980 | 1248 | 1361 | 2034 | 321 |
| | 272 | 540 | 653 | 1326 | 1665 | 1852 | 1589 |
| | 1680 | 618 | 957 | 26 | 1198 | 1751 | 446 |
| | 249 | 1370 | 490 | 1043 | 1790 | 1446 | 1731 |

-continued

| Block Length N | Permutation Indices π = [π(0), π(1), . . . , π(N − 1)] | | | | | | |
|---|---|---|---|---|---|---|---|
| | 1834 | 335 | 148 | 738 | 1023 | 367 | 910 |
| | 1492 | 1448 | 315 | 1711 | 202 | 1104 | 1217 |
| | 1659 | 1003 | 128 | 396 | 509 | 1182 | 1521 |
| | 1472 | 1740 | 1536 | 474 | 813 | 1000 | 737 |
| | 828 | 1818 | 105 | 1226 | 346 | 899 | 1646 |
| | 1449 | 518 | 1690 | 191 | 938 | 594 | 879 |
| | 982 | 1535 | 1348 | 1938 | 171 | 1567 | 58 |
| | 640 | 596 | 1515 | 859 | 1402 | 252 | 365 |
| | 807 | 151 | 1328 | 1596 | 1709 | 330 | 669 |
| | 620 | 888 | 684 | 1674 | 2013 | 1082 | 1937 |
| | 2028 | 966 | 1305 | 374 | 1546 | 47 | 794 |
| | 597 | 1718 | 838 | 1391 | 86 | 1794 | 27 |
| | 130 | 683 | 496 | 452 | 1371 | 715 | 1258 |
| | 1796 | 7 | 1211 | 1233 | 1543 | 1474 | 1840 |
| | 503 | 525 | 835 | 449 | 1132 | 4 | 1884 |
| | 127 | 1793 | 424 | 230 | 1176 | 1112 | 591 |
| | 650 | 1574 | 468 | 404 | 1935 | 205 | 1650 |
| | 77 | 1114 | 1227 | 2016 | 942 | 421 | 1775 |
| | 519 | 1308 | 1652 | 1915 | 1067 | 1089 | 1399 |
| | 944 | 1207 | 359 | 381 | 691 | 622 | 988 |
| | 1386 | 1725 | 2035 | 1649 | 280 | 1204 | 1032 |
| | 1327 | 941 | 1624 | 324 | 233 | 260 | 1791 |
| | 1506 | 1668 | 1894 | 1604 | 1083 | 1631 | 1142 |
| | 1186 | 262 | 375 | 923 | 434 | 1739 | 945 |
| | 1719 | 215 | 844 | 547 | 237 | 1358 | 456 |
| | 136 | 1891 | 1581 | 1768 | 1800 | 355 | 92 |
| | 873 | 1060 | 1092 | 1549 | 1436 | 180 | 89 |
| | 1969 | 841 | 1362 | 1524 | 1433 | 1460 | 939 |
| | 654 | 816 | 1042 | 118 | 231 | 779 | 290 |
| | 334 | 1462 | 1575 | 71 | 1634 | 887 | 93 |
| | 867 | 1415 | 2044 | 1747 | 1437 | 506 | 1656 |
| | 1336 | 1039 | 729 | 916 | 948 | 1555 | 1292 |
| | 21 | 208 | 240 | 697 | 584 | 1380 | 1289 |
| | 1117 | 2041 | 510 | 672 | 898 | 608 | 87 |
| | 1854 | 281 | 190 | 1318 | 1431 | 1979 | 1490 |
| | 1534 | 610 | 723 | 1271 | 782 | 35 | 1293 |
| | 15 | 563 | 1192 | 895 | 585 | 1706 | 804 |
| | 484 | 187 | 1929 | 64 | 96 | 703 | 440 |
| | 1221 | 1408 | 1440 | 1897 | 1784 | 528 | 437 |
| | 265 | 1189 | 1710 | 1872 | 46 | 1808 | 1287 |
| | 1002 | 1481 | 1390 | 466 | 579 | 1127 | 638 |
| | 682 | 1810 | 1923 | 419 | 1048 | 1235 | 441 |
| | 1215 | 1763 | 340 | 43 | 1785 | 854 | 2004 |
| | 1684 | 1387 | 1077 | 1264 | 1296 | 1903 | 1640 |
| | 369 | 556 | 588 | 1045 | 1566 | 1728 | 1637 |
| | 1465 | 337 | 858 | 1020 | 1246 | 956 | 435 |
| | 150 | 629 | 538 | 1666 | 1779 | 275 | 1838 |
| | 1882 | 958 | 1071 | 1619 | 196 | 383 | 1641 |
| | 363 | 911 | 1540 | 1243 | 933 | 2 | 1152 |
| | 412 | 535 | 444 | 203 | 1707 | 225 | 149 |
| | 1788 | 1230 | 999 | 1569 | 1493 | 812 | 350 |
| | 291 | 861 | 785 | 104 | 1694 | 829 | 1350 |
| | 394 | 814 | 986 | 121 | 642 | 1829 | 566 |
| | 1396 | 1615 | 1352 | 1121 | 1910 | 1583 | 1008 |
| | 644 | 413 | 268 | 391 | 300 | 59 | 1563 |
| | 1612 | 1735 | 1644 | 1086 | 855 | 1425 | 1349 |
| | 469 | 378 | 147 | 717 | 641 | 2012 | 1550 |
| | 1491 | 9 | 1985 | 1304 | 842 | 2029 | 498 |
| | 1594 | 2014 | 134 | 1321 | 1842 | 977 | 1766 |
| | 544 | 763 | 500 | 269 | 1058 | 247 | 156 |
| | 1844 | 1613 | 1468 | 1591 | 1500 | 1259 | 711 |
| | 760 | 883 | 792 | 234 | 3 | 573 | 497 |
| | 1669 | 1578 | 1347 | 1917 | 1841 | 1160 | 698 |
| | 639 | 1209 | 1133 | 1870 | 2042 | 1177 | 1698 |
| | 742 | 1162 | 1334 | 619 | 990 | 125 | 914 |
| | 1744 | 1963 | 1700 | 1469 | 206 | 1447 | 1356 |
| | 992 | 761 | 616 | 739 | 648 | 407 | 1911 |
| | 1960 | 31 | 1992 | 1434 | 1203 | 1773 | 1697 |
| | 817 | 726 | 495 | 1065 | 989 | 308 | 1898 |
| | 1839 | 357 | 598 | 1018 | 1190 | 325 | 846 |
| | 1942 | 310 | 482 | 1819 | 138 | 1325 | 62 |
| | 892 | 1111 | 848 | 617 | 1406 | 595 | 504 |
| | 140 | 1961 | 1816 | 1939 | 1848 | 1607 | 1059 |
| | 1108 | 1231 | 1140 | 582 | 351 | 921 | 845 |
| | 2017 | 1926 | 1695 | 213 | 137 | 1508 | 1046 |
| | 987 | 1557 | 1798 | 166 | 338 | 1525 | 2046 |

-continued

| Block Length N | Permutation Indices π = [π(0), π(1), . . . , π(N − 1)] | | | | | | |
|---|---|---|---|---|---|---|---|
| | 1090 | 1510 | 748 | 967 | 1338 | 473 | 1262 |
| | 40 | 259 | 2048 | 1817 | 554 | 1795 | 1704 |
| | 1340 | 1109 | 964 | 1087 | 996 | 755 | 207 |
| | 256 | 379 | 288 | 1782 | 1551 | 69 | 2045 |
| | 1165 | 1074 | 843 | 1413 | 1337 | 656 | 194 |
| | 135 | 705 | 946 | 1366 | 1538 | 673 | 1194 |
| | 238 | | | | | | |
| 2259 | 1686 | 698 | 67 | 2251 | 29 | 2161 | 807 |
| | 2258 | 367 | 1542 | 1932 | 917 | 1107 | 64 |
| | 595 | 629 | 505 | 1407 | 364 | 1736 | 1176 |
| | 1517 | 1707 | 664 | 1798 | 170 | 1426 | 1689 |
| | 311 | 80 | 1776 | 1726 | 1989 | 1583 | 892 |
| | 770 | 2026 | 33 | 1230 | 242 | 205 | 786 |
| | 333 | 2183 | 542 | 2167 | 2095 | 1476 | 461 |
| | 1792 | 805 | 1386 | 173 | 49 | 951 | 1511 |
| | 439 | 2076 | 2257 | 1061 | 1251 | 208 | 1342 |
| | 773 | 649 | 1551 | 2111 | 1880 | 14 | 1270 |
| | 1851 | 808 | 1942 | 1620 | 1808 | 1833 | 774 |
| | 224 | 614 | 1870 | 2133 | 1727 | 86 | 1711 |
| | 152 | 177 | 2027 | 1336 | 349 | 930 | 1320 |
| | 1674 | 686 | 55 | 2239 | 17 | 2149 | 795 |
| | 949 | 1530 | 1920 | 905 | 1095 | 1655 | 1424 |
| | 617 | 493 | 1395 | 352 | 2256 | 1486 | 1164 |
| | 1505 | 1695 | 2255 | 2024 | 158 | 1414 | 1677 |
| | 952 | 68 | 1764 | 1952 | 1977 | 1571 | 880 |
| | 758 | 2014 | 21 | 1218 | 230 | 193 | 1783 |
| | 321 | 2171 | 1480 | 2155 | 1074 | 1464 | 449 |
| | 830 | 793 | 1374 | 161 | 37 | 939 | 1499 |
| | 427 | 2064 | 1049 | 1239 | 196 | 1330 | 1958 |
| | 637 | 1539 | 2099 | 1868 | 1308 | 1258 | 1521 |
| | 796 | 1930 | 1608 | 1796 | 1821 | 762 | 724 |
| | 602 | 1858 | 2121 | 1715 | 74 | 1699 | 1627 |
| | 165 | 1362 | 1324 | 337 | 918 | 1961 | 1837 |
| | 674 | 43 | 2227 | 5 | 593 | 783 | 1996 |
| | 1518 | 1908 | 181 | 1083 | 1643 | 1412 | 1802 |
| | 481 | 1383 | 340 | 1474 | 1152 | 1340 | 1365 |
| | 2243 | 2012 | 146 | 1402 | 1665 | 606 | 1874 |
| | 1752 | 1940 | 1965 | 1559 | 868 | 2137 | 462 |
| | 9 | 1206 | 218 | 1843 | 1771 | 1805 | 1681 |
| | 1468 | 2143 | 1062 | 1452 | 437 | 627 | 1187 |
| | 115 | 149 | 25 | 927 | 2140 | 1256 | 696 |
| | 1037 | 1227 | 184 | 1318 | 1946 | 946 | 1209 |
| | 2087 | 1856 | 1296 | 1484 | 1509 | 1103 | 412 |
| | 290 | 1546 | 1809 | 750 | 2018 | 1981 | 306 |
| | 2109 | 1703 | 1012 | 1687 | 1615 | 996 | 2237 |
| | 362 | 325 | 906 | 1949 | 1825 | 471 | 1031 |
| | 2215 | 1596 | 581 | 771 | 1984 | 862 | 540 |
| | 169 | 1071 | 1631 | 1400 | 1790 | 790 | 1053 |
| | 1371 | 893 | 1328 | 1181 | 1525 | 256 | 1140 |
| | 1390 | 769 | 1231 | 1862 | 134 | 1653 | 1247 |
| | 2125 | 856 | 1740 | 1953 | 894 | 450 | 575 |
| | 734 | 2253 | 1847 | 1759 | 1528 | 406 | 315 |
| | 2147 | 1050 | 1175 | 944 | 615 | 137 | 334 |
| | 2128 | 1006 | 915 | 2040 | 872 | 13 | 1069 |
| | 1215 | 737 | 934 | 1025 | 775 | 1406 | 1934 |
| | 1472 | 613 | 1075 | 400 | 1284 | 1497 | 1091 |
| | 1969 | 2006 | 278 | 1797 | 738 | 1303 | 1072 |
| | 1884 | 2097 | 1691 | 594 | 1372 | 250 | 159 |
| | 1338 | 1903 | 1019 | 788 | 459 | 1584 | 416 |
| | 1972 | 850 | 759 | 281 | 478 | 569 | 913 |
| | 1059 | 2184 | 778 | 157 | 619 | 2200 | 828 |
| | 1316 | 1169 | 1513 | 1550 | 2078 | 1341 | 282 |
| | 1219 | 1850 | 1428 | 1641 | 1235 | 1147 | 916 |
| | 1728 | 1941 | 882 | 438 | 563 | 332 | 3 |
| | 1835 | 1747 | 1516 | 394 | 303 | 2081 | 260 |
| | 1163 | 932 | 603 | 125 | 322 | 1957 | 163 |
| | 903 | 2028 | 860 | 713 | 1057 | 2044 | 672 |
| | 922 | 301 | 763 | 1394 | 1922 | 1185 | 779 |
| | 1657 | 388 | 1272 | 1485 | 1079 | 2238 | 107 |
| | 266 | 1785 | 726 | 1291 | 1060 | 2194 | 2103 |
| | 1679 | 582 | 707 | 476 | 147 | 1925 | 2122 |
| | 1660 | 538 | 447 | 1572 | 404 | 1801 | 7 |
| | 747 | 269 | 466 | 557 | 901 | 938 | 1466 |
| | 1004 | 145 | 607 | 2188 | 816 | 1029 | 623 |
| | 1501 | 1538 | 2066 | 1329 | 270 | 835 | 2207 |
| | 1416 | 1629 | 1223 | 126 | 904 | 2038 | 1947 |

-continued

| Block Length N | Permutation Indices π = [π(0), π(1), . . . , π(N − 1)] | | | | | | |
|---|---|---|---|---|---|---|---|
| | 870 | 426 | 551 | 320 | 2247 | 1116 | 1966 |
| | 1504 | 382 | 291 | 2069 | 248 | 101 | 445 |
| | 591 | 1716 | 310 | 1945 | 151 | 782 | 360 |
| | 848 | 701 | 1045 | 2032 | 660 | 873 | 2070 |
| | 751 | 1382 | 1910 | 1173 | 767 | 679 | 448 |
| | 1260 | 1473 | 414 | 2226 | 95 | 2120 | 1791 |
| | 1367 | 1279 | 1048 | 2182 | 2091 | 960 | 2048 |
| | 695 | 464 | 135 | 1913 | 2110 | 1489 | 1951 |
| | 435 | 1560 | 392 | 1789 | 589 | 1576 | 204 |
| | 454 | 545 | 295 | 926 | 1454 | 717 | 1914 |
| | 1189 | 2176 | 804 | 1017 | 611 | 1770 | 1895 |
| | 2054 | 1317 | 258 | 823 | 592 | 1964 | 1635 |
| | 1211 | 114 | 239 | 8 | 1935 | 1457 | 1654 |
| | 2235 | 714 | 2217 | 1120 | 1811 | 1795 | 2004 |
| | 261 | 470 | 1458 | 433 | 998 | 1492 | 370 |
| | 155 | 139 | 348 | 1139 | 908 | 536 | 1704 |
| | 1598 | 2092 | 970 | 598 | 401 | 689 | 667 |
| | 1179 | 755 | 948 | 739 | 2214 | 1001 | 1461 |
| | 2198 | 1633 | 1267 | 648 | 1761 | 1970 | 83 |
| | 558 | 1601 | 2061 | 964 | 1036 | 1889 | 2036 |
| | 105 | 314 | 683 | 1477 | 2098 | 452 | 123 |
| | 1636 | 233 | 380 | 514 | 423 | 1602 | 192 |
| | 442 | 1052 | 723 | 299 | 1442 | 283 | 1758 |
| | 1023 | 599 | 792 | 1177 | 811 | 845 | 1305 |
| | 2042 | 883 | 102 | 492 | 1605 | 508 | 580 |
| | 1411 | 1445 | 1905 | 2114 | 227 | 1733 | 1642 |
| | 2205 | 1108 | 1180 | 1321 | 2180 | 58 | 2223 |
| | 827 | 77 | 2242 | 596 | 267 | 1446 | 986 |
| | 524 | 896 | 567 | 143 | 336 | 127 | 355 |
| | 867 | 2046 | 1586 | 1021 | 1902 | 36 | 1149 |
| | 936 | 727 | 2202 | 989 | 1449 | 1658 | 424 |
| | 1255 | 636 | 1749 | 652 | 71 | 865 | 1724 |
| | 2049 | 2 | 1024 | 1877 | 1786 | 2158 | 2067 |
| | 671 | 1465 | 2086 | 440 | 111 | 1943 | 2136 |
| | 368 | 502 | 411 | 1590 | 1130 | 565 | 199 |
| | 711 | 287 | 480 | 271 | 1746 | 533 | 993 |
| | 780 | 1165 | 799 | 180 | 1293 | 1502 | 1871 |
| | 90 | 1133 | 1593 | 496 | 568 | 1421 | 1568 |
| | 1893 | 2102 | 215 | 1009 | 1630 | 2240 | 1911 |
| | 1168 | 2021 | 2168 | 46 | 2211 | 1787 | 1980 |
| | 2230 | 584 | 255 | 1434 | 974 | 2071 | 1290 |
| | 555 | 131 | 324 | 709 | 343 | 377 | 837 |
| | 1574 | 415 | 1890 | 24 | 1137 | 40 | 112 |
| | 943 | 977 | 1437 | 1646 | 2015 | 1265 | 1174 |
| | 1737 | 640 | 712 | 853 | 1712 | 2084 | 1755 |
| | 359 | 1865 | 1774 | 2146 | 2055 | 978 | 518 |
| | 56 | 428 | 99 | 1931 | 2124 | 1915 | 1134 |
| | 399 | 1578 | 1118 | 553 | 187 | 1824 | 681 |
| | 468 | 259 | 1734 | 521 | 981 | 1190 | 2212 |
| | 787 | 168 | 1281 | 1490 | 1859 | 397 | 1018 |
| | 1581 | 484 | 556 | 1409 | 1556 | 1690 | 1599 |
| | 203 | 997 | 1618 | 2228 | 1899 | 1475 | 1668 |
| | 2156 | 34 | 2199 | 1122 | 1968 | 97 | 1987 |
| | 243 | 2075 | 962 | 2059 | 1278 | 65 | 525 |
| | 312 | 697 | 825 | 2197 | 1562 | 403 | 331 |
| | 1125 | 953 | 912 | 1297 | 1878 | 1143 | 1100 |
| | 2162 | 1003 | 931 | 1443 | 1162 | 366 | 2003 |
| | 222 | 1743 | 1700 | 1319 | 700 | 628 | 1834 |
| | 1762 | 966 | 347 | 2234 | 116 | 1565 | 69 |
| | 1300 | 1228 | 178 | 1212 | 369 | 197 | 1106 |
| | 716 | 2165 | 669 | 2041 | 456 | 247 | 1422 |
| | 969 | 797 | 1706 | 1141 | 475 | 987 | 706 |
| | 1056 | 847 | 2022 | 1287 | 1244 | 863 | 244 |
| | 66 | 1587 | 1306 | 510 | 544 | 1778 | 1678 |
| | 1844 | 1463 | 191 | 772 | 2216 | 756 | 2169 |
| | 1144 | 122 | 22 | 1709 | 213 | 1585 | 0 |
| | 560 | 1356 | 513 | 341 | 1250 | 685 | 1266 |
| | 813 | 2185 | 600 | 391 | 319 | 831 | 550 |
| | 900 | 1285 | 1866 | 1131 | 1088 | 54 | 88 |
| | 919 | 1431 | 1150 | 1007 | 1991 | 1622 | 1760 |
| | 1688 | 654 | 688 | 616 | 1822 | 1253 | 2013 |
| | 335 | 2222 | 104 | 1553 | 57 | 2141 | 2100 |
| | 166 | 1200 | 357 | 1729 | 1094 | 2191 | 2119 |
| | 657 | 2029 | 444 | 829 | 1410 | 675 | 632 |
| | 1694 | 535 | 463 | 975 | 694 | 2154 | 1535 |
| | 2010 | 1275 | 1232 | 851 | 232 | 160 | 1366 |

| Block Length N | Permutation Indices π = [π(0), π(1), . . . , π(N − 1)] | | | | | | |
|---|---|---|---|---|---|---|---|
| | 1294 | 498 | 2135 | 1766 | 1904 | 1097 | 1857 |
| | 832 | 760 | 2204 | 744 | 2157 | 1985 | 638 |
| | 10 | 1697 | 201 | 1573 | 2244 | 2035 | 954 |
| | 501 | 329 | 1238 | 673 | 1254 | 519 | 238 |
| | 588 | 379 | 307 | 819 | 776 | 395 | 1379 |
| | 1854 | 1119 | 838 | 42 | 76 | 1310 | 1210 |
| | 1138 | 995 | 1979 | 1610 | 1748 | 288 | 1701 |
| | 676 | 604 | 1810 | 1241 | 2001 | 1117 | 1788 |
| | 92 | 888 | 45 | 2129 | 2088 | 217 | 798 |
| | 345 | 1717 | 1082 | 2179 | 2107 | 363 | 82 |
| | 432 | 817 | 1398 | 663 | 620 | 1842 | 1876 |
| | 451 | 963 | 682 | 539 | 1523 | 1154 | 1292 |
| | 1220 | 839 | 220 | 148 | 1354 | 132 | 1545 |
| | 2123 | 1754 | 1892 | 1085 | 1845 | 961 | 1632 |
| | 1954 | 732 | 2145 | 1973 | 626 | 1723 | 1651 |
| | 189 | 1561 | 2232 | 2023 | 942 | 207 | 164 |
| 3012 | 516 | 593 | 487 | 815 | 1408 | 2145 | 2781 |
| | 2892 | 2015 | 2608 | 333 | 969 | 617 | 2473 |
| | 796 | 1533 | 1928 | 1817 | 902 | 1976 | 1234 |
| | 116 | 5 | 2102 | 164 | 2434 | 2082 | 2304 |
| | 290 | 1364 | 622 | 270 | 492 | 569 | 1668 |
| | 1822 | 1470 | 1692 | 1769 | 2868 | 1991 | 2584 |
| | 1446 | 2969 | 1056 | 661 | 772 | 1509 | 1904 |
| | 2256 | 1861 | 1972 | 179 | 92 | 2391 | 2078 |
| | 160 | 1379 | 1292 | 579 | 266 | 1340 | 598 |
| | 2492 | 1779 | 1466 | 2540 | 1798 | 362 | 222 |
| | 2666 | 728 | 2998 | 1562 | 1422 | 2343 | 1032 |
| | 1186 | 2762 | 2622 | 531 | 2232 | 1837 | 1948 |
| | 810 | 1731 | 2227 | 25 | 136 | 1355 | 1268 |
| | 415 | 1225 | 1336 | 2555 | 2709 | 1755 | 1201 |
| | 2536 | 743 | 897 | 2955 | 2401 | 463 | 2974 |
| | 2097 | 1745 | 589 | 1663 | 1162 | 2738 | 2598 |
| | 1789 | 2863 | 2362 | 926 | 786 | 1707 | 2203 |
| | 550 | 2126 | 420 | 2907 | 391 | 719 | 1312 |
| | 1620 | 1095 | 1591 | 1919 | 2512 | 237 | 873 |
| | 2791 | 107 | 700 | 1437 | 2073 | 1721 | 565 |
| | 1900 | 2637 | 261 | 2921 | 1765 | 2839 | 2338 |
| | 1461 | 1109 | 2965 | 1027 | 526 | 174 | 396 |
| | 1153 | 2468 | 1726 | 1374 | 1596 | 1673 | 2772 |
| | 2926 | 2574 | 2796 | 2873 | 960 | 83 | 676 |
| | 984 | 1061 | 2160 | 1283 | 1876 | 2613 | 3008 |
| | 348 | 2483 | 64 | 801 | 1196 | 483 | 170 |
| | 1264 | 2001 | 2396 | 1683 | 1370 | 2444 | 1702 |
| | 584 | 2883 | 2570 | 632 | 2902 | 2550 | 1326 |
| | 758 | 1832 | 1090 | 738 | 2526 | 1037 | 2136 |
| | 2290 | 1938 | 714 | 2237 | 324 | 2941 | 40 |
| | 1914 | 425 | 1524 | 1129 | 1240 | 2459 | 2372 |
| | 2724 | 2329 | 2440 | 647 | 560 | 2859 | 2546 |
| | 628 | 1847 | 1760 | 1047 | 734 | 1567 | 1066 |
| | 2960 | 2247 | 1934 | 2767 | 2266 | 830 | 690 |
| | 2893 | 955 | 454 | 2030 | 1890 | 2811 | 295 |
| | 1654 | 218 | 78 | 999 | 1495 | 2305 | 2416 |
| | 1278 | 2199 | 2695 | 493 | 604 | 1823 | 1977 |
| | 883 | 1693 | 1804 | 11 | 165 | 2825 | 1669 |
| | 3004 | 1211 | 1365 | 1013 | 2869 | 931 | 430 |
| | 2565 | 2213 | 1057 | 2131 | 1630 | 194 | 1500 |
| | 2257 | 319 | 2830 | 1394 | 2700 | 2175 | 2671 |
| | 1018 | 2594 | 888 | 965 | 859 | 1187 | 1780 |
| | 2088 | 2165 | 2059 | 2387 | 2980 | 705 | 1341 |
| | 247 | 575 | 1168 | 1905 | 2541 | 2189 | 1033 |
| | 2368 | 93 | 729 | 377 | 2233 | 536 | 2806 |
| | 1688 | 1577 | 662 | 1736 | 994 | 642 | 864 |
| | 1862 | 2936 | 2194 | 1842 | 2064 | 2141 | 228 |
| | 382 | 30 | 252 | 329 | 1428 | 551 | 1144 |
| | 1452 | 1529 | 2628 | 1751 | 2344 | 69 | 464 |
| | 816 | 421 | 532 | 1269 | 1664 | 951 | 638 |
| | 1732 | 2951 | 2864 | 2151 | 1838 | 2912 | 2170 |
| | 1052 | 339 | 26 | 1100 | 358 | 6 | 1794 |
| | 1226 | 2300 | 1558 | 122 | 2994 | 903 | 2604 |
| | 2758 | 1322 | 1182 | 2103 | 792 | 397 | 508 |
| | 2382 | 291 | 1992 | 1597 | 1708 | 2927 | 2840 |
| | 1987 | 2797 | 2908 | 1115 | 1028 | 315 | 2773 |
| | 1096 | 2315 | 2469 | 1515 | 961 | 2035 | 1534 |
| | 657 | 2715 | 2161 | 223 | 2734 | 1298 | 1158 |
| | 349 | 1423 | 922 | 2498 | 2358 | 267 | 763 |
| | 2122 | 686 | 546 | 1467 | 1963 | 2291 | 2884 |

| Block Length N | Permutation Indices π = [π(0), π(1), . . . , π(N − 1)] | | | | | | |
|---|---|---|---|---|---|---|---|
| | 180 | 2667 | 151 | 479 | 1072 | 1809 | 2445 |
| | 1351 | 1679 | 2272 | 3009 | 633 | 281 | 2137 |
| | 460 | 1197 | 1833 | 1481 | 325 | 1399 | 898 |
| | 21 | 2681 | 1525 | 2599 | 2098 | 1746 | 1968 |
| | 2725 | 787 | 286 | 2946 | 156 | 233 | 127 |
| | 1486 | 1134 | 1356 | 1433 | 2532 | 1655 | 2248 |
| | 2556 | 2633 | 720 | 2855 | 436 | 1173 | 1568 |
| | 1920 | 1043 | 1636 | 2373 | 2768 | 2657 | 1742 |
| | 2836 | 561 | 956 | 243 | 2942 | 1004 | 262 |
| | 2156 | 1443 | 1130 | 2204 | 1462 | 1110 | 1332 |
| | 2330 | 392 | 2662 | 2310 | 1086 | 2609 | 696 |
| | 850 | 498 | 2286 | 797 | 1896 | 1501 | 1612 |
| | 474 | 1997 | 84 | 2701 | 2812 | 1019 | 932 |
| | 1284 | 889 | 1000 | 2219 | 2132 | 1419 | 1106 |
| | 2200 | 407 | 320 | 2619 | 2306 | 368 | 2638 |
| | 1520 | 807 | 494 | 1327 | 826 | 2402 | 2262 |
| | 1694 | 2527 | 2026 | 590 | 450 | 1371 | 1867 |
| | 214 | 1790 | 1650 | 2571 | 55 | 865 | 976 |
| | 2850 | 759 | 1255 | 2065 | 2176 | 383 | 537 |
| | 2455 | 253 | 364 | 1583 | 1737 | 1385 | 229 |
| | 1564 | 2783 | 2937 | 2585 | 1429 | 2503 | 2002 |
| | 1125 | 773 | 2629 | 691 | 190 | 1766 | 60 |
| | 2152 | 1390 | 1689 | 1231 | 735 | 1891 | 2966 |
| | 2889 | 2431 | 1935 | 79 | 1154 | 2460 | 2759 |
| | 725 | 1279 | 2354 | 648 | 947 | 2561 | 1405 |
| | 1626 | 1848 | 2147 | 749 | 2605 | 1101 | 928 |
| | 335 | 1949 | 793 | 2301 | 2128 | 1366 | 1665 |
| | 1993 | 489 | 316 | 2566 | 2865 | 600 | 2513 |
| | 1516 | 754 | 1053 | 1800 | 701 | 1496 | 402 |
| | 2253 | 3000 | 1901 | 2696 | 1602 | 1824 | 2123 |
| | 89 | 884 | 2802 | 12 | 311 | 1323 | 1010 |
| | 990 | 1212 | 1511 | 2523 | 2210 | 224 | 292 |
| | 181 | 711 | 398 | 1424 | 1492 | 730 | 1029 |
| | 1598 | 2624 | 2692 | 1930 | 2711 | 2976 | 1877 |
| | 880 | 118 | 899 | 1164 | 65 | 860 | 2778 |
| | 2099 | 2364 | 663 | 2060 | 2894 | 2754 | 1969 |
| | 1863 | 248 | 1082 | 942 | 157 | 687 | 374 |
| | 2282 | 2142 | 1357 | 1887 | 1574 | 2600 | 2668 |
| | 2557 | 75 | 2533 | 788 | 856 | 94 | 875 |
| | 721 | 2229 | 2056 | 1294 | 2075 | 1135 | 639 |
| | 244 | 2494 | 263 | 2335 | 1839 | 2995 | 1058 |
| | 1463 | 523 | 27 | 1183 | 2258 | 2118 | 1333 |
| | 1227 | 2383 | 446 | 306 | 2051 | 2509 | 1005 |
| | 1646 | 653 | 832 | 697 | 2205 | 1439 | 1771 |
| | 2032 | 1897 | 393 | 2639 | 2971 | 2340 | 2311 |
| | 1593 | 827 | 1159 | 528 | 499 | 957 | 605 |
| | 2359 | 1728 | 1699 | 2157 | 1805 | 1858 | 1506 |
| | 2899 | 345 | 3005 | 46 | 2706 | 629 | 808 |
| | 1193 | 1246 | 894 | 1829 | 2008 | 1873 | 369 |
| | 2094 | 17 | 196 | 302 | 1328 | 803 | 1376 |
| | 1396 | 1502 | 2528 | 2003 | 2576 | 1704 | 2880 |
| | 716 | 191 | 764 | 2904 | 1068 | 321 | 2981 |
| | 1964 | 1092 | 2268 | 1521 | 1169 | 1222 | 870 |
| | 456 | 2721 | 2369 | 2422 | 2070 | 2403 | 172 |
| | 557 | 610 | 258 | 591 | 1372 | 1478 | 2504 |
| | 1458 | 1791 | 2572 | 2678 | 692 | 649 | 740 |
| | 760 | 866 | 1892 | 1849 | 1940 | 2634 | 2244 |
| | 80 | 37 | 128 | 822 | 432 | 167 | 1743 |
| | 1087 | 2022 | 1632 | 1367 | 2943 | 586 | 2162 |
| | 1627 | 2567 | 1131 | 1786 | 350 | 1767 | 2548 |
| | 2331 | 2986 | 1550 | 2967 | 736 | 601 | 2109 |
| | 2750 | 1155 | 1936 | 1801 | 297 | 13 | 2875 |
| | 124 | 3001 | 1497 | 1213 | 1063 | 1998 | 403 |
| | 2524 | 326 | 1107 | 2345 | 2543 | 1762 | 1189 |
| | 2307 | 533 | 731 | 2962 | 2389 | 885 | 2832 |
| | 1449 | 1150 | 577 | 2085 | 1020 | 1651 | 991 |
| | 1777 | 273 | 2220 | 2851 | 2191 | 707 | 1300 |
| | 408 | 1039 | 379 | 1907 | 2500 | 1386 | 1685 |
| | 1579 | 95 | 688 | 2586 | 2885 | 509 | 225 |
| | 1888 | 774 | 1073 | 1709 | 1425 | 1126 | 553 |
| | 2273 | 2909 | 2625 | 2326 | 1753 | 249 | 2196 |
| | 813 | 514 | 182 | 1208 | 384 | 1256 | 1560 |
| | 1382 | 2408 | 1584 | 2456 | 2760 | 71 | 664 |
| | 2784 | 644 | 948 | 1271 | 1864 | 750 | 1049 |
| | 2148 | 2953 | 52 | 1950 | 2249 | 2283 | 2601 |
| | 1252 | 138 | 437 | 471 | 789 | 490 | 158 |

-continued

| Block Length N | Permutation Indices π = [π(0), π(1), . . . , π(N − 1)] | | | | | | |
|---|---|---|---|---|---|---|---|
| | 1637 | 1671 | 2471 | 1690 | 1358 | 2384 | 114 |
| | 659 | 2890 | 2558 | 572 | 1314 | 620 | 924 |
| | 746 | 1772 | 2514 | 1820 | 2124 | 2929 | 28 |
| | 702 | 8 | 312 | 1117 | 1228 | 2042 | 2823 |
| | 1512 | 2317 | 2428 | 230 | 1011 | 1647 | 2447 |
| | 616 | 1430 | 2211 | 2847 | 635 | 2866 | 2293 |
| | 399 | 1035 | 1835 | 1054 | 481 | 1989 | 2490 |
| | 23 | 2254 | 1681 | 177 | 678 | 2755 | 2095 |
| | 2881 | 1377 | 1878 | 943 | 283 | 1811 | 2404 |
| | 66 | 2143 | 1483 | 3011 | 592 | 1406 | 2187 |
| | 2683 | 1199 | 1792 | 2606 | 375 | 1613 | 1329 |
| | 2992 | 794 | 1575 | 2813 | 2529 | 2230 | 1657 |
| | 365 | 1001 | 717 | 418 | 2857 | 1353 | 288 |
| | 1917 | 1618 | 1045 | 2553 | 1488 | 2119 | 1459 |
| | 2245 | 741 | 2688 | 307 | 2659 | 1175 | 1768 |
| | 876 | 1748 | 2052 | 2375 | 2968 | 1854 | 2153 |
| | 240 | 563 | 1156 | 42 | 341 | 977 | 693 |
| | 2356 | 1242 | 1541 | 2177 | 1893 | 1594 | 1262 |
| | 2741 | 2775 | 81 | 2794 | 2462 | 476 | 2664 |
| | 1281 | 982 | 650 | 1676 | 852 | 1724 | 2028 |
| | 1850 | 2876 | 606 | 2924 | 216 | 1021 | 1132 |
| | 1806 | 1112 | 1416 | 2221 | 2332 | 1218 | 1517 |
| | 2616 | 409 | 520 | 2418 | 2717 | 2751 | 539 |
| | 1720 | 2534 | 303 | 939 | 1739 | 958 | 626 |
| | 1503 | 2139 | 2939 | 2158 | 1826 | 2852 | 582 |
| | 1127 | 346 | 14 | 1040 | 1782 | 847 | 1392 |
| | 1214 | 2240 | 2982 | 2047 | 1387 | 385 | 496 |
| | 1170 | 235 | 2587 | 1585 | 1696 | 2510 | 279 |
| | 775 | 698 | 2915 | 2635 | 1975 | 2785 | 57 |
| | 1103 | 823 | 163 | 973 | 1257 | 322 | 1758 |
| | 1363 | 1691 | 2457 | 1522 | 2958 | 2105 | 867 |
| | 645 | 2722 | 2592 | 293 | 2067 | 2149 | 472 |
| | 780 | 1493 | 255 | 337 | 1672 | 674 | 2409 |
| | 1455 | 1537 | 2872 | 1874 | 597 | 799 | 139 |
| | 1060 | 1146 | 1797 | 1999 | 1339 | 1667 | 2433 |
| | 2997 | 187 | 2539 | 2867 | 621 | 2698 | 2568 |
| | 1932 | 1055 | 1821 | 886 | 756 | 1469 | 833 |
| | 9 | 2086 | 1956 | 2669 | 2033 | 1513 | 2848 |
| | 144 | 857 | 221 | 2954 | 1036 | 1122 | 1773 |
| | 1421 | 1142 | 2236 | 2322 | 2973 | 404 | 708 |
| | 424 | 510 | 1161 | 1604 | 1908 | 1031 | 1556 |
| | 2361 | 2804 | 96 | 2713 | 2756 | 2062 | 486 |
| | 1296 | 901 | 944 | 250 | 1686 | 231 | 197 |
| | 2144 | 1450 | 2886 | 1431 | 1397 | 1118 | 2212 |
| | 1074 | 2631 | 2597 | 2318 | 400 | 2414 | 1619 |
| | 183 | 506 | 1600 | 602 | 2819 | 2780 | 72 |
| | 2800 | 1802 | 1007 | 727 | 1272 | 877 | 920 |

-continued

| Block Length N | Permutation Indices π = [π(0), π(1), . . . , π(N − 1)] | | | | | | |
|---|---|---|---|---|---|---|---|
| | 2207 | 1927 | 1267 | 2077 | 2120 | 1426 | 2862 |
| | 2467 | 265 | 308 | 2626 | 1050 | 2607 | 1971 |
| | 1749 | 814 | 2250 | 795 | 159 | 241 | 1576 |
| | 438 | 1995 | 1359 | 1441 | 2776 | 1778 | 983 |
| | 2559 | 2641 | 964 | 2978 | 2183 | 1903 | 1243 |
| | 2164 | 1166 | 371 | 91 | 2443 | 2771 | 525 |
| | 1089 | 1291 | 631 | 959 | 1725 | 790 | 660 |
| | 1831 | 2159 | 2925 | 1990 | 1860 | 2573 | 1335 |
| | 1113 | 178 | 48 | 761 | 125 | 2617 | 940 |
| | 1248 | 1961 | 1325 | 805 | 2140 | 2226 | 2877 |
| | 2525 | 2005 | 328 | 414 | 1065 | 1508 | 1812 |
| | 1528 | 1614 | 2265 | 2708 | 0 | 2135 | 2901 |
| | 453 | 896 | 1200 | 323 | 848 | 154 | 24 |
| | 2400 | 1523 | 2048 | 1354 | 1224 | 1937 | 1301 |
| | 236 | 2554 | 2424 | 2535 | 2501 | 2222 | 304 |
| | 612 | 723 | 689 | 410 | 1504 | 1590 | 2241 |
| | 1889 | 1610 | 2704 | 2790 | 429 | 872 | 1176 |
| | 892 | 978 | 1629 | 2072 | 2376 | 1981 | 2024 |
| | 299 | 260 | 564 | 169 | 212 | 2530 | 954 |
| | 1764 | 1369 | 1412 | 718 | 2154 | 699 | 665 |
| | 2612 | 1918 | 342 | 1899 | 1263 | 1586 | 2680 |
| | 1542 | 87 | 2463 | 2786 | 868 | 2882 | 2087 |
| | 651 | 974 | 2068 | 1070 | 275 | 3007 | 2347 |
| | 256 | 2270 | 1475 | 1195 | 535 | 1345 | 1388 |
| | 2675 | 2395 | 1735 | 2545 | 2829 | 1894 | 318 |
| | 2935 | 733 | 1017 | 82 | 1518 | 63 | 2439 |
| | 2217 | 1282 | 2718 | 1865 | 627 | 709 | 2044 |
| | 906 | 53 | 1827 | 1909 | 232 | 2246 | 1451 |
| | 15 | 97 | 1432 | 434 | 2169 | 2371 | 1711 |
| | 2632 | 1634 | 357 | 559 | 2911 | 227 | 993 |
| | 1557 | 1759 | 1099 | 1427 | 2193 | 1258 | 1128 |
| | 2299 | 2627 | 381 | 2458 | 2328 | 29 | 2405. |

2. A method for interleaving a codeword, wherein the codeword comprises a first bit sequence $b'=[b'_0, b'_1, \ldots, b'_{N-1}] \in \{0,1\}^N$ of a block length N, the method comprising:

interleaving the codeword based on an interleaver, wherein the interleaver specifies a set of permutation indices $\pi=[\pi(0), \pi(1), \ldots, \pi(N-1)]$;

wherein the interleaving of the codeword comprises reordering or mapping the first bit sequence $b'=[b'_0, b'_1, \ldots, b'_{N-1}] \in \{0,1\}^N$ of the codeword into a second bit sequence $b=[b_0, b_1, \ldots, b_{N-1}]=[b'_{\pi(0)}, b'_{\pi(1)}, \ldots, b'_{\pi(N-1)}] \in \{0,1\}^N$; and wherein, for a block length of N=1200, the interleaver comprises the set of permutation indices, as follows:

| Block Length N | Permutation Indices π = [π(0), π(1), . . . , π(N − 1)] | | | | | | | | | | | | | |
|---|---|---|---|---|---|---|---|---|---|---|---|---|---|---|
| 1200 | 199 | 1000 | 670 | 477 | 613 | 236 | 684 | 372 | 809 | 98 | 951 | 179 | 547 | 148 |
| | 1018 | 825 | 961 | 584 | 1194 | 720 | 1157 | 446 | 229 | 527 | 895 | 496 | 1139 | 1173 |
| | 109 | 932 | 342 | 1068 | 305 | 794 | 447 | 875 | 43 | 844 | 514 | 321 | 327 | 80 |
| | 690 | 216 | 653 | 1142 | 795 | 23 | 1137 | 1192 | 862 | 669 | 805 | 428 | 1038 | 564 |
| | 1001 | 290 | 1143 | 371 | 739 | 340 | 10 | 1017 | 1153 | 776 | 186 | 328 | 149 | 638 |
| | 291 | 719 | 1087 | 688 | 131 | 1138 | 301 | 1124 | 534 | 60 | 497 | 986 | 639 | 1067 |
| | 235 | 1036 | 706 | 513 | 649 | 272 | 882 | 408 | 391 | 134 | 987 | 215 | 583 | 184 |
| | 1054 | 861 | 997 | 620 | 30 | 756 | 1193 | 482 | 135 | 563 | 931 | 532 | 202 | 9 |
| | 145 | 968 | 378 | 520 | 341 | 830 | 483 | 846 | 79 | 880 | 550 | 357 | 493 | 116 |
| | 726 | 252 | 689 | 1178 | 831 | 59 | 427 | 28 | 898 | 705 | 841 | 464 | 912 | 600 |
| | 1037 | 326 | 1179 | 407 | 775 | 376 | 46 | 1053 | 1189 | 812 | 222 | 948 | 185 | 674 |
| | 457 | 755 | 1123 | 724 | 394 | 201 | 337 | 1160 | 570 | 96 | 533 | 1022 | 675 | 1103 |
| | 271 | 845 | 742 | 549 | 555 | 308 | 918 | 444 | 881 | 170 | 1023 | 251 | 165 | 220 |
| | 1090 | 897 | 1033 | 656 | 1104 | 792 | 29 | 518 | 171 | 599 | 967 | 568 | 238 | 45 |
| | 181 | 1004 | 414 | 1140 | 377 | 866 | 519 | 947 | 115 | 916 | 359 | 166 | 529 | 152 |
| | 762 | 288 | 725 | 14 | 867 | 95 | 463 | 64 | 934 | 741 | 747 | 500 | 1110 | 636 |
| | 619 | 362 | 15 | 443 | 811 | 412 | 82 | 1089 | 25 | 848 | 258 | 984 | 221 | 710 |
| | 363 | 791 | 1159 | 760 | 430 | 237 | 373 | 1196 | 606 | 748 | 569 | 1058 | 711 | 1074 |
| | 307 | 1108 | 778 | 358 | 721 | 344 | 954 | 480 | 917 | 206 | 1059 | 287 | 655 | 256 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 1126 | 933 | 1069 | 692 | 102 | 828 | 65 | 554 | 207 | 635 | 1003 | 604 | 274 | 81 |
| | 217 | 1040 | 450 | 1176 | 413 | 902 | 685 | 983 | 151 | 952 | 622 | 429 | 565 | 188 |
| | 798 | 324 | 761 | 50 | 903 | 66 | 499 | 1073 | 970 | 777 | 913 | 536 | 1146 | 672 |
| | 1109 | 398 | 51 | 479 | 393 | 448 | 118 | 1125 | 61 | 884 | 132 | 1020 | 257 | 746 |
| | 399 | 827 | 1195 | 796 | 466 | 273 | 409 | 32 | 642 | 168 | 605 | 1094 | 877 | 1175 |
| | 343 | 1144 | 587 | 621 | 757 | 380 | 990 | 516 | 953 | 242 | 1095 | 323 | 691 | 292 |
| | 1162 | 969 | 975 | 728 | 138 | 864 | 847 | 590 | 243 | 671 | 310 | 117 | 640 | 1019 |
| | 1076 | 585 | 938 | 449 | 253 | 486 | 12 | 591 | 658 | 465 | 988 | 167 | 224 | 187 |
| | 86 | 797 | 601 | 834 | 976 | 939 | 1006 | 586 | 136 | 515 | 572 | 535 | 434 | 1145 |
| | 949 | 1182 | 708 | 87 | 154 | 1161 | 484 | 863 | 920 | 883 | 782 | 1039 | 97 | 330 |
| | 1056 | 435 | 502 | 309 | 832 | 11 | 68 | 31 | 1130 | 641 | 445 | 678 | 204 | 783 |
| | 850 | 657 | 1180 | 294 | 416 | 379 | 278 | 989 | 793 | 1026 | 552 | 1131 | 1198 | 1005 |
| | 101 | 707 | 764 | 727 | 626 | 137 | 1141 | 174 | 900 | 279 | 346 | 153 | 676 | 1055 |
| | 1112 | 1075 | 974 | 485 | 289 | 360 | 48 | 627 | 694 | 501 | 1024 | 203 | 260 | 223 |
| | 122 | 833 | 637 | 870 | 396 | 1105 | 815 | 849 | 172 | 551 | 608 | 571 | 470 | 1181 |
| | 985 | 18 | 744 | 123 | 190 | 1197 | 293 | 899 | 956 | 919 | 818 | 329 | 3 | 366 |
| | 1092 | 471 | 538 | 345 | 868 | 47 | 104 | 813 | 1166 | 677 | 481 | 714 | 240 | 819 |
| | 886 | 693 | 16 | 395 | 452 | 415 | 314 | 1025 | 829 | 1062 | 4 | 1167 | 1007 | 814 |
| | 364 | 743 | 800 | 763 | 662 | 173 | 1177 | 210 | 936 | 315 | 382 | 189 | 712 | 1091 |
| | 1148 | 1111 | 1010 | 67 | 325 | 558 | 84 | 663 | 730 | 537 | 1060 | 239 | 296 | 259 |
| | 158 | 869 | 673 | 906 | 432 | 1011 | 1078 | 885 | 208 | 522 | 644 | 607 | 506 | 17 |
| | 1021 | 54 | 196 | 159 | 226 | 33 | 556 | 935 | 992 | 955 | 854 | 365 | 169 | 402 |
| | 1128 | 507 | 574 | 381 | 904 | 83 | 140 | 103 | 2 | 713 | 517 | 588 | 276 | 855 |
| | 922 | 729 | 52 | 431 | 488 | 451 | 350 | 1061 | 865 | 1098 | 624 | 133 | 70 | 1077 |
| | 400 | 779 | 836 | 799 | 698 | 209 | 13 | 246 | 972 | 351 | 418 | 225 | 521 | 1127 |
| | 1184 | 1147 | 1046 | 557 | 231 | 594 | 120 | 699 | 766 | 573 | 1096 | 275 | 332 | 1041 |
| | 194 | 905 | 709 | 780 | 468 | 1047 | 1114 | 921 | 244 | 623 | 680 | 643 | 542 | 53 |
| | 1057 | 90 | 816 | 195 | 35 | 1042 | 592 | 971 | 1028 | 991 | 890 | 401 | 205 | 438 |
| | 1164 | 543 | 610 | 417 | 940 | 119 | 176 | 139 | 38 | 295 | 423 | 786 | 312 | 891 |
| | 958 | 765 | 88 | 467 | 524 | 487 | 386 | 1097 | 901 | 1134 | 660 | 39 | 106 | 1113 |
| | 436 | 750 | 872 | 835 | 734 | 245 | 49 | 282 | 424 | 387 | 784 | 735 | 630 | 593 |
| | 156 | 1082 | 397 | 454 | 34 | 20 | 1163 | 1183 | 1132 | 1083 | 978 | 941 | 504 | 230 |
| | 745 | 802 | 609 | 368 | 311 | 331 | 280 | 361 | 126 | 89 | 852 | 578 | 1093 | 1150 |
| | 957 | 716 | 659 | 679 | 628 | 579 | 474 | 437 | 0 | 926 | 241 | 298 | 105 | 1064 |
| | 942 | 1027 | 749 | 927 | 822 | 785 | 348 | 74 | 589 | 646 | 453 | 212 | 155 | 175 |
| | 124 | 75 | 1008 | 1133 | 696 | 422 | 937 | 994 | 801 | 560 | 503 | 69 | 472 | 553 |
| | 318 | 281 | 1044 | 770 | 85 | 142 | 1149 | 908 | 851 | 871 | 820 | 771 | 666 | 629 |
| | 192 | 1118 | 433 | 263 | 297 | 56 | 1199 | 19 | 1168 | 1119 | 1014 | 523 | 540 | 266 |
| | 651 | 838 | 645 | 404 | 347 | 367 | 316 | 267 | 162 | 125 | 888 | 614 | 1129 | 1186 |
| | 993 | 752 | 695 | 261 | 664 | 615 | 510 | 473 | 652 | 962 | 277 | 334 | 141 | 1100 |
| | 1043 | 1063 | 1012 | 963 | 858 | 821 | 384 | 110 | 625 | 682 | 262 | 248 | 191 | 211 |
| | 160 | 111 | 6 | 715 | 732 | 458 | 973 | 1030 | 837 | 596 | 539 | 559 | 508 | 459 |
| | 354 | 317 | 1080 | 806 | 121 | 178 | 1185 | 944 | 887 | 907 | 856 | 807 | 702 | 665 |
| | 228 | 1154 | 469 | 526 | 333 | 92 | 1170 | 55 | 977 | 1155 | 1050 | 1013 | 576 | 302 |
| | 817 | 874 | 681 | 440 | 383 | 403 | 352 | 303 | 36 | 161 | 924 | 650 | 1165 | 22 |
| | 1029 | 788 | 731 | 751 | 700 | 781 | 546 | 509 | 72 | 998 | 313 | 370 | 177 | 1136 |
| | 1079 | 1099 | 1048 | 999 | 894 | 857 | 420 | 146 | 661 | 718 | 525 | 284 | 227 | 247 |
| | 1169 | 147 | 42 | 5 | 768 | 494 | 879 | 1066 | 873 | 632 | 575 | 595 | 544 | 495 |
| | 390 | 353 | 1116 | 842 | 157 | 214 | 21 | 980 | 923 | 489 | 892 | 843 | 738 | 701 |
| | 264 | 1190 | 505 | 562 | 369 | 128 | 71 | 91 | 40 | 1191 | 1086 | 1049 | 612 | 338 |
| | 853 | 683 | 490 | 476 | 419 | 439 | 388 | 339 | 234 | 943 | 960 | 686 | 1 | 58 |
| | 1065 | 824 | 767 | 787 | 736 | 687 | 582 | 545 | 108 | 1034 | 349 | 406 | 213 | 1172 |
| | 1115 | 1135 | 1084 | 1035 | 930 | 893 | 1072 | 182 | 697 | 754 | 561 | 320 | 198 | 283 |
| | 232 | 183 | 78 | 41 | 804 | 530 | 1045 | 1102 | 909 | 668 | 611 | 631 | 580 | 531 |
| | 426 | 389 | 1152 | 878 | 193 | 250 | 57 | 1016 | 959 | 979 | 928 | 1009 | 774 | 737 |
| | 300 | 26 | 541 | 598 | 405 | 164 | 107 | 127 | 76 | 27 | 1122 | 1085 | 648 | 374 |
| | 889 | 946 | 753 | 512 | 455 | 475 | 197 | 375 | 270 | 233 | 996 | 722 | 37 | 94 |
| | 1101 | 860 | 803 | 823 | 772 | 723 | 456 | 581 | 144 | 1070 | 385 | 442 | 249 | 8 |
| | 1151 | 717 | 966 | 319 | 733 | 218 | 1071 | 1120 | 356 | 492 | 790 | 929 | 597 | 299 |
| | 114 | 667 | 1081 | 566 | 219 | 268 | 704 | 840 | 911 | 77 | 945 | 647 | 462 | 1015 |
| | 99 | 914 | 567 | 616 | 1052 | 1188 | 286 | 1171 | 93 | 995 | 810 | 163 | 577 | 62 |
| | 915 | 964 | 200 | 336 | 634 | 773 | 441 | 143 | 1158 | 511 | 925 | 410 | 63 | 112 |
| | 548 | 100 | 982 | 1121 | 789 | 491 | 306 | 859 | 73 | 758 | 411 | 460 | 896 | 1032 |
| | 130 | 269 | 910 | 839 | 654 | 7 | 421 | 1106 | 759 | 808 | 44 | 180 | 478 | 617 |
| | 285 | 1187 | 1002 | 355 | 769 | 254 | 1107 | 1156 | 392 | 528 | 826 | 965 | 633 | 335 |
| | 150 | 703 | 1117 | 602 | 255 | 304 | 740 | 876 | 1174 | 113 | 981 | 618 | 498 | 1051 |
| | 265 | 950 | 603 | 425 | 1088 | 24 | 322 | 461 | 129 | 1031. | | | | |

3. An apparatus for interleaving a codeword, wherein the codeword comprises a first bit sequence $b'=[b'_0, b'_1, \ldots, b'_{N-1}]\in\{0,1\}^N$ of a block length N, the apparatus comprising:

an interleaver module configured to interleave the codeword based on an interleaver, wherein the interleaver specifies a set of permutation indices $\pi=[\pi(0), \pi(1), \ldots, \pi(N-1)]$;

wherein the interleaving of the codeword comprises reordering or mapping the first bit sequence $b'=[b'_0, b'_1, \ldots, b'_{N-1}]\in\{0,1\}^N$ of the codeword into a second bit sequence $b=[b_0, b_1, \ldots, b_{N-1}]=[b'_{\pi(0)}, b'_{\pi(1)}, \ldots, b'_{\pi(N-1)}]\in\{0,1\}^N$; and wherein, for any one specific block length N listed in the following table, the interleaver comprises the set of permutation indices specified in the table for that block length N:

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| 336 | 156 | 145 | 332 | 198 | 11 | 239 | 22 | 249 | 279 | 290 | 170 | 48 | 264 | 186 |
| | 37 | 305 | 319 | 77 | 130 | 21 | 51 | 62 | 280 | 223 | 238 | 25 | 212 | 78 |
| | 227 | 119 | 104 | 129 | 159 | 172 | 50 | 331 | 144 | 133 | 253 | 185 | 335 | 293 |
| | 10 | 237 | 267 | 278 | 160 | 36 | 118 | 174 | 92 | 294 | 307 | 65 | 320 | 9 |
| | 39 | 52 | 268 | 211 | 24 | 13 | 200 | 66 | 215 | 107 | 226 | 117 | 147 | 158 |
| | 38 | 252 | 132 | 54 | 241 | 173 | 187 | 281 | 334 | 225 | 255 | 266 | 148 | 91 |
| | 80 | 282 | 229 | 199 | 323 | 106 | 40 | 27 | 95 | 308 | 333 | 254 | 121 | 53 |
| | 1 | 240 | 161 | 12 | 146 | 135 | 203 | 214 | 105 | 28 | 296 | 162 | 42 | 79 |
| | 269 | 322 | 256 | 243 | 175 | 188 | 213 | 136 | 68 | 270 | 217 | 120 | 311 | 228 |
| | 26 | 15 | 83 | 94 | 321 | 242 | 109 | 41 | 258 | 295 | 149 | 0 | 134 | 123 |
| | 55 | 202 | 93 | 16 | 284 | 150 | 30 | 67 | 191 | 310 | 244 | 231 | 163 | 176 |
| | 201 | 122 | 325 | 257 | 205 | 108 | 299 | 216 | 14 | 3 | 71 | 82 | 309 | 230 |
| | 4 | 283 | 56 | 111 | 97 | 190 | 137 | 79 | 246 | 81 | 43 | 124 | 110 | 324 |
| | 164 | 219 | 272 | 298 | 179 | 138 | 85 | 189 | 287 | 232 | 220 | 96 | 70 | 327 |
| | 313 | 204 | 17 | 245 | 126 | 297 | 259 | 2 | 326 | 271 | 44 | 99 | 152 | 178 |
| | 59 | 18 | 234 | 69 | 31 | 112 | 98 | 312 | 286 | 207 | 193 | 84 | 167 | 125 |
| | 73 | 177 | 275 | 218 | 208 | 151 | 260 | 315 | 301 | 58 | 5 | 233 | 114 | 285 |
| | 247 | 328 | 314 | 192 | 32 | 87 | 140 | 166 | 47 | 6 | 289 | 57 | 155 | 100 |
| | 274 | 72 | 127 | 206 | 88 | 330 | 221 | 165 | 181 | 195 | 113 | 300 | 248 | 46 |
| | 235 | 316 | 194 | 102 | 263 | 273 | 20 | 303 | 222 | 139 | 154 | 288 | 143 | 86 |
| | 302 | 277 | 35 | 45 | 61 | 75 | 329 | 180 | 128 | 262 | 115 | 196 | 76 | 318 |
| | 209 | 153 | 169 | 183 | 101 | 19 | 236 | 34 | 23 | 304 | 182 | 157 | 251 | 261 |
| | 8 | 291 | 210 | 60 | 142 | 276 | 131 | 74 | 292 | 265 | 89 | 33 | 49 | 63 |
| | 317 | 168 | 116 | 250 | 103 | 184 | 64 | 306 | 197 | 141 | 224 | 171 | 90 | 7 |
| 471 | 374 | 169 | 5 | 160 | 344 | 25 | 70 | 259 | 419 | 393 | 120 | 185 | 206 | 1 |
| | 46 | 460 | 176 | 325 | 370 | 91 | 251 | 470 | 235 | 420 | 17 | 38 | 301 | 346 |
| | 292 | 8 | 157 | 202 | 391 | 83 | 67 | 252 | 317 | 338 | 133 | 178 | 124 | 308 |
| | 457 | 34 | 223 | 383 | 367 | 84 | 149 | 170 | 433 | 269 | 384 | 140 | 339 | 364 |
| | 294 | 225 | 189 | 155 | 210 | 2 | 315 | 101 | 216 | 440 | 171 | 196 | 126 | 57 |
| | 21 | 455 | 42 | 302 | 147 | 401 | 48 | 272 | 3 | 78 | 426 | 357 | 321 | 287 |
| | 342 | 134 | 447 | 233 | 348 | 104 | 303 | 328 | 258 | 179 | 153 | 119 | 174 | 434 |
| | 229 | 274 | 220 | 404 | 85 | 130 | 319 | 11 | 453 | 180 | 245 | 266 | 61 | 106 |
| | 52 | 236 | 385 | 430 | 151 | 311 | 295 | 12 | 77 | 469 | 98 | 361 | 406 | 352 |
| | 68 | 217 | 262 | 451 | 143 | 127 | 312 | 377 | 398 | 193 | 238 | 184 | 368 | 49 |
| | 94 | 283 | 443 | 427 | 144 | 438 | 329 | 444 | 75 | 270 | 399 | 230 | 249 | 285 |
| | 200 | 424 | 354 | 215 | 161 | 276 | 375 | 102 | 231 | 62 | 81 | 117 | 32 | 256 |
| | 186 | 47 | 461 | 108 | 207 | 402 | 63 | 362 | 381 | 417 | 332 | 88 | 18 | 347 |
| | 293 | 448 | 39 | 234 | 363 | 194 | 213 | 239 | 164 | 388 | 318 | 408 | 334 | 280 |
| | 289 | 305 | 145 | 26 | 55 | 71 | 464 | 190 | 379 | 240 | 166 | 112 | 121 | 137 |
| | 445 | 326 | 355 | 371 | 296 | 22 | 211 | 72 | 466 | 412 | 421 | 468 | 437 | 277 |
| | 158 | 187 | 203 | 128 | 322 | 43 | 372 | 298 | 244 | 253 | 30 | 109 | 458 | 19 |
| | 45 | 428 | 154 | 343 | 204 | 389 | 36 | 135 | 330 | 459 | 290 | 309 | 345 | 260 |
| | 16 | 414 | 275 | 336 | 435 | 107 | 92 | 246 | 141 | 122 | 177 | 291 | 316 | 221 |
| | 162 | 168 | 267 | 407 | 392 | 78 | 441 | 422 | 9 | 123 | 148 | 53 | 462 | 0 |
| | 65 | 418 | 299 | 353 | 254 | 423 | 40 | 99 | 378 | 224 | 273 | 300 | 365 | 250 |
| | 131 | 394 | 86 | 205 | 340 | 349 | 439 | 56 | 115 | 132 | 197 | 82 | 431 | 226 |
| | 386 | 37 | 172 | 181 | 271 | 356 | 415 | 432 | 29 | 382 | 263 | 58 | 218 | 337 |
| | 4 | 13 | 103 | 188 | 247 | 35 | 90 | 214 | 105 | 358 | 50 | 219 | 264 | 313 |
| | 403 | 20 | 79 | 335 | 390 | 76 | 405 | 449 | 350 | 51 | 96 | 195 | 6 | 320 |
| | 369 | 167 | 222 | 376 | 237 | 281 | 182 | 351 | 396 | 27 | 306 | 152 | 201 | 467 |
| | 54 | 208 | 69 | 113 | 14 | 183 | 228 | 327 | 138 | 452 | 33 | 60 | 125 | 10 |
| | 359 | 413 | 314 | 15 | 100 | 159 | 199 | 284 | 333 | 360 | 425 | 310 | 191 | 454 |
| | 146 | 265 | 400 | 409 | 31 | 116 | 175 | 142 | 446 | 416 | 7 | 192 | 241 | 97 |
| | 331 | 286 | 23 | 232 | 257 | 442 | 278 | 248 | 307 | 24 | 73 | 397 | 163 | 118 |
| | 323 | 64 | 89 | 304 | 110 | 80 | 139 | 95 | 373 | 279 | 463 | 209 | 165 | 324 |
| | 150 | 136 | 410 | 380 | 429 | 395 | 255 | 111 | 66 | 41 | 465 | 156 | 450 | 436 |
| | 242 | 212 | 261 | 227 | 87 | 411 | 366 | 341 | 297 | 456 | 282 | 268 | 74 | 44 |
| | 93 | 59 | 387 | 243 | 198 | 173 | 129 | 288 | 114 | | | | | |
| 504 | 293 | 325 | 372 | 104 | 171 | 438 | 19 | 467 | 350 | 154 | 208 | 237 | 70 | 121 |
| | 482 | 366 | 357 | 215 | 319 | 244 | 336 | 454 | 99 | 185 | 389 | 421 | 278 | 200 |
| | 267 | 30 | 115 | 59 | 446 | 212 | 304 | 333 | 166 | 217 | 264 | 462 | 453 | 311 |
| | 415 | 359 | 432 | 46 | 195 | 281 | 485 | 13 | 374 | 296 | 363 | 107 | 211 | 136 |
| | 38 | 308 | 400 | 429 | 262 | 313 | 360 | 54 | 159 | 426 | 7 | 455 | 24 | 142 |
| | 291 | 377 | 77 | 109 | 470 | 354 | 345 | 203 | 307 | 232 | 134 | 404 | 496 | 21 |
| | 358 | 409 | 456 | 188 | 255 | 18 | 103 | 47 | 120 | 238 | 387 | 321 | 173 | 205 |

-continued

| Block Length N | Permutation Indices $\pi = [\pi(0), \pi(1), \ldots, \pi(N-1)]$ | | | | | | | | | | | | |
|---|---|---|---|---|---|---|---|---|---|---|---|---|---|---|
| | 62 | 450 | 441 | 299 | 403 | 328 | 230 | 500 | 183 | 269 | 473 | 1 | 48 | 284 |
| | 351 | 114 | 199 | 143 | 26 | 334 | 388 | 417 | 250 | 301 | 158 | 42 | 33 | 395 |
| | 499 | 424 | 12 | 92 | 279 | 365 | 65 | 97 | 144 | 380 | 447 | 210 | 295 | 239 |
| | 122 | 392 | 484 | 9 | 254 | 138 | 397 | 461 | 491 | 346 | 226 | 108 | 129 | 91 |
| | 16 | 375 | 50 | 476 | 193 | 105 | 306 | 161 | 488 | 218 | 39 | 391 | 316 | 76 |
| | 36 | 234 | 493 | 53 | 102 | 442 | 322 | 204 | 225 | 187 | 131 | 471 | 146 | 68 |
| | 289 | 201 | 383 | 257 | 80 | 314 | 135 | 487 | 412 | 172 | 132 | 330 | 85 | 149 |
| | 198 | 34 | 418 | 300 | 435 | 283 | 227 | 63 | 242 | 126 | 385 | 449 | 479 | 353 |
| | 176 | 410 | 117 | 79 | 4 | 268 | 228 | 464 | 181 | 93 | 294 | 130 | 10 | 396 |
| | 27 | 379 | 323 | 64 | 338 | 222 | 481 | 41 | 71 | 430 | 272 | 2 | 213 | 175 |
| | 100 | 459 | 324 | 56 | 277 | 189 | 390 | 245 | 106 | 302 | 123 | 475 | 419 | 160 |
| | 318 | 73 | 51 | 309 | 196 | 368 | 22 | 288 | 167 | 271 | 434 | 137 | 152 | 373 |
| | 256 | 219 | 11 | 164 | 341 | 398 | 486 | 67 | 420 | 285 | 147 | 233 | 367 | 384 |
| | 216 | 118 | 263 | 414 | 169 | 292 | 405 | 502 | 352 | 381 | 163 | 494 | 326 | 437 |
| | 78 | 248 | 469 | 88 | 315 | 260 | 243 | 329 | 463 | 480 | 312 | 214 | 378 | 6 |
| | 265 | 407 | 501 | 94 | 448 | 477 | 259 | 86 | 422 | 29 | 155 | 344 | 61 | 184 |
| | 297 | 356 | 339 | 425 | 55 | 72 | 408 | 310 | 474 | 140 | 361 | 503 | 207 | 190 |
| | 40 | 221 | 355 | 182 | 14 | 125 | 251 | 402 | 157 | 280 | 393 | 452 | 340 | 369 |
| | 151 | 168 | 0 | 406 | 66 | 236 | 457 | 95 | 303 | 286 | 231 | 317 | 451 | 468 |
| | 110 | 202 | 347 | 498 | 253 | 376 | 489 | 44 | 436 | 465 | 247 | 74 | 96 | 17 |
| | 162 | 332 | 49 | 191 | 399 | 382 | 327 | 413 | 43 | 60 | 206 | 298 | 443 | 90 |
| | 349 | 472 | 81 | 178 | 343 | 113 | 495 | 440 | 28 | 145 | 258 | 287 | 192 | 170 |
| | 428 | 57 | 139 | 394 | 177 | 274 | 423 | 445 | 35 | 83 | 492 | 156 | 186 | 5 |
| | 439 | 209 | 87 | 32 | 124 | 241 | 335 | 364 | 98 | 266 | 20 | 153 | 235 | 490 |
| | 273 | 370 | 15 | 37 | 150 | 179 | 84 | 252 | 282 | 101 | 31 | 305 | 69 | 128 |
| | 220 | 337 | 431 | 460 | 194 | 362 | 116 | 249 | 331 | 82 | 483 | 466 | 111 | 133 |
| | 246 | 275 | 180 | 348 | 416 | 45 | 127 | 401 | 165 | 224 | 411 | 433 | 23 | 52 |
| | 290 | 458 | 174 | 497 | 427 | 197 | 75 | 58 | 112 | 229 | 342 | 371 | 276 | 444 |
| | 8 | 141 | 223 | 478 | 261 | 320 | 3 | 25 | 119 | 148 | 386 | 240 | 270 | 89 |
| 603 | 127 | 490 | 316 | 213 | 386 | 406 | 14 | 306 | 63 | 445 | 137 | 203 | 499 | 152 |
| | 88 | 585 | 540 | 178 | 4 | 78 | 435 | 602 | 271 | 509 | 575 | 599 | 524 | 460 |
| | 357 | 312 | 440 | 158 | 450 | 207 | 589 | 281 | 347 | 43 | 296 | 232 | 129 | 84 |
| | 322 | 530 | 277 | 579 | 361 | 162 | 119 | 415 | 68 | 113 | 501 | 456 | 94 | 302 |
| | 594 | 351 | 133 | 425 | 0 | 187 | 550 | 376 | 273 | 228 | 466 | 74 | 366 | 123 |
| | 505 | 197 | 263 | 559 | 212 | 148 | 45 | 218 | 238 | 446 | 138 | 495 | 331 | 569 |
| | 35 | 59 | 584 | 520 | 417 | 372 | 10 | 436 | 510 | 267 | 49 | 341 | 407 | 103 |
| | 356 | 292 | 189 | 144 | 272 | 590 | 282 | 39 | 421 | 222 | 179 | 475 | 128 | 64 |
| | 561 | 516 | 154 | 362 | 109 | 411 | 193 | 485 | 60 | 601 | 247 | 500 | 545 | 333 |
| | 288 | 526 | 134 | 426 | 183 | 565 | 257 | 323 | 19 | 382 | 208 | 105 | 278 | 298 |
| | 506 | 198 | 555 | 337 | 29 | 95 | 391 | 44 | 580 | 477 | 432 | 70 | 496 | 570 |
| | 327 | 163 | 401 | 467 | 491 | 416 | 352 | 249 | 204 | 332 | 50 | 342 | 99 | 481 |
| | 173 | 239 | 124 | 21 | 188 | 11 | 214 | 535 | 253 | 471 | 576 | 422 | 169 | 54 |
| | 5 | 393 | 560 | 492 | 586 | 307 | 25 | 243 | 348 | 194 | 486 | 317 | 268 | 165 |
| | 442 | 155 | 358 | 79 | 397 | 15 | 120 | 566 | 258 | 89 | 40 | 537 | 104 | 527 |
| | 130 | 451 | 223 | 387 | 110 | 338 | 30 | 461 | 412 | 309 | 476 | 600 | 299 | 502 |
| | 551 | 541 | 159 | 264 | 328 | 402 | 233 | 184 | 81 | 248 | 71 | 164 | 595 | 313 |
| | 531 | 36 | 482 | 174 | 114 | 556 | 453 | 20 | 552 | 46 | 367 | 85 | 303 | 408 |
| | 254 | 1 | 377 | 437 | 225 | 392 | 215 | 418 | 139 | 457 | 75 | 180 | 26 | 318 |
| | 149 | 100 | 597 | 274 | 587 | 190 | 511 | 229 | 447 | 170 | 398 | 90 | 521 | 472 |
| | 369 | 536 | 359 | 562 | 283 | 55 | 219 | 324 | 388 | 462 | 293 | 244 | 141 | 308 |
| | 131 | 224 | 383 | 373 | 591 | 96 | 542 | 234 | 65 | 16 | 513 | 80 | 503 | 106 |
| | 427 | 145 | 363 | 468 | 314 | 61 | 546 | 452 | 209 | 86 | 135 | 378 | 517 | 240 |
| | 497 | 285 | 478 | 384 | 199 | 334 | 581 | 458 | 507 | 150 | 289 | 12 | 160 | 57 |
| | 250 | 47 | 571 | 596 | 353 | 230 | 279 | 522 | 115 | 2 | 532 | 429 | 22 | 419 |
| | 343 | 368 | 125 | 220 | 51 | 294 | 433 | 156 | 304 | 201 | 394 | 191 | 443 | 140 |
| | 6 | 374 | 423 | 66 | 205 | 528 | 76 | 573 | 56 | 563 | 487 | 512 | 269 | 146 |
| | 195 | 493 | 577 | 300 | 448 | 345 | 538 | 444 | 259 | 284 | 41 | 518 | 567 | 210 |
| | 349 | 72 | 329 | 117 | 310 | 216 | 31 | 166 | 413 | 290 | 339 | 582 | 121 | 62 |
| | 592 | 489 | 82 | 479 | 403 | 428 | 185 | 280 | 111 | 354 | 547 | 434 | 364 | 261 |
| | 454 | 251 | 175 | 200 | 557 | 52 | 483 | 126 | 265 | 588 | 136 | 33 | 116 | 23 |
| | 275 | 572 | 438 | 206 | 255 | 553 | 37 | 360 | 508 | 405 | 488 | 395 | 319 | 344 |
| | 101 | 578 | 27 | 325 | 409 | 132 | 389 | 177 | 370 | 276 | 91 | 350 | 181 | 539 |
| | 463 | 226 | 549 | 504 | 142 | 42 | 399 | 161 | 473 | 122 | 7 | 311 | 235 | 598 |
| | 321 | 494 | 514 | 414 | 171 | 424 | 245 | 112 | 335 | 48 | 379 | 17 | 260 | 286 |
| | 186 | 196 | 543 | 93 | 83 | 266 | 107 | 420 | 97 | 498 | 32 | 548 | 558 | 568 |
| | 315 | 465 | 455 | 38 | 151 | 192 | 469 | 270 | 404 | 430 | 385 | 340 | 87 | 237 |
| | 227 | 410 | 523 | 564 | 241 | 533 | 176 | 202 | 102 | 221 | 459 | 9 | 108 | 182 |
| | 295 | 336 | 13 | 305 | 58 | 574 | 474 | 484 | 231 | 381 | 371 | 554 | 67 | 326 |
| | 439 | 77 | 320 | 346 | 246 | 256 | 3 | 153 | 143 | 544 | 167 | 480 | 157 | 449 |
| | 92 | 118 | 18 | 28 | 375 | 525 | 515 | 98 | 211 | 252 | 529 | 330 | 464 | 380 |
| | 390 | 400 | 147 | 297 | 287 | 470 | 583 | 24 | 301 | 593 | 236 | 262 | 217 | 172 |
| | 519 | 69 | 168 | 242 | 355 | 396 | 73 | 365 | 8 | 34 | 534 | 53 | 291 | 441 |
| | 431 | | | | | | | | | | | | | |
| 804 | 168 | 361 | 473 | 794 | 38 | 53 | 487 | 346 | 764 | 87 | 135 | 102 | 635 | 265 |
| | 57 | 216 | 424 | 520 | 391 | 491 | 666 | 153 | 442 | 6 | 780 | 169 | 281 | 602 |
| | 328 | 665 | 295 | 395 | 572 | 699 | 747 | 716 | 443 | 73 | 669 | 24 | 554 | 569 |
| | 199 | 58 | 476 | 765 | 250 | 618 | 588 | 781 | 89 | 410 | 136 | 232 | 103 | 203 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 378 | 507 | 154 | 524 | 251 | 685 | 477 | 314 | 362 | 377 | 7 | 670 | 284 | 573 |
| | 459 | 426 | 396 | 589 | 381 | 540 | 748 | 40 | 715 | 11 | 186 | 315 | 766 | 332 |
| | 300 | 493 | 605 | 122 | 170 | 185 | 619 | 719 | 97 | 219 | 267 | 234 | 767 | 397 |
| | 189 | 348 | 556 | 652 | 523 | 382 | 800 | 285 | 574 | 138 | 108 | 301 | 413 | 734 |
| | 460 | 797 | 427 | 527 | 702 | 27 | 478 | 44 | 575 | 205 | 801 | 638 | 686 | 701 |
| | 331 | 190 | 608 | 93 | 783 | 750 | 720 | 109 | 705 | 60 | 268 | 364 | 235 | 335 |
| | 510 | 639 | 286 | 656 | 624 | 13 | 125 | 446 | 494 | 509 | 139 | 239 | 416 | 543 |
| | 591 | 558 | 287 | 721 | 513 | 672 | 76 | 172 | 43 | 706 | 320 | 609 | 94 | 462 |
| | 432 | 625 | 737 | 254 | 784 | 317 | 751 | 47 | 222 | 351 | 802 | 368 | 95 | 529 |
| | 321 | 158 | 206 | 221 | 655 | 514 | 128 | 417 | 303 | 270 | 240 | 433 | 225 | 384 |
| | 592 | 688 | 559 | 659 | 30 | 159 | 610 | 176 | 144 | 337 | 449 | 770 | 14 | 29 |
| | 463 | 563 | 740 | 63 | 111 | 78 | 611 | 241 | 33 | 192 | 400 | 496 | 367 | 226 |
| | 644 | 129 | 418 | 786 | 756 | 145 | 257 | 578 | 304 | 641 | 271 | 371 | 546 | 675 |
| | 322 | 692 | 645 | 482 | 49 | 594 | 545 | 419 | 741 | 452 | 530 | 175 | 34 | 627 |
| | 549 | 708 | 757 | 500 | 208 | 564 | 483 | 354 | 112 | 79 | 179 | 130 | 773 | 290 |
| | 661 | 402 | 353 | 468 | 387 | 260 | 338 | 787 | 83 | 435 | 357 | 516 | 565 | 306 |
| | 16 | 131 | 453 | 164 | 724 | 691 | 550 | 742 | 581 | 98 | 469 | 717 | 161 | 276 |
| | 195 | 66 | 628 | 595 | 695 | 646 | 165 | 2 | 373 | 114 | 65 | 743 | 261 | 776 |
| | 50 | 499 | 358 | 147 | 69 | 228 | 277 | 20 | 532 | 84 | 3 | 678 | 436 | 403 |
| | 503 | 454 | 293 | 614 | 181 | 726 | 677 | 792 | 711 | 584 | 662 | 307 | 407 | 759 |
| | 681 | 36 | 85 | 630 | 340 | 455 | 777 | 488 | 244 | 211 | 70 | 262 | 101 | 422 |
| | 793 | 536 | 485 | 600 | 519 | 390 | 148 | 115 | 215 | 166 | 489 | 326 | 697 | 438 |
| | 389 | 263 | 585 | 296 | 374 | 19 | 682 | 471 | 393 | 552 | 601 | 344 | 52 | 408 |
| | 327 | 198 | 760 | 727 | 23 | 778 | 617 | 134 | 505 | 246 | 197 | 312 | 231 | 104 |
| | 182 | 631 | 731 | 279 | 201 | 360 | 409 | 150 | 664 | 779 | 297 | 8 | 568 | 535 |
| | 394 | 586 | 425 | 746 | 313 | 56 | 5 | 120 | 39 | 714 | 472 | 439 | 539 | 490 |
| | 9 | 650 | 217 | 762 | 713 | 587 | 105 | 620 | 698 | 343 | 202 | 795 | 717 | 72 |
| | 121 | 668 | 376 | 732 | 651 | 522 | 280 | 247 | 347 | 298 | 137 | 458 | 75 | 570 |
| | 521 | 636 | 555 | 428 | 506 | 151 | 10 | 603 | 733 | 106 | 55 | 330 | 155 | 621 |
| | 88 | 525 | 684 | 184 | 474 | 299 | 637 | 411 | 763 | 236 | 59 | 363 | 796 | 749 |
| | 266 | 329 | 380 | 444 | 718 | 282 | 667 | 140 | 333 | 107 | 233 | 492 | 541 | 526 |
| | 218 | 429 | 622 | 188 | 571 | 42 | 237 | 252 | 700 | 74 | 445 | 671 | 604 | 171 |
| | 123 | 90 | 475 | 752 | 461 | 156 | 41 | 782 | 349 | 334 | 26 | 75 | 430 | 798 |
| | 379 | 654 | 45 | 623 | 508 | 204 | 253 | 479 | 412 | 141 | 735 | 704 | 283 | 560 |
| | 269 | 768 | 653 | 590 | 157 | 383 | 316 | 687 | 238 | 606 | 187 | 464 | 657 | 431 |
| | 557 | 12 | 61 | 46 | 542 | 753 | 142 | 512 | 91 | 366 | 561 | 576 | 220 | 398 |
| | 769 | 191 | 124 | 495 | 447 | 414 | 799 | 272 | 785 | 480 | 365 | 302 | 673 | 658 |
| | 350 | 399 | 754 | 318 | 703 | 174 | 369 | 143 | 28 | 528 | 577 | 803 | 736 | 465 |
| | 255 | 224 | 607 | 80 | 593 | 288 | 173 | 110 | 481 | 707 | 640 | 207 | 562 | 126 |
| | 511 | 788 | 177 | 755 | 77 | 336 | 385 | 370 | 62 | 273 | 466 | 32 | 415 | 690 |
| | 81 | 96 | 544 | 722 | 289 | 515 | 448 | 15 | 771 | 738 | 319 | 596 | 305 | 0 |
| | 689 | 626 | 193 | 178 | 674 | 723 | 274 | 642 | 223 | 498 | 693 | 467 | 352 | 48 |
| | 97 | 323 | 256 | 789 | 127 | 612 | 160 | 531 | 579 | 1 | 497 | 227 | 113 | 404 |
| | 434 | 548 | 31 | 275 | 386 | 597 | 82 | 709 | 401 | 694 | 501 | 308 | 660 | 450 |
| | 739 | 420 | 772 | 339 | 790 | 613 | 64 | 35 | 405 | 210 | 242 | 356 | 643 | 324 |
| | 194 | 243 | 291 | 517 | 209 | 502 | 629 | 116 | 146 | 258 | 547 | 791 | 580 | 309 |
| | 598 | 421 | 676 | 647 | 213 | 18 | 372 | 162 | 451 | 132 | 484 | 51 | 99 | 325 |
| | 17 | 551 | 437 | 728 | 758 | 68 | 355 | 599 | 710 | 117 | 406 | 229 | 725 | 214 |
| | 21 | 632 | 180 | 774 | 259 | 744 | 292 | 663 | 310 | 133 | 388 | 359 | 729 | 534 |
| | 566 | 680 | 163 | 648 | 518 | 567 | 615 | 37 | 533 | 22 | 149 | 440 | 470 | 582 |
| | 67 | 311 | 100 | 633 | 118 | 745 | 196 | 167 | 537 | 342 | 696 | 486 | 775 | 456 |
| | 4 | 375 | 423 | 649 | 341 | 71 | 761 | 248 | 278 | 392 | 679 | 119 | 230 | 441 |
| | 730 | 553 | 245 | 538 | 345 | 152 | 504 | 294 | 583 | 264 | 616 | 183 | 634 | 457 |
| | 712 | 683 | 249 | 54 | 86 | 200 | | | | | | | | |
| 912 | 576 | 882 | 475 | 762 | 257 | 905 | 705 | 400 | 128 | 86 | 651 | 685 | 252 | 558 |
| | 151 | 438 | 845 | 581 | 381 | 76 | 550 | 592 | 327 | 361 | 94 | 234 | 739 | 114 |
| | 521 | 671 | 57 | 664 | 226 | 268 | 3 | 37 | 682 | 822 | 415 | 702 | 197 | 347 |
| | 645 | 422 | 814 | 856 | 591 | 625 | 358 | 498 | 464 | 751 | 785 | 23 | 321 | 98 |
| | 490 | 532 | 267 | 840 | 34 | 215 | 140 | 427 | 709 | 611 | 909 | 686 | 166 | 208 |
| | 855 | 516 | 622 | 803 | 728 | 103 | 385 | 287 | 585 | 362 | 8 | 878 | 531 | 192 |
| | 132 | 479 | 404 | 691 | 61 | 461 | 261 | 38 | 596 | 554 | 207 | 780 | 720 | 155 |
| | 80 | 367 | 649 | 137 | 849 | 544 | 272 | 230 | 795 | 456 | 396 | 743 | 295 | 43 |
| | 325 | 725 | 525 | 220 | 860 | 818 | 471 | 505 | 72 | 378 | 883 | 258 | 1 | 401 |
| | 201 | 808 | 536 | 494 | 147 | 181 | 660 | 54 | 559 | 846 | 341 | 77 | 789 | 484 |
| | 46 | 88 | 735 | 769 | 502 | 642 | 235 | 522 | 17 | 665 | 465 | 160 | 634 | 676 |
| | 411 | 445 | 178 | 318 | 823 | 198 | 605 | 755 | 141 | 748 | 310 | 352 | 87 | 121 |
| | 766 | 906 | 499 | 786 | 281 | 431 | 729 | 506 | 898 | 28 | 675 | 336 | 442 | 582 |
| | 548 | 835 | 869 | 107 | 405 | 182 | 574 | 616 | 351 | 12 | 118 | 299 | 224 | 511 |
| | 793 | 695 | 81 | 770 | 250 | 292 | 27 | 600 | 706 | 887 | 812 | 187 | 469 | 371 |
| | 669 | 446 | 92 | 50 | 615 | 276 | 216 | 563 | 488 | 775 | 145 | 545 | 345 | 122 |
| | 680 | 638 | 291 | 864 | 804 | 239 | 164 | 451 | 733 | 221 | 21 | 628 | 356 | 314 |
| | 879 | 540 | 379 | 127 | 827 | 589 | 809 | 480 | 902 | 32 | 409 | 609 | 304 | 555 |
| | 55 | 342 | 462 | 265 | 485 | 156 | 578 | 620 | 85 | 285 | 892 | 231 | 643 | 18 |
| | 138 | 853 | 161 | 744 | 172 | 130 | 425 | 873 | 568 | 819 | 319 | 606 | 726 | 529 |
| | 749 | 586 | 760 | 718 | 101 | 549 | 244 | 495 | 907 | 282 | 402 | 205 | 839 | 262 |
| | 436 | 394 | 689 | 225 | 832 | 171 | 583 | 870 | 78 | 420 | 515 | 850 | 112 | 70 |
| | 365 | 813 | 590 | 759 | 632 | 7 | 666 | 96 | 191 | 526 | 700 | 658 | 41 | 489 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 266 | 435 | 308 | 595 | 383 | 684 | 779 | 202 | 376 | 334 | 877 | 165 | 854 | 111 |
| | 896 | 271 | 59 | 360 | 455 | 790 | 134 | 176 | 553 | 753 | 530 | 699 | 572 | 859 |
| | 647 | 36 | 629 | 300 | 722 | 764 | 229 | 429 | 206 | 375 | 248 | 535 | 323 | 624 |
| | 305 | 888 | 398 | 440 | 817 | 105 | 712 | 51 | 463 | 211 | 911 | 673 | 893 | 564 |
| | 74 | 116 | 493 | 693 | 388 | 639 | 139 | 426 | 546 | 349 | 569 | 240 | 662 | 704 |
| | 169 | 369 | 64 | 315 | 727 | 102 | 222 | 25 | 245 | 828 | 256 | 214 | 509 | 45 |
| | 652 | 903 | 403 | 690 | 810 | 613 | 833 | 670 | 844 | 802 | 185 | 633 | 328 | 579 |
| | 79 | 366 | 486 | 289 | 11 | 346 | 520 | 478 | 773 | 309 | 4 | 255 | 667 | 42 |
| | 162 | 504 | 599 | 22 | 196 | 154 | 449 | 897 | 674 | 843 | 716 | 91 | 750 | 180 |
| | 275 | 610 | 784 | 742 | 125 | 573 | 350 | 519 | 679 | 467 | 195 | 49 | 26 | 460 |
| | 286 | 418 | 863 | 249 | 392 | 768 | 783 | 444 | 837 | 260 | 68 | 874 | 539 | 355 |
| | 143 | 614 | 637 | 218 | 459 | 120 | 513 | 848 | 656 | 384 | 713 | 31 | 731 | 290 |
| | 313 | 806 | 135 | 708 | 189 | 524 | 332 | 60 | 389 | 619 | 407 | 796 | 901 | 482 |
| | 723 | 757 | 777 | 200 | 547 | 648 | 65 | 834 | 83 | 472 | 577 | 158 | 399 | 433 |
| | 453 | 788 | 223 | 324 | 653 | 510 | 630 | 148 | 5 | 746 | 75 | 109 | 129 | 298 |
| | 811 | 0 | 329 | 186 | 306 | 736 | 593 | 340 | 663 | 697 | 717 | 886 | 487 | 754 |
| | 419 | 774 | 894 | 412 | 269 | 16 | 339 | 373 | 393 | 562 | 163 | 430 | 95 | 450 |
| | 570 | 170 | 857 | 604 | 15 | 588 | 69 | 238 | 212 | 106 | 683 | 126 | 246 | 758 |
| | 533 | 280 | 603 | 264 | 657 | 826 | 800 | 694 | 359 | 175 | 875 | 434 | 209 | 868 |
| | 279 | 852 | 333 | 668 | 476 | 370 | 35 | 763 | 551 | 110 | 133 | 626 | 867 | 528 |
| | 9 | 344 | 152 | 792 | 623 | 439 | 227 | 698 | 721 | 302 | 543 | 204 | 597 | 20 |
| | 740 | 468 | 797 | 115 | 815 | 374 | 397 | 890 | 219 | 253 | 273 | 608 | 416 | 144 |
| | 473 | 703 | 491 | 880 | 73 | 566 | 807 | 841 | 861 | 284 | 631 | 732 | 149 | 6 |
| | 167 | 556 | 661 | 242 | 483 | 517 | 537 | 872 | 307 | 408 | 737 | 594 | 714 | 232 |
| | 89 | 830 | 159 | 193 | 213 | 382 | 895 | 84 | 413 | 270 | 390 | 820 | 677 | 424 |
| | 747 | 781 | 801 | 58 | 571 | 838 | 503 | 858 | 66 | 496 | 353 | 100 | 423 | 457 |
| | 477 | 646 | 247 | 514 | 179 | 534 | 654 | 254 | 29 | 688 | 153 | 190 | 617 | 364 |
| | 99 | 330 | 767 | 842 | 296 | 322 | 210 | 672 | 741 | 778 | 293 | 40 | 687 | 47 |
| | 443 | 518 | 884 | 910 | 259 | 348 | 417 | 454 | 217 | 710 | 363 | 635 | 119 | 194 |
| | 560 | 752 | 847 | 24 | 93 | 876 | 805 | 386 | 39 | 311 | 707 | 782 | 236 | 428 |
| | 523 | 612 | 681 | 552 | 481 | 62 | 627 | 899 | 881 | 458 | 824 | 104 | 199 | 288 |
| | 357 | 228 | 157 | 650 | 303 | 575 | 557 | 52 | 500 | 692 | 787 | 337 | 33 | 816 |
| | 745 | 326 | 891 | 251 | 233 | 640 | 715 | 368 | 90 | 13 | 621 | 492 | 173 | 2 |
| | 567 | 798 | 821 | 316 | 391 | 44 | 678 | 601 | 297 | 168 | 761 | 508 | 243 | 474 |
| | 497 | 904 | 67 | 466 | 354 | 277 | 885 | 10 | 437 | 184 | 831 | 150 | 587 | 580 |
| | 655 | 142 | 30 | 865 | 561 | 598 | 113 | 772 | 507 | 738 | 263 | 338 | 331 | 730 |
| | 618 | 541 | 237 | 274 | 701 | 448 | 183 | 414 | 851 | 14 | 380 | 406 | 294 | 756 |
| | 825 | 862 | 377 | 124 | 771 | 131 | 527 | 602 | 56 | 82 | 343 | 432 | 501 | 538 |
| | 301 | 794 | 447 | 719 | 203 | 278 | 644 | 836 | 19 | 108 | 177 | 48 | 889 | 470 |
| | 123 | 395 | 791 | 866 | 320 | 512 | 607 | 696 | 765 | 636 | 565 | 146 | 711 | 71 |
| | 53 | 542 | 908 | 188 | 283 | 372 | 441 | 312 | 241 | 734 | 387 | 659 | 641 | 136 |
| | 584 | 776 | 871 | 421 | 117 | 900 | 829 | 410 | 63 | 335 | 317 | 724 | 799 | 452 |
| | 174 | 97 | | | | | | | | | | | | |
| 1200 | 199 | 1000 | 670 | 477 | 613 | 236 | 684 | 372 | 809 | 98 | 951 | 179 | 547 | 148 |
| | 1018 | 825 | 961 | 584 | 1194 | 720 | 1157 | 446 | 229 | 527 | 895 | 496 | 1139 | 1173 |
| | 109 | 932 | 342 | 1068 | 305 | 794 | 447 | 875 | 43 | 844 | 514 | 321 | 327 | 80 |
| | 690 | 216 | 653 | 1142 | 795 | 23 | 1137 | 1192 | 862 | 669 | 805 | 428 | 1038 | 564 |
| | 1001 | 290 | 1143 | 371 | 739 | 340 | 10 | 1017 | 1153 | 776 | 186 | 328 | 149 | 638 |
| | 291 | 719 | 1087 | 688 | 131 | 1138 | 301 | 1124 | 534 | 60 | 497 | 986 | 639 | 1067 |
| | 235 | 1036 | 706 | 513 | 649 | 272 | 882 | 408 | 391 | 134 | 987 | 215 | 583 | 184 |
| | 1054 | 861 | 997 | 620 | 30 | 756 | 1193 | 482 | 135 | 563 | 931 | 532 | 202 | 9 |
| | 145 | 968 | 378 | 520 | 341 | 830 | 483 | 846 | 79 | 880 | 550 | 357 | 493 | 116 |
| | 726 | 252 | 689 | 1178 | 831 | 59 | 427 | 28 | 898 | 705 | 841 | 464 | 912 | 600 |
| | 1037 | 326 | 1179 | 407 | 775 | 376 | 46 | 1053 | 1189 | 812 | 222 | 948 | 185 | 674 |
| | 457 | 755 | 1123 | 724 | 394 | 201 | 337 | 1160 | 570 | 96 | 533 | 1022 | 675 | 1103 |
| | 271 | 845 | 742 | 549 | 555 | 308 | 918 | 444 | 881 | 170 | 1023 | 251 | 165 | 220 |
| | 1090 | 897 | 1033 | 656 | 1104 | 792 | 29 | 518 | 171 | 599 | 967 | 568 | 238 | 45 |
| | 181 | 1004 | 414 | 1140 | 377 | 866 | 519 | 947 | 115 | 916 | 359 | 166 | 529 | 152 |
| | 762 | 288 | 725 | 14 | 867 | 95 | 463 | 64 | 934 | 741 | 747 | 500 | 1110 | 636 |
| | 619 | 362 | 15 | 443 | 811 | 412 | 82 | 1089 | 25 | 848 | 258 | 984 | 221 | 710 |
| | 363 | 791 | 1159 | 760 | 430 | 237 | 373 | 1196 | 606 | 748 | 569 | 1058 | 711 | 1074 |
| | 307 | 1108 | 778 | 358 | 721 | 344 | 954 | 480 | 917 | 206 | 1059 | 287 | 655 | 256 |
| | 1126 | 933 | 1069 | 692 | 102 | 828 | 65 | 554 | 207 | 635 | 1003 | 604 | 274 | 81 |
| | 217 | 1040 | 450 | 1176 | 413 | 902 | 685 | 983 | 151 | 952 | 622 | 429 | 565 | 188 |
| | 798 | 324 | 761 | 50 | 903 | 66 | 499 | 1073 | 970 | 777 | 913 | 536 | 1146 | 672 |
| | 1109 | 398 | 51 | 479 | 393 | 448 | 118 | 1125 | 61 | 884 | 132 | 1020 | 257 | 746 |
| | 399 | 827 | 1195 | 796 | 466 | 273 | 409 | 32 | 642 | 168 | 605 | 1094 | 877 | 1175 |
| | 343 | 1144 | 587 | 621 | 757 | 380 | 990 | 516 | 953 | 242 | 1095 | 323 | 691 | 292 |
| | 1162 | 969 | 975 | 728 | 138 | 864 | 847 | 590 | 243 | 671 | 310 | 117 | 640 | 1019 |
| | 1076 | 585 | 938 | 449 | 253 | 486 | 12 | 591 | 658 | 465 | 988 | 167 | 224 | 187 |
| | 86 | 797 | 601 | 834 | 976 | 939 | 1006 | 586 | 136 | 515 | 572 | 535 | 434 | 1145 |
| | 949 | 1182 | 708 | 87 | 154 | 1161 | 484 | 863 | 920 | 883 | 782 | 1039 | 97 | 330 |
| | 1056 | 435 | 502 | 309 | 832 | 11 | 68 | 31 | 1130 | 641 | 445 | 678 | 204 | 783 |
| | 850 | 657 | 1180 | 294 | 416 | 379 | 278 | 989 | 793 | 1026 | 552 | 1131 | 1198 | 1005 |
| | 101 | 707 | 764 | 727 | 626 | 137 | 1141 | 174 | 900 | 279 | 346 | 153 | 676 | 1055 |
| | 1112 | 1075 | 974 | 485 | 289 | 360 | 48 | 627 | 694 | 501 | 1024 | 203 | 260 | 223 |
| | 122 | 833 | 637 | 870 | 396 | 1105 | 815 | 849 | 172 | 551 | 608 | 571 | 470 | 1181 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 985 | 18 | 744 | 123 | 190 | 1197 | 293 | 899 | 956 | 919 | 818 | 329 | 3 | 366 |
| | 1092 | 471 | 538 | 345 | 868 | 47 | 104 | 813 | 1166 | 677 | 481 | 714 | 240 | 819 |
| | 886 | 693 | 16 | 395 | 452 | 415 | 314 | 1025 | 829 | 1062 | 4 | 1167 | 1007 | 814 |
| | 364 | 743 | 800 | 763 | 662 | 173 | 1177 | 210 | 936 | 315 | 382 | 189 | 712 | 1091 |
| | 1148 | 1111 | 1010 | 67 | 325 | 558 | 84 | 663 | 730 | 537 | 1060 | 239 | 296 | 259 |
| | 158 | 869 | 673 | 906 | 432 | 1011 | 1078 | 885 | 208 | 522 | 644 | 607 | 506 | 17 |
| | 1021 | 54 | 196 | 159 | 226 | 33 | 556 | 935 | 992 | 955 | 854 | 365 | 169 | 402 |
| | 1128 | 507 | 574 | 381 | 904 | 83 | 140 | 103 | 2 | 713 | 517 | 588 | 276 | 855 |
| | 922 | 729 | 52 | 431 | 488 | 451 | 350 | 1061 | 865 | 1098 | 624 | 133 | 70 | 1077 |
| | 400 | 779 | 836 | 799 | 698 | 209 | 13 | 246 | 972 | 351 | 418 | 225 | 521 | 1127 |
| | 1184 | 1147 | 1046 | 557 | 231 | 594 | 120 | 699 | 766 | 573 | 1096 | 275 | 332 | 1041 |
| | 194 | 905 | 709 | 780 | 468 | 1047 | 1114 | 921 | 244 | 623 | 680 | 643 | 542 | 53 |
| | 1057 | 90 | 816 | 195 | 35 | 1042 | 592 | 971 | 1028 | 991 | 890 | 401 | 205 | 438 |
| | 1164 | 543 | 610 | 417 | 940 | 119 | 176 | 139 | 38 | 295 | 423 | 786 | 312 | 891 |
| | 958 | 765 | 89 | 467 | 524 | 487 | 386 | 1097 | 901 | 1134 | 660 | 39 | 106 | 1113 |
| | 436 | 750 | 872 | 835 | 734 | 245 | 49 | 282 | 424 | 387 | 784 | 735 | 630 | 593 |
| | 156 | 1082 | 397 | 454 | 34 | 20 | 1163 | 1183 | 1132 | 1083 | 978 | 941 | 504 | 230 |
| | 745 | 802 | 609 | 368 | 311 | 331 | 280 | 361 | 126 | 89 | 852 | 578 | 1093 | 1150 |
| | 957 | 716 | 659 | 679 | 628 | 579 | 474 | 437 | 0 | 926 | 241 | 298 | 105 | 1064 |
| | 942 | 1027 | 749 | 927 | 822 | 785 | 348 | 74 | 589 | 646 | 453 | 212 | 155 | 175 |
| | 124 | 75 | 1008 | 1133 | 696 | 422 | 937 | 994 | 801 | 560 | 503 | 69 | 472 | 553 |
| | 318 | 281 | 1044 | 770 | 85 | 142 | 1149 | 908 | 851 | 871 | 820 | 771 | 666 | 629 |
| | 192 | 1118 | 433 | 263 | 297 | 56 | 1199 | 19 | 1168 | 1119 | 1014 | 523 | 540 | 266 |
| | 651 | 838 | 645 | 404 | 347 | 367 | 316 | 267 | 162 | 125 | 888 | 614 | 1129 | 1186 |
| | 993 | 752 | 695 | 261 | 664 | 615 | 510 | 473 | 652 | 962 | 277 | 334 | 141 | 1100 |
| | 1043 | 1063 | 1012 | 963 | 858 | 821 | 384 | 110 | 625 | 682 | 262 | 248 | 191 | 211 |
| | 160 | 111 | 6 | 715 | 732 | 458 | 973 | 1030 | 837 | 596 | 539 | 559 | 508 | 459 |
| | 354 | 317 | 1080 | 806 | 121 | 178 | 1185 | 944 | 887 | 907 | 856 | 807 | 702 | 665 |
| | 228 | 1154 | 469 | 526 | 333 | 92 | 1170 | 55 | 977 | 1155 | 1050 | 1013 | 576 | 302 |
| | 817 | 874 | 681 | 440 | 383 | 403 | 352 | 303 | 36 | 161 | 924 | 650 | 1165 | 22 |
| | 1029 | 788 | 731 | 751 | 700 | 781 | 546 | 509 | 72 | 998 | 313 | 370 | 177 | 1136 |
| | 1079 | 1099 | 1048 | 999 | 894 | 857 | 420 | 146 | 661 | 718 | 525 | 284 | 227 | 247 |
| | 1169 | 147 | 42 | 5 | 768 | 494 | 879 | 1066 | 873 | 632 | 575 | 595 | 544 | 495 |
| | 390 | 353 | 1116 | 842 | 157 | 214 | 21 | 980 | 923 | 489 | 892 | 843 | 738 | 701 |
| | 264 | 1190 | 505 | 562 | 369 | 128 | 71 | 91 | 40 | 1191 | 1086 | 1049 | 612 | 338 |
| | 853 | 683 | 490 | 476 | 419 | 439 | 388 | 339 | 234 | 943 | 960 | 686 | 1 | 58 |
| | 1065 | 824 | 767 | 787 | 736 | 687 | 582 | 545 | 108 | 1034 | 349 | 406 | 213 | 1172 |
| | 1115 | 1135 | 1084 | 1035 | 930 | 893 | 1072 | 182 | 697 | 754 | 561 | 320 | 198 | 283 |
| | 232 | 183 | 78 | 41 | 804 | 530 | 1045 | 1102 | 909 | 668 | 611 | 631 | 580 | 531 |
| | 426 | 389 | 1152 | 878 | 193 | 250 | 57 | 1016 | 959 | 979 | 928 | 1009 | 774 | 737 |
| | 300 | 26 | 541 | 598 | 405 | 164 | 107 | 127 | 76 | 27 | 1122 | 1085 | 648 | 374 |
| | 889 | 946 | 753 | 512 | 455 | 475 | 197 | 375 | 270 | 233 | 996 | 722 | 37 | 94 |
| | 1101 | 860 | 803 | 823 | 772 | 723 | 456 | 581 | 144 | 1070 | 385 | 442 | 249 | 8 |
| | 1151 | 717 | 966 | 319 | 733 | 218 | 1071 | 1120 | 356 | 492 | 790 | 929 | 597 | 299 |
| | 114 | 667 | 1081 | 566 | 219 | 268 | 704 | 840 | 911 | 77 | 945 | 647 | 462 | 1015 |
| | 99 | 914 | 567 | 616 | 1052 | 1188 | 286 | 1171 | 93 | 995 | 810 | 163 | 577 | 62 |
| | 915 | 964 | 200 | 336 | 634 | 773 | 441 | 143 | 1158 | 511 | 925 | 410 | 63 | 112 |
| | 548 | 100 | 982 | 1121 | 789 | 491 | 306 | 859 | 73 | 758 | 411 | 460 | 896 | 1032 |
| | 130 | 269 | 910 | 839 | 654 | 7 | 421 | 1106 | 759 | 808 | 44 | 180 | 478 | 617 |
| | 285 | 1187 | 1002 | 355 | 769 | 254 | 1107 | 1156 | 392 | 528 | 826 | 965 | 633 | 335 |
| | 150 | 703 | 1117 | 602 | 255 | 304 | 740 | 876 | 1174 | 113 | 981 | 618 | 498 | 1051 |
| | 265 | 950 | 603 | 425 | 1088 | 24 | 322 | 461 | 129 | 1031 | | | | |
| 1284 | 242 | 317 | 1155 | 16 | 684 | 823 | 879 | 960 | 163 | 261 | 659 | 854 | 229 | 53 |
| | 669 | 534 | 420 | 810 | 644 | 696 | 1183 | 1281 | 395 | 88 | 998 | 1073 | 627 | 772 |
| | 214 | 546 | 351 | 490 | 668 | 457 | 131 | 326 | 985 | 809 | 363 | 508 | 1176 | 31 |
| | 116 | 168 | 655 | 753 | 1151 | 844 | 721 | 545 | 1161 | 1026 | 912 | 18 | 1136 | 1188 |
| | 391 | 489 | 887 | 580 | 206 | 281 | 1119 | 1264 | 706 | 1038 | 843 | 982 | 1160 | 949 |
| | 623 | 818 | 193 | 17 | 855 | 1000 | 384 | 523 | 608 | 660 | 1147 | 1245 | 359 | 52 |
| | 1213 | 1037 | 369 | 234 | 178 | 510 | 344 | 454 | 883 | 981 | 95 | 1072 | 698 | 773 |
| | 327 | 472 | 1198 | 246 | 51 | 190 | 368 | 157 | 1115 | 26 | 685 | 509 | 63 | 208 |
| | 876 | 1015 | 1100 | 1152 | 355 | 453 | 851 | 544 | 421 | 245 | 861 | 726 | 670 | 1002 |
| | 836 | 946 | 1124 | 189 | 587 | 782 | 1190 | 1265 | 819 | 964 | 406 | 487 | 543 | 682 |
| | 860 | 649 | 323 | 518 | 1177 | 1001 | 555 | 700 | 84 | 223 | 308 | 360 | 847 | 945 |
| | 59 | 1036 | 913 | 737 | 69 | 1218 | 1162 | 210 | 44 | 154 | 332 | 681 | 1079 | 1274 |
| | 398 | 473 | 27 | 172 | 840 | 979 | 1035 | 1174 | 68 | 1141 | 815 | 1010 | 385 | 209 |
| | 825 | 1192 | 576 | 715 | 800 | 852 | 55 | 153 | 551 | 244 | 121 | 1229 | 561 | 426 |
| | 370 | 702 | 536 | 646 | 824 | 1173 | 287 | 482 | 890 | 965 | 519 | 664 | 48 | 187 |
| | 243 | 382 | 811 | 349 | 23 | 218 | 877 | 701 | 33 | 1182 | 1068 | 174 | 8 | 60 |
| | 547 | 645 | 1043 | 736 | 613 | 437 | 1053 | 918 | 862 | 1194 | 1028 | 1138 | 32 | 381 |
| | 779 | 974 | 98 | 173 | 1011 | 1156 | 540 | 679 | 735 | 874 | 19 | 841 | 515 | 710 |
| | 85 | 1193 | 525 | 390 | 276 | 666 | 500 | 552 | 1039 | 1137 | 251 | 1228 | 1105 | 929 |
| | 483 | 126 | 70 | 402 | 207 | 346 | 524 | 313 | 1271 | 182 | 590 | 665 | 219 | 364 |
| | 1032 | 1171 | 1227 | 82 | 511 | 49 | 1007 | 1202 | 577 | 401 | 1017 | 882 | 768 | 1158 |
| | 992 | 1044 | 247 | 345 | 743 | 436 | 62 | 137 | 975 | 1120 | 562 | 894 | 699 | 838 |
| | 1016 | 805 | 479 | 674 | 1082 | 1157 | 711 | 856 | 240 | 379 | 435 | 516 | 1003 | 541 |
| | 215 | 410 | 1069 | 893 | 225 | 90 | 1260 | 366 | 200 | 252 | 739 | 837 | 1235 | 928 |
| | 554 | 629 | 183 | 328 | 1054 | 102 | 1191 | 46 | 224 | 13 | 971 | 1166 | 290 | 365 |

-continued

| Block Length N | Permutation Indices π = [π(0), π(1), . . . , π(N − 1)] | | | | | | | | | | | | | |
|---|---|---|---|---|---|---|---|---|---|---|---|---|---|---|
| | 1203 | 64 | 732 | 871 | 956 | 1008 | 211 | 309 | 707 | 400 | 717 | 582 | 101 | 136 |
| | 858 | 277 | 45 | 1231 | 468 | 692 | 744 | 443 | 675 | 820 | 1121 | 374 | 594 | 1046 |
| | 505 | 716 | 262 | 399 | 538 | 179 | 411 | 556 | 857 | 892 | 79 | 1033 | 801 | 703 |
| | 1224 | 164 | 216 | 1199 | 1209 | 1074 | 593 | 628 | 66 | 769 | 537 | 439 | 1018 | 1184 |
| | 10 | 935 | 1167 | 28 | 329 | 866 | 1086 | 254 | 997 | 1208 | 754 | 891 | 1030 | 671 |
| | 903 | 1048 | 65 | 100 | 571 | 241 | 9 | 1195 | 432 | 656 | 708 | 407 | 417 | 282 |
| | 1085 | 338 | 558 | 1261 | 1029 | 680 | 226 | 392 | 502 | 143 | 375 | 520 | 821 | 74 |
| | 43 | 746 | 205 | 416 | 1246 | 99 | 238 | 1163 | 111 | 256 | 557 | 592 | 1063 | 733 |
| | 501 | 403 | 924 | 1148 | 1200 | 899 | 909 | 774 | 293 | 830 | 1050 | 469 | 237 | 1172 |
| | 718 | 884 | 994 | 635 | 867 | 1012 | 29 | 566 | 535 | 1238 | 697 | 908 | 396 | 591 |
| | 730 | 371 | 603 | 748 | 1049 | 1084 | 271 | 1225 | 993 | 895 | 132 | 356 | 408 | 107 |
| | 117 | 1266 | 785 | 38 | 258 | 961 | 729 | 380 | 1210 | 92 | 202 | 1127 | 75 | 220 |
| | 521 | 1058 | 1027 | 446 | 1189 | 367 | 888 | 1083 | 1222 | 863 | 873 | 738 | 257 | 292 |
| | 1014 | 433 | 201 | 103 | 624 | 848 | 900 | 599 | 609 | 474 | 1277 | 530 | 750 | 169 |
| | 1221 | 872 | 418 | 584 | 694 | 335 | 567 | 712 | 1013 | 266 | 235 | 938 | 397 | 859 |
| | 96 | 291 | 430 | 71 | 81 | 1230 | 749 | 784 | 222 | 925 | 693 | 595 | 1116 | 56 |
| | 108 | 1091 | 1101 | 966 | 485 | 1022 | 1242 | 661 | 1153 | 80 | 910 | 1047 | 1186 | 827 |
| | 1059 | 1204 | 221 | 758 | 727 | 146 | 889 | 67 | 588 | 783 | 922 | 563 | 573 | 438 |
| | 1241 | 1276 | 714 | 133 | 1185 | 1087 | 324 | 548 | 600 | 299 | 531 | 676 | 977 | 230 |
| | 450 | 902 | 361 | 572 | 118 | 255 | 394 | 35 | 267 | 412 | 713 | 1250 | 1219 | 638 |
| | 97 | 559 | 1080 | 1275 | 130 | 1055 | 1065 | 930 | 449 | 484 | 1206 | 625 | 393 | 295 |
| | 816 | 1040 | 1092 | 791 | 1023 | 1168 | 185 | 722 | 942 | 110 | 853 | 1064 | 610 | 747 |
| | 886 | 527 | 759 | 904 | 1205 | 1240 | 427 | 1130 | 1149 | 1051 | 288 | 512 | 564 | 263 |
| | 273 | 138 | 941 | 976 | 414 | 1117 | 885 | 787 | 24 | 248 | 300 | 1283 | 231 | 376 |
| | 677 | 1214 | 150 | 602 | 61 | 272 | 1102 | 1239 | 94 | 1019 | 413 | 755 | 1004 | 259 |
| | 1056 | 357 | 780 | 1251 | 112 | 919 | 448 | 589 | 149 | 491 | 740 | 1279 | 792 | 93 |
| | 574 | 765 | 630 | 906 | 184 | 325 | 1169 | 227 | 447 | 764 | 586 | 553 | 310 | 723 |
| | 868 | 642 | 422 | 1094 | 905 | 1247 | 212 | 751 | 264 | 849 | 1272 | 459 | 604 | 127 |
| | 940 | 1081 | 983 | 1178 | 1232 | 236 | 1257 | 817 | 114 | 1122 | 641 | 58 | 1066 | 585 |
| | 719 | 914 | 939 | 1256 | 1215 | 302 | 1134 | 76 | 377 | 1078 | 802 | 1045 | 455 | 148 |
| | 704 | 1243 | 951 | 289 | 619 | 1096 | 113 | 756 | 480 | 57 | 191 | 386 | 440 | 728 |
| | 465 | 25 | 606 | 330 | 1133 | 550 | 274 | 1077 | 1711 | 122 | 147 | 464 | 423 | 794 |
| | 91 | 568 | 869 | 286 | 1236 | 253 | 947 | 640 | 1196 | 451 | 159 | 781 | 1111 | 304 |
| | 605 | 1248 | 972 | 549 | 683 | 878 | 932 | 1220 | 957 | 517 | 1098 | 822 | 341 | 1042 |
| | 766 | 285 | 419 | 614 | 639 | 1207 | 915 | 2 | 583 | 1060 | 77 | 778 | 444 | 745 |
| | 155 | 1132 | 404 | 943 | 429 | 1273 | 319 | 294 | 1097 | 456 | 180 | 1041 | 1175 | 86 |
| | 140 | 428 | 165 | 1009 | 306 | 30 | 833 | 250 | 1258 | 777 | 911 | 1106 | 1131 | 415 |
| | 123 | 494 | 1075 | 268 | 569 | 1270 | 936 | 1237 | 647 | 340 | 896 | 151 | 921 | 481 |
| | 1062 | 786 | 305 | 948 | 672 | 249 | 383 | 578 | 632 | 920 | 657 | 217 | 798 | 522 |
| | 41 | 742 | 466 | 709 | 119 | 314 | 339 | 907 | 615 | 986 | 283 | 760 | 1061 | 478 |
| | 144 | 445 | 1139 | 832 | 104 | 643 | 129 | 973 | 270 | 1278 | 797 | 156 | 1164 | 741 |
| | 875 | 1070 | 1095 | 128 | 87 | 458 | 6 | 232 | 533 | 1234 | 958 | 1201 | 611 | 806 |
| | 831 | 115 | 1107 | 194 | 775 | 1252 | 269 | 970 | 636 | 937 | 347 | 40 | 596 | 1135 |
| | 621 | 181 | 762 | 486 | 5 | 648 | 372 | 1233 | 83 | 278 | 303 | 620 | 579 | 950 |
| | 498 | 724 | 1025 | 442 | 166 | 409 | 1103 | 796 | 39 | 607 | 315 | 686 | 1267 | 460 |
| | 761 | 120 | 1128 | 705 | 839 | 532 | 1088 | 343 | 1113 | 673 | 1254 | 978 | 497 | 1140 |
| | 864 | 441 | 575 | 770 | 795 | 1112 | 1071 | 158 | 990 | 1216 | 233 | 934 | 658 | 901 |
| | 560 | 145 | 336 | 1197 | 311 | 1253 | 475 | 612 | 807 | 1099 | 952 | 4 | 296 | 1165 |
| | 72 | 933 | 47 | 989 | 462 | 348 | 321 | 835 | 186 | 1024 | 3 | 650 | 1150 | 109 |
| | 1067 | 725 | 198 | 142 | 279 | 320 | 424 | 1262 | 1052 | 637 | 828 | 405 | 803 | 461 |
| | 967 | 1104 | 15 | 307 | 160 | 496 | 788 | 373 | 622 | 141 | 539 | 197 | 954 | 898 |
| | 813 | 1076 | 678 | 734 | 495 | 1142 | 358 | 601 | 275 | 1217 | 690 | 634 | 771 | 812 |
| | 916 | 470 | 260 | 1129 | 36 | 897 | 11 | 953 | 175 | 312 | 507 | 799 | 652 | 988 |
| | 1280 | 865 | 1114 | 633 | 1031 | 689 | 162 | 106 | 21 | 284 | 1170 | 1226 | 987 | 350 |
| | 850 | 1093 | 767 | 425 | 931 | 1126 | 1263 | 20 | 124 | 962 | 752 | 337 | 528 | 105 |
| | 503 | 161 | 667 | 804 | 999 | 7 | 1144 | 196 | 488 | 73 | 322 | 1125 | 239 | 1181 |
| | 654 | 598 | 513 | 776 | 378 | 434 | 195 | 842 | 0 | 301 | 1259 | 917 | 139 | 334 |
| | 471 | 763 | 616 | 170 | 1244 | 829 | 1020 | 597 | 995 | 653 | 1159 | 12 | 1269 | 499 |
| | 352 | 688 | 980 | 565 | 814 | 333 | 731 | 389 | 1146 | 1090 | 1005 | 1268 | 870 | 926 |
| | 687 | 50 | 492 | 793 | 467 | 125 | 631 | 826 | 963 | 1255 | 1108 | 662 | 452 | 37 |
| | 228 | 1089 | 203 | 1145 | 618 | 504 | 477 | 991 | 342 | 1180 | 188 | 1057 | 22 | 265 |
| | 1223 | 881 | 354 | 298 | 213 | 476 | 78 | 134 | 1179 | 542 | 984 | 1 | 959 | 617 |
| | 1123 | 34 | 171 | 463 | 316 | 1154 | 944 | 529 | 720 | 297 | 695 | 353 | 1110 | 996 |
| | 969 | 199 | 834 | 388 | 651 | 14 | 514 | 757 | 431 | 89 | 846 | 790 | 927 | 968 |
| | 570 | 626 | 387 | 1034 | 192 | 493 | 167 | 1109 | 331 | 526 | 663 | 955 | 808 | 362 |
| | 152 | 1021 | 1212 | 789 | 1187 | 845 | 318 | 204 | 177 | 691 | 42 | 880 | 1143 | 506 |
| | 1006 | 1249 | 923 | 581 | 54 | 1282 | 135 | 176 | 230 | 1118 | | | | |
| 1539 | 1014 | 1137 | 191 | 1246 | 656 | 905 | 960 | 1423 | 817 | 723 | 1532 | 300 | 162 | 178 |
| | 195 | 394 | 1340 | 53 | 108 | 571 | 1501 | 1538 | 1300 | 894 | 518 | 1060 | 862 | 879 |
| | 1078 | 488 | 95 | 792 | 1255 | 649 | 448 | 42 | 1202 | 208 | 10 | 27 | 226 | 1065 |
| | 779 | 1010 | 403 | 1333 | 1132 | 726 | 350 | 892 | 801 | 1391 | 1445 | 213 | 1463 | 158 |
| | 1087 | 481 | 387 | 1196 | 1500 | 1362 | 1485 | 539 | 593 | 897 | 1253 | 842 | 235 | 1165 |
| | 1071 | 344 | 648 | 510 | 633 | 1223 | 1277 | 152 | 401 | 456 | 919 | 313 | 219 | 1028 |
| | 1332 | 1194 | 1210 | 1227 | 1426 | 836 | 1085 | 1140 | 67 | 997 | 796 | 390 | 14 | 556 |
| | 358 | 375 | 574 | 1520 | 1127 | 288 | 751 | 145 | 1480 | 1074 | 698 | 1240 | 1042 | 1059 |
| | 1258 | 561 | 275 | 506 | 1435 | 829 | 628 | 222 | 1382 | 1537 | 388 | 297 | 207 | 941 |
| | 1245 | 959 | 1190 | 583 | 1513 | 1419 | 692 | 996 | 858 | 981 | 35 | 89 | 393 | 749 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 338 | 1267 | 661 | 567 | 1376 | 144 | 6 | 129 | 719 | 773 | 1184 | 1433 | 1488 | 415 |
| | 1345 | 1251 | 524 | 828 | 690 | 706 | 1403 | 922 | 332 | 581 | 636 | 1099 | 493 | 292 |
| | 1208 | 1046 | 52 | 1390 | 1407 | 70 | 1016 | 623 | 1320 | 247 | 1177 | 976 | 570 | 194 |
| | 736 | 538 | 555 | 754 | 57 | 1307 | 2 | 931 | 325 | 124 | 1254 | 878 | 1420 | 1329 |
| | 1239 | 437 | 741 | 455 | 686 | 79 | 1009 | 915 | 402 | 492 | 354 | 477 | 1067 | 1121 |
| | 1425 | 245 | 1370 | 763 | 157 | 63 | 872 | 1176 | 1038 | 1161 | 215 | 1536 | 269 | 680 |
| | 929 | 984 | 1447 | 841 | 747 | 20 | 324 | 186 | 202 | 899 | 418 | 1364 | 77 | 132 |
| | 595 | 1525 | 1324 | 704 | 542 | 1084 | 886 | 903 | 1102 | 512 | 761 | 816 | 1279 | 673 |
| | 472 | 66 | 1226 | 232 | 34 | 51 | 250 | 1089 | 803 | 1034 | 427 | 1357 | 1156 | 750 |
| | 374 | 916 | 825 | 735 | 1469 | 237 | 1487 | 182 | 1111 | 505 | 411 | 1434 | 1524 | 1386 |
| | 1509 | 563 | 617 | 921 | 635 | 866 | 259 | 1189 | 1095 | 368 | 672 | 534 | 657 | 1247 |
| | 1301 | 176 | 425 | 480 | 943 | 337 | 243 | 1052 | 1356 | 1218 | 1234 | 395 | 1450 | 860 |
| | 1109 | 1164 | 91 | 1021 | 820 | 200 | 38 | 580 | 382 | 399 | 598 | 8 | 257 | 312 |
| | 775 | 169 | 1504 | 1098 | 722 | 1264 | 1066 | 1083 | 1282 | 585 | 299 | 530 | 1459 | 853 |
| | 652 | 246 | 1406 | 412 | 321 | 231 | 965 | 1269 | 983 | 1214 | 607 | 1 | 1443 | 930 |
| | 1020 | 882 | 1005 | 59 | 113 | 417 | 131 | 362 | 1291 | 685 | 591 | 1400 | 168 | 30 |
| | 153 | 743 | 797 | 1101 | 1457 | 1512 | 439 | 1369 | 1275 | 548 | 852 | 714 | 730 | 1427 |
| | 946 | 356 | 605 | 660 | 1123 | 517 | 316 | 1232 | 1070 | 76 | 1414 | 1431 | 94 | 1040 |
| | 1289 | 1344 | 271 | 1201 | 1000 | 594 | 218 | 760 | 562 | 579 | 778 | 188 | 1331 | 26 |
| | 955 | 349 | 148 | 1278 | 902 | 1263 | 461 | 1353 | 516 | 479 | 1444 | 939 | 1033 | 765 |
| | 710 | 103 | 426 | 1091 | 1145 | 501 | 1200 | 1163 | 378 | 87 | 181 | 1449 | 1394 | 787 |
| | 896 | 239 | 293 | 1185 | 348 | 953 | 1062 | 771 | 865 | 597 | 1008 | 1471 | 44 | 923 |
| | 442 | 333 | 566 | 101 | 210 | 1348 | 13 | 1388 | 156 | 619 | 728 | 927 | 1126 | 910 |
| | 1250 | 785 | 1108 | 496 | 697 | 536 | 840 | 1303 | 90 | 75 | 274 | 58 | 398 | 827 |
| | 256 | 1180 | 1381 | 1220 | 1058 | 451 | 774 | 759 | 1493 | 742 | 1082 | 1511 | 940 | 435 |
| | 529 | 261 | 206 | 1135 | 1458 | 587 | 641 | 1533 | 696 | 659 | 1410 | 1119 | 1213 | 945 |
| | 890 | 283 | 392 | 1271 | 1325 | 681 | 1380 | 449 | 558 | 267 | 361 | 93 | 504 | 967 |
| | 1076 | 419 | 1474 | 1365 | 528 | 1133 | 1242 | 844 | 1045 | 884 | 1188 | 115 | 224 | 423 |
| | 622 | 406 | 746 | 281 | 604 | 1528 | 193 | 32 | 336 | 799 | 1122 | 1107 | 1306 | 1090 |
| | 1430 | 323 | 1288 | 676 | 877 | 716 | 554 | 1483 | 270 | 255 | 989 | 238 | 578 | 1007 |
| | 436 | 1467 | 25 | 1293 | 1238 | 631 | 954 | 83 | 137 | 1029 | 192 | 155 | 906 | 615 |
| | 709 | 441 | 386 | 1315 | 1424 | 767 | 821 | 177 | 876 | 1481 | 54 | 1299 | 1393 | 1125 |
| | 0 | 463 | 572 | 1451 | 970 | 861 | 24 | 629 | 738 | 340 | 541 | 380 | 684 | 1147 |
| | 1256 | 1455 | 118 | 1438 | 242 | 1313 | 1422 | 1024 | 1225 | 1064 | 1368 | 295 | 618 | 603 |
| | 802 | 586 | 926 | 1355 | 784 | 172 | 373 | 212 | 50 | 979 | 1302 | 1287 | 485 | 1270 |
| | 74 | 503 | 1468 | 963 | 1057 | 789 | 734 | 127 | 450 | 1115 | 1169 | 525 | 1224 | 1187 |
| | 616 | 111 | 205 | 1473 | 1418 | 811 | 920 | 263 | 317 | 1209 | 372 | 977 | 1086 | 795 |
| | 889 | 621 | 1032 | 1495 | 68 | 947 | 466 | 357 | 1056 | 125 | 234 | 1372 | 37 | 1412 |
| | 180 | 643 | 752 | 951 | 1150 | 934 | 1274 | 809 | 918 | 520 | 721 | 560 | 864 | 1327 |
| | 114 | 99 | 298 | 82 | 422 | 851 | 280 | 1204 | 1405 | 1244 | 12 | 475 | 798 | 783 |
| | 1517 | 766 | 1106 | 1535 | 964 | 459 | 553 | 285 | 230 | 1159 | 1482 | 611 | 665 | 21 |
| | 720 | 683 | 112 | 1143 | 1237 | 969 | 914 | 307 | 416 | 1295 | 1349 | 705 | 1404 | 473 |
| | 582 | 291 | 385 | 117 | 62 | 991 | 1100 | 443 | 1498 | 1389 | 552 | 1157 | 1266 | 975 |
| | 1069 | 908 | 1212 | 139 | 248 | 447 | 646 | 430 | 770 | 305 | 414 | 16 | 217 | 56 |
| | 360 | 823 | 1146 | 1131 | 1330 | 1114 | 1454 | 347 | 1312 | 700 | 901 | 740 | 1044 | 1507 |
| | 294 | 1013 | 262 | 978 | 1317 | 655 | 1384 | 460 | 49 | 1031 | 1262 | 279 | 602 | 161 |
| | 1053 | 1448 | 465 | 1339 | 639 | 1144 | 733 | 179 | 410 | 107 | 216 | 596 | 900 | 1094 |
| | 1417 | 791 | 78 | 1505 | 845 | 201 | 487 | 1149 | 1323 | 1280 | 48 | 708 | 565 | 1475 |
| | 762 | 653 | 1529 | 885 | 1171 | 404 | 471 | 642 | 266 | 1392 | 1249 | 1479 | 1446 | 1337 |
| | 142 | 1462 | 319 | 1088 | 1048 | 1326 | 950 | 540 | 397 | 627 | 808 | 1379 | 826 | 610 |
| | 1003 | 236 | 196 | 474 | 93 | 758 | 1081 | 1311 | 1492 | 527 | 1510 | 1294 | 151 | 813 |
| | 880 | 944 | 1248 | 1442 | 229 | 1139 | 640 | 1211 | 1193 | 549 | 835 | 1497 | 135 | 92 |
| | 396 | 590 | 913 | 287 | 1110 | 1001 | 341 | 1233 | 1519 | 645 | 819 | 776 | 1080 | 204 |
| | 61 | 971 | 258 | 149 | 1025 | 381 | 667 | 1436 | 1503 | 138 | 1298 | 888 | 745 | 119 |
| | 942 | 833 | 1174 | 958 | 1351 | 584 | 544 | 822 | 446 | 36 | 1429 | 123 | 304 | 875 |
| | 322 | 106 | 499 | 1268 | 1228 | 1506 | 1130 | 254 | 577 | 807 | 988 | 23 | 1006 | 790 |
| | 1183 | 309 | 376 | 654 | 744 | 938 | 1261 | 1491 | 136 | 707 | 689 | 45 | 331 | 993 |
| | 1167 | 1124 | 1428 | 86 | 409 | 1319 | 606 | 497 | 1373 | 729 | 1015 | 141 | 315 | 272 |
| | 576 | 1236 | 1093 | 467 | 1290 | 1181 | 521 | 1413 | 163 | 932 | 999 | 956 | 794 | 384 |
| | 241 | 1151 | 438 | 329 | 670 | 454 | 847 | 80 | 40 | 318 | 1478 | 1068 | 925 | 1155 |
| | 1336 | 371 | 1354 | 1138 | 1531 | 764 | 724 | 1002 | 626 | 1286 | 73 | 303 | 484 | 1055 |
| | 502 | 286 | 679 | 1341 | 1408 | 150 | 240 | 434 | 757 | 987 | 1168 | 203 | 185 | 1077 |
| | 1363 | 489 | 663 | 620 | 924 | 1118 | 1441 | 815 | 102 | 887 | 869 | 225 | 511 | 1173 |
| | 1347 | 1304 | 72 | 732 | 589 | 1499 | 786 | 677 | 17 | 909 | 1195 | 428 | 495 | 452 |
| | 290 | 1416 | 1273 | 647 | 1470 | 1361 | 166 | 1486 | 343 | 1112 | 1072 | 1350 | 974 | 564 |
| | 421 | 651 | 832 | 509 | 850 | 634 | 1027 | 260 | 220 | 498 | 122 | 782 | 1105 | 1335 |
| | 1516 | 551 | 1534 | 1318 | 175 | 837 | 904 | 1182 | 1272 | 1466 | 253 | 483 | 664 | 1235 |
| | 1217 | 573 | 859 | 1521 | 159 | 116 | 420 | 614 | 937 | 311 | 1134 | 383 | 365 | 1257 |
| | 7 | 669 | 843 | 800 | 1104 | 228 | 85 | 995 | 282 | 173 | 1049 | 405 | 691 | 1460 |
| | 1527 | 1484 | 1322 | 912 | 769 | 143 | 966 | 857 | 1198 | 982 | 1375 | 608 | 568 | 846 |
| | 470 | 60 | 1453 | 147 | 328 | 5 | 346 | 130 | 523 | 1292 | 1252 | 1530 | 1154 | 278 |
| | 601 | 831 | 1012 | 47 | 1030 | 814 | 1207 | 440 | 400 | 678 | 768 | 962 | 1285 | 1515 |
| | 160 | 731 | 713 | 69 | 355 | 1017 | 1191 | 1148 | 1452 | 110 | 433 | 1343 | 630 | 1415 |
| | 1397 | 753 | 1039 | 165 | 339 | 296 | 600 | 1260 | 1117 | 491 | 1314 | 1205 | 545 | 1437 |
| | 187 | 849 | 1023 | 408 | 462 | 104 | 64 | 980 | 478 | 353 | 871 | 1175 | 265 | 694 |
| | 818 | 1092 | 1360 | 788 | 748 | 342 | 1162 | 1037 | 19 | 1179 | 949 | 1378 | 1502 | 1310 |
| | 508 | 1472 | 1432 | 1026 | 310 | 1079 | 703 | 327 | 97 | 526 | 650 | 458 | 1192 | 513 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 687 | 174 | 994 | 227 | 1387 | 1011 | 781 | 209 | 264 | 1142 | 126 | 1197 | 1371 | 644 |
| | 249 | 911 | 535 | 839 | 1465 | 893 | 948 | 756 | 810 | 345 | 519 | 1328 | 933 | 701 |
| | 1219 | 1523 | 613 | 41 | 96 | 1440 | 1494 | 1136 | 1096 | 476 | 81 | 1385 | 367 | 671 |
| | 1297 | 190 | 780 | 588 | 856 | 284 | 244 | 1374 | 658 | 533 | 1051 | 675 | 445 | 874 |
| | 998 | 806 | 4 | 968 | 928 | 522 | 1342 | 575 | 199 | 1359 | 1129 | 22 | 146 | 1490 |
| | 688 | 9 | 183 | 1206 | 490 | 1259 | 883 | 507 | 277 | 1241 | 830 | 638 | 1158 | 693 |
| | 867 | 140 | 1281 | 407 | 31 | 335 | 961 | 389 | 444 | 252 | 306 | 1377 | 15 | 824 |
| | 429 | 197 | 715 | 1019 | 109 | 1073 | 1128 | 936 | 990 | 632 | 592 | 1508 | 1113 | 881 |
| | 1399 | 167 | 793 | 1222 | 276 | 84 | 352 | 1316 | 1276 | 870 | 154 | 29 | 547 | 171 |
| | 1477 | 370 | 494 | 302 | 1036 | 464 | 424 | 18 | 838 | 71 | 1231 | 855 | 625 | 1054 |
| | 1178 | 986 | 184 | 1041 | 1215 | 702 | 1522 | 755 | 379 | 3 | 1309 | 737 | 326 | 134 |
| | 868 | 189 | 363 | 1172 | 777 | 1439 | 1063 | 1367 | 457 | 1421 | 1476 | 1284 | 1338 | 873 |
| | 1047 | 320 | 1461 | 1229 | 211 | 515 | 1141 | 569 | 624 | 432 | 486 | 128 | 88 | 1004 |
| | 609 | 377 | 895 | 1199 | 289 | 718 | 1308 | 1116 | 1170 | 812 | 772 | 366 | 1186 | 1061 |
| | 43 | 1203 | 973 | 1402 | 1526 | 1334 | 532 | 1496 | 1456 | 1050 | 334 | 1103 | 727 | 351 |
| | 121 | 550 | 674 | 482 | 1216 | 537 | 711 | 198 | 1018 | 251 | 1411 | 1035 | 805 | 233 |
| | 1358 | 1166 | 364 | 1221 | 1395 | 668 | 273 | 935 | 559 | 863 | 1489 | 917 | 972 | 314 |
| | 834 | 369 | 543 | 1352 | 957 | 725 | 1243 | 11 | 637 | 65 | 120 | 1464 | 1518 | 1160 |
| | 1120 | 500 | 105 | 1409 | 391 | 695 | 1321 | 214 | 804 | 612 | 666 | 308 | 268 | 1398 |
| | 682 | 557 | 1075 | 699 | 469 | 898 | 1022 | 1296 | 28 | 992 | 952 | 546 | 1366 | 599 |
| | 223 | 1383 | 1153 | 46 | 170 | 1514 | 712 | 33 | 100 | 1230 | 514 | 1283 | 907 | 531 |
| | 301 | 1265 | 854 | 662 | 1396 | 717 | 891 | 164 | 1305 | 431 | 55 | 359 | 985 | 413 |
| | 468 | 1346 | 330 | 1401 | 39 | 848 | 453 | 221 | 739 | 1043 | 133 | 1097 | 1152 | |
| 1759 | 196 | 1350 | 469 | 101 | 1395 | 519 | 1017 | 947 | 1580 | 1738 | 624 | 1032 | 496 | 1650 |
| | 769 | 401 | 1695 | 859 | 1317 | 1247 | 128 | 1758 | 286 | 924 | 446 | 796 | 198 | 1069 |
| | 701 | 243 | 1159 | 1617 | 1547 | 428 | 586 | 1224 | 746 | 1096 | 498 | 1369 | 1001 | 543 |
| | 1459 | 165 | 95 | 728 | 886 | 1524 | 1046 | 1396 | 798 | 1669 | 1301 | 843 | 7 | 465 |
| | 395 | 1028 | 1186 | 72 | 1346 | 1696 | 1098 | 217 | 1601 | 1143 | 307 | 765 | 695 | 1328 |
| | 1486 | 372 | 1646 | 244 | 1398 | 517 | 149 | 1443 | 607 | 1065 | 995 | 1628 | 34 | 672 |
| | 194 | 544 | 1698 | 817 | 449 | 1743 | 907 | 932 | 1295 | 176 | 334 | 106 | 494 | 844 |
| | 246 | 1117 | 749 | 291 | 1207 | 1665 | 1595 | 476 | 634 | 1272 | 794 | 1144 | 546 | 1417 |
| | 1049 | 591 | 1507 | 213 | 143 | 776 | 934 | 1572 | 1094 | 1752 | 1444 | 846 | 1717 | 1349 |
| | 891 | 55 | 513 | 443 | 1076 | 1234 | 120 | 1394 | 1744 | 1146 | 265 | 1649 | 1191 | 355 |
| | 813 | 743 | 1376 | 1534 | 420 | 1694 | 292 | 1446 | 565 | 197 | 1491 | 655 | 1113 | 1043 |
| | 1676 | 82 | 720 | 242 | 592 | 1746 | 865 | 497 | 39 | 955 | 1413 | 1343 | 224 | 382 |
| | 1020 | 542 | 66 | 294 | 1165 | 797 | 339 | 1255 | 1713 | 1643 | 524 | 682 | 1320 | 842 |
| | 1192 | 594 | 619 | 1097 | 639 | 1555 | 261 | 191 | 824 | 982 | 1620 | 1142 | 1492 | 894 |
| | 13 | 1397 | 939 | 103 | 561 | 491 | 1124 | 1282 | 168 | 1442 | 40 | 1194 | 313 | 1697 |
| | 1239 | 403 | 861 | 791 | 1424 | 1582 | 468 | 1742 | 340 | 1494 | 613 | 1756 | 245 | 1539 |
| | 703 | 1161 | 1091 | 1724 | 130 | 768 | 290 | 640 | 42 | 913 | 545 | 87 | 1003 | 1461 |
| | 1391 | 272 | 430 | 1068 | 590 | 940 | 342 | 1213 | 845 | 387 | 1303 | 9 | 1691 | 572 |
| | 730 | 1368 | 890 | 1240 | 642 | 1513 | 1145 | 687 | 1603 | 309 | 239 | 872 | 1030 | 1668 |
| | 1190 | 1540 | 942 | 61 | 1445 | 987 | 151 | 609 | 539 | 1172 | 1330 | 216 | 1490 | 88 |
| | 1242 | 361 | 1745 | 1287 | 451 | 909 | 839 | 1472 | 1630 | 516 | 38 | 388 | 1542 | 661 |
| | 293 | 1587 | 751 | 1209 | 1139 | 20 | 178 | 816 | 338 | 688 | 90 | 961 | 593 | 135 |
| | 1051 | 1509 | 1439 | 320 | 478 | 1116 | 638 | 988 | 390 | 1261 | 893 | 435 | 1351 | 1755 |
| | 57 | 1739 | 620 | 778 | 1416 | 938 | 1288 | 690 | 1561 | 1193 | 735 | 1651 | 357 | 287 |
| | 920 | 1078 | 1716 | 1238 | 1588 | 990 | 109 | 1493 | 1035 | 199 | 657 | 587 | 1220 | 1378 |
| | 264 | 1538 | 136 | 1290 | 409 | 41 | 1335 | 459 | 957 | 887 | 1520 | 1678 | 564 | 972 |
| | 436 | 1590 | 709 | 341 | 1635 | 799 | 1257 | 1187 | 68 | 226 | 864 | 386 | 736 | 138 |
| | 1009 | 641 | 183 | 1099 | 1557 | 1487 | 368 | 526 | 1164 | 686 | 1036 | 438 | 1309 | 941 |
| | 483 | 1399 | 105 | 35 | 668 | 826 | 1464 | 986 | 1336 | 738 | 1609 | 1241 | 783 | 1699 |
| | 405 | 335 | 968 | 1126 | 12 | 1286 | 1636 | 1038 | 157 | 1541 | 1083 | 247 | 705 | 635 |
| | 1268 | 1754 | 1426 | 312 | 1586 | 184 | 1338 | 457 | 89 | 1383 | 547 | 1005 | 935 | 1568 |
| | 1726 | 612 | 134 | 484 | 1638 | 757 | 389 | 1683 | 847 | 1305 | 1235 | 116 | 274 | 46 |
| | 434 | 784 | 1012 | 1057 | 689 | 231 | 1147 | 1605 | 1535 | 416 | 574 | 1212 | 734 | 1084 |
| | 486 | 1357 | 989 | 531 | 1447 | 153 | 83 | 716 | 874 | 1512 | 1034 | 1384 | 786 | 1657 |
| | 1289 | 831 | 1747 | 453 | 383 | 1016 | 1174 | 60 | 1334 | 1684 | 1086 | 205 | 1589 | 1131 |
| | 295 | 753 | 683 | 1316 | 1474 | 360 | 1634 | 232 | 1386 | 505 | 137 | 1431 | 595 | 1053 |
| | 983 | 1616 | 22 | 660 | 182 | 532 | 1686 | 805 | 437 | 1731 | 895 | 1353 | 1283 | 164 |
| | 322 | 960 | 482 | 1753 | 832 | 234 | 1105 | 737 | 279 | 1195 | 1653 | 1583 | 464 | 622 |
| | 1260 | 782 | 1132 | 534 | 559 | 1037 | 146 | 1495 | 201 | 131 | 764 | 922 | 1560 | 1082 |
| | 1432 | 834 | 1705 | 1337 | 879 | 43 | 501 | 431 | 1064 | 1222 | 108 | 1382 | 1732 | 1134 |
| | 253 | 1637 | 1179 | 343 | 801 | 731 | 1364 | 1522 | 408 | 1682 | 280 | 1434 | 553 | 185 |
| | 1479 | 643 | 1101 | 1031 | 1664 | 70 | 708 | 230 | 580 | 1734 | 853 | 485 | 27 | 943 |
| | 1401 | 1331 | 212 | 370 | 1008 | 530 | 880 | 282 | 1153 | 785 | 327 | 1243 | 1701 | 1631 |
| | 512 | 670 | 1308 | 830 | 1180 | 582 | 1453 | 1085 | 627 | 1543 | 249 | 179 | 812 | 970 |
| | 1608 | 1130 | 1480 | 882 | 1 | 1757 | 1385 | 927 | 91 | 549 | 479 | 1112 | 1270 | 156 |
| | 1430 | 28 | 1182 | 301 | 1685 | 1227 | 391 | 849 | 779 | 1412 | 1570 | 456 | 1730 | 328 |
| | 1482 | 601 | 233 | 1527 | 691 | 1149 | 1079 | 1712 | 118 | 756 | 278 | 628 | 30 | 901 |
| | 533 | 75 | 991 | 1449 | 1379 | 260 | 418 | 1056 | 578 | 928 | 330 | 1201 | 833 | 375 |
| | 1291 | 1749 | 1679 | 560 | 718 | 1356 | 878 | 1228 | 630 | 1501 | 1133 | 675 | 1591 | 297 |
| | 227 | 860 | 1018 | 1656 | 1178 | 1528 | 930 | 49 | 1433 | 975 | 139 | 597 | 527 | 1160 |
| | 1318 | 204 | 1478 | 76 | 1230 | 349 | 1733 | 1275 | 439 | 897 | 827 | 1460 | 1618 | 504 |
| | 912 | 376 | 1530 | 649 | 281 | 1575 | 739 | 1197 | 1127 | 8 | 1485 | 804 | 326 | 676 |
| | 78 | 949 | 581 | 123 | 1039 | 1497 | 1427 | 308 | 466 | 1104 | 626 | 976 | 378 | 1249 |
| | 881 | 423 | 1339 | 45 | 1727 | 608 | 766 | 1404 | 926 | 1276 | 678 | 1549 | 1181 | 723 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 1639 | 345 | 275 | 908 | 1066 | 1704 | 1226 | 1576 | 978 | 97 | 1481 | 1023 | 187 | 645 |
| | 575 | 1208 | 1366 | 252 | 1526 | 124 | 1278 | 397 | 29 | 1323 | 487 | 945 | 875 | 1508 |
| | 1666 | 552 | 74 | 424 | 1578 | 697 | 329 | 1623 | 787 | 1245 | 1175 | 56 | 214 | 852 |
| | 374 | 724 | 952 | 997 | 629 | 171 | 1087 | 1545 | 1475 | 356 | 514 | 1152 | 674 | 1024 |
| | 426 | 1297 | 929 | 471 | 1387 | 93 | 23 | 656 | 814 | 1452 | 974 | 1324 | 726 | 1597 |
| | 1229 | 771 | 1687 | 393 | 323 | 956 | 1114 | 0 | 1274 | 1624 | 1026 | 145 | 1529 | 1071 |
| | 235 | 693 | 623 | 1256 | 1414 | 300 | 1574 | 172 | 1326 | 445 | 77 | 1371 | 535 | 993 |
| | 923 | 1556 | 1714 | 600 | 122 | 472 | 1626 | 745 | 377 | 1671 | 835 | 1293 | 1223 | 104 |
| | 262 | 900 | 422 | 772 | 174 | 1045 | 677 | 219 | 1135 | 1593 | 1523 | 404 | 562 | 1200 |
| | 722 | 1072 | 474 | 499 | 977 | 86 | 1435 | 141 | 71 | 704 | 862 | 1500 | 1022 | 1372 |
| | 774 | 1645 | 1277 | 819 | 1735 | 441 | 371 | 1004 | 1162 | 48 | 1322 | 1672 | 1074 | 193 |
| | 1577 | 1119 | 283 | 741 | 671 | 1304 | 1462 | 348 | 1622 | 220 | 1374 | 493 | 125 | 1419 |
| | 583 | 1041 | 971 | 1604 | 10 | 648 | 170 | 520 | 1674 | 793 | 425 | 1719 | 883 | 1341 |
| | 1271 | 152 | 310 | 948 | 470 | 820 | 222 | 1093 | 725 | 267 | 1183 | 1641 | 1571 | 452 |
| | 610 | 1248 | 770 | 1120 | 522 | 1393 | 1025 | 567 | 1483 | 189 | 119 | 752 | 910 | 1548 |
| | 1070 | 1420 | 822 | 1693 | 1325 | 867 | 31 | 489 | 419 | 1465 | 1210 | 96 | 1370 | 1720 |
| | 1122 | 241 | 1625 | 1167 | 331 | 789 | 719 | 1352 | 1510 | 396 | 1670 | 268 | 1422 | 541 |
| | 173 | 1467 | 631 | 1089 | 1019 | 1652 | 58 | 696 | 218 | 568 | 1722 | 841 | 473 | 15 |
| | 931 | 1389 | 1319 | 200 | 358 | 996 | 518 | 868 | 270 | 1141 | 773 | 315 | 1231 | 1689 |
| | 1619 | 500 | 658 | 1296 | 818 | 1168 | 570 | 1441 | 1073 | 615 | 1531 | 237 | 167 | 800 |
| | 958 | 1596 | 1118 | 1468 | 870 | 1741 | 1373 | 915 | 79 | 537 | 467 | 1100 | 1258 | 144 |
| | 1418 | 16 | 1170 | 289 | 1673 | 1215 | 379 | 837 | 767 | 1400 | 1558 | 444 | 1718 | 316 |
| | 1470 | 589 | 221 | 1515 | 679 | 1137 | 1067 | 1700 | 1425 | 744 | 266 | 616 | 18 | 889 |
| | 521 | 63 | 979 | 1437 | 1367 | 248 | 406 | 1044 | 566 | 916 | 318 | 1189 | 821 | 363 |
| | 1279 | 1737 | 1667 | 548 | 706 | 1344 | 866 | 1216 | 618 | 1489 | 1121 | 663 | 1579 | 285 |
| | 215 | 848 | 1006 | 1644 | 1166 | 1516 | 918 | 37 | 1421 | 963 | 127 | 585 | 515 | 1148 |
| | 1306 | 192 | 1466 | 64 | 1218 | 337 | 1721 | 1263 | 427 | 885 | 815 | 1448 | 1606 | 492 |
| | 14 | 364 | 1518 | 637 | 269 | 1563 | 727 | 1185 | 1115 | 1748 | 154 | 792 | 314 | 664 |
| | 892 | 937 | 569 | 111 | 1027 | 1052 | 1415 | 296 | 454 | 1092 | 614 | 964 | 366 | 1237 |
| | 869 | 411 | 1327 | 33 | 1715 | 596 | 754 | 1392 | 914 | 1264 | 666 | 1537 | 1169 | 711 |
| | 1627 | 333 | 263 | 896 | 1054 | 1692 | 1214 | 1564 | 966 | 85 | 1469 | 1011 | 175 | 633 |
| | 563 | 1196 | 1354 | 240 | 1514 | 112 | 1266 | 385 | 17 | 1311 | 475 | 933 | 863 | 1496 |
| | 1654 | 540 | 62 | 685 | 317 | 1566 | 362 | 775 | 412 | 202 | 44 | 1611 | 1233 | 1163 |
| | 840 | 985 | 617 | 114 | 662 | 1075 | 712 | 502 | 344 | 159 | 1533 | 1463 | 1140 | 1285 |
| | 917 | 414 | 962 | 1375 | 186 | 802 | 644 | 26 | 81 | 11 | 1440 | 1585 | 1217 | 714 |
| | 1262 | 1675 | 1312 | 1102 | 944 | 759 | 381 | 311 | 1740 | 133 | 1517 | 1014 | 1562 | 223 |
| | 1612 | 1402 | 1244 | 1059 | 681 | 611 | 288 | 433 | 65 | 1314 | 110 | 523 | 160 | 1702 |
| | 1544 | 1359 | 981 | 911 | 588 | 733 | 365 | 1614 | 410 | 823 | 460 | 250 | 92 | 1659 |
| | 1281 | 1211 | 888 | 1033 | 665 | 162 | 710 | 1123 | 760 | 550 | 392 | 207 | 1581 | 1511 |
| | 1188 | 1333 | 965 | 462 | 1010 | 1423 | 1060 | 850 | 692 | 507 | 129 | 59 | 1488 | 1633 |
| | 1265 | 762 | 1310 | 1723 | 1360 | 1150 | 1405 | 807 | 429 | 359 | 36 | 181 | 1565 | 1062 |
| | 1610 | 271 | 1660 | 1450 | 1292 | 1107 | 729 | 659 | 336 | 481 | 113 | 1362 | 158 | 571 |
| | 208 | 1750 | 1592 | 1407 | 1029 | 959 | 636 | 781 | 413 | 1662 | 458 | 871 | 508 | 298 |
| | 140 | 1707 | 1329 | 1259 | 936 | 1081 | 713 | 210 | 758 | 1171 | 808 | 598 | 440 | 255 |
| | 1629 | 1559 | 1236 | 1381 | 1013 | 510 | 1058 | 1471 | 1108 | 898 | 740 | 555 | 177 | 107 |
| | 1536 | 1681 | 1313 | 810 | 1358 | 19 | 1408 | 1198 | 1040 | 855 | 477 | 407 | 84 | 229 |
| | 1613 | 1110 | 1658 | 319 | 1708 | 1498 | 1340 | 1155 | 777 | 707 | 384 | 529 | 161 | 1410 |
| | 206 | 579 | 256 | 1365 | 1640 | 1455 | 1077 | 1007 | 684 | 829 | 461 | 1710 | 506 | 919 |
| | 556 | 346 | 188 | 3 | 1377 | 1307 | 984 | 1129 | 761 | 258 | 806 | 1219 | 856 | 646 |
| | 488 | 303 | 1677 | 1607 | 1284 | 558 | 1584 | 225 | 788 | 155 | 946 | 603 | 1429 | 1061 |
| | 1519 | 1106 | 1156 | 858 | 132 | 525 | 1088 | 455 | 1246 | 903 | 1729 | 1361 | 67 | 1406 |
| | 1456 | 1158 | 432 | 825 | 1388 | 755 | 1546 | 1203 | 277 | 1661 | 367 | 1706 | 4 | 1458 |
| | 732 | 1125 | 1688 | 1055 | 94 | 1503 | 577 | 209 | 667 | 254 | 304 | 6 | 166 | 992 |
| | 236 | 1355 | 394 | 51 | 877 | 509 | 967 | 554 | 604 | 306 | 1332 | 1725 | 536 | 1655 |
| | 694 | 351 | 1177 | 809 | 1267 | 854 | 904 | 606 | 1632 | 273 | 836 | 203 | 994 | 651 |
| | 1477 | 1109 | 1567 | 1154 | 1204 | 906 | 180 | 573 | 1136 | 503 | 1294 | 951 | 25 | 1409 |
| | 115 | 1454 | 1504 | 1206 | 480 | 873 | 1436 | 803 | 1594 | 1251 | 325 | 1709 | 415 | 2 |
| | 52 | 1506 | 780 | 1173 | 1736 | 1103 | 142 | 1551 | 625 | 257 | 715 | 302 | 352 | 54 |
| | 1080 | 1473 | 284 | 1403 | 442 | 99 | 925 | 557 | 1015 | 602 | 652 | 354 | 1380 | 21 |
| | 584 | 1703 | 742 | 399 | 1225 | 857 | 1315 | 902 | 126 | 654 | 1680 | 321 | 884 | 251 |
| | 1042 | 699 | 1525 | 1157 | 1615 | 1202 | 1252 | 954 | 228 | 621 | 1184 | 551 | 1342 | 999 |
| | 73 | 1457 | 163 | 1502 | 1552 | 1254 | 528 | 921 | 1484 | 851 | 1642 | 1299 | 373 | 5 |
| | 463 | 50 | 100 | 1554 | 828 | 1221 | 32 | 1151 | 190 | 1599 | 673 | 305 | 763 | 350 |
| | 400 | 1521 | 490 | 650 | 700 | 102 | 605 | 147 | 1063 | 1451 | 332 | 973 | 1128 | 69 |
| | 790 | 950 | 1000 | 402 | 905 | 447 | 1363 | 1751 | 632 | 1273 | 1428 | 369 | 1090 | 1250 |
| | 1300 | 702 | 1205 | 747 | 1663 | 299 | 1345 | 1573 | 1728 | 669 | 1390 | 1550 | 1600 | 1002 |
| | 1505 | 1047 | 211 | 599 | 1232 | 121 | 276 | 969 | 1690 | 98 | 148 | 1302 | 53 | 1347 |
| | 511 | 899 | 1532 | 421 | 576 | 1269 | 238 | 398 | 448 | 1602 | 353 | 1647 | 811 | 1199 |
| | 80 | 721 | 876 | 1569 | 538 | 698 | 748 | 150 | 653 | 195 | 1111 | 1499 | 380 | 1021 |
| | 1176 | 117 | 1048 | 495 | 838 | 1476 | 450 | 1411 | 47 | 1321 | 680 | 953 | 998 | 417 |
| | 1348 | 795 | 1138 | 24 | 750 | 1711 | 347 | 1621 | 980 | 1253 | 1298 | 717 | 1648 | 1095 |
| | 1438 | 324 | 1050 | 259 | 647 | 169 | 1280 | 1553 | 1598 | | | | | |
| 1884 | 961 | 1193 | 1659 | 1588 | 1404 | 378 | 656 | 1702 | 487 | 633 | 683 | 170 | 1046 | 1325 |
| | 1791 | 1720 | 1536 | 510 | 788 | 1834 | 572 | 765 | 815 | 208 | 1178 | 1457 | 1641 | 1758 |
| | 1198 | 595 | 1155 | 552 | 704 | 1273 | 947 | 340 | 1357 | 1589 | 1773 | 100 | 1800 | 774 |
| | 1052 | 684 | 883 | 1405 | 1079 | 566 | 1489 | 1721 | 303 | 232 | 48 | 906 | 1184 | 346 |
| | 1015 | 1161 | 1211 | 698 | 1574 | 1853 | 153 | 270 | 1594 | 991 | 1551 | 948 | 1100 | 1293 |

-continued

| Block Length N | Permutation Indices π = [π(0), π(1), . . . , π(N − 1)] | | | | | | | | | | | | | |
|---|---|---|---|---|---|---|---|---|---|---|---|---|---|---|
| | 1343 | 736 | 1753 | 101 | 285 | 402 | 1726 | 1123 | 1683 | 1080 | 1279 | 1801 | 1475 | 962 |
| | 1 | 233 | 699 | 628 | 444 | 1302 | 1580 | 742 | 1411 | 1557 | 1607 | 1094 | 86 | 365 |
| | 831 | 666 | 106 | 1434 | 63 | 874 | 1496 | 1689 | 1739 | 1132 | 218 | 497 | 681 | 798 |
| | 238 | 1519 | 195 | 1476 | 1628 | 313 | 1871 | 1264 | 397 | 629 | 1095 | 1024 | 840 | 1698 |
| | 92 | 1138 | 1807 | 69 | 119 | 1490 | 482 | 761 | 1227 | 1156 | 972 | 1830 | 224 | 1270 |
| | 8 | 201 | 251 | 1622 | 614 | 893 | 1077 | 1194 | 634 | 31 | 591 | 1872 | 140 | 709 |
| | 383 | 1660 | 793 | 1025 | 1209 | 1420 | 1236 | 210 | 488 | 120 | 319 | 841 | 515 | 2 |
| | 925 | 1157 | 1623 | 1552 | 1368 | 342 | 620 | 1666 | 451 | 597 | 647 | 134 | 1010 | 1289 |
| | 1473 | 1590 | 1030 | 427 | 987 | 384 | 536 | 729 | 779 | 172 | 1189 | 1421 | 1605 | 1722 |
| | 1162 | 559 | 1119 | 516 | 715 | 1237 | 911 | 398 | 1321 | 1553 | 135 | 64 | 1764 | 738 |
| | 1016 | 178 | 847 | 993 | 1043 | 530 | 1406 | 1685 | 267 | 102 | 1426 | 870 | 1383 | 310 |
| | 932 | 1125 | 1175 | 568 | 1538 | 1817 | 117 | 234 | 1558 | 955 | 1515 | 912 | 1064 | 1633 |
| | 1307 | 700 | 1717 | 65 | 531 | 460 | 276 | 1134 | 1412 | 574 | 1243 | 1765 | 1439 | 926 |
| | 1802 | 197 | 663 | 592 | 408 | 1266 | 1544 | 706 | 1328 | 1521 | 1571 | 1058 | 50 | 329 |
| | 513 | 630 | 70 | 1351 | 27 | 1308 | 1460 | 145 | 1703 | 1096 | 229 | 461 | 645 | 856 |
| | 672 | 1483 | 1808 | 1440 | 1639 | 277 | 1835 | 1322 | 361 | 593 | 1059 | 988 | 804 | 1662 |
| | 56 | 1102 | 1771 | 33 | 83 | 1454 | 446 | 725 | 909 | 1026 | 466 | 1747 | 423 | 1704 |
| | 1856 | 165 | 215 | 1492 | 625 | 857 | 1041 | 1158 | 598 | 1879 | 555 | 1836 | 151 | 673 |
| | 347 | 1624 | 757 | 989 | 1455 | 1384 | 1200 | 174 | 452 | 1498 | 283 | 429 | 479 | 1850 |
| | 842 | 1121 | 1587 | 1422 | 862 | 306 | 819 | 1630 | 368 | 561 | 611 | 4 | 974 | 1253 |
| | 1437 | 1554 | 994 | 391 | 951 | 348 | 500 | 1069 | 743 | 136 | 1153 | 1385 | 1851 | 1780 |
| | 1596 | 570 | 848 | 10 | 679 | 1201 | 875 | 362 | 1238 | 1517 | 99 | 28 | 1728 | 702 |
| | 980 | 142 | 764 | 957 | 1007 | 494 | 1370 | 1649 | 1833 | 66 | 1390 | 787 | 1347 | 744 |
| | 896 | 1465 | 1139 | 532 | 1549 | 1781 | 81 | 292 | 108 | 919 | 1244 | 876 | 1075 | 1597 |
| | 1271 | 758 | 1681 | 29 | 495 | 424 | 240 | 1098 | 1376 | 538 | 1207 | 1353 | 1403 | 890 |
| | 1766 | 161 | 345 | 462 | 1786 | 1183 | 1743 | 1140 | 1292 | 1485 | 1535 | 928 | 61 | 293 |
| | 477 | 594 | 34 | 1315 | 1875 | 1272 | 1471 | 109 | 1667 | 1060 | 193 | 425 | 891 | 820 |
| | 636 | 1494 | 1772 | 934 | 1603 | 1749 | 1799 | 1286 | 278 | 557 | 1023 | 858 | 298 | 1626 |
| | 255 | 1066 | 1688 | 1881 | 47 | 1324 | 410 | 689 | 873 | 990 | 430 | 1711 | 387 | 1668 |
| | 1820 | 505 | 179 | 1456 | 589 | 821 | 1287 | 1216 | 1032 | 6 | 284 | 1330 | 115 | 637 |
| | 311 | 1682 | 674 | 953 | 1419 | 1348 | 1164 | 138 | 416 | 1462 | 200 | 393 | 443 | 1814 |
| | 1269 | 1386 | 1085 | 1852 | 223 | 806 | 901 | 332 | 826 | 783 | 180 | 575 | 1401 | 1612 |
| | 1217 | 194 | 355 | 985 | 1033 | 511 | 1428 | 680 | 312 | 707 | 1815 | 1744 | 1349 | 326 |
| | 534 | 1117 | 789 | 643 | 1560 | 812 | 1858 | 839 | 1665 | 1782 | 1481 | 364 | 619 | 1202 |
| | 921 | 728 | 1222 | 1179 | 576 | 971 | 1797 | 30 | 1613 | 496 | 751 | 1381 | 1429 | 907 |
| | 1354 | 1311 | 708 | 1103 | 327 | 256 | 1745 | 722 | 930 | 1513 | 1185 | 1039 | 72 | 1208 |
| | 370 | 1235 | 459 | 294 | 1877 | 760 | 1062 | 1598 | 1317 | 1124 | 1618 | 1340 | 502 | 1367 |
| | 309 | 426 | 125 | 892 | 1147 | 1730 | 1825 | 1256 | 1750 | 1707 | 1104 | 1499 | 723 | 652 |
| | 257 | 1118 | 1326 | 25 | 73 | 1435 | 468 | 1604 | 766 | 1631 | 855 | 784 | 389 | 1250 |
| | 1458 | 110 | 1713 | 1520 | 600 | 1736 | 898 | 1763 | 705 | 822 | 521 | 1288 | 1543 | 242 |
| | 337 | 1652 | 262 | 219 | 1500 | 11 | 837 | 1048 | 653 | 1514 | 1675 | 421 | 469 | 1831 |
| | 864 | 116 | 1632 | 143 | 1251 | 1180 | 785 | 1646 | 1854 | 553 | 225 | 79 | 996 | 248 |
| | 1294 | 275 | 1101 | 1218 | 917 | 1684 | 55 | 638 | 357 | 164 | 658 | 615 | 12 | 407 |
| | 1233 | 1350 | 1049 | 1816 | 187 | 817 | 865 | 343 | 790 | 747 | 144 | 539 | 1647 | 1576 |
| | 1181 | 158 | 366 | 949 | 621 | 475 | 1392 | 644 | 1690 | 671 | 1779 | 1614 | 1313 | 196 |
| | 498 | 1034 | 753 | 560 | 1054 | 776 | 1822 | 803 | 1629 | 1746 | 1445 | 328 | 583 | 1166 |
| | 1261 | 692 | 1186 | 1143 | 540 | 935 | 159 | 88 | 1577 | 554 | 762 | 1345 | 1393 | 871 |
| | 1788 | 1040 | 202 | 1067 | 291 | 220 | 1709 | 686 | 894 | 1430 | 1149 | 956 | 36 | 1172 |
| | 334 | 1199 | 141 | 258 | 1841 | 724 | 979 | 1562 | 1657 | 1088 | 1582 | 1539 | 936 | 1331 |
| | 273 | 484 | 89 | 950 | 1111 | 1741 | 1789 | 1267 | 300 | 1671 | 1068 | 1463 | 687 | 616 |
| | 221 | 1082 | 1290 | 1873 | 1545 | 1399 | 432 | 1568 | 730 | 1595 | 537 | 654 | 353 | 1120 |
| | 1375 | 74 | 1677 | 1484 | 94 | 51 | 1332 | 1727 | 669 | 786 | 485 | 1252 | 1507 | 253 |
| | 301 | 1663 | 226 | 183 | 1464 | 1859 | 1083 | 1012 | 617 | 1478 | 1686 | 385 | 57 | 1795 |
| | 828 | 80 | 1126 | 107 | 1215 | 1050 | 749 | 1516 | 1818 | 470 | 189 | 1880 | 490 | 212 |
| | 1258 | 239 | 1065 | 1182 | 881 | 1648 | 19 | 602 | 697 | 128 | 622 | 579 | 1860 | 371 |
| | 1479 | 1408 | 1013 | 1874 | 198 | 781 | 829 | 307 | 1224 | 476 | 1522 | 503 | 1611 | 1540 |
| | 1145 | 122 | 330 | 866 | 585 | 392 | 1356 | 608 | 1654 | 635 | 1461 | 1578 | 1277 | 160 |
| | 415 | 998 | 1093 | 524 | 1018 | 975 | 372 | 767 | 1593 | 1804 | 1409 | 386 | 547 | 1177 |
| | 1225 | 703 | 1620 | 1107 | 504 | 899 | 123 | 52 | 1541 | 518 | 726 | 1309 | 981 | 835 |
| | 1752 | 1004 | 166 | 1031 | 1857 | 90 | 1673 | 556 | 811 | 1394 | 1113 | 920 | 1414 | 1371 |
| | 768 | 1163 | 105 | 222 | 1805 | 688 | 943 | 1573 | 1621 | 1099 | 1546 | 1503 | 900 | 1295 |
| | 519 | 448 | 53 | 914 | 1122 | 1705 | 1377 | 1231 | 264 | 1400 | 562 | 1427 | 651 | 486 |
| | 185 | 952 | 1254 | 1790 | 1509 | 1316 | 1810 | 1532 | 694 | 1559 | 501 | 618 | 317 | 1084 |
| | 1339 | 38 | 133 | 1448 | 58 | 15 | 1296 | 1691 | 844 | 449 | 1823 | 660 | 958 | 265 |
| | 217 | 1627 | 1518 | 1796 | 915 | 1310 | 976 | 581 | 71 | 792 | 1090 | 21 | 302 | 1712 |
| | 1650 | 44 | 1047 | 1442 | 203 | 1480 | 411 | 1844 | 897 | 434 | 1735 | 1014 | 713 | 1692 |
| | 454 | 529 | 335 | 1706 | 543 | 139 | 1029 | 613 | 1867 | 1240 | 845 | 1824 | 1056 | 661 |
| | 467 | 1838 | 440 | 271 | 1443 | 745 | 162 | 1372 | 977 | 1486 | 1188 | 417 | 599 | 1876 |
| | 807 | 356 | 1575 | 830 | 247 | 1410 | 1109 | 204 | 850 | 549 | 731 | 124 | 939 | 535 |
| | 1425 | 1009 | 379 | 1542 | 1241 | 336 | 982 | 1057 | 863 | 350 | 836 | 667 | 1839 | 1141 |
| | 558 | 1768 | 1373 | 1882 | 1584 | 813 | 995 | 388 | 968 | 752 | 87 | 1226 | 690 | 1806 |
| | 1505 | 130 | 1716 | 945 | 1127 | 520 | 1335 | 884 | 1821 | 1358 | 775 | 54 | 1637 | 732 |
| | 1378 | 1453 | 1259 | 746 | 1232 | 1063 | 351 | 1537 | 954 | 280 | 1769 | 394 | 96 | 1585 |
| | 1391 | 878 | 1364 | 1148 | 483 | 1669 | 1086 | 412 | 17 | 526 | 228 | 1341 | 1523 | 916 |
| | 1731 | 1280 | 333 | 1754 | 1171 | 450 | 149 | 1128 | 1774 | 1849 | 1655 | 1142 | 1863 | 1459 |
| | 465 | 49 | 1303 | 676 | 281 | 1260 | 492 | 97 | 1787 | 1274 | 1760 | 1591 | 879 | 181 |
| | 1482 | 808 | 413 | 922 | 624 | 1737 | 35 | 1312 | 243 | 1676 | 1011 | 266 | 1567 | 846 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 545 | 1524 | 286 | 1869 | 167 | 1444 | 375 | 1855 | 861 | 445 | 1699 | 978 | 677 | 1656 |
| | 418 | 493 | 299 | 1670 | 272 | 103 | 1275 | 577 | 1878 | 1204 | 809 | 1318 | 1020 | 249 |
| | 431 | 1708 | 404 | 188 | 1407 | 662 | 126 | 1242 | 941 | 1450 | 1152 | 381 | 563 | 1840 |
| | 771 | 320 | 1257 | 794 | 211 | 1374 | 1073 | 168 | 814 | 889 | 695 | 182 | 668 | 499 |
| | 1389 | 973 | 390 | 1600 | 1205 | 1714 | 1416 | 1021 | 827 | 314 | 800 | 584 | 1803 | 1105 |
| | 522 | 1732 | 1337 | 1846 | 1548 | 777 | 959 | 352 | 1167 | 716 | 1653 | 1190 | 607 | 1770 |
| | 1469 | 564 | 1210 | 1285 | 1091 | 578 | 1299 | 895 | 1785 | 1369 | 739 | 112 | 1601 | 696 |
| | 1342 | 1417 | 1223 | 710 | 1196 | 1027 | 315 | 1501 | 918 | 244 | 1733 | 358 | 60 | 1173 |
| | 1355 | 748 | 1563 | 1112 | 447 | 1586 | 1003 | 282 | 1865 | 960 | 1606 | 1305 | 1487 | 880 |
| | 1695 | 1291 | 297 | 1718 | 1135 | 414 | 113 | 1092 | 1738 | 1813 | 1619 | 1106 | 1592 | 1423 |
| | 711 | 13 | 1314 | 640 | 245 | 754 | 456 | 1569 | 1751 | 1144 | 1724 | 1508 | 843 | 98 |
| | 1446 | 678 | 377 | 886 | 588 | 1701 | 1883 | 1276 | 207 | 1640 | 693 | 230 | 1531 | 810 |
| | 509 | 1488 | 250 | 325 | 131 | 1502 | 104 | 1819 | 825 | 409 | 1710 | 1036 | 641 | 1150 |
| | 852 | 457 | 263 | 1634 | 236 | 20 | 1239 | 541 | 1842 | 1168 | 773 | 1282 | 984 | 213 |
| | 395 | 1672 | 603 | 152 | 1089 | 626 | 43 | 1206 | 905 | 0 | 646 | 721 | 527 | 14 |
| | 735 | 331 | 1221 | 805 | 175 | 1432 | 1037 | 132 | 778 | 853 | 659 | 146 | 632 | 463 |
| | 1635 | 937 | 354 | 1564 | 1169 | 1678 | 1380 | 609 | 791 | 184 | 999 | 548 | 1767 | 1022 |
| | 439 | 1602 | 1301 | 396 | 1042 | 741 | 923 | 316 | 1131 | 727 | 1617 | 1154 | 571 | 1734 |
| | 1433 | 528 | 1174 | 1249 | 1055 | 542 | 1028 | 859 | 147 | 1333 | 750 | 76 | 1565 | 190 |
| | 1776 | 1005 | 1187 | 580 | 1160 | 944 | 279 | 1418 | 882 | 114 | 1697 | 322 | 74 | 1137 |
| | 1319 | 712 | 1527 | 1076 | 129 | 1550 | 967 | 246 | 1829 | 924 | 1570 | 1645 | 1451 | 938 |
| | 1424 | 1255 | 261 | 1729 | 1146 | 472 | 77 | 586 | 288 | 1777 | 1556 | 1861 | 420 | 1533 |
| | 1583 | 209 | 1278 | 718 | 675 | 1387 | 604 | 1070 | 39 | 67 | 82 | 157 | 1715 | 341 |
| | 1363 | 1320 | 525 | 1472 | 642 | 1108 | 171 | 241 | 214 | 289 | 1847 | 473 | 1495 | 1452 |
| | 657 | 1651 | 868 | 1334 | 68 | 373 | 816 | 45 | 95 | 605 | 1674 | 1114 | 1071 | 1783 |
| | 1000 | 1466 | 435 | 458 | 478 | 177 | 227 | 737 | 1759 | 1246 | 1203 | 1868 | 1038 | 1504 |
| | 567 | 590 | 610 | 685 | 359 | 869 | 7 | 1848 | 1053 | 163 | 1170 | 1636 | 464 | 769 |
| | 1212 | 441 | 491 | 1001 | 186 | 1510 | 1467 | 295 | 1396 | 1862 | 596 | 854 | 1344 | 573 |
| | 623 | 1133 | 318 | 1642 | 1599 | 380 | 1528 | 16 | 963 | 986 | 1006 | 1081 | 755 | 1265 |
| | 403 | 360 | 1449 | 512 | 1566 | 148 | 860 | 1165 | 1608 | 1213 | 887 | 1397 | 582 | 22 |
| | 1581 | 691 | 1792 | 374 | 992 | 1297 | 1740 | 969 | 1019 | 1529 | 714 | 154 | 111 | 823 |
| | 40 | 506 | 1359 | 1382 | 1402 | 1477 | 1151 | 1661 | 799 | 756 | 1845 | 908 | 78 | 544 |
| | 1491 | 1561 | 1534 | 1609 | 1283 | 1793 | 931 | 888 | 93 | 1087 | 304 | 770 | 1388 | 1693 |
| | 252 | 1365 | 1415 | 41 | 1110 | 550 | 507 | 1219 | 436 | 902 | 1755 | 1778 | 1798 | 1497 |
| | 1547 | 173 | 1195 | 682 | 639 | 1304 | 474 | 940 | 3 | 26 | 46 | 121 | 1679 | 305 |
| | 1327 | 1284 | 489 | 1436 | 606 | 1072 | 1784 | 205 | 648 | 1761 | 1811 | 437 | 1506 | 946 |
| | 903 | 1615 | 832 | 1298 | 32 | 290 | 780 | 9 | 59 | 569 | 1638 | 1078 | 1035 | 1700 |
| | 964 | 1336 | 399 | 422 | 442 | 517 | 191 | 701 | 1723 | 1680 | 885 | 1832 | 1002 | 1468 |
| | 296 | 601 | 1044 | 649 | 323 | 833 | 18 | 1812 | 1017 | 127 | 1228 | 1694 | 428 | 733 |
| | 1176 | 405 | 455 | 965 | 150 | 1474 | 1431 | 259 | 1360 | 1826 | 795 | 818 | 838 | 913 |
| | 587 | 1097 | 235 | 192 | 1281 | 344 | 1398 | 1864 | 927 | 997 | 970 | 1045 | 719 | 1229 |
| | 367 | 324 | 1413 | 523 | 1530 | 206 | 824 | 1129 | 1572 | 801 | 851 | 1361 | 546 | 1870 |
| | 1827 | 655 | 1756 | 338 | 1191 | 1214 | 1234 | 933 | 983 | 1493 | 631 | 118 | 75 | 740 |
| | 1794 | 376 | 1323 | 1346 | 1366 | 1441 | 1115 | 1625 | 763 | 720 | 1809 | 872 | 42 | 508 |
| | 1220 | 1525 | 84 | 1197 | 1247 | 1757 | 942 | 382 | 339 | 1051 | 268 | 734 | 1352 | 1610 |
| | 216 | 1329 | 1379 | 5 | 1074 | 514 | 471 | 1136 | 400 | 772 | 1719 | 1742 | 1762 | 1837 |
| | 1511 | 137 | 1159 | 1116 | 321 | 1268 | 438 | 904 | 1616 | 37 | 480 | 85 | 1643 | 269 |
| | 1338 | 1248 | 453 | 1447 | 664 | 1130 | 1748 | 169 | 612 | 1725 | 1775 | 401 | 1470 | 910 |
| | 867 | 1579 | 796 | 1262 | 231 | 254 | 274 | 349 | 23 | 533 | 1555 | 1512 | 717 | 1664 |
| | 834 | 1300 | 363 | 433 | 406 | 481 | 155 | 665 | 1687 | 1644 | 849 | 1843 | 966 | 1526 |
| | 260 | 565 | 1008 | 237 | 287 | 797 | 1866 | 1306 | 1263 | 91 | 1192 | 1658 | 627 | 650 |
| | 670 | 369 | 419 | 929 | 67 | 1438 | 1395 | 176 | 1230 | 1696 | 759 | 782 | 802 | 877 |
| | 551 | 1061 | 199 | 156 | 1245 | 308 | 1362 | 1828 | | | | | | |
| 2052 | 1948 | 410 | 1319 | 1341 | 115 | 83 | 658 | 1560 | 771 | 486 | 1673 | 1582 | 1240 | 1754 |
| | 611 | 633 | 1459 | 943 | 2002 | 852 | 63 | 1196 | 965 | 874 | 532 | 112 | 1955 | 1977 |
| | 751 | 235 | 1928 | 144 | 1407 | 488 | 257 | 1901 | 1876 | 1456 | 930 | 1269 | 1945 | 1579 |
| | 1220 | 1488 | 699 | 414 | 1284 | 1193 | 50 | 1682 | 222 | 561 | 1237 | 871 | 512 | 313 |
| | 2043 | 1758 | 576 | 485 | 1394 | 974 | 1883 | 1905 | 529 | 647 | 1856 | 1657 | 1335 | 1050 |
| | 1920 | 94 | 686 | 266 | 1175 | 1197 | 1873 | 1991 | 514 | 949 | 627 | 342 | 1529 | 1438 |
| | 1096 | 1610 | 467 | 489 | 1315 | 1283 | 1858 | 708 | 1971 | 1052 | 821 | 730 | 388 | 2020 |
| | 1811 | 1833 | 607 | 91 | 1150 | 0 | 1263 | 344 | 113 | 22 | 1732 | 1312 | 786 | 1125 |
| | 1951 | 1435 | 1076 | 1344 | 555 | 1688 | 1457 | 1049 | 1024 | 604 | 78 | 417 | 1093 | 727 |
| | 368 | 636 | 1899 | 1614 | 432 | 341 | 1250 | 830 | 1422 | 1761 | 385 | 19 | 1712 | 1513 |
| | 1191 | 906 | 1776 | 1685 | 542 | 122 | 1031 | 1053 | 1729 | 1847 | 1004 | 805 | 483 | 198 |
| | 1068 | 1294 | 1886 | 1466 | 323 | 345 | 1021 | 1139 | 1714 | 564 | 1827 | 1542 | 677 | 586 |
| | 244 | 758 | 1667 | 1689 | 463 | 1999 | 1006 | 1908 | 1119 | 200 | 2021 | 1930 | 1588 | 1168 |
| | 959 | 981 | 1807 | 1291 | 932 | 1200 | 411 | 1544 | 1313 | 1222 | 880 | 460 | 1986 | 273 |
| | 1099 | 583 | 224 | 492 | 1755 | 836 | 605 | 197 | 172 | 1804 | 1278 | 1617 | 241 | 1927 |
| | 1568 | 1369 | 1047 | 762 | 1632 | 1541 | 398 | 2030 | 570 | 909 | 1585 | 1703 | 860 | 661 |
| | 339 | 54 | 924 | 833 | 1742 | 1322 | 179 | 201 | 877 | 995 | 1570 | 2005 | 1683 | 1398 |
| | 216 | 442 | 1034 | 614 | 1523 | 1545 | 169 | 287 | 862 | 1764 | 975 | 690 | 1877 | 1786 |
| | 1444 | 1958 | 815 | 837 | 1663 | 1147 | 154 | 1056 | 267 | 1400 | 1169 | 1078 | 736 | 316 |
| | 107 | 129 | 955 | 439 | 80 | 348 | 1611 | 692 | 461 | 370 | 28 | 1660 | 1134 | 1473 |
| | 97 | 1783 | 1424 | 1692 | 903 | 2036 | 1805 | 1397 | 1372 | 952 | 426 | 765 | 1441 | 1075 |
| | 716 | 517 | 195 | 1962 | 780 | 689 | 1598 | 1178 | 1770 | 57 | 733 | 851 | 8 | 1861 |
| | 1539 | 1254 | 72 | 298 | 890 | 470 | 1379 | 1401 | 25 | 143 | 718 | 1153 | 831 | 546 |
| | 1416 | 1642 | 182 | 1814 | 671 | 693 | 1519 | 1487 | 10 | 912 | 123 | 1890 | 1025 | 934 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 592 | 1106 | 2015 | 2037 | 811 | 295 | 1354 | 204 | 1467 | 548 | 317 | 226 | 1936 | 1516 |
| | 1307 | 1329 | 103 | 1639 | 1280 | 1548 | 759 | 1892 | 1661 | 1253 | 1228 | 808 | 282 | 621 |
| | 1297 | 931 | 572 | 840 | 51 | 1184 | 953 | 545 | 520 | 100 | 1626 | 1965 | 589 | 223 |
| | 1916 | 1717 | 1395 | 1110 | 1980 | 1889 | 746 | 326 | 918 | 1257 | 1933 | 2051 | 1208 | 1009 |
| | 687 | 402 | 1272 | 1498 | 38 | 1670 | 527 | 549 | 1225 | 1343 | 1918 | 301 | 2031 | 1746 |
| | 881 | 790 | 448 | 962 | 1871 | 1893 | 667 | 635 | 1210 | 60 | 1323 | 1038 | 173 | 82 |
| | 1792 | 254 | 1163 | 1185 | 2011 | 1495 | 502 | 1404 | 615 | 1748 | 1517 | 1426 | 1084 | 664 |
| | 455 | 477 | 1303 | 787 | 428 | 696 | 1959 | 1040 | 809 | 401 | 376 | 2008 | 1482 | 1821 |
| | 445 | 79 | 1772 | 2040 | 1251 | 332 | 1836 | 1745 | 602 | 1300 | 774 | 1113 | 1789 | 1423 |
| | 1064 | 865 | 543 | 258 | 1128 | 1037 | 1946 | 1526 | 66 | 405 | 1081 | 1199 | 356 | 157 |
| | 1887 | 1602 | 420 | 646 | 1238 | 818 | 1727 | 1749 | 373 | 491 | 1066 | 1501 | 1179 | 894 |
| | 29 | 1990 | 1648 | 110 | 1019 | 1041 | 1867 | 1835 | 358 | 1260 | 471 | 186 | 1373 | 1282 |
| | 940 | 1454 | 311 | 333 | 1159 | 643 | 1702 | 552 | 1815 | 896 | 665 | 574 | 232 | 1864 |
| | 1655 | 1677 | 451 | 1987 | 1628 | 1896 | 1107 | 188 | 2009 | 1601 | 1576 | 1156 | 630 | 969 |
| | 1645 | 1279 | 920 | 1188 | 399 | 114 | 984 | 893 | 1802 | 1382 | 1974 | 261 | 937 | 571 |
| | 212 | 13 | 1743 | 1458 | 276 | 185 | 1266 | 1605 | 674 | 1846 | 347 | 1094 | 750 | 1035 |
| | 229 | 1556 | 1357 | 1620 | 875 | 897 | 2018 | 1138 | 1691 | 386 | 42 | 327 | 1573 | 214 |
| | 649 | 1229 | 167 | 189 | 1310 | 430 | 983 | 796 | 752 | 1671 | 1015 | 1558 | 408 | 521 |
| | 1511 | 1533 | 1720 | 1774 | 1843 | 88 | 44 | 963 | 307 | 850 | 1752 | 1865 | 803 | 825 |
| | 1012 | 749 | 1135 | 1432 | 1388 | 255 | 1651 | 776 | 1044 | 1157 | 1830 | 117 | 304 | 41 |
| | 427 | 724 | 1314 | 1599 | 793 | 68 | 336 | 132 | 1122 | 1461 | 530 | 1385 | 1771 | 950 |
| | 606 | 891 | 85 | 1412 | 1213 | 1476 | 731 | 753 | 1874 | 994 | 1547 | 242 | 1950 | 183 |
| | 1429 | 704 | 505 | 768 | 23 | 45 | 1166 | 286 | 839 | 1586 | 1242 | 1527 | 721 | 1414 |
| | 264 | 377 | 1367 | 1389 | 458 | 1630 | 1699 | 1996 | 1952 | 819 | 163 | 706 | 1608 | 1721 |
| | 659 | 681 | 868 | 922 | 991 | 1288 | 1244 | 111 | 1507 | 2050 | 900 | 1013 | 1686 | 2025 |
| | 160 | 1949 | 283 | 580 | 536 | 1455 | 799 | 1976 | 192 | 305 | 978 | 1317 | 1504 | 1241 |
| | 1627 | 1924 | 462 | 747 | 1993 | 1268 | 1069 | 1332 | 270 | 609 | 1730 | 533 | 1403 | 98 |
| | 1806 | 39 | 1285 | 560 | 361 | 624 | 1931 | 1953 | 1022 | 142 | 695 | 1442 | 1098 | 1383 |
| | 577 | 1904 | 1705 | 1968 | 1223 | 1245 | 314 | 1486 | 2039 | 734 | 390 | 675 | 1921 | 562 |
| | 1464 | 1577 | 515 | 537 | 1658 | 778 | 847 | 1144 | 1100 | 2019 | 1363 | 1906 | 756 | 869 |
| | 1859 | 1881 | 16 | 70 | 139 | 436 | 392 | 1311 | 655 | 1832 | 48 | 161 | 834 | 1173 |
| | 1360 | 1097 | 1483 | 1780 | 1736 | 603 | 1849 | 1124 | 1392 | 1505 | 126 | 465 | 652 | 389 |
| | 775 | 1072 | 1662 | 1947 | 1141 | 416 | 217 | 480 | 1470 | 1809 | 878 | 1733 | 551 | 1298 |
| | 954 | 1239 | 433 | 1760 | 1561 | 1824 | 1079 | 1101 | 170 | 1342 | 1895 | 590 | 246 | 531 |
| | 1777 | 418 | 853 | 1116 | 371 | 393 | 1514 | 634 | 1187 | 1934 | 1590 | 1875 | 1219 | 1762 |
| | 612 | 725 | 1715 | 1737 | 806 | 1978 | 2047 | 292 | 248 | 1167 | 511 | 1054 | 1956 | 17 |
| | 1007 | 1029 | 1216 | 1270 | 1339 | 1636 | 1592 | 459 | 1855 | 980 | 1248 | 1361 | 2034 | 321 |
| | 508 | 245 | 631 | 928 | 884 | 1803 | 997 | 272 | 540 | 653 | 1326 | 1665 | 1852 | 1589 |
| | 1975 | 220 | 810 | 1095 | 289 | 1616 | 1417 | 1680 | 618 | 957 | 26 | 1198 | 1751 | 446 |
| | 102 | 387 | 1633 | 908 | 709 | 972 | 227 | 249 | 1370 | 490 | 1043 | 1790 | 1446 | 1731 |
| | 925 | 1618 | 1 | 581 | 1571 | 1593 | 662 | 1834 | 335 | 148 | 738 | 1023 | 367 | 910 |
| | 1812 | 1925 | 863 | 885 | 2006 | 1126 | 1195 | 1492 | 1448 | 315 | 1711 | 202 | 1104 | 1217 |
| | 155 | 177 | 364 | 101 | 487 | 784 | 740 | 1659 | 1003 | 128 | 396 | 509 | 1182 | 1521 |
| | 1708 | 1445 | 1831 | 76 | 32 | 951 | 145 | 1472 | 1740 | 1536 | 474 | 813 | 1000 | 737 |
| | 1123 | 302 | 2010 | 243 | 1489 | 764 | 565 | 828 | 1818 | 105 | 1226 | 346 | 899 | 1646 |
| | 1302 | 1587 | 781 | 56 | 1909 | 120 | 1427 | 1449 | 518 | 1690 | 191 | 938 | 594 | 879 |
| | 73 | 766 | 1201 | 1781 | 719 | 741 | 1862 | 982 | 1535 | 1348 | 1938 | 171 | 1567 | 58 |
| | 960 | 1073 | 11 | 33 | 1154 | 274 | 343 | 640 | 596 | 1515 | 859 | 1402 | 252 | 365 |
| | 1355 | 1377 | 1564 | 1301 | 1687 | 1984 | 1940 | 807 | 151 | 1328 | 1596 | 1709 | 330 | 669 |
| | 856 | 593 | 979 | 1276 | 1866 | 99 | 1345 | 620 | 888 | 684 | 1674 | 2013 | 1082 | 1937 |
| | 271 | 1502 | 1158 | 1443 | 637 | 1964 | 1765 | 2028 | 966 | 1305 | 374 | 1546 | 47 | 794 |
| | 450 | 735 | 1981 | 1256 | 1057 | 1320 | 575 | 597 | 1718 | 838 | 1391 | 86 | 1794 | 27 |
| | 1273 | 1966 | 349 | 929 | 1919 | 1941 | 1010 | 130 | 683 | 496 | 452 | 1371 | 715 | 1258 |
| | 108 | 221 | 1420 | 1565 | 550 | 663 | 1452 | 1796 | 7 | 1211 | 1233 | 1543 | 1474 | 1840 |
| | 712 | 857 | 476 | 2007 | 744 | 1088 | 1351 | 503 | 525 | 835 | 449 | 1132 | 4 | 1884 |
| | 1820 | 1299 | 36 | 1014 | 493 | 1530 | 1869 | 127 | 1793 | 424 | 230 | 1176 | 1112 | 591 |
| | 913 | 306 | 1837 | 822 | 1161 | 1471 | 1085 | 650 | 1574 | 468 | 404 | 1935 | 205 | 1650 |
| | 1129 | 431 | 453 | 1247 | 694 | 1994 | 866 | 77 | 1114 | 1227 | 2016 | 942 | 421 | 1775 |
| | 1797 | 539 | 2038 | 1286 | 158 | 1421 | 406 | 519 | 1308 | 1652 | 1915 | 1067 | 1089 | 1399 |
| | 1330 | 1696 | 568 | 713 | 1750 | 1863 | 600 | 944 | 1207 | 359 | 381 | 691 | 622 | 988 |
| | 1912 | 5 | 1676 | 1155 | 1944 | 236 | 499 | 1386 | 1725 | 2035 | 1649 | 280 | 1204 | 1032 |
| | 968 | 447 | 769 | 162 | 1693 | 678 | 1017 | 1327 | 941 | 1624 | 324 | 233 | 260 | 1791 |
| | 2022 | 1850 | 1103 | 309 | 1430 | 61 | 985 | 1506 | 1668 | 1894 | 1604 | 1083 | 1631 | 1142 |
| | 395 | 1653 | 722 | 1405 | 277 | 798 | 1277 | 1186 | 262 | 375 | 923 | 434 | 1739 | 945 |
| | 14 | 1164 | 1621 | 90 | 569 | 478 | 1606 | 1719 | 215 | 844 | 547 | 237 | 1358 | 456 |
| | 1063 | 800 | 1913 | 1822 | 1532 | 1011 | 1559 | 136 | 1891 | 1581 | 1768 | 1800 | 355 | 92 |
| | 1205 | 797 | 824 | 303 | 534 | 1480 | 1183 | 873 | 1060 | 1092 | 1549 | 1436 | 180 | 89 |
| | 116 | 1647 | 1878 | 772 | 475 | 165 | 352 | 1969 | 841 | 1362 | 1524 | 1433 | 1460 | 939 |
| | 1170 | 998 | 251 | 1509 | 578 | 1261 | 133 | 654 | 816 | 1042 | 118 | 231 | 779 | 290 |
| | 1595 | 801 | 1922 | 553 | 1477 | 1998 | 425 | 334 | 1462 | 1575 | 71 | 1634 | 887 | 93 |
| | 1214 | 312 | 919 | 1290 | 1769 | 1678 | 754 | 867 | 1415 | 2044 | 1747 | 1437 | 506 | 1656 |
| | 211 | 2000 | 1061 | 970 | 680 | 159 | 707 | 1336 | 1039 | 729 | 916 | 948 | 1555 | 1292 |
| | 353 | 1997 | 2024 | 1503 | 1734 | 628 | 331 | 21 | 208 | 240 | 697 | 584 | 1380 | 1289 |
| | 1316 | 795 | 1026 | 1972 | 1675 | 1365 | 1552 | 1117 | 2041 | 510 | 672 | 898 | 608 | 87 |
| | 318 | 146 | 1451 | 657 | 1778 | 409 | 1333 | 1854 | 281 | 190 | 1318 | 1431 | 1979 | 1490 |
| | 743 | 2001 | 1070 | 1753 | 625 | 1146 | 1625 | 1534 | 610 | 723 | 1271 | 782 | 35 | 1293 |
| | 362 | 1512 | 67 | 438 | 917 | 826 | 1954 | 15 | 563 | 1192 | 895 | 585 | 1706 | 804 |

-continued

| Block Length N | Permutation Indices π = [π(0), π(1), . . . , π(N − 1)] | | | | | | | | | | | | | |
|---|---|---|---|---|---|---|---|---|---|---|---|---|---|---|
| | 1411 | 1148 | 209 | 1853 | 1880 | 1359 | 1907 | 484 | 187 | 1929 | 64 | 96 | 703 | 440 |
| | 1236 | 1145 | 1172 | 651 | 882 | 1828 | 1531 | 1221 | 1408 | 1440 | 1897 | 1784 | 528 | 437 |
| | 464 | 1995 | 174 | 1120 | 823 | 513 | 700 | 265 | 1189 | 1710 | 1872 | 46 | 1808 | 1287 |
| | 1518 | 1346 | 599 | 1857 | 926 | 1609 | 481 | 1002 | 1481 | 1390 | 466 | 579 | 1127 | 638 |
| | 1943 | 1149 | 218 | 901 | 1825 | 294 | 773 | 682 | 1810 | 1923 | 419 | 1048 | 1235 | 441 |
| | 1562 | 660 | 1267 | 1638 | 65 | 2026 | 1102 | 1215 | 1763 | 340 | 43 | 1785 | 854 | 2004 |
| | 559 | 296 | 1409 | 1001 | 1028 | 507 | 1055 | 1684 | 1387 | 1077 | 1264 | 1296 | 1903 | 1640 |
| | 384 | 293 | 320 | 1851 | 30 | 976 | 679 | 369 | 556 | 588 | 1045 | 1566 | 1728 | 1637 |
| | 1664 | 1143 | 1374 | 1202 | 2023 | 1713 | 1900 | 1465 | 337 | 858 | 1020 | 1246 | 956 | 435 |
| | 666 | 494 | 1799 | 1005 | 74 | 757 | 1681 | 150 | 629 | 538 | 1666 | 1779 | 275 | 1838 |
| | 1091 | 297 | 1418 | 49 | 973 | 1494 | 1973 | 1882 | 958 | 1071 | 1619 | 196 | 383 | 1641 |
| | 710 | 1860 | 415 | 152 | 1265 | 1174 | 250 | 363 | 911 | 1540 | 1243 | 933 | 2 | 1152 |
| | 1759 | 1496 | 176 | 832 | 1051 | 788 | 557 | 412 | 535 | 444 | 203 | 1707 | 225 | 149 |
| | 1520 | 124 | 193 | 714 | 1584 | 1756 | 1879 | 1788 | 1230 | 999 | 1569 | 1493 | 812 | 350 |
| | 1537 | 6 | 876 | 1982 | 1171 | 613 | 522 | 291 | 861 | 785 | 104 | 1694 | 829 | 1350 |
| | 168 | 1274 | 947 | 1957 | 131 | 1635 | 153 | 394 | 814 | 986 | 121 | 642 | 1829 | 566 |
| | 239 | 1716 | 1475 | 927 | 1497 | 1738 | 106 | 1396 | 1615 | 1352 | 1121 | 1910 | 1583 | 1008 |
| | 767 | 219 | 789 | 1030 | 1450 | 688 | 907 | 644 | 413 | 268 | 391 | 300 | 59 | 1563 |
| | 81 | 322 | 1376 | 2032 | 199 | 1988 | 1757 | 1612 | 1735 | 1644 | 1086 | 855 | 1425 | 1349 |
| | 668 | 1324 | 1393 | 1914 | 732 | 904 | 1027 | 469 | 378 | 147 | 717 | 641 | 2012 | 1550 |
| | 685 | 1206 | 24 | 1130 | 319 | 1813 | 1722 | 1491 | 9 | 1985 | 1304 | 842 | 2029 | 498 |
| | 1368 | 422 | 95 | 1105 | 1331 | 783 | 1353 | 1594 | 2014 | 134 | 1321 | 1842 | 977 | 1766 |
| | 1439 | 864 | 623 | 75 | 645 | 886 | 1306 | 544 | 763 | 500 | 269 | 1058 | 247 | 156 |
| | 1967 | 1419 | 1989 | 178 | 1232 | 1888 | 55 | 1844 | 1613 | 1468 | 1591 | 1500 | 1259 | 711 |
| | 1281 | 1522 | 524 | 1180 | 1249 | 1136 | 905 | 760 | 883 | 792 | 234 | 3 | 573 | 497 |
| | 1868 | 472 | 541 | 1062 | 1932 | 52 | 175 | 1669 | 1578 | 1347 | 1917 | 1841 | 1160 | 698 |
| | 1885 | 354 | 1224 | 278 | 2003 | 961 | 870 | 639 | 1209 | 1133 | 1870 | 2042 | 1177 | 1698 |
| | 516 | 1622 | 1295 | 253 | 479 | 1983 | 501 | 742 | 1162 | 1334 | 619 | 990 | 125 | 914 |
| | 587 | 12 | 1823 | 1275 | 1845 | 34 | 454 | 1744 | 1963 | 1700 | 1469 | 206 | 1447 | 1356 |
| | 1115 | 567 | 1137 | 1378 | 380 | 1036 | 1255 | 992 | 761 | 616 | 739 | 648 | 407 | 1911 |
| | 429 | 670 | 1724 | 328 | 397 | 284 | 53 | 1960 | 31 | 1992 | 1434 | 1203 | 1773 | 1697 |
| | 1016 | 1672 | 1741 | 210 | 1080 | 1252 | 1375 | 817 | 726 | 495 | 1065 | 989 | 308 | 1898 |
| | 1033 | 1554 | 372 | 1478 | 1151 | 109 | 18 | 1839 | 357 | 598 | 1018 | 1190 | 325 | 846 |
| | 2033 | 770 | 443 | 1453 | 1679 | 1131 | 1701 | 1942 | 310 | 482 | 1819 | 138 | 1325 | 62 |
| | 1787 | 1212 | 971 | 423 | 993 | 1234 | 1654 | 892 | 1111 | 848 | 617 | 1406 | 595 | 504 |
| | 263 | 1767 | 285 | 526 | 1580 | 184 | 403 | 140 | 1961 | 1816 | 1939 | 1848 | 1607 | 1059 |
| | 1629 | 1553 | 872 | 1528 | 1597 | 1484 | 936 | 1108 | 1231 | 1140 | 582 | 351 | 921 | 845 |
| | 164 | 820 | 889 | 1410 | 228 | 400 | 523 | 2017 | 1926 | 1695 | 213 | 137 | 1508 | 1046 |
| | 181 | 702 | 1572 | 626 | 299 | 1309 | 1218 | 987 | 1557 | 1798 | 166 | 338 | 1525 | 2046 |
| | 1181 | 1970 | 1643 | 601 | 827 | 279 | 849 | 1090 | 1510 | 748 | 967 | 1338 | 473 | 1262 |
| | 935 | 360 | 119 | 1623 | 141 | 382 | 802 | 40 | 259 | 2048 | 1817 | 554 | 1795 | 1704 |
| | 1463 | 915 | 1485 | 1726 | 728 | 1384 | 1603 | 1340 | 1109 | 964 | 1087 | 996 | 755 | 207 |
| | 777 | 701 | 20 | 676 | 745 | 632 | 84 | 256 | 379 | 288 | 1782 | 1551 | 69 | 2045 |
| | 1364 | 902 | 37 | 558 | 1428 | 1600 | 1723 | 1165 | 1074 | 843 | 1413 | 1337 | 656 | 194 |
| | 1381 | 1902 | 720 | 1826 | 1499 | 457 | 366 | 135 | 705 | 946 | 1366 | 1538 | 673 | 1194 |
| | 329 | 1118 | 791 | 1801 | 2027 | 1479 | 2049 | 238 | | | | | | |
| 2259 | 317 | 507 | 1067 | 836 | 1226 | 226 | 489 | 1686 | 698 | 67 | 2251 | 29 | 2161 | 807 |
| | 2020 | 1136 | 576 | 764 | 789 | 383 | 1948 | 2258 | 367 | 1542 | 1932 | 917 | 1107 | 64 |
| | 1198 | 1826 | 826 | 1089 | 30 | 1298 | 1261 | 595 | 629 | 505 | 1407 | 364 | 1736 | 1176 |
| | 1364 | 1389 | 983 | 292 | 967 | 2142 | 276 | 1517 | 1707 | 664 | 1798 | 170 | 1426 | 1689 |
| | 630 | 1898 | 1861 | 186 | 1229 | 1105 | 2007 | 311 | 80 | 1776 | 1726 | 1989 | 1583 | 892 |
| | 1567 | 1495 | 876 | 2117 | 51 | 1264 | 142 | 770 | 2026 | 33 | 1230 | 242 | 205 | 786 |
| | 1829 | 1705 | 351 | 911 | 680 | 120 | 70 | 333 | 2183 | 542 | 2167 | 2095 | 1476 | 461 |
| | 651 | 1864 | 742 | 420 | 608 | 633 | 1830 | 1792 | 805 | 1386 | 173 | 49 | 951 | 1511 |
| | 1280 | 720 | 670 | 933 | 527 | 1142 | 511 | 439 | 2076 | 2257 | 1061 | 1251 | 208 | 1342 |
| | 1020 | 1208 | 1233 | 174 | 136 | 1405 | 1986 | 773 | 649 | 1551 | 2111 | 1880 | 14 | 1270 |
| | 1533 | 1127 | 1742 | 1111 | 1039 | 1073 | 1661 | 1851 | 808 | 1942 | 1620 | 1808 | 1833 | 774 |
| | 736 | 2005 | 330 | 1373 | 1249 | 2151 | 455 | 224 | 614 | 1870 | 2133 | 1727 | 86 | 1711 |
| | 1639 | 1673 | 1549 | 195 | 1408 | 286 | 2220 | 152 | 177 | 2027 | 1336 | 349 | 930 | 1320 |
| | 305 | 495 | 1055 | 824 | 1214 | 214 | 477 | 1674 | 686 | 55 | 2239 | 17 | 2149 | 795 |
| | 2008 | 886 | 564 | 752 | 777 | 371 | 1936 | 949 | 1530 | 1920 | 905 | 1095 | 1655 | 1424 |
| | 1814 | 814 | 1077 | 18 | 1286 | 655 | 583 | 617 | 493 | 1395 | 352 | 2256 | 1486 | 1164 |
| | 1352 | 1377 | 971 | 280 | 955 | 2130 | 264 | 1505 | 1695 | 2255 | 2024 | 158 | 1414 | 1677 |
| | 618 | 1886 | 1849 | 1183 | 1217 | 1093 | 1995 | 952 | 68 | 1764 | 1952 | 1977 | 1571 | 880 |
| | 1555 | 474 | 864 | 2105 | 39 | 1252 | 130 | 758 | 2014 | 21 | 1218 | 230 | 193 | 1783 |
| | 1817 | 1693 | 339 | 899 | 668 | 108 | 296 | 321 | 2171 | 1480 | 2155 | 1074 | 1464 | 449 |
| | 639 | 1852 | 730 | 1358 | 358 | 621 | 1818 | 830 | 793 | 1374 | 161 | 37 | 939 | 1499 |
| | 1268 | 708 | 658 | 921 | 515 | 2080 | 499 | 427 | 2064 | 1049 | 1239 | 196 | 1330 | 1958 |
| | 1196 | 1221 | 162 | 1430 | 1393 | 1974 | 761 | 637 | 1539 | 2099 | 1868 | 1308 | 1258 | 1521 |
| | 1115 | 1730 | 1099 | 1027 | 408 | 1649 | 1839 | 796 | 1930 | 1608 | 1796 | 1821 | 762 | 724 |
| | 1993 | 318 | 1361 | 1237 | 2139 | 443 | 212 | 602 | 1858 | 2121 | 1715 | 74 | 1699 | 1627 |
| | 1008 | 2249 | 183 | 1396 | 274 | 2208 | 140 | 165 | 1362 | 1324 | 337 | 918 | 1961 | 1837 |
| | 483 | 1043 | 812 | 1202 | 202 | 465 | 59 | 674 | 43 | 2227 | 5 | 593 | 783 | 1996 |
| | 874 | 552 | 740 | 765 | 1962 | 1924 | 937 | 1518 | 1908 | 181 | 1083 | 1643 | 1412 | 1802 |
| | 802 | 1065 | 659 | 1274 | 643 | 571 | 605 | 481 | 1383 | 340 | 1474 | 1152 | 1340 | 1365 |
| | 959 | 268 | 1537 | 2118 | 252 | 1493 | 1683 | 2243 | 2012 | 146 | 1402 | 1665 | 606 | 1874 |
| | 1243 | 1171 | 1205 | 1081 | 1983 | 940 | 2074 | 1752 | 1940 | 1965 | 1559 | 868 | 2137 | 462 |

-continued

| Block Length N | Permutation Indices π = [π(0), π(1), . . . , π(N − 1)] | | | | | | | | | | | | | |
|---|---|---|---|---|---|---|---|---|---|---|---|---|---|---|
| | 852 | 2093 | 27 | 587 | 356 | 746 | 2002 | 9 | 1206 | 218 | 1843 | 1771 | 1805 | 1681 |
| | 327 | 1540 | 418 | 96 | 284 | 309 | 2159 | 1468 | 2143 | 1062 | 1452 | 437 | 627 | 1187 |
| | 956 | 1346 | 346 | 609 | 1806 | 818 | 781 | 115 | 149 | 25 | 927 | 2140 | 1256 | 696 |
| | 884 | 909 | 503 | 2068 | 487 | 1662 | 2052 | 1037 | 1227 | 184 | 1318 | 1946 | 946 | 1209 |
| | 150 | 1418 | 1381 | 715 | 749 | 625 | 1527 | 2087 | 1856 | 1296 | 1484 | 1509 | 1103 | 412 |
| | 1087 | 6 | 396 | 1637 | 1827 | 784 | 1918 | 290 | 1546 | 1809 | 750 | 2018 | 1981 | 306 |
| | 1349 | 1225 | 2127 | 431 | 200 | 1896 | 1846 | 2109 | 1703 | 1012 | 1687 | 1615 | 996 | 2237 |
| | 171 | 1384 | 262 | 890 | 128 | 153 | 1350 | 362 | 325 | 906 | 1949 | 1825 | 471 | 1031 |
| | 800 | 240 | 190 | 453 | 47 | 662 | 31 | 2215 | 1596 | 581 | 771 | 1984 | 862 | 540 |
| | 728 | 753 | 1950 | 1912 | 925 | 1506 | 293 | 169 | 1071 | 1631 | 1400 | 1790 | 790 | 1053 |
| | 647 | 1262 | 631 | 559 | 2196 | 328 | 1462 | 1371 | 893 | 1328 | 1181 | 1525 | 256 | 1140 |
| | 1353 | 294 | 2106 | 2231 | 2000 | 1671 | 1193 | 1390 | 769 | 1231 | 1862 | 134 | 1653 | 1247 |
| | 1159 | 928 | 2062 | 1971 | 840 | 1928 | 1781 | 2125 | 856 | 1740 | 1953 | 894 | 450 | 575 |
| | 344 | 15 | 1793 | 1990 | 1369 | 1831 | 206 | 734 | 2253 | 1847 | 1759 | 1528 | 406 | 315 |
| | 1440 | 272 | 1669 | 469 | 1456 | 84 | 297 | 2147 | 1050 | 1175 | 944 | 615 | 137 | 334 |
| | 425 | 175 | 806 | 1334 | 597 | 1794 | 103 | 2128 | 1006 | 915 | 2040 | 872 | 13 | 1069 |
| | 2056 | 684 | 897 | 491 | 1650 | 1775 | 1544 | 1215 | 737 | 934 | 1025 | 775 | 1406 | 1934 |
| | 1197 | 138 | 703 | 472 | 1606 | 1515 | 384 | 1472 | 613 | 1075 | 400 | 1284 | 1497 | 1091 |
| | 2250 | 119 | 2144 | 1815 | 1337 | 1534 | 1625 | 1969 | 2006 | 278 | 1797 | 738 | 1303 | 1072 |
| | 188 | 2115 | 984 | 2072 | 1213 | 1675 | 1000 | 1884 | 2097 | 1691 | 594 | 1372 | 250 | 159 |
| | 1937 | 2134 | 2225 | 313 | 350 | 878 | 141 | 1338 | 1903 | 1019 | 788 | 459 | 1584 | 416 |
| | 1813 | 19 | 1600 | 228 | 441 | 35 | 1194 | 1972 | 850 | 759 | 281 | 478 | 569 | 913 |
| | 950 | 1478 | 741 | 1938 | 1494 | 1619 | 1388 | 1059 | 2184 | 778 | 157 | 619 | 2200 | 828 |
| | 1041 | 635 | 547 | 316 | 1450 | 1359 | 881 | 1316 | 1169 | 1513 | 1550 | 2078 | 1341 | 282 |
| | 2094 | 2219 | 1988 | 1659 | 528 | 1378 | 757 | 1219 | 1850 | 1428 | 1641 | 1235 | 1147 | 916 |
| | 2050 | 1959 | 1481 | 1916 | 1769 | 2113 | 844 | 1728 | 1941 | 882 | 438 | 563 | 332 | 3 |
| | 1128 | 1978 | 1357 | 1819 | 194 | 722 | 2241 | 1835 | 1747 | 1516 | 394 | 303 | 2081 | 260 |
| | 113 | 457 | 1444 | 72 | 285 | 1482 | 1038 | 1163 | 932 | 603 | 125 | 322 | 1957 | 163 |
| | 794 | 1322 | 585 | 179 | 91 | 2116 | 994 | 903 | 2028 | 860 | 713 | 1057 | 2044 | 672 |
| | 885 | 2082 | 1638 | 1763 | 1532 | 1203 | 725 | 922 | 301 | 763 | 1394 | 1922 | 1185 | 779 |
| | 691 | 460 | 1594 | 1503 | 372 | 1460 | 601 | 1657 | 388 | 1272 | 1485 | 1079 | 2238 | 107 |
| | 2132 | 1803 | 1325 | 1522 | 1613 | 1363 | 1994 | 266 | 1785 | 726 | 1291 | 1060 | 2194 | 2103 |
| | 972 | 2060 | 1201 | 1 | 988 | 1872 | 2085 | 1679 | 582 | 707 | 476 | 147 | 1925 | 2122 |
| | 2213 | 1963 | 338 | 866 | 129 | 1326 | 1891 | 1660 | 538 | 447 | 1572 | 404 | 1801 | 7 |
| | 1588 | 216 | 429 | 23 | 1182 | 1307 | 1076 | 747 | 269 | 466 | 557 | 901 | 938 | 1466 |
| | 729 | 1926 | 235 | 4 | 1376 | 1047 | 2172 | 1004 | 145 | 607 | 2188 | 816 | 1029 | 623 |
| | 1782 | 304 | 1438 | 1347 | 869 | 1066 | 1157 | 1501 | 1538 | 2066 | 1329 | 270 | 835 | 2207 |
| | 1976 | 1647 | 516 | 1604 | 745 | 1207 | 532 | 1416 | 1629 | 1223 | 126 | 904 | 2038 | 1947 |
| | 1469 | 1666 | 1757 | 2101 | 2138 | 410 | 1929 | 870 | 426 | 551 | 320 | 2247 | 1116 | 1966 |
| | 1345 | 1807 | 1132 | 2016 | 2229 | 1823 | 1735 | 1504 | 382 | 291 | 2069 | 248 | 101 | 445 |
| | 482 | 1010 | 273 | 1470 | 1026 | 1151 | 920 | 591 | 1716 | 310 | 1945 | 151 | 782 | 360 |
| | 573 | 167 | 79 | 2104 | 982 | 891 | 413 | 848 | 701 | 1045 | 2032 | 660 | 873 | 2070 |
| | 1626 | 1751 | 1520 | 1191 | 60 | 910 | 289 | 751 | 1382 | 1910 | 1173 | 767 | 679 | 448 |
| | 1582 | 1491 | 1013 | 1448 | 1301 | 1645 | 376 | 1260 | 1473 | 414 | 2226 | 95 | 2120 | 1791 |
| | 1313 | 1510 | 889 | 1351 | 1982 | 254 | 1773 | 1367 | 1279 | 1048 | 2182 | 2091 | 960 | 2048 |
| | 1901 | 2245 | 976 | 1860 | 2073 | 1667 | 570 | 695 | 464 | 135 | 1913 | 2110 | 1489 | 1951 |
| | 326 | 854 | 117 | 1967 | 1879 | 1648 | 526 | 435 | 1560 | 392 | 1789 | 589 | 1576 | 204 |
| | 417 | 11 | 1170 | 1295 | 1064 | 735 | 257 | 454 | 545 | 295 | 926 | 1454 | 717 | 1914 |
| | 223 | 2248 | 1126 | 1035 | 2160 | 992 | 133 | 1189 | 2176 | 804 | 1017 | 611 | 1770 | 1895 |
| | 1664 | 1335 | 857 | 1054 | 1145 | 895 | 1526 | 2054 | 1317 | 258 | 823 | 592 | 1964 | 1635 |
| | 504 | 1592 | 733 | 1195 | 520 | 1404 | 1617 | 1211 | 114 | 239 | 8 | 1935 | 1457 | 1654 |
| | 1745 | 2089 | 2126 | 398 | 1917 | 858 | 1423 | 2235 | 714 | 2217 | 1120 | 1811 | 1795 | 2004 |
| | 1192 | 308 | 2192 | 1104 | 1333 | 279 | 1014 | 261 | 470 | 1458 | 433 | 998 | 1492 | 370 |
| | 2254 | 2057 | 89 | 579 | 1314 | 561 | 1720 | 155 | 139 | 348 | 1139 | 908 | 536 | 1704 |
| | 1933 | 879 | 1614 | 861 | 1070 | 2058 | 1033 | 1598 | 2092 | 970 | 598 | 401 | 689 | 667 |
| | 48 | 1161 | 1370 | 1739 | 277 | 898 | 1508 | 1179 | 755 | 948 | 739 | 2214 | 1001 | 1461 |
| | 1670 | 436 | 1289 | 1436 | 1570 | 1479 | 402 | 2198 | 1633 | 1267 | 648 | 1761 | 1970 | 83 |
| | 877 | 1498 | 2108 | 1779 | 1355 | 1548 | 1339 | 558 | 1601 | 2061 | 964 | 1036 | 1889 | 2036 |
| | 2170 | 2079 | 1002 | 1848 | 2233 | 1867 | 1248 | 105 | 314 | 683 | 1477 | 2098 | 452 | 123 |
| | 1955 | 842 | 1939 | 1158 | 2201 | 405 | 1564 | 1636 | 233 | 380 | 514 | 423 | 1602 | 192 |
| | 577 | 211 | 245 | 705 | 914 | 1283 | 2077 | 442 | 1052 | 723 | 299 | 1442 | 283 | 1758 |
| | 2148 | 1005 | 2164 | 2236 | 833 | 980 | 1114 | 1023 | 599 | 792 | 1177 | 811 | 845 | 1305 |
| | 1514 | 1883 | 421 | 1042 | 1652 | 1323 | 246 | 2042 | 883 | 102 | 492 | 1605 | 508 | 580 |
| | 721 | 1580 | 1714 | 1623 | 1199 | 1392 | 1777 | 1411 | 1445 | 1905 | 2114 | 227 | 1733 | 1642 |
| | 2252 | 1923 | 846 | 386 | 1483 | 702 | 1092 | 2205 | 1108 | 1180 | 1321 | 2180 | 58 | 2223 |
| | 1799 | 1992 | 121 | 2011 | 2045 | 249 | 458 | 827 | 77 | 2242 | 596 | 267 | 1446 | 986 |
| | 2083 | 1302 | 1692 | 549 | 1708 | 1780 | 1921 | 524 | 896 | 567 | 143 | 336 | 127 | 355 |
| | 389 | 849 | 1058 | 1427 | 677 | 586 | 958 | 867 | 2046 | 1586 | 1021 | 1902 | 36 | 1149 |
| | 52 | 124 | 265 | 1124 | 1496 | 1167 | 743 | 936 | 727 | 2202 | 989 | 1449 | 1658 | 424 |
| | 1277 | 1186 | 1558 | 1467 | 390 | 2186 | 1621 | 1255 | 636 | 1749 | 652 | 71 | 865 | 1724 |
| | 2096 | 1767 | 1343 | 1536 | 1327 | 546 | 1589 | 2049 | 2 | 1024 | 1877 | 1786 | 2158 | 2067 |
| | 990 | 530 | 2221 | 1855 | 1236 | 93 | 302 | 671 | 1465 | 2086 | 440 | 111 | 1943 | 2136 |
| | 1927 | 1146 | 2189 | 393 | 1552 | 1624 | 221 | 368 | 502 | 411 | 1590 | 1130 | 565 | 199 |
| | 1836 | 693 | 902 | 1271 | 2065 | 430 | 1040 | 711 | 287 | 480 | 271 | 1746 | 533 | 993 |
| | 2152 | 2224 | 821 | 968 | 1102 | 1011 | 2190 | 780 | 1165 | 799 | 180 | 1293 | 1502 | 1871 |
| | 409 | 1030 | 1640 | 1311 | 887 | 2030 | 871 | 90 | 1133 | 1593 | 496 | 568 | 1421 | 1568 |
| | 1702 | 1611 | 534 | 1380 | 1765 | 1399 | 1433 | 1893 | 2102 | 215 | 1009 | 1630 | 2240 | 1911 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 1487 | 374 | 1471 | 690 | 1080 | 2193 | 1096 | 1168 | 2021 | 2168 | 46 | 2211 | 1787 | 1980 |
| | 109 | 1999 | 2033 | 237 | 446 | 815 | 1609 | 2230 | 584 | 255 | 1434 | 974 | 2071 | 1290 |
| | 1680 | 537 | 1696 | 1768 | 1909 | 512 | 646 | 555 | 131 | 324 | 709 | 343 | 377 | 837 |
| | 1046 | 1415 | 665 | 574 | 1184 | 855 | 2034 | 1574 | 415 | 1890 | 24 | 1137 | 40 | 112 |
| | 253 | 1112 | 1246 | 1155 | 731 | 924 | 1309 | 943 | 977 | 1437 | 1646 | 2015 | 1265 | 1174 |
| | 1784 | 1455 | 378 | 2174 | 1015 | 234 | 624 | 1737 | 640 | 712 | 853 | 1712 | 2084 | 1755 |
| | 1331 | 1524 | 1315 | 1543 | 1577 | 2037 | 2246 | 359 | 1865 | 1774 | 2146 | 2055 | 978 | 518 |
| | 2209 | 834 | 1224 | 81 | 1240 | 1312 | 1453 | 56 | 428 | 99 | 1931 | 2124 | 1915 | 1134 |
| | 2177 | 381 | 590 | 1612 | 209 | 118 | 490 | 399 | 1578 | 1118 | 553 | 187 | 1824 | 681 |
| | 1840 | 1259 | 2053 | 656 | 1028 | 699 | 275 | 468 | 259 | 1734 | 521 | 981 | 1190 | 2212 |
| | 809 | 718 | 1090 | 999 | 2178 | 1718 | 1153 | 787 | 168 | 1281 | 1490 | 1859 | 397 | 1018 |
| | 1628 | 1299 | 875 | 1068 | 859 | 78 | 1121 | 1581 | 484 | 556 | 1409 | 1556 | 1690 | 1599 |
| | 522 | 62 | 1753 | 1387 | 768 | 1881 | 2090 | 203 | 997 | 1618 | 2228 | 1899 | 1475 | 1668 |
| | 1459 | 678 | 1721 | 2181 | 1084 | 1156 | 2009 | 2156 | 34 | 2199 | 1122 | 1968 | 97 | 1987 |
| | 1368 | 225 | 434 | 803 | 1597 | 2218 | 572 | 243 | 2075 | 962 | 2059 | 1278 | 65 | 525 |
| | 1684 | 1756 | 353 | 500 | 634 | 543 | 1722 | 312 | 697 | 825 | 2197 | 1562 | 403 | 331 |
| | 843 | 562 | 419 | 1403 | 1034 | 1172 | 365 | 1125 | 953 | 912 | 1297 | 1878 | 1143 | 1100 |
| | 719 | 100 | 28 | 1234 | 12 | 1425 | 541 | 2162 | 1003 | 931 | 1443 | 1162 | 366 | 2003 |
| | 1634 | 1772 | 965 | 1725 | 841 | 1512 | 1897 | 222 | 1743 | 1700 | 1319 | 700 | 628 | 1834 |
| | 612 | 2025 | 1853 | 506 | 1603 | 1531 | 2043 | 1762 | 966 | 347 | 2234 | 116 | 1565 | 69 |
| | 1441 | 2112 | 241 | 822 | 87 | 44 | 1919 | 1300 | 1228 | 178 | 1212 | 369 | 197 | 1106 |
| | 2203 | 2131 | 387 | 106 | 1566 | 947 | 578 | 716 | 2165 | 669 | 2041 | 456 | 247 | 1422 |
| | 687 | 644 | 263 | 1900 | 1828 | 1016 | 1812 | 969 | 797 | 1706 | 1141 | 475 | 987 | 706 |
| | 2166 | 1547 | 1178 | 1078 | 509 | 1269 | 385 | 1056 | 847 | 2022 | 1287 | 1244 | 863 | 244 |
| | 172 | 1616 | 156 | 1569 | 1397 | 50 | 1741 | 66 | 1587 | 1306 | 510 | 544 | 1778 | 1678 |
| | 1109 | 1869 | 985 | 1656 | 1447 | 1375 | 1887 | 1844 | 1463 | 191 | 772 | 2216 | 756 | 2169 |
| | 1997 | 650 | 85 | 666 | 2187 | 1906 | 1110 | 1144 | 122 | 22 | 1709 | 213 | 1585 | 0 |
| | 2047 | 1975 | 231 | 2206 | 2063 | 791 | 422 | 560 | 1356 | 513 | 341 | 1250 | 685 | 1266 |
| | 531 | 488 | 1710 | 1744 | 1672 | 622 | 53 | 813 | 2185 | 600 | 391 | 319 | 831 | 550 |
| | 407 | 1391 | 1022 | 1160 | 1956 | 1113 | 941 | 900 | 1285 | 1866 | 1131 | 1088 | 54 | 88 |
| | 16 | 1222 | 653 | 1413 | 529 | 2150 | 991 | 919 | 1431 | 1150 | 1007 | 1991 | 1622 | 1760 |
| | 300 | 1713 | 1541 | 1500 | 1885 | 210 | 1731 | 1688 | 654 | 688 | 616 | 1822 | 1253 | 2013 |
| | 1129 | 494 | 1591 | 1519 | 2031 | 1750 | 1607 | 335 | 2222 | 104 | 1553 | 57 | 2141 | 2100 |
| | 229 | 810 | 75 | 32 | 1907 | 1288 | 1216 | 166 | 1200 | 357 | 1729 | 1094 | 2191 | 2119 |
| | 375 | 94 | 1554 | 935 | 566 | 704 | 2153 | 657 | 2029 | 444 | 829 | 1410 | 675 | 632 |
| | 251 | 1888 | 1816 | 766 | 1800 | 957 | 785 | 1694 | 535 | 463 | 975 | 694 | 2154 | 1535 |
| | 1166 | 1304 | 497 | 1257 | 373 | 1044 | 1429 | 2010 | 1275 | 1232 | 851 | 232 | 160 | 1366 |
| | 144 | 1557 | 1385 | 38 | 1135 | 1063 | 1575 | 1294 | 498 | 2135 | 1766 | 1904 | 1097 | 1857 |
| | 973 | 1644 | 1435 | 354 | 1875 | 1832 | 1451 | 832 | 760 | 2204 | 744 | 2157 | 1985 | 638 |
| | 73 | 1663 | 2175 | 1894 | 1098 | 479 | 110 | 10 | 1697 | 201 | 1573 | 2244 | 2035 | 954 |
| | 219 | 176 | 2051 | 1432 | 1360 | 548 | 1344 | 501 | 329 | 1238 | 673 | 1254 | 519 | 238 |
| | 1698 | 1732 | 710 | 610 | 41 | 801 | 2173 | 588 | 379 | 307 | 819 | 776 | 395 | 1379 |
| | 1960 | 1148 | 1944 | 1101 | 929 | 1838 | 1273 | 1854 | 1119 | 838 | 42 | 76 | 1310 | 1210 |
| | 641 | 1401 | 517 | 1188 | 979 | 907 | 1419 | 1138 | 995 | 1979 | 1610 | 1748 | 288 | 1701 |
| | 1529 | 182 | 1873 | 198 | 1719 | 1676 | 642 | 676 | 604 | 1810 | 1241 | 2001 | 1117 | 1788 |
| | 1579 | 1507 | 2019 | 1738 | 1595 | 323 | 2210 | 92 | 888 | 45 | 2129 | 2088 | 217 | 798 |
| | 63 | 20 | 1242 | 1276 | 1204 | 154 | 1841 | 345 | 1717 | 1082 | 2179 | 2107 | 363 | 82 |
| | 2195 | 923 | 554 | 692 | 1488 | 645 | 473 | 432 | 817 | 1398 | 663 | 620 | 1842 | 1876 |
| | 1804 | 754 | 185 | 945 | 61 | 1682 | 523 | 451 | 963 | 682 | 539 | 1523 | 1154 | 1292 |
| | 485 | 1245 | 361 | 1032 | 1417 | 1998 | 1263 | 1220 | 839 | 220 | 148 | 1354 | 132 | 1545 |
| | 661 | 26 | 1123 | 1051 | 1563 | 1282 | 486 | 2123 | 1754 | 1892 | 1085 | 1845 | 961 | 1632 |
| | 2017 | 342 | 1863 | 1820 | 1439 | 820 | 748 | 1954 | 732 | 2145 | 1973 | 626 | 1723 | 1651 |
| | 2163 | 1882 | 1086 | 467 | 98 | 236 | 1685 | 189 | 1561 | 2232 | 2023 | 942 | 207 | 164 |
| | 2039 | 1420 | 1348 | 298 | 1332 | | | | | | | | | |
| 3012 | 945 | 1581 | 1229 | 73 | 1147 | 646 | 294 | 516 | 593 | 487 | 815 | 1408 | 2145 | 2781 |
| | 2429 | 1273 | 2588 | 1846 | 1494 | 1716 | 1793 | 2892 | 2015 | 2608 | 333 | 969 | 617 | 2473 |
| | 776 | 34 | 2694 | 2916 | 2993 | 1080 | 203 | 796 | 1533 | 1928 | 1817 | 902 | 1976 | 1234 |
| | 882 | 1104 | 1181 | 2280 | 1403 | 1996 | 2733 | 116 | 5 | 2102 | 164 | 2434 | 2082 | 2304 |
| | 2381 | 468 | 2603 | 184 | 921 | 1316 | 603 | 290 | 1364 | 622 | 270 | 492 | 569 | 1668 |
| | 791 | 1384 | 2121 | 2516 | 1803 | 1490 | 2564 | 1822 | 1470 | 1692 | 1769 | 2868 | 1991 | 2584 |
| | 309 | 704 | 3003 | 2690 | 752 | 10 | 2670 | 1446 | 2969 | 1056 | 661 | 772 | 1509 | 1904 |
| | 1191 | 878 | 1952 | 1210 | 858 | 2646 | 1157 | 2256 | 1861 | 1972 | 179 | 92 | 2391 | 2078 |
| | 140 | 2410 | 2058 | 834 | 2357 | 444 | 49 | 160 | 1379 | 1292 | 579 | 266 | 1340 | 598 |
| | 246 | 2034 | 545 | 1644 | 1249 | 1360 | 2579 | 2492 | 1779 | 1466 | 2540 | 1798 | 362 | 222 |
| | 1143 | 2844 | 2449 | 2560 | 767 | 680 | 2979 | 2666 | 728 | 2998 | 1562 | 1422 | 2343 | 1032 |
| | 637 | 748 | 1967 | 1880 | 1167 | 854 | 1687 | 1186 | 2762 | 2622 | 531 | 2232 | 1837 | 1948 |
| | 155 | 68 | 2367 | 2054 | 2887 | 2386 | 950 | 810 | 1731 | 2227 | 25 | 136 | 1355 | 1268 |
| | 555 | 1 | 1075 | 574 | 2150 | 2010 | 2931 | 415 | 1225 | 1336 | 2555 | 2709 | 1755 | 1201 |
| | 2275 | 1774 | 338 | 198 | 1119 | 1615 | 2425 | 2536 | 743 | 897 | 2955 | 2401 | 463 | 2974 |
| | 1538 | 1398 | 2319 | 2815 | 613 | 724 | 1943 | 2097 | 1745 | 589 | 1663 | 1162 | 2738 | 2598 |
| | 507 | 1003 | 1813 | 1924 | 131 | 285 | 2945 | 1789 | 2863 | 2362 | 926 | 786 | 1707 | 2203 |
| | 2531 | 112 | 1331 | 1485 | 1133 | 2989 | 1051 | 550 | 2126 | 420 | 2907 | 391 | 719 | 1312 |
| | 2049 | 2685 | 2333 | 1177 | 2251 | 1750 | 314 | 1620 | 1095 | 1591 | 1919 | 2512 | 237 | 873 |
| | 521 | 2377 | 439 | 2950 | 1514 | 2820 | 2295 | 2791 | 107 | 700 | 1437 | 2073 | 1721 | 565 |
| | 1639 | 1138 | 2714 | 1008 | 1085 | 979 | 1307 | 1900 | 2637 | 261 | 2921 | 1765 | 2839 | 2338 |
| | 1986 | 2208 | 2285 | 2179 | 2507 | 88 | 825 | 1461 | 1109 | 2965 | 1027 | 526 | 174 | 396 |
| | 473 | 367 | 695 | 1288 | 2025 | 2661 | 2309 | 1153 | 2468 | 1726 | 1374 | 1596 | 1673 | 2772 |

-continued

| Block Length N | Permutation Indices π = [π(0), π(1), . . . , π(N − 1)] | | | | | | | | | | | | |
|---|---|---|---|---|---|---|---|---|---|---|---|---|---|---|
| | 1895 | 2488 | 213 | 849 | 497 | 2353 | 656 | 2926 | 2574 | 2796 | 2873 | 960 | 83 | 676 |
| | 1413 | 1808 | 1697 | 782 | 1856 | 1114 | 762 | 984 | 1061 | 2160 | 1283 | 1876 | 2613 | 3008 |
| | 2897 | 1982 | 44 | 2314 | 1962 | 2184 | 2261 | 348 | 2483 | 64 | 801 | 1196 | 483 | 170 |
| | 1244 | 502 | 150 | 372 | 449 | 1548 | 671 | 1264 | 2001 | 2396 | 1683 | 1370 | 2444 | 1702 |
| | 1350 | 1572 | 1649 | 2748 | 1871 | 2464 | 189 | 584 | 2883 | 2570 | 632 | 2902 | 2550 | 1326 |
| | 2849 | 936 | 541 | 652 | 1389 | 1784 | 1071 | 758 | 1832 | 1090 | 738 | 2526 | 1037 | 2136 |
| | 1741 | 1852 | 59 | 2984 | 2271 | 1958 | 20 | 2290 | 1938 | 714 | 2237 | 324 | 2941 | 40 |
| | 1259 | 1172 | 459 | 146 | 1220 | 478 | 126 | 1914 | 425 | 1524 | 1129 | 1240 | 2459 | 2372 |
| | 1659 | 1346 | 2420 | 1678 | 242 | 102 | 1023 | 2724 | 2329 | 2440 | 647 | 560 | 2859 | 2546 |
| | 608 | 2878 | 1442 | 1302 | 2223 | 912 | 517 | 628 | 1847 | 1760 | 1047 | 734 | 1567 | 1066 |
| | 2642 | 2502 | 411 | 2112 | 1717 | 1828 | 35 | 2960 | 2247 | 1934 | 2767 | 2266 | 830 | 690 |
| | 1611 | 2107 | 2917 | 16 | 1235 | 1148 | 435 | 2893 | 955 | 454 | 2030 | 1890 | 2811 | 295 |
| | 1105 | 1216 | 2435 | 2589 | 1635 | 1081 | 2155 | 1654 | 218 | 78 | 999 | 1495 | 2305 | 2416 |
| | 623 | 777 | 2835 | 2281 | 343 | 2854 | 1418 | 1278 | 2199 | 2695 | 493 | 604 | 1823 | 1977 |
| | 1625 | 469 | 1543 | 1042 | 2618 | 2478 | 387 | 883 | 1693 | 1804 | 11 | 165 | 2825 | 1669 |
| | 2743 | 2242 | 806 | 666 | 1587 | 2083 | 2411 | 3004 | 1211 | 1365 | 1013 | 2869 | 931 | 430 |
| | 2006 | 300 | 2787 | 271 | 599 | 1192 | 1929 | 2565 | 2213 | 1057 | 2131 | 1630 | 194 | 1500 |
| | 975 | 1471 | 1799 | 2392 | 117 | 753 | 401 | 2257 | 319 | 2830 | 1394 | 2700 | 2175 | 2671 |
| | 2999 | 580 | 1317 | 1953 | 1601 | 445 | 1519 | 1018 | 2594 | 888 | 965 | 859 | 1187 | 1780 |
| | 2517 | 141 | 2801 | 1645 | 2719 | 2218 | 1866 | 2088 | 2165 | 2059 | 2387 | 2980 | 705 | 1341 |
| | 989 | 2845 | 907 | 406 | 54 | 276 | 353 | 247 | 575 | 1168 | 1905 | 2541 | 2189 | 1033 |
| | 2348 | 1606 | 1254 | 1476 | 1553 | 2652 | 1775 | 2368 | 93 | 729 | 377 | 2233 | 536 | 2806 |
| | 2454 | 2676 | 2753 | 840 | 2975 | 556 | 1293 | 1688 | 1577 | 662 | 1736 | 994 | 642 | 864 |
| | 941 | 2040 | 1163 | 1756 | 2493 | 2888 | 2777 | 1862 | 2936 | 2194 | 1842 | 2064 | 2141 | 228 |
| | 2363 | 2956 | 681 | 1076 | 363 | 50 | 1124 | 382 | 30 | 252 | 329 | 1428 | 551 | 1144 |
| | 1881 | 2276 | 1563 | 1250 | 2324 | 1582 | 1230 | 1452 | 1529 | 2628 | 1751 | 2344 | 69 | 464 |
| | 2763 | 2450 | 512 | 2782 | 2430 | 1206 | 2729 | 816 | 421 | 532 | 1269 | 1664 | 951 | 638 |
| | 1712 | 970 | 618 | 2406 | 917 | 2016 | 1621 | 1732 | 2951 | 2864 | 2151 | 1838 | 2912 | 2170 |
| | 1818 | 594 | 2117 | 204 | 2821 | 2932 | 1139 | 1052 | 339 | 26 | 1100 | 358 | 6 | 1794 |
| | 305 | 1404 | 1009 | 1120 | 2339 | 2252 | 1539 | 1226 | 2300 | 1558 | 122 | 2994 | 903 | 2604 |
| | 2209 | 2320 | 527 | 440 | 2739 | 2426 | 488 | 2758 | 1322 | 1182 | 2103 | 792 | 397 | 508 |
| | 1727 | 1640 | 927 | 614 | 1447 | 946 | 2522 | 2382 | 291 | 1992 | 1597 | 1708 | 2927 | 2840 |
| | 2127 | 1814 | 2647 | 2146 | 710 | 570 | 1491 | 1987 | 2797 | 2908 | 1115 | 1028 | 315 | 2773 |
| | 835 | 334 | 1910 | 1770 | 2691 | 175 | 985 | 1096 | 2315 | 2469 | 1515 | 961 | 2035 | 1534 |
| | 98 | 2970 | 879 | 1375 | 2185 | 2296 | 503 | 657 | 2715 | 2161 | 223 | 2734 | 1298 | 1158 |
| | 2079 | 2575 | 373 | 484 | 1703 | 1857 | 1505 | 349 | 1423 | 922 | 2498 | 2358 | 267 | 763 |
| | 1573 | 1684 | 2903 | 45 | 2705 | 1549 | 2623 | 2122 | 686 | 546 | 1467 | 1963 | 2291 | 2884 |
| | 1091 | 1245 | 893 | 2749 | 811 | 310 | 1886 | 180 | 2667 | 151 | 479 | 1072 | 1809 | 2445 |
| | 2093 | 937 | 2011 | 1510 | 74 | 1380 | 855 | 1351 | 1679 | 2272 | 3009 | 633 | 281 | 2137 |
| | 199 | 2710 | 1274 | 2580 | 2055 | 2551 | 2879 | 460 | 1197 | 1833 | 1481 | 325 | 1399 | 898 |
| | 2474 | 768 | 845 | 739 | 1067 | 1660 | 2397 | 21 | 2681 | 1525 | 2599 | 2098 | 1746 | 1968 |
| | 2045 | 1939 | 2267 | 2860 | 585 | 1221 | 869 | 2725 | 787 | 286 | 2946 | 156 | 233 | 127 |
| | 455 | 1048 | 1785 | 2421 | 2069 | 913 | 2228 | 1486 | 1134 | 1356 | 1433 | 2532 | 1655 | 2248 |
| | 2985 | 609 | 257 | 2113 | 416 | 2686 | 2334 | 2556 | 2633 | 720 | 2855 | 436 | 1173 | 1568 |
| | 1457 | 542 | 1616 | 874 | 522 | 744 | 821 | 1920 | 1043 | 1636 | 2373 | 2768 | 2657 | 1742 |
| | 2816 | 2074 | 1722 | 1944 | 2071 | 108 | 2243 | 2836 | 561 | 956 | 243 | 2942 | 1004 | 262 |
| | 2922 | 132 | 209 | 1308 | 431 | 1024 | 1761 | 2156 | 1443 | 1130 | 2204 | 1462 | 1110 | 1332 |
| | 1409 | 2508 | 1631 | 2224 | 2961 | 344 | 2643 | 2330 | 392 | 2662 | 2310 | 1086 | 2609 | 696 |
| | 301 | 412 | 1149 | 1544 | 831 | 518 | 1592 | 850 | 498 | 2286 | 797 | 1896 | 1501 | 1612 |
| | 2831 | 2744 | 2031 | 1718 | 2792 | 2050 | 1698 | 474 | 1997 | 84 | 2701 | 2812 | 1019 | 932 |
| | 219 | 2918 | 980 | 238 | 2898 | 1674 | 185 | 1284 | 889 | 1000 | 2219 | 2132 | 1419 | 1106 |
| | 2180 | 1438 | 2 | 2874 | 783 | 2484 | 2089 | 2200 | 407 | 320 | 2619 | 2306 | 368 | 2638 |
| | 1202 | 1062 | 1983 | 672 | 277 | 388 | 1607 | 1520 | 807 | 494 | 1327 | 826 | 2402 | 2262 |
| | 171 | 1872 | 1477 | 1588 | 2807 | 2720 | 2007 | 1694 | 2527 | 2026 | 590 | 450 | 1371 | 1867 |
| | 2677 | 2788 | 995 | 908 | 195 | 2653 | 715 | 214 | 1790 | 1650 | 2571 | 55 | 865 | 976 |
| | 2195 | 2349 | 1395 | 841 | 1915 | 1414 | 2990 | 2850 | 759 | 1255 | 2065 | 2176 | 383 | 537 |
| | 2595 | 2041 | 103 | 2614 | 1178 | 1038 | 1959 | 2455 | 253 | 364 | 1583 | 1737 | 1385 | 229 |
| | 1303 | 802 | 2378 | 2238 | 147 | 643 | 1453 | 1564 | 2783 | 2937 | 2585 | 1429 | 2503 | 2002 |
| | 566 | 426 | 1347 | 1843 | 2171 | 2764 | 971 | 1125 | 773 | 2629 | 691 | 190 | 1766 | 60 |
| | 2547 | 31 | 359 | 952 | 1973 | 817 | 2325 | 2152 | 1390 | 1689 | 1231 | 735 | 1891 | 2966 |
| | 1260 | 1559 | 161 | 2017 | 513 | 340 | 2590 | 2889 | 2431 | 1935 | 79 | 1154 | 2460 | 2759 |
| | 1361 | 205 | 1713 | 1540 | 778 | 1077 | 619 | 725 | 1279 | 2354 | 648 | 947 | 2561 | 1405 |
| | 2913 | 2740 | 1978 | 2277 | 1819 | 1925 | 2479 | 1626 | 1848 | 2147 | 749 | 2605 | 1101 | 928 |
| | 166 | 465 | 7 | 113 | 667 | 2826 | 36 | 335 | 1949 | 793 | 2301 | 2128 | 1366 | 1665 |
| | 2412 | 1313 | 2108 | 1014 | 1236 | 1535 | 137 | 1993 | 489 | 316 | 2566 | 2865 | 600 | 2513 |
| | 296 | 2214 | 2436 | 2735 | 1337 | 422 | 1448 | 1516 | 754 | 1053 | 1800 | 701 | 1496 | 402 |
| | 624 | 923 | 2537 | 1622 | 2648 | 2716 | 1954 | 2253 | 3000 | 1901 | 2696 | 1602 | 1824 | 2123 |
| | 123 | 2822 | 836 | 904 | 142 | 441 | 1188 | 89 | 884 | 2802 | 12 | 311 | 1323 | 1010 |
| | 2036 | 2104 | 1342 | 1641 | 2388 | 1289 | 2084 | 990 | 1212 | 1511 | 2523 | 2210 | 224 | 292 |
| | 2542 | 2841 | 576 | 2489 | 272 | 2190 | 966 | 181 | 711 | 398 | 1424 | 1492 | 730 | 1029 |
| | 1776 | 677 | 1472 | 378 | 2166 | 1381 | 1911 | 1598 | 2624 | 2692 | 1930 | 2711 | 2976 | 1877 |
| | 2672 | 1578 | 354 | 2581 | 99 | 2798 | 812 | 880 | 118 | 899 | 1164 | 65 | 860 | 2778 |
| | 1554 | 769 | 1299 | 986 | 2012 | 2080 | 1318 | 2099 | 2364 | 663 | 2060 | 2894 | 2754 | 1969 |
| | 2499 | 2186 | 200 | 268 | 2518 | 287 | 552 | 1863 | 248 | 1082 | 942 | 157 | 687 | 374 |
| | 1400 | 1468 | 706 | 1487 | 1752 | 51 | 1207 | 2282 | 2142 | 1357 | 1887 | 1574 | 2600 | 2668 |
| | 1906 | 2687 | 1747 | 1251 | 2407 | 470 | 330 | 2557 | 75 | 2533 | 788 | 856 | 94 | 875 |
| | 2947 | 2451 | 595 | 1670 | 1530 | 745 | 1275 | 721 | 2229 | 2056 | 1294 | 2075 | 1135 | 639 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 1795 | 2870 | 2730 | 1945 | 2475 | 1921 | 417 | 244 | 2494 | 263 | 2335 | 1839 | 2995 | 1058 |
| | 918 | 133 | 1265 | 109 | 1617 | 1444 | 682 | 1463 | 523 | 27 | 1183 | 2258 | 2118 | 1333 |
| | 2465 | 1309 | 2817 | 2644 | 1882 | 2663 | 1723 | 1227 | 2383 | 446 | 306 | 2051 | 2509 | 1005 |
| | 239 | 571 | 2952 | 2923 | 851 | 2427 | 70 | 1646 | 653 | 832 | 697 | 2205 | 1439 | 1771 |
| | 1140 | 1111 | 1569 | 615 | 1270 | 2846 | 1853 | 2032 | 1897 | 393 | 2639 | 2971 | 2340 | 2311 |
| | 2769 | 1815 | 2470 | 1034 | 41 | 220 | 85 | 1593 | 827 | 1159 | 528 | 499 | 957 | 605 |
| | 658 | 2234 | 1241 | 1420 | 1285 | 2793 | 2027 | 2359 | 1728 | 1699 | 2157 | 1805 | 1858 | 1506 |
| | 2441 | 2620 | 2485 | 981 | 215 | 547 | 2928 | 2899 | 345 | 3005 | 46 | 2706 | 629 | 808 |
| | 673 | 2181 | 1415 | 1988 | 1116 | 2292 | 1545 | 1193 | 1246 | 894 | 1829 | 2008 | 1873 | 369 |
| | 2615 | 176 | 2316 | 480 | 2745 | 2393 | 2446 | 2094 | 17 | 196 | 302 | 1328 | 803 | 1376 |
| | 504 | 1680 | 933 | 581 | 634 | 282 | 1217 | 1396 | 1502 | 2528 | 2003 | 2576 | 1704 | 2880 |
| | 2133 | 1781 | 1834 | 1482 | 2417 | 2596 | 2702 | 716 | 191 | 764 | 2904 | 1068 | 321 | 2981 |
| | 22 | 2682 | 3 | 784 | 890 | 1916 | 1391 | 1964 | 1092 | 2268 | 1521 | 1169 | 1222 | 870 |
| | 1203 | 1984 | 2090 | 104 | 61 | 152 | 846 | 456 | 2721 | 2369 | 2422 | 2070 | 2403 | 172 |
| | 278 | 1304 | 1261 | 1352 | 2046 | 1656 | 909 | 557 | 610 | 258 | 591 | 1372 | 1478 | 2504 |
| | 2461 | 2552 | 234 | 2856 | 2591 | 1757 | 1810 | 1458 | 1791 | 2572 | 2678 | 692 | 649 | 740 |
| | 1434 | 1044 | 779 | 2957 | 3010 | 2658 | 2991 | 760 | 866 | 1892 | 1849 | 1940 | 2634 | 2244 |
| | 1979 | 543 | 1198 | 2774 | 1179 | 1960 | 2066 | 80 | 37 | 128 | 822 | 432 | 167 | 1743 |
| | 2398 | 962 | 2379 | 148 | 254 | 1280 | 1237 | 1087 | 2022 | 1632 | 1367 | 2943 | 586 | 2162 |
| | 567 | 1348 | 1454 | 2480 | 2437 | 2287 | 210 | 1627 | 2567 | 1131 | 1786 | 350 | 1767 | 2548 |
| | 2413 | 668 | 625 | 475 | 1410 | 2827 | 755 | 2331 | 2986 | 1550 | 2967 | 736 | 601 | 2109 |
| | 1825 | 1675 | 2610 | 1015 | 1955 | 519 | 1174 | 2750 | 1155 | 1936 | 1801 | 297 | 13 | 2875 |
| | 798 | 2215 | 143 | 1719 | 2374 | 938 | 2355 | 124 | 3001 | 1497 | 1213 | 1063 | 1998 | 403 |
| | 1343 | 2919 | 562 | 2138 | 1145 | 1324 | 1931 | 2524 | 326 | 1107 | 2345 | 2543 | 1762 | 1189 |
| | 2697 | 186 | 2263 | 1603 | 119 | 712 | 1526 | 2307 | 533 | 731 | 2962 | 2389 | 885 | 2832 |
| | 451 | 2803 | 1319 | 1912 | 2726 | 495 | 1733 | 1449 | 1150 | 577 | 2085 | 1020 | 1651 | 991 |
| | 2519 | 100 | 914 | 1695 | 2933 | 2649 | 2350 | 1777 | 273 | 2220 | 2851 | 2191 | 707 | 1300 |
| | 2114 | 485 | 1121 | 837 | 538 | 2977 | 1473 | 408 | 1039 | 379 | 1907 | 2500 | 1386 | 1685 |
| | 2321 | 2037 | 1738 | 1165 | 2673 | 1608 | 2239 | 1579 | 95 | 688 | 2586 | 2885 | 509 | 225 |
| | 2938 | 2365 | 861 | 2808 | 427 | 2779 | 1295 | 1888 | 774 | 1073 | 1709 | 1425 | 1126 | 553 |
| | 2061 | 996 | 1868 | 2172 | 2495 | 76 | 1974 | 2273 | 2909 | 2625 | 2326 | 1753 | 249 | 2196 |
| | 56 | 360 | 683 | 1276 | 162 | 461 | 1097 | 813 | 514 | 182 | 1208 | 384 | 1256 | 1560 |
| | 1883 | 2476 | 1362 | 1661 | 2297 | 2013 | 1714 | 1382 | 2408 | 1584 | 2456 | 2760 | 71 | 664 |
| | 2562 | 2861 | 2895 | 201 | 2914 | 2582 | 596 | 2784 | 644 | 948 | 1271 | 1864 | 750 | 1049 |
| | 1083 | 1401 | 1102 | 770 | 1796 | 972 | 1844 | 2148 | 2953 | 52 | 1950 | 2249 | 2283 | 2601 |
| | 2302 | 1970 | 2996 | 726 | 32 | 336 | 1141 | 1252 | 138 | 437 | 471 | 789 | 490 | 158 |
| | 1184 | 1926 | 1232 | 1536 | 2341 | 2452 | 1338 | 1637 | 1671 | 2471 | 1690 | 1358 | 2384 | 114 |
| | 2432 | 2736 | 529 | 640 | 2538 | 2837 | 2871 | 659 | 2890 | 2558 | 572 | 1314 | 620 | 924 |
| | 1729 | 1840 | 2654 | 423 | 1059 | 1859 | 1078 | 746 | 1772 | 2514 | 1820 | 2124 | 2929 | 28 |
| | 842 | 1623 | 2259 | 47 | 2278 | 1946 | 2972 | 702 | 8 | 312 | 1117 | 1228 | 2042 | 2823 |
| | 447 | 1247 | 466 | 134 | 1160 | 1902 | 967 | 1512 | 2317 | 2428 | 230 | 1011 | 1647 | 2447 |
| | 1666 | 1334 | 2360 | 90 | 2167 | 1507 | 505 | 616 | 1430 | 2211 | 2847 | 635 | 2866 | 2293 |
| | 548 | 1290 | 355 | 2707 | 1705 | 1816 | 2630 | 399 | 1035 | 1835 | 1054 | 481 | 1989 | 2490 |
| | 1555 | 895 | 2905 | 4 | 818 | 1599 | 2235 | 23 | 2254 | 1681 | 177 | 678 | 2755 | 2095 |
| | 1093 | 1204 | 2018 | 2799 | 1025 | 1223 | 442 | 2881 | 1377 | 1878 | 943 | 283 | 1811 | 2404 |
| | 206 | 987 | 2225 | 2423 | 1642 | 1069 | 2577 | 66 | 2143 | 1483 | 3011 | 592 | 1406 | 2187 |
| | 413 | 611 | 2842 | 2269 | 765 | 2712 | 331 | 2683 | 1199 | 1792 | 2606 | 375 | 1613 | 1329 |
| | 1030 | 457 | 1965 | 900 | 1531 | 871 | 2399 | 2992 | 794 | 1575 | 2813 | 2529 | 2230 | 1657 |
| | 153 | 2100 | 2731 | 2071 | 587 | 1180 | 1994 | 365 | 1001 | 717 | 418 | 2857 | 1353 | 288 |
| | 919 | 259 | 1787 | 2380 | 1266 | 1565 | 2201 | 1917 | 1618 | 1045 | 2553 | 1488 | 2119 | 1459 |
| | 2987 | 568 | 2466 | 2765 | 389 | 105 | 2818 | 2245 | 741 | 2688 | 307 | 2659 | 1175 | 1768 |
| | 654 | 953 | 1589 | 1305 | 1006 | 433 | 1941 | 876 | 1748 | 2052 | 2375 | 2968 | 1854 | 2153 |
| | 2789 | 2505 | 2206 | 1633 | 129 | 2076 | 2948 | 240 | 563 | 1156 | 42 | 341 | 977 | 693 |
| | 394 | 62 | 1088 | 264 | 1136 | 1440 | 1763 | 2356 | 1242 | 1541 | 2177 | 1893 | 1594 | 1262 |
| | 2288 | 1464 | 2336 | 2640 | 2963 | 544 | 2442 | 2741 | 2775 | 81 | 2794 | 2462 | 476 | 2664 |
| | 524 | 828 | 1151 | 1744 | 630 | 929 | 963 | 1281 | 982 | 650 | 1676 | 852 | 1724 | 2028 |
| | 2833 | 2944 | 1830 | 2129 | 2163 | 2481 | 2182 | 1850 | 2876 | 606 | 2924 | 216 | 1021 | 1132 |
| | 18 | 317 | 351 | 669 | 370 | 38 | 1064 | 1806 | 1112 | 1416 | 2221 | 2332 | 1218 | 1517 |
| | 1551 | 2351 | 1570 | 1238 | 2264 | 3006 | 2312 | 2616 | 409 | 520 | 2418 | 2717 | 2751 | 539 |
| | 2770 | 2438 | 452 | 1194 | 500 | 804 | 1609 | 1720 | 2534 | 303 | 939 | 1739 | 958 | 626 |
| | 1652 | 2394 | 1700 | 2004 | 2809 | 2920 | 722 | 1503 | 2139 | 2939 | 2158 | 1826 | 2852 | 582 |
| | 2900 | 192 | 997 | 1108 | 1922 | 2703 | 327 | 1127 | 346 | 14 | 1040 | 1782 | 847 | 1392 |
| | 2197 | 2308 | 110 | 891 | 1527 | 2327 | 1546 | 1214 | 2240 | 2982 | 2047 | 1387 | 385 | 496 |
| | 1310 | 2091 | 2727 | 515 | 2746 | 2173 | 428 | 1170 | 235 | 2587 | 1585 | 1696 | 2510 | 279 |
| | 915 | 1715 | 934 | 361 | 1869 | 2370 | 1435 | 775 | 698 | 2915 | 2635 | 1975 | 2785 | 57 |
| | 2134 | 558 | 2115 | 1479 | 1561 | 2896 | 1898 | 1103 | 823 | 163 | 973 | 1257 | 322 | 1758 |
| | 905 | 2679 | 2761 | 1084 | 86 | 2303 | 2023 | 1363 | 1691 | 2457 | 1522 | 2958 | 2105 | 867 |
| | 949 | 2284 | 1286 | 491 | 211 | 2563 | 2891 | 645 | 2722 | 2592 | 293 | 2067 | 2149 | 472 |
| | 2486 | 1209 | 1411 | 751 | 1079 | 1845 | 910 | 780 | 1493 | 255 | 337 | 1672 | 674 | 2409 |
| | 2611 | 1951 | 2279 | 33 | 2110 | 1980 | 2693 | 1455 | 1537 | 2872 | 1874 | 597 | 799 | 139 |
| | 467 | 1233 | 298 | 168 | 881 | 245 | 2737 | 1060 | 1146 | 1797 | 1999 | 1339 | 1667 | 2433 |
| | 1498 | 1368 | 2081 | 1445 | 925 | 2260 | 2346 | 2997 | 187 | 2539 | 2867 | 621 | 2698 | 2568 |
| | 269 | 2645 | 2125 | 448 | 534 | 1185 | 1628 | 1932 | 1055 | 1821 | 886 | 756 | 1469 | 833 |
| | 313 | 1648 | 1734 | 2385 | 2828 | 120 | 2255 | 9 | 2086 | 1956 | 2669 | 2033 | 1513 | 2848 |
| | 2934 | 573 | 1016 | 1320 | 443 | 968 | 274 | 144 | 857 | 221 | 2954 | 1036 | 1122 | 1773 |
| | 2216 | 2520 | 1643 | 2168 | 1474 | 1344 | 2057 | 1421 | 1142 | 2236 | 2322 | 2973 | 404 | 708 |
| | 2843 | 356 | 2674 | 2544 | 2655 | 2621 | 2342 | 424 | 510 | 1161 | 1604 | 1908 | 1031 | 1556 |

-continued

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| | 862 | 732 | 843 | 809 | 530 | 1624 | 1710 | 2361 | 2804 | 96 | 2713 | 2756 | 2062 | 486 |
| | 2043 | 2009 | 1730 | 2824 | 2910 | 549 | 992 | 1296 | 901 | 944 | 250 | 1686 | 231 | 197 |
| | 2930 | 1012 | 1098 | 2231 | 2192 | 2496 | 2101 | 2144 | 1450 | 2886 | 1431 | 1397 | 1118 | 2212 |
| | 2298 | 419 | 380 | 684 | 289 | 332 | 2650 | 1074 | 2631 | 2597 | 2318 | 400 | 2414 | 1619 |
| | 1580 | 1884 | 1489 | 1532 | 838 | 2274 | 819 | 183 | 506 | 1600 | 602 | 2819 | 2780 | 72 |
| | 2689 | 2732 | 2038 | 462 | 2019 | 1383 | 1706 | 2800 | 1802 | 1007 | 727 | 1272 | 877 | 920 |
| | 226 | 1662 | 207 | 2583 | 2906 | 988 | 3002 | 2207 | 1927 | 1267 | 2077 | 2120 | 1426 | 2862 |
| | 1407 | 771 | 1094 | 2188 | 1190 | 395 | 115 | 2467 | 265 | 308 | 2626 | 1050 | 2607 | 1971 |
| | 2053 | 376 | 2390 | 1595 | 1315 | 655 | 1465 | 1749 | 814 | 2250 | 795 | 159 | 241 | 1576 |
| | 578 | 2795 | 2515 | 1855 | 2665 | 2949 | 2014 | 438 | 1995 | 1359 | 1441 | 2776 | 1778 | 983 |
| | 703 | 43 | 853 | 1137 | 202 | 1638 | 785 | 2559 | 2641 | 964 | 2978 | 2183 | 1903 | 1243 |
| | 1571 | 2337 | 1402 | 2838 | 1985 | 747 | 829 | 2164 | 1166 | 371 | 91 | 2443 | 2771 | 525 |
| | 2602 | 2472 | 173 | 1947 | 2029 | 352 | 2366 | 1089 | 1291 | 631 | 959 | 1725 | 790 | 660 |
| | 1373 | 135 | 217 | 1552 | 554 | 2289 | 2491 | 1831 | 2159 | 2925 | 1990 | 1860 | 2573 | 1335 |
| | 1417 | 2752 | 1754 | 477 | 679 | 19 | 347 | 1113 | 178 | 48 | 761 | 125 | 2617 | 940 |
| | 1026 | 1677 | 1879 | 1219 | 1547 | 2313 | 1378 | 1248 | 1961 | 1325 | 805 | 2140 | 2226 | 2877 |
| | 67 | 2419 | 2747 | 501 | 2578 | 2448 | 149 | 2525 | 2005 | 328 | 414 | 1065 | 1508 | 1812 |
| | 935 | 1701 | 766 | 636 | 1349 | 713 | 193 | 1528 | 1614 | 2265 | 2708 | 0 | 2135 | 2901 |
| | 1966 | 1836 | 2549 | 1913 | 1393 | 2728 | 2814 | 453 | 896 | 1200 | 323 | 848 | 154 | 24 |
| | 737 | 101 | 2593 | 916 | 1002 | 1653 | 2096 | 2400 | 1523 | 2048 | 1354 | 1224 | 1937 | 1301 |
| | 1022 | 2116 | 2202 | 2853 | 284 | 588 | 2723 | 236 | 2554 | 2424 | 2535 | 2501 | 2222 | 304 |
| | 390 | 1041 | 1484 | 1788 | 911 | 1436 | 742 | 612 | 723 | 689 | 410 | 1504 | 1590 | 2241 |
| | 2684 | 2988 | 2111 | 2636 | 1942 | 366 | 1923 | 1889 | 1610 | 2704 | 2790 | 429 | 872 | 1176 |
| | 781 | 824 | 130 | 1566 | 111 | 77 | 2810 | 892 | 978 | 1629 | 2072 | 2376 | 1981 | 2024 |
| | 1330 | 2766 | 1311 | 1277 | 998 | 2092 | 2178 | 299 | 260 | 564 | 169 | 212 | 2530 | 954 |
| | 2511 | 2477 | 2198 | 280 | 2294 | 1499 | 1460 | 1764 | 1369 | 1412 | 718 | 2154 | 699 | 665 |
| | 386 | 1480 | 482 | 2699 | 2660 | 2964 | 2569 | 2612 | 1918 | 342 | 1899 | 1263 | 1586 | 2680 |
| | 1682 | 887 | 607 | 1152 | 757 | 800 | 106 | 1542 | 87 | 2463 | 2786 | 868 | 2882 | 2087 |
| | 1807 | 2352 | 1957 | 2000 | 1306 | 2742 | 1287 | 651 | 974 | 2068 | 1070 | 275 | 3007 | 2347 |
| | 145 | 188 | 2506 | 930 | 2487 | 1851 | 2174 | 256 | 2270 | 1475 | 1195 | 535 | 1345 | 1388 |
| | 694 | 2130 | 675 | 39 | 121 | 1456 | 458 | 2675 | 2395 | 1735 | 2545 | 2829 | 1894 | 318 |
| | 1875 | 1239 | 1321 | 2656 | 1658 | 863 | 583 | 2935 | 733 | 1017 | 82 | 1518 | 63 | 2439 |
| | 2521 | 844 | 2858 | 2063 | 1783 | 1123 | 1933 | 2217 | 1282 | 2718 | 1865 | 627 | 709 | 2044 |
| | 1046 | 251 | 2983 | 2323 | 2651 | 405 | 2482 | 906 | 53 | 1827 | 1909 | 232 | 2246 | 1451 |
| | 1171 | 511 | 839 | 1605 | 670 | 540 | 1253 | 15 | 97 | 1432 | 434 | 2169 | 2371 | 1711 |
| | 2039 | 2805 | 1870 | 1740 | 2453 | 1215 | 1297 | 2632 | 1634 | 357 | 559 | 2911 | 227 | 993 |
| | 58 | 2940 | 641 | 2415 | 2497 | 820 | 2834 | 1557 | 1759 | 1099 | 1427 | 2193 | 1258 | 1128 |
| | 1841 | 1205 | 685 | 2020 | 2106 | 2757 | 2959 | 2299 | 2627 | 381 | 2458 | 2328 | 29 | 2405 |
| | 1885 | 208. | | | | | | | | | | | | |

4. An apparatus for interleaving a codeword, wherein the codeword comprises a first bit sequence $b'=[b'_0, b'_1, \ldots, b'_{N-1}] \in \{0,1\}^N$ of a block length N, the apparatus comprising:

an interleaver module configured to interleave the codeword based on an interleaver, wherein the interleaver specifies a set of permutation indices $\pi=[\pi(0), \pi(1), \ldots, \pi(N-1)]$;

wherein the interleaving of the codeword comprises reordering or mapping the first bit sequence $b'=[b'_0, b'_1, \ldots, b'_{N-1}] \in \{0,1\}^N$ of the codeword into a second bit sequence $b=[b_0, b_1, \ldots, b_{N-1}]=[b'_{\pi(0)}, b'_{\pi(1)}, \ldots, b'_{\pi(N-1)}]\{0,1\}^N$; and wherein, for a block length of N=1200, the interleaver comprises the set of permutation indices, as follows:

| Block Length N | Permutation Indices $\pi = [\pi(0), \pi(1), \ldots, \pi(N-1)]$ | | | | | | | | | | | | | |
|---|---|---|---|---|---|---|---|---|---|---|---|---|---|---|
| 1200 | 199 | 1000 | 670 | 477 | 613 | 236 | 684 | 372 | 809 | 98 | 951 | 179 | 547 | 148 |
| | 1018 | 825 | 961 | 584 | 1194 | 720 | 1157 | 446 | 229 | 527 | 895 | 496 | 1139 | 1173 |
| | 109 | 932 | 342 | 1068 | 305 | 794 | 447 | 875 | 43 | 844 | 514 | 321 | 327 | 80 |
| | 690 | 216 | 653 | 1142 | 795 | 23 | 1137 | 1192 | 862 | 669 | 805 | 428 | 1038 | 564 |
| | 1001 | 290 | 1143 | 371 | 739 | 340 | 10 | 1017 | 1153 | 776 | 186 | 328 | 149 | 638 |
| | 291 | 719 | 1087 | 688 | 131 | 1138 | 301 | 1124 | 534 | 60 | 497 | 986 | 639 | 1067 |
| | 235 | 1036 | 706 | 513 | 649 | 272 | 882 | 408 | 391 | 134 | 987 | 215 | 583 | 184 |
| | 1054 | 861 | 997 | 620 | 30 | 756 | 1193 | 482 | 135 | 563 | 931 | 532 | 202 | 9 |
| | 145 | 968 | 378 | 520 | 341 | 830 | 483 | 846 | 79 | 880 | 550 | 357 | 493 | 116 |
| | 726 | 252 | 689 | 1178 | 831 | 59 | 427 | 28 | 898 | 705 | 841 | 464 | 912 | 600 |
| | 1037 | 326 | 1179 | 407 | 775 | 376 | 46 | 1053 | 1189 | 812 | 222 | 948 | 185 | 674 |
| | 457 | 755 | 1123 | 724 | 394 | 201 | 337 | 1160 | 570 | 96 | 533 | 1022 | 675 | 1103 |
| | 271 | 845 | 742 | 549 | 555 | 308 | 918 | 444 | 881 | 170 | 1023 | 251 | 165 | 220 |
| | 1090 | 897 | 1033 | 656 | 1104 | 792 | 29 | 518 | 171 | 599 | 967 | 568 | 238 | 45 |
| | 181 | 1004 | 414 | 1140 | 377 | 866 | 519 | 947 | 115 | 916 | 359 | 166 | 529 | 152 |
| | 762 | 288 | 725 | 14 | 867 | 95 | 463 | 64 | 934 | 741 | 747 | 500 | 1110 | 636 |
| | 619 | 362 | 15 | 443 | 811 | 412 | 82 | 1089 | 25 | 848 | 258 | 984 | 221 | 710 |
| | 363 | 791 | 1159 | 760 | 430 | 237 | 373 | 1196 | 606 | 748 | 569 | 1058 | 711 | 1074 |
| | 307 | 1108 | 778 | 358 | 721 | 344 | 954 | 480 | 917 | 206 | 1059 | 287 | 655 | 256 |

-continued

| Block Length N | Permutation Indices π = [π(0), π(1), . . . , π(N − 1)] | | | | | | | | | | | | | |
|---|---|---|---|---|---|---|---|---|---|---|---|---|---|---|
| | 1126 | 933 | 1069 | 692 | 102 | 828 | 65 | 554 | 207 | 635 | 1003 | 604 | 274 | 81 |
| | 217 | 1040 | 450 | 1176 | 413 | 902 | 685 | 983 | 151 | 952 | 622 | 429 | 565 | 188 |
| | 798 | 324 | 761 | 50 | 903 | 66 | 499 | 1073 | 970 | 777 | 913 | 536 | 1146 | 672 |
| | 1109 | 398 | 51 | 479 | 393 | 448 | 118 | 1125 | 61 | 884 | 132 | 1020 | 257 | 746 |
| | 399 | 827 | 1195 | 796 | 466 | 273 | 409 | 32 | 642 | 168 | 605 | 1094 | 877 | 1175 |
| | 343 | 1144 | 587 | 621 | 757 | 380 | 990 | 516 | 953 | 242 | 1095 | 323 | 691 | 292 |
| | 1162 | 969 | 975 | 728 | 138 | 864 | 847 | 590 | 243 | 671 | 310 | 117 | 640 | 1019 |
| | 1076 | 585 | 938 | 449 | 253 | 486 | 12 | 591 | 658 | 465 | 988 | 167 | 224 | 187 |
| | 86 | 797 | 601 | 834 | 976 | 939 | 1006 | 586 | 136 | 515 | 572 | 535 | 434 | 1145 |
| | 949 | 1182 | 708 | 87 | 154 | 1161 | 484 | 863 | 920 | 883 | 782 | 1039 | 97 | 330 |
| | 1056 | 435 | 502 | 309 | 832 | 11 | 68 | 31 | 1130 | 641 | 445 | 678 | 204 | 783 |
| | 850 | 657 | 1180 | 294 | 416 | 379 | 278 | 989 | 793 | 1026 | 552 | 1131 | 1198 | 1005 |
| | 101 | 707 | 764 | 727 | 626 | 137 | 1141 | 174 | 900 | 279 | 346 | 153 | 676 | 1055 |
| | 1112 | 1075 | 974 | 485 | 289 | 360 | 48 | 627 | 694 | 501 | 1024 | 203 | 260 | 223 |
| | 122 | 833 | 637 | 870 | 396 | 1105 | 815 | 849 | 172 | 551 | 608 | 571 | 470 | 1181 |
| | 985 | 18 | 744 | 123 | 190 | 1197 | 293 | 899 | 956 | 919 | 818 | 329 | 3 | 366 |
| | 1092 | 471 | 538 | 345 | 868 | 47 | 104 | 813 | 1166 | 677 | 481 | 714 | 240 | 819 |
| | 886 | 693 | 16 | 395 | 452 | 415 | 314 | 1025 | 829 | 1062 | 4 | 1167 | 1007 | 814 |
| | 364 | 743 | 800 | 763 | 662 | 173 | 1177 | 210 | 936 | 315 | 382 | 189 | 712 | 1091 |
| | 1148 | 1111 | 1010 | 67 | 325 | 558 | 84 | 663 | 730 | 537 | 1060 | 239 | 296 | 259 |
| | 158 | 869 | 673 | 906 | 432 | 1011 | 1078 | 885 | 208 | 522 | 644 | 607 | 506 | 17 |
| | 1021 | 54 | 196 | 159 | 226 | 33 | 556 | 935 | 992 | 955 | 854 | 365 | 169 | 402 |
| | 1128 | 507 | 574 | 381 | 904 | 83 | 140 | 103 | 2 | 713 | 517 | 588 | 276 | 855 |
| | 922 | 729 | 52 | 431 | 488 | 451 | 350 | 1061 | 865 | 1098 | 624 | 133 | 70 | 1077 |
| | 400 | 779 | 836 | 799 | 698 | 209 | 13 | 246 | 972 | 351 | 418 | 225 | 521 | 1127 |
| | 1184 | 1147 | 1046 | 557 | 231 | 594 | 120 | 699 | 766 | 573 | 1096 | 275 | 332 | 1041 |
| | 194 | 905 | 709 | 780 | 468 | 1047 | 1114 | 921 | 244 | 623 | 680 | 643 | 542 | 53 |
| | 1057 | 90 | 816 | 195 | 35 | 1042 | 592 | 971 | 1028 | 991 | 890 | 401 | 205 | 438 |
| | 1164 | 543 | 610 | 417 | 940 | 119 | 176 | 139 | 38 | 295 | 423 | 786 | 312 | 891 |
| | 958 | 765 | 88 | 467 | 524 | 487 | 386 | 1097 | 901 | 1134 | 660 | 39 | 106 | 1113 |
| | 436 | 750 | 872 | 835 | 734 | 245 | 49 | 282 | 424 | 387 | 784 | 735 | 630 | 593 |
| | 156 | 1082 | 397 | 454 | 34 | 20 | 1163 | 1183 | 1132 | 1083 | 978 | 941 | 504 | 230 |
| | 745 | 802 | 609 | 368 | 311 | 331 | 280 | 361 | 126 | 89 | 852 | 578 | 1093 | 1150 |
| | 957 | 716 | 659 | 679 | 628 | 579 | 474 | 437 | 0 | 926 | 241 | 298 | 105 | 1064 |
| | 942 | 1027 | 749 | 927 | 822 | 785 | 348 | 74 | 589 | 646 | 453 | 212 | 155 | 175 |
| | 124 | 75 | 1008 | 1133 | 696 | 422 | 937 | 994 | 801 | 560 | 503 | 69 | 472 | 553 |
| | 318 | 281 | 1044 | 770 | 85 | 142 | 1149 | 908 | 851 | 871 | 820 | 771 | 666 | 629 |
| | 192 | 1118 | 433 | 263 | 297 | 56 | 1199 | 19 | 1168 | 1119 | 1014 | 523 | 540 | 266 |
| | 651 | 838 | 645 | 404 | 347 | 367 | 316 | 267 | 162 | 125 | 888 | 614 | 1129 | 1186 |
| | 993 | 752 | 695 | 261 | 664 | 615 | 510 | 473 | 652 | 962 | 277 | 334 | 141 | 1100 |
| | 1043 | 1063 | 1012 | 963 | 858 | 821 | 384 | 110 | 625 | 682 | 262 | 248 | 191 | 211 |
| | 160 | 111 | 6 | 715 | 732 | 458 | 973 | 1030 | 837 | 596 | 539 | 559 | 508 | 459 |
| | 354 | 317 | 1080 | 806 | 121 | 178 | 1185 | 944 | 887 | 907 | 856 | 807 | 702 | 665 |
| | 228 | 1154 | 469 | 526 | 333 | 92 | 1170 | 55 | 977 | 1155 | 1050 | 1013 | 576 | 302 |
| | 817 | 874 | 681 | 440 | 383 | 403 | 352 | 303 | 36 | 161 | 924 | 650 | 1165 | 22 |
| | 1029 | 788 | 731 | 751 | 700 | 781 | 546 | 509 | 72 | 998 | 313 | 370 | 177 | 1136 |
| | 1079 | 1099 | 1048 | 999 | 894 | 857 | 420 | 146 | 661 | 718 | 525 | 284 | 227 | 247 |
| | 1169 | 147 | 42 | 5 | 768 | 494 | 879 | 1066 | 873 | 632 | 575 | 595 | 544 | 495 |
| | 390 | 353 | 1116 | 842 | 157 | 214 | 21 | 980 | 923 | 489 | 892 | 843 | 738 | 701 |
| | 264 | 1190 | 505 | 562 | 369 | 128 | 71 | 91 | 40 | 1191 | 1086 | 1049 | 612 | 338 |
| | 853 | 683 | 490 | 476 | 419 | 439 | 388 | 339 | 234 | 943 | 960 | 686 | 1 | 58 |
| | 1065 | 824 | 767 | 787 | 736 | 687 | 582 | 545 | 108 | 1034 | 349 | 406 | 213 | 1172 |
| | 1115 | 1135 | 1084 | 1035 | 930 | 893 | 1072 | 182 | 697 | 754 | 561 | 320 | 198 | 283 |
| | 232 | 183 | 78 | 41 | 804 | 530 | 1045 | 1102 | 909 | 668 | 611 | 631 | 580 | 531 |
| | 426 | 389 | 1152 | 878 | 193 | 250 | 57 | 1016 | 959 | 979 | 928 | 1009 | 774 | 737 |
| | 300 | 26 | 541 | 598 | 405 | 164 | 107 | 127 | 76 | 27 | 1122 | 1085 | 648 | 374 |
| | 889 | 946 | 753 | 512 | 455 | 475 | 197 | 375 | 270 | 233 | 996 | 722 | 37 | 94 |
| | 1101 | 860 | 803 | 823 | 772 | 723 | 456 | 581 | 144 | 1070 | 385 | 442 | 249 | 8 |
| | 1151 | 717 | 966 | 319 | 733 | 218 | 1071 | 1120 | 356 | 492 | 790 | 929 | 597 | 299 |
| | 114 | 667 | 1081 | 566 | 219 | 268 | 704 | 840 | 911 | 77 | 945 | 647 | 462 | 1015 |
| | 99 | 914 | 567 | 616 | 1052 | 1188 | 286 | 1171 | 93 | 995 | 810 | 163 | 577 | 62 |
| | 915 | 964 | 200 | 336 | 634 | 773 | 441 | 143 | 1158 | 511 | 925 | 410 | 63 | 112 |
| | 548 | 100 | 982 | 1121 | 789 | 491 | 306 | 859 | 73 | 758 | 411 | 460 | 896 | 1032 |
| | 130 | 269 | 910 | 839 | 654 | 7 | 421 | 1106 | 759 | 808 | 44 | 180 | 478 | 617 |
| | 285 | 1187 | 1002 | 355 | 769 | 254 | 1107 | 1156 | 392 | 528 | 826 | 965 | 633 | 335 |
| | 150 | 703 | 1117 | 602 | 255 | 304 | 740 | 876 | 1174 | 113 | 981 | 618 | 498 | 1051 |
| | 265 | 950 | 603 | 425 | 1088 | 24 | 322 | 461 | 129 | 1031. | | | | |

* * * * *